United States Patent
Zafar et al.

(10) Patent No.: US 9,401,014 B2
(45) Date of Patent: Jul. 26, 2016

(54) METHODS AND SYSTEMS FOR UTILIZING DESIGN DATA IN COMBINATION WITH INSPECTION DATA

(71) Applicant: KLA-Tencor Technologies Corporation, Milpitas, CA (US)

(72) Inventors: Khurram Zafar, San Jose, CA (US); Sagar Kekare, Milpitas, CA (US); Ellis Chang, Saratoga, CA (US); Allen Park, San Jose, CA (US); Peter Rose, Boulder Creek, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 0 days.

(21) Appl. No.: 14/578,317

(22) Filed: Dec. 19, 2014

(65) Prior Publication Data
US 2015/0154746 A1  Jun. 4, 2015

Related U.S. Application Data

(62) Division of application No. 12/534,547, filed on Aug. 3, 2009, now Pat. No. 8,923,600, which is a division of application No. 11/561,659, filed on Nov. 20, 2006, now Pat. No. 7,570,796.

(60) Provisional application No. 60/737,947, filed on Nov. 18, 2005, provisional application No. 60/738,290, filed on Nov. 18, 2005.

(51) Int. Cl.
*G06K 9/00* (2006.01)
*G06T 7/00* (2006.01)
(Continued)

(52) U.S. Cl.
CPC ................ *G06T 7/0006* (2013.01); *G03F 1/84* (2013.01); *G06F 17/5081* (2013.01); *G06T 7/0008* (2013.01); *G06T 2207/20076* (2013.01); *G06T 2207/30148* (2013.01)

(58) Field of Classification Search
CPC ................ G06T 7/0006; G06T 7/0008; G06T 2207/20076; G06T 2207/30148; G03F 1/84; G06F 17/5081
See application file for complete search history.

(56) References Cited

U.S. PATENT DOCUMENTS 6,427,024 B1    7/2002  Bishop
6,553,329 B2 *  4/2003  Balachandran .. G01R 31/31704
                                                  702/118

(Continued)

FOREIGN PATENT DOCUMENTS

CN    101275920    10/2008

OTHER PUBLICATIONS

Gu et al., "Lossless Compression Algorithms for Hierarchical IC Layout," IEEE Transactions on Semiconductor Manufacturing, vol. 21, No. 2, May 2008, pp. 285-296.

*Primary Examiner* — Molly Delaney
(74) *Attorney, Agent, or Firm* — Ann Marie Mewherter

(57) ABSTRACT

Various methods and systems for utilizing design data in combination with inspection data are provided. One computer-implemented method for binning defects detected on a wafer includes comparing portions of design data proximate positions of the defects in design data space. The method also includes determining if the design data in the portions is at least similar based on results of the comparing step. In addition, the method includes binning the defects in groups such that the portions of the design data proximate the positions of the defects in each of the groups are at least similar. The method further includes storing results of the binning step in a storage medium.

103 Claims, 16 Drawing Sheets

(51) Int. Cl.
　　*G03F 1/84* (2012.01)
　　*G06F 17/50* (2006.01)

(56) References Cited

U.S. PATENT DOCUMENTS

| | | | |
|---|---|---|---|
| 7,133,070 B2 * | 11/2006 | Wheeler | H04N 1/40 |
| | | | 348/223.1 |
| 7,558,419 B1 | 7/2009 | Ye et al. | |
| 8,041,106 B2 | 10/2011 | Pak et al. | |
| 8,223,327 B2 | 7/2012 | Chen et al. | |
| 8,255,172 B2 | 8/2012 | Auerbach | |
| 8,269,960 B2 | 9/2012 | Reich et al. | |
| 8,605,275 B2 | 12/2013 | Chen et al. | |
| 2003/0082463 A1 | 5/2003 | Laidig et al. | |
| 2003/0228050 A1 | 12/2003 | Geshel et al. | |
| 2005/0249318 A1 * | 11/2005 | Minemura | G11B 20/10009 |
| | | | 375/341 |
| 2006/0078192 A1 | 4/2006 | Oh | |
| 2006/0083135 A1 * | 4/2006 | Minemura | G11B 7/0062 |
| | | | 369/47.51 |
| 2009/0310864 A1 | 12/2009 | Takagi et al. | |
| 2011/0129142 A1 | 6/2011 | Takahashi et al. | |
| 2011/0188733 A1 | 8/2011 | Bardos et al. | |
| 2011/0320149 A1 | 12/2011 | Lee et al. | |
| 2012/0229618 A1 | 9/2012 | Urano et al. | |
| 2013/0064442 A1 | 3/2013 | Chang et al. | |
| 2013/0129189 A1 | 5/2013 | Wu et al. | |
| 2013/0236084 A1 | 9/2013 | Li et al. | |
| 2014/0002632 A1 | 1/2014 | Lin et al. | |
| 2014/0050389 A1 | 2/2014 | Mahadevan et al. | |
| 2014/0185919 A1 | 7/2014 | Lang et al. | |
| 2014/0193065 A1 | 7/2014 | Chu et al. | |
| 2014/0219544 A1 | 8/2014 | Wu et al. | |

\* cited by examiner

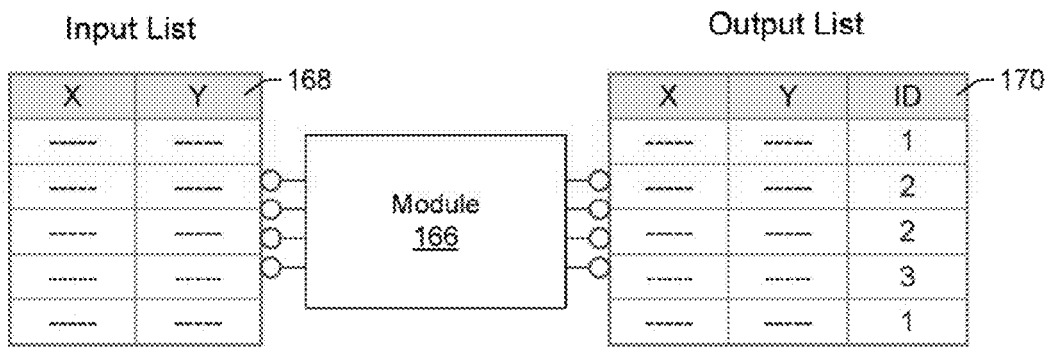
Fig. 20
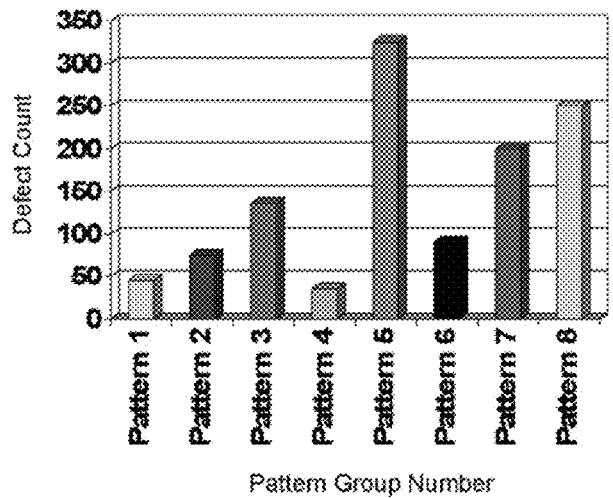
Fig. 21
Fig. 22

METHODS AND SYSTEMS FOR UTILIZING DESIGN DATA IN COMBINATION WITH INSPECTION DATA

BACKGROUND OF THE INVENTION

1. Field of the Invention

The present invention generally relates to methods and systems for utilizing design data in combination with inspection data. Certain embodiments relate to a computer-implemented method for determining a position of inspection data in design data space and/or substantially accurately determining the position of a design space location on a wafer during an inspection process.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate the circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

The term "design data" as used herein generally refers to the physical design (layout) of an IC and data derived from the physical design through complex simulation or simple geometric and Boolean operations.

A semiconductor device design is verified by different procedures before production of ICs. For example, the semiconductor device design is checked by software simulation to verify that all features will be printed correctly after lithography in manufacturing. Such checking commonly includes steps such as design rule checking (DRC), optical rule checking (ORC), and more sophisticated software based verification approaches that include process simulation calibrated to a specific fab and process. The output of the physical design verification steps can be used to identify a potentially large number of critical points, sometimes referred to as "hot spots," in the design.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Another important part of manufacturing yield control is determining the cause of defects on the wafer or reticle such that the cause of the defects can be corrected to thereby reduce the number of defects on other wafers or reticles. Often, determining the cause of defects involves identifying the defect type and other attributes of the defects such as size, shape, composition, etc. Since inspection typically only involves detecting defects on the wafer or reticle and providing limited information about the defects such as location on the wafer or reticle, number of defects on the wafer or reticle, and sometimes defect size, defect review is often used to determine more information about individual defects than that which can be determined from inspection results. For instance, a defect review tool may be used to revisit defects detected on a wafer or reticle and to examine the defects further in some manner either automatically or manually.

Defect review typically involves generating additional information about defects at a higher resolution using either a high magnification optical system or a scanning electron microscope (SEM). The higher resolution data for the defects generated by defect review is more suitable for determining attributes of the defects such as profile, roughness, more accurate size information, etc. Defect analysis may also be performed using a system such as an electron dispersive x-ray spectroscopy (EDS) system. Such defect analysis may be performed to determine information such as composition of the defects. Attributes of the defects determined by inspection, review, analysis, or some combination thereof can be used to identify the type of the defect (i.e., defect classification) and possibly a root cause of the defects. This information can then be used to monitor and alter one or more parameters of one or more semiconductor fabrication processes to reduce or eliminate the defects.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive. As such, determining which of the defects actually have an effect on the electrical parameters of the devices and the yield may allow process control methods to be focused on those defects while largely ignoring others. Furthermore, at smaller design rules, process induced failures may, in some cases, tend to be systematic. That is, process induced failures tend to fail at predetermined design patterns often repeated many times within the design. Elimination of spatially systematic, electrically relevant defects is important because eliminating such defects can have a significant overall impact on yield. Whether or not defects will affect device parameters and yield often cannot be determined from the inspection, review, and analysis processes described above since these processes may not be able to determine the position of the defect with respect to the electrical design.

Some methods and systems for aligning defect information to the electrical design have been developed. For instance, a SEM review system may be used to determine more accurate coordinates of defect locations for a sample of defects, and the defect coordinates reported by the SEM review system may be used to determine locations of defects in the electrical design. Other methods involve aligning inspection care areas (e.g., the areas of the device pattern formed on the wafer in which inspection will be performed) to the physical location of the pattern printed on the wafer. However, currently, the care areas can be aligned to the pattern printed on the wafer with an accuracy of no better than about 2 µm due to system errors and imperfections. For instance, some bright field (BF) inspection systems have coordinate accuracies of about +/−1 µm. In addition, the inspection care areas in currently used methods are relatively large and include many non-critical features as well as desired critical features. In trying to maximize the sensitivity of the inspection system to capture subtle spatially systematic "design-for-manufacturability" (DFM) defects resulting from design and process interdependencies, the system may be overwhelmed by millions of events in non-critical areas such as CMP fill regions. Detecting such nuisance defects is disadvantageous for a number of reasons. For example, these nuisance events need to be filtered out of the inspection results by post-processing of the inspection data. In addition, nuisance event detection limits the ultimate achievable sensitivity of the inspection system for DFM applications. A high rate of nuisance defect data may also overload the run time data processing capacity of the inspection system thereby reducing throughput and/or causing the loss of data.

Accordingly, it may be advantageous to develop methods and systems for aligning inspection data to design data with sub-pixel accuracy (where the size of the pixel may be on the order of the size of the geometries being inspected) such that substantially highly accurate "context" of the design data can be utilized to perform one or more context-based functions such as, but not limited to, grouping pixels in a defect detection algorithm or method, tailoring detection sensitivity, filtering nuisance defects, classifying defects, grouping defects, and sampling defects for review by using design context as part of the sampling scheme.

SUMMARY OF THE INVENTION

The following description of various embodiments of methods and systems is not to be construed in any way as limiting the subject matter of the appended claims.

One embodiment relates to a computer-implemented method for determining a position of inspection data in design data space. The method includes aligning data acquired by an inspection system for alignment sites on a wafer with data (e.g., design data) for predetermined alignment sites. The data for the predetermined alignment sites and the data acquired by the inspection system for the alignment sites on the wafer are obtained separately. For instance, the data for the predetermined alignment sites is not acquired using the wafer on which the alignment sites are printed. The method also includes determining positions of the alignment sites on the wafer in design data space based on positions of the predetermined alignment sites in the design data space. Determining the positions of the alignment sites on the wafer in design data space may also be performed based on design layout on the wafer and/or the orientation of the wafer during inspection. In addition, the method includes determining a position of inspection data acquired for the wafer by the inspection system in the design data space based on the positions of the alignment sites on the wafer in the design data space. The position of the inspection data may be stored and used as described further herein. In one embodiment, the position of the inspection data is determined with sub-pixel accuracy.

In another embodiment, the data for the predetermined alignment sites includes design data stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files. Although some embodiments are described herein with respect to GDS or GDSII files, it is to be understood that the embodiments are equally applicable to this entire class of files irrespective of data structure configuration, storage format, or storage mechanism. In a different embodiment, the data for the predetermined alignment sites includes one or more simulated images illustrating how the predetermined alignment sites will be printed on the wafer.

In some embodiments, the data for the predetermined alignment sites includes one or more attributes of the predetermined alignment sites, the data for the alignment sites includes one or more attributes of the alignment sites, and the aligning step includes aligning the one or more attributes of the predetermined alignment sites to the one or more attributes of the alignment sites. In one such embodiment, the one or more attributes of the predetermined alignment sites include centroids of the predetermined alignment sites, and the one or more attributes of the alignment sites include centroids of the alignment sites.

In an additional embodiment, the data for the predetermined alignment sites includes data, acquired by the inspection system or other image acquisition system, that has been aligned to design data stored in a data structure such as a GDSII file for the design data. In still another embodiment, the data for the predetermined alignment sites includes at least a portion of a standard reference die image that has been aligned to design coordinates in the design data space. The standard reference die image may be a reference image that has been acquired, simulated, augmented, or any combination thereof.

In some embodiments, the predetermined alignment sites include at least one alignment feature having one or more attributes that are unique in the x and y directions. In other embodiments, the predetermined alignment sites include at least two alignment features. A first of the at least two alignment features has one or more attributes that are unique in the x direction. A second of the at least two alignment features has one or more attributes that are unique in the y direction.

In an additional embodiment, the method includes selecting the predetermined alignment sites using the inspection system. In one such embodiment, an imaging mode of the inspection system (or other image acquisition system) used for selecting the predetermined alignment sites is different than an imaging mode or imaging modes of the inspection system used to acquire the inspection data. In some embodiments, determining the positions of the alignment sites is performed before inspection of the wafer, and determining the position of the inspection data is performed during the inspection of the wafer. In other embodiments, determining the position of the inspection data is performed subsequent to inspection of the wafer. In one such embodiment, determining the position of the inspection data is performed for portions of the inspection data corresponding to defects detected on the wafer and not for portions of the inspection data that do not correspond to the defects. In this manner, the position of the inspection data in design data space may be determined only for inspection data (e.g., patch images) acquired at defective locations on the wafer.

In another embodiment, the data for the alignment sites is within a swath of the inspection data. In one such embodiment, determining the position of the inspection data includes determining the position of the swath in the design data space based on the positions of the alignment sites in the design data space and determining the position of an additional swath of the inspection data in the design data space based on the position of the swath.

In one embodiment, the method includes determining a sensitivity for detecting defects on different portions of the wafer based on the position of the inspection data in the design data space and one or more attributes of design data in the design data space. In one such embodiment, the one or more attributes of the design data are selected based on one or more attributes of previously acquired inspection data for the wafer, other wafers, or some combination thereof for the design data, different design data, or some combination thereof for a process layer for which the inspection data for the wafer was acquired, for different process layers, or some combination thereof. In another such embodiment, the one or more attributes of the design data are selected based on yield criticality of defects previously detected in the different portions, fault probability of the defects previously detected in the different portions, or some combination thereof.

In another embodiment, the method includes determining a sensitivity for detecting defects on different portions of the wafer based on the position of the inspection data in the design data space and a context map, which includes values for one or more attributes of design data across the design data space. In one such embodiment, determining the sensitivity includes determining sensitivity thresholds used with the inspection data to detect the defects on the different portions of the wafer. In another such embodiment, determining the sensitivity is performed by the inspection system during inspection of the wafer. In a further such embodiment, determining the sensitivity is performed after acquisition of the inspection data for the wafer has been completed.

In an additional embodiment, the method includes determining a sensitivity for detecting defects on different portions of the wafer based on the position of the inspection data in the design data space, one or more attributes of design data in the design data space, and one or more attributes of the inspection data. In one such embodiment, the one or more attributes of the inspection data include one or more image noise attributes, if defects were detected in the different portions, or some combination thereof.

In some embodiments, the method includes altering one or more parameters for detecting defects on the wafer based on one or more attributes of schematic data for a design of a device being fabricated on the wafer, one or more attributes of expected electrical behavior of a physical layout for the device, or some combination thereof. In another embodiment, the method includes altering one or more parameters for detecting defects on the wafer using the inspection data based on one or more parameters of an electrical test process to be performed on the wafer. In an additional embodiment, the method includes altering one or more parameters of an electrical test process to be performed on the wafer based on defects detected on the wafer using the inspection data.

In a further embodiment, the method includes periodically altering one or more parameters of an inspection process performed by the inspection system based on results of one or more steps of the method using a feedback control technique. In another embodiment, the method includes automatically altering one or more parameters of an inspection process performed by the inspection system based on results of one or more steps of the method using a feedback control technique. In yet another embodiment, the method includes generating a knowledge base using results of one or more steps of the method and generating an inspection process performed by the inspection system using the knowledge base.

In another embodiment, the method includes classifying defects detected on different portions of the wafer based on the positions of portions of the inspection data corresponding to the defects in the design data space and a context map, which includes values for one or more attributes of design data across the design data space. In one such embodiment, classifying the defects is performed by the inspection system during inspection of the wafer. In another such embodiment, classifying the defects is performed after acquisition of the inspection data for the wafer has been completed.

In another embodiment, the inspection data includes data for a defect or defects on the wafer. In one such embodiment, the method includes determining positions of the defects in the design data space based on the position of the inspection data in the design data space and determining if the defects are nuisance defects based on the positions of the defects in the design data space and one or more attributes of design data in the design data space. In such an embodiment, the method may include determining if the defects not determined to be nuisance defects are systematic or random defects based on the one or more attributes of the design data in the design data space. Determining if the defects are spatially systematic defects or random defects may also be performed based on one or more attributes of the design data in design data space in combination with other information such as historical fab data or other data corresponding to a hot spot in the design data. In such an embodiment, the method may also include determining if the defects are systematic or random defects based on the position of the inspection data in the design data space and one or more statistically determined attributes of the inspection data. In one embodiment, the inspection data is acquired for process window qualification. In another embodiment, the method includes classifying the defect based on the position of the inspection data in the design data space and one or more attributes of design data in the design data space.

In one embodiment, the method includes binning the defects into groups based on the position of the inspection data in the design data space and one or more attributes of design data in the design data space. In some embodiments, the method includes binning the defects into groups based on the position of the inspection data in the design data space, one or more attributes of design data in the design data space, and one or more attributes of reticle inspection data acquired for a reticle on which the design data is printed. In an additional embodiment, the method includes binning the defects into groups based on the position of the inspection data in the design data space, one or more attributes of design data in the design data space, and one or more attributes of the inspection data. In some embodiments, the method includes binning the defects into groups based on the position of the inspection data in the design data space, one or more attributes of design data in the design data space, one or more attributes of the inspection data, and one or more attributes of reticle inspection data acquired for a reticle on which the design data is printed. In a further embodiment, the method includes binning the defects into groups based on the position of the inspection data in the design data space, one or more attributes of design data in the design data space, one or more attributes of the inspection data, and one or more attributes of previously acquired inspection data for the wafer, other wafers, or some combination thereof for the design data, different design data, or some combination thereof for a process layer for which the inspection data for the wafer was acquired, for different process layers, or some combination thereof.

As described above, the inspection data may include data for a defect or defects on the wafer. In one such embodiment, the method includes selecting at least a portion of the defects for review based on the position of the inspection data in the design data space and one or more attributes of design data in the design data space. In a further such embodiment, the method includes determining a sequence in which the defects are to be reviewed based on the position of the inspection data in the design data space and one or more attributes of design data in the design data space. In yet another such embodiment, the method includes selecting at least a portion of the defects for review, and at least the portion of the defects includes at least one defect located within each portion of design data in the design data space having different values of one or more attributes of the design data. Defect review sampling may also or alternatively be performed based on one or more attributes of groups into which the defects are binned. The defects may be binned as described further herein, and the one or more attributes of the groups may be determined based on one or more attributes of the design data or in any other manner described herein.

In another embodiment, the method includes extracting one or more predetermined attributes of output from one or more detectors of the inspection system acquired for different portions of the wafer based on the position of the inspection data in the design data space and one or more attributes of design data in the design data space. In one such embodiment, the one or more attributes of the design data are selected based on one or more attributes of previously acquired inspection data for the wafer, other wafers, or some combination thereof for the design data, different design data, or some combination thereof for a process layer for which the inspection data for the wafer was acquired, for different process layers, or some combination thereof.

In another embodiment, the method includes extracting one or more predetermined attributes of output from one or more detectors of the inspection system acquired for different portions of the wafer based on the position of the inspection data in the design data space, one or more attributes of design data in the design data space, and one or more attributes of the inspection data. In one such embodiment, the one or more attributes of the inspection data include one or more image noise attributes, if one or more defects were detected in the different portions, or some combination thereof.

In some embodiments, the method includes determining a fault probability value for one or more defects detected on the wafer based on the position of the inspection data in the design data space and one or more attributes of design data in the design data space.

In another embodiment, the method includes determining coordinates of positions of defects detected on the wafer in the design data space based on the position of the inspection data in the design data space and translating the coordinates of the positions of the defects to design cell coordinates based on a floor plan for the design data. In one such embodiment, the method includes determining different regions surrounding the defects using an overlay tolerance and performing defect repeater analysis using the different regions for one or more cell types to determine if the one or more cell types are systematically defective cell types and to determine one or more locations of one or more systematically defective geometries within the systematically defective cell types. In one such embodiment, the method includes determining if spatially systematic defects occur in the systematically defective cell types based on one or more attributes of design data for cells, geometries, or some combination thereof located proximate to the systematically defective cell types.

In another embodiment, the method includes determining a position of a defect detected on the wafer in the design data space based on the position of the inspection data in the design data space and determining values for one or more attributes of design data corresponding to the position of the defect using a data structure in which predetermined values for the one or more attributes of the design data are stored as a function of position in the design data space.

In a further embodiment, an image of a reticle generated by a reticle inspection system is used as design data in the design data space. The reticle is used to print the design data on the wafer. In another embodiment, a simulated image illustrating how a reticle image would be printed on the wafer is used as design data in the design data space. In an additional embodiment, the method includes generating a context map for design data in the design data space based on reticle inspection data acquired for a reticle used to print the design data on the wafer.

In one embodiment, the method includes optimizing a wafer inspection process for determining printability of a reticle defect on the wafer using the position of the inspection data in the design data space and a context map. In another embodiment, the method includes detecting defects on the wafer using the inspection data and a standard reference die for standard reference die based inspection. In an additional embodiment, the method includes detecting defects on the wafer using the inspection data, a standard reference die, and a representation of wafer noise associated with the standard reference die in a perturbation matrix for standard reference die based inspection.

In a further embodiment, the wafer and additional wafers are processed using wafer level process parameter modulation, and the method includes detecting defects on the wafer and the additional wafers by comparing inspection data for die on the wafer and the additional wafers to a common standard reference die.

Each of the steps described above may be performed based on the approximate position of the inspection data in the design data space, one or more attributes of design data in the design data space, historical fab data, or other data corresponding to a hot spot in the design data. In some embodiments, the method may include performing statistical process control (SPC) based on the defects, one or more attributes of groups into which the defects were binned, or any other results of any of the method embodiment(s) described herein. Each of the embodiments of the method described above may include any other step(s) of any method(s) described herein. Each of the embodiments of the method described above may be performed by any of the system embodiments described herein.

Another embodiment relates to a system configured to determine a position of inspection data in design data space. The system includes a storage medium that includes design data. The system also includes a processor coupled to the storage medium. The processor is configured to align data acquired by an inspection system for alignment sites on a wafer with data for predetermined alignment sites. The processor is also configured to determine positions of the alignment sites on the wafer in design data space based on positions of the predetermined alignment sites in the design data space. In addition, the processor is configured to determine a position of inspection data acquired for the wafer by the inspection system in the design data space based on the positions of the alignment sites on the wafer in the design data space. This embodiment of the system may be further configured as described herein.

An additional embodiment relates to a system configured to determine a position of inspection data in design data space. This system includes an inspection system configured to acquire data for alignment sites on a wafer and inspection data for the wafer. The system also includes a storage medium that includes design data. In addition, the system includes a processor coupled to the inspection system and the storage medium. The processor is configured to align the data for the alignment sites on the wafer with data for predetermined alignment sites. The processor is also configured to determine positions of the alignment sites on the wafer in design data space based on positions of the predetermined alignment sites in the design data space. In addition, the processor is configured to determine a position of the inspection data in the design data space based on the positions of the alignment sites on the wafer in the design data space. This embodiment of the system may be further configured as described herein.

An additional embodiment relates to a system configured to determine positions of design data-based care areas (e.g., areas to inspect, areas to be inspected with higher sensitivity, or areas to be inspected with lower sensitivity) in inspection space at run time (e.g., during the inspection process). In addition, the system may be configured to substantially accurately assign acquired pixels of data to the correct care area during the inspection process. The size and frequency of such care areas may approach the size and frequency of design geometries on the die. This system may be further configured as described herein.

A further embodiment relates to a computer-implemented method for binning defects detected on a wafer. The method includes comparing portions of design data proximate positions of the defects in design data space. The method also includes determining if the design data in the portions is at least similar based on results of the comparing step. Determining if the design data in the portions is at least similar may include rotating and/or mirroring one or more of the portions. In addition, the method includes binning the defects in groups such that the portions of the design data proximate the positions of the defects in each of the groups are at least similar. The method further includes storing results of the binning step in a storage medium.

In one embodiment, dimensions of the portions are determined based, at least in part, on positions of the defects reported by an inspection system used to detect the defects, coordinate inaccuracy of the inspection system, one or more attributes of the design data, defect size error of the inspection system, or some combination thereof. In another embodiment, dimensions of at least some of the portions are different.

In one embodiment, the design data in the portions includes design data for more than one design layer. In this manner, the design data used in the methods described herein may be design data for one or more layers of the design. Using design data for one or more layers of the design in the methods described herein may be useful in instances such as when the defects are detected using bright field (BF) inspection, which may detect defects on more than one layer, and if the criticality of a location may depend on what happens on previous or following layers of the design. The method described above may include binning some or all defects of interest into groups with at least similar design data.

In another embodiment, the comparing step includes comparing an entirety of the design data in at least some of the portions to the design data in others of the portions. In a different embodiment, the comparing step includes comparing different regions of the design data in at least some of the portions to the design data in others of the portions.

In one embodiment, the method includes determining the positions of the defects in the design data space by comparing data acquired by an inspection system for alignment sites on the wafer with data for predetermined alignment sites. In another embodiment, the method includes determining the positions of the defects in the design data space by comparing data acquired by an inspection system during detection of the defects to locations in the design data determined by review.

It is noted that alignment accuracy depends on both coordinate transformation from design to wafer and coordinate accuracy of the inspection system. Preferably, therefore, the coordinates reported by the inspection system are substantially accurate. In addition, the measurements for alignment sites may be performed using logical inspection coordinates. (Inspection systems output logical wafer coordinates, but defect review tools such as scanning electron microscopes (SEMs) measure physical wafer coordinates. Therefore, the physical coordinates on the wafer may be corrected by the inspection system to account for difference in reticle offset, scaling and slight rotation when compared to the expected wafer layout. As such, these corrections may also be applied to the SEM measurements to reduce errors between the two coordinate systems from reticle to reticle.)

In one embodiment, the binning step includes binning the defects in the groups such that the portions of the design data proximate the positions of the defects in each of the groups are at least similar and such that one or more attributes of the defects in each of the groups are at least similar. In one such embodiment, the one or more attributes include one or more attributes of results of inspection in which the defects were detected, one or more parameters of the inspection, or some combination thereof.

In some embodiments, the portions of the design data proximate the positions of the defects include the design data on which the defects are located. In another embodiment, the portions of the design data proximate the positions of the defects include the design data around the positions of the defects.

In another embodiment, the binning step includes binning the defects in the groups such that the portions of the design data proximate the positions of the defects in each of the groups are at least similar and such that positions of the defects in each of the groups with respect to polygons in the portions are at least similar.

In a further embodiment, the method includes determining a defect criticality index (DCI) for one or more of the defects. In another embodiment, the method includes determining a probability that one or more of the defects will cause one or more electrical faults in a device fabricated for the design data based on one or more attributes of the design data proximate the positions of the defects, one or more attributes of the defects, positions of the defects reported by an inspection system used to detect the defects, coordinate inaccuracy of the inspection system, or some combination thereof. In one such embodiment, the method also includes determining a DCI for the one or more of the defects based on the probability.

In some embodiments, the method includes identifying one or more hot spots in the design data based on results of the binning step. In another embodiment, the method includes selecting at least some of the defects for review based on results of the binning step. In an additional embodiment, the method includes generating a process for sampling the defects for review based on the results of the binning step. In a further embodiment, the method includes altering a process for inspecting the wafer based on the results of the binning step. In some embodiments, the method includes altering a process for inspection of the wafer during the inspection based on results of the inspection. In yet another embodiment, the method includes altering a metrology process for the wafer based on the results of the binning step. In a further embodiment, the method includes altering a sampling plan for a metrology process for the wafer based on the results of the binning step. In still another embodiment, the method includes monitoring systematic defects, potential systematic defects, or some combination thereof over time using the results of the binning step.

In yet another embodiment, the defects were detected by an inspection process, and the method includes reviewing locations on the wafer at which one or more patterns of interest (POIs) in the design data are printed, determining based on results of the reviewing step if defects should have been detected at the locations of the one or more POIs, and altering the inspection process to improve one or more defect capture rates.

In some embodiments, the method includes prioritizing one or more POIs in the design data and optimizing one or more processes to be performed on wafers on which the design data will be printed based on results of the prioritizing step. In another embodiment, the method includes prioritizing one or more POIs in the design data and optimizing at least one of the one or more POIs based on results of the prioritizing step. In an additional embodiment, the method includes prioritizing one or more POIs in the design data and optimizing one or more resolution enhancement technology (RET) features of the one or more POIs based on results of the prioritizing step.

In one embodiment, the defects are detected by optical inspection. In some embodiments, the defects are detected by electron beam inspection. In another embodiment, the defects are detected in a process window qualification (PWQ) method.

In some embodiments, the method includes determining if one or more of the groups of defects correspond to nuisance defects by reviewing at least some of the defects in the one or more of the groups and removing the one or more of the groups corresponding to the nuisance defects from results of an inspection process in which the defects were detected to increase signal-to-noise ratio of the results of the inspection process. In another embodiment, the method includes classifying one or more of the groups of defects based on results of review of at least some of the defects in the one or more of the groups, one or more attributes of design data, one or more attributes of the defects, or some combination thereof. In an additional embodiment, the method includes determining a root cause of one or more of the groups of defects based on results of review of at least some of the defects in the one or more of the groups, one or more attributes of the design data, one or more attributes of the defects, or some combination thereof.

In one embodiment, the method includes determining a root cause of one or more of the groups of defects by mapping at least some of the defects in the one or more of the groups to experimental process window results. In another embodiment, the method includes determining a root cause of one or more of the groups of defects by mapping at least some of the defects in the one or more of the groups to simulated process window results.

In some embodiments, the method includes modeling electrical properties of a device being fabricated using the design data about a defect location and determining parametric relevancy of a defect at the defect location based on results of the modeling step. In another embodiment, the method includes monitoring a kill probability (KP) value of one or more of the defects based on one or more attributes of the design data. In an additional embodiment, the method includes monitoring a KP value for one or more POIs in the design data and assigning the KP value for the one or more POIs to one or more of the groups if the portions of the design data proximate the positions of the defects binned into the one or more of the groups correspond to the one or more POIs.

In some embodiments, one or more of the steps of the methods described herein may be performed by the inspection system (i.e., "on tool") or by a processor physically separate from, but perhaps coupled to the inspection system by a transmission medium (i.e., "off tool"). For instance, in one embodiment, the computer-implemented method is performed by an inspection system used to detect the defects. In an alternative embodiment, the computer-implemented method is performed by a system other than an inspection system used to detect the defects.

In another embodiment, the determining step includes determining if common patterns in the design data in the portions are at least similar. In an additional embodiment, the determining step includes determining if common attributes of the design data in the portions are at least similar. In a further embodiment, the determining step includes determining if common attributes in feature space of the design data in the portions are at least similar.

In one embodiment, the method includes determining a percentage of a die formed on the wafer impacted by one or more of the groups of defects. In another embodiment, the method includes determining one or more POIs in the design data corresponding to at least one of the groups and determining a ratio of number of defects binned in the at least one of the groups corresponding to the one or more POIs to number of locations of the one or more POIs on the wafer. In an additional embodiment, the method includes determining one or more POIs in the design data corresponding to at least one of the groups and determining a ratio of number of the defects binned in the at least one of the groups corresponding to the one or more POIs to number of locations of the one or more POIs in the design data.

In a further embodiment, the method includes determining a POI in the design data corresponding to at least one of the groups, determining a percentage of a die formed on the wafer in which the defects binned in the at least one of the groups are located, and assigning a priority to the POI based on the percentage. In some embodiments, the method includes prioritizing one or more of the groups by number of total design instances on the wafer at which the defects in the one or more of the groups are detected. In another embodiment, the method includes prioritizing one or more of the groups by number of design instances on a reticle, used to print the design data on the wafer, at which the defects in the one or more of the groups are detected at least once. In an additional embodiment, the method includes determining reticle-based marginality for one or more of the groups based on number of locations on a reticle at which defects binned into one or more of the groups were detected and total number of portions of the design data printed on the reticle that are at least similar to the portions of the design data proximate to the positions of the defects binned into the one or more of the groups.

In one embodiment, the method includes converting the portions of the design data proximate the positions of the defects in the design data space to bitmaps prior to the comparing step. In one such embodiment, the comparing step includes comparing the bitmaps to each other.

Each of the embodiments of the method described above may include any other step(s) of any method(s) described herein. In addition, each of the embodiments of the method described above may be performed by any of the systems described herein.

Another embodiment relates to a method for determining a DCI for a defect detected on a wafer. The method includes determining a probability that the defect will alter one or more electrical attributes of a device being fabricated on the wafer based on one or more attributes of design data, for the device, proximate the position of the defect in design data space. The method also includes determining the DCI for the defect based on the probability that the defect will alter the one or more electrical attributes. In addition, the method includes storing the DCI in a storage medium.

In one embodiment, the defect includes a random defect. In another embodiment, the defect includes a systematic defect. In an additional embodiment, the one or more electrical attributes include functionality of the device. In a further embodiment, the one or more electrical attributes include one or more electrical parametrics of the device.

In one embodiment, the one or more attributes of the design data include redundancy, net list, or some combination thereof. In another embodiment, the one or more attributes of the design data include dimensions of features in the design data, density of features in the design data, or some combination thereof.

In one embodiment, determining the probability includes determining the probability using a correlation between electrical test results for the design data and the one or more attributes of the design data. In another embodiment, determining the probability includes determining the probability based on the one or more attributes of the design data in combination with a probability of the position of the defect within the design data space, a position of the defect reported by an inspection system used detect the defect, coordinate inaccuracy of the inspection system, a size of the defect, defect size error of the inspection system, or some combination thereof. In one such embodiment, the defect includes a random defect.

In some embodiments, determining the probability includes determining the probability based on the one or more attributes of the design data in combination with one or more attributes of the defect. In one such embodiment, the defect includes a systematic defect.

In one embodiment, determining the DCI includes determining the DCI for the defect based on the probability in combination with a classification assigned to the defect. In another embodiment, the one or more attributes of the design data include one or more attributes of the design data for more than one design layer for the device.

In one embodiment, the method includes determining the design data proximate the position of the defect by determining a position of inspection data in the design data space. In another embodiment, the method includes determining the design data proximate the position of the defect by defect alignment. In some embodiments, the method includes determining the design data proximate the position of the defect based, at least in part, on a position of the defect reported by an inspection system used to detect the defect, coordinate inaccuracy of the inspection system, one or more attributes of the design data, defect size, defect size error of the inspection system, or some combination thereof.

In one embodiment, the method includes modifying the DCI based on sensitivity of yield of the design data to defects. In another embodiment, the method includes altering a process performed on the defect based on the DCI determined for the defect. In an additional embodiment, the method includes altering a process used to detect the defect based on the DCI determined for the defect. In a further embodiment, the method includes generating a process for inspection of additional wafers on which the device will be fabricated based on the DCI for the defect.

In one embodiment, the computer-implemented method is performed by an inspection system used to detect the defect. In another embodiment, the computer-implemented method is performed by a system other than an inspection system used to detect the defect.

Each of the embodiments of the method described above may include any other step(s) of any method(s) described herein. In addition, each of the embodiments of the method described above may be performed by any of the systems described herein.

Another embodiment relates to a computer-implemented method for determining a memory repair index (MRI) for a memory bank formed on a wafer. The method includes determining a number of redundant rows and a number of redundant columns required to repair the memory bank based on defects located in an array block area of the memory bank. The method also includes comparing the number of the redundant rows required to repair the memory bank to an amount of available redundant rows for the memory bank. In addition, the method includes comparing the number of the redundant columns required to repair the memory bank to an amount of available redundant columns for the memory bank. The method further includes determining the MRI for the memory bank based on results of comparing the number of the redundant rows and comparing the number of the redundant columns. The MRI indicates if the memory bank is repairable. The method also includes storing the MRI in a storage medium.

In one embodiment, the method includes determining which of the defects located in the array block area will cause bits in the memory bank to fail and determining positions of the bits that will fail based on locations of the defects that will cause the bits to fail. In one such embodiment, determining the number of the redundant rows and the number of the redundant columns required to repair the memory bank is performed using the positions of the bits that will fail.

In another embodiment, the method includes altering one or more parameters of an electrical test process based on the MRI using a feed forward control technique. In an additional embodiment, the method includes altering one or more parameters of an electrical test process based on the MRI using a feed forward control technique such that if the memory bank is not repairable, a die in which the memory bank is located is not tested during the electrical test process. In a further embodiment, the method includes altering one or more parameters of a repair process based on one or more attributes of the defects located in the array block area of the memory bank, the MRI, or some combination thereof.

In one embodiment, the defects include defects detected at a gate layer of the memory bank. In another embodiment, the defects include defects detected at a metal layer of the memory bank.

In some embodiments, the method includes predicting bit failure modes of the defects based on locations of the defects in the memory bank. In another embodiment, the method includes determining a DCI for one or more of the defects located in the array block area. In one such embodiment, determining the number of the redundant rows and the number of the redundant columns required to repair the memory bank is performed using the DCIs for the one or more of the defects.

In one embodiment, comparing the number of the redundant rows is performed separately for each bank of a memory die, and comparing the number of the redundant columns is performed separately for each bank of the memory die. In some embodiments, the method includes determining the amount of the available redundant rows and the amount of the available redundant columns based on defects located in the redundant rows and the redundant columns of the memory bank.

In one embodiment, the method includes determining the MRI for more than one memory bank formed in a die and predicting a repair yield for the die based on the MRIs for the more than one memory bank. In another embodiment, the method includes determining, based on the MRI, if the amount of the available redundant columns, the amount of the available redundant rows, or some combination thereof in the memory bank should be evaluated by a designer of the memory bank.

In some embodiments, the method includes determining the MRI for each memory bank in one or more dies on the wafer and determining a memory repair yield for the one or more dies based on the MRIs for each memory bank. In some such embodiments, the method includes performing wafer disposition based on the one or more memory repair yields for the one or more dies on the wafer.

In one embodiment, comparing the number of the redundant rows includes determining a fraction of the redundant rows needed to repair the memory bank, comparing the number of the redundant columns includes determining a fraction of the redundant columns needed to repair the memory bank, and determining the MRI for the memory bank includes determining the MRI based on the fraction of the redundant rows and the fraction of the redundant columns. In some such embodiments, the method includes determining the MRI for each memory bank in one or more dies on the wafer and determining a memory repair yield for the one or more dies based on the MRIs for each memory bank. In additional such embodiments, the method includes determining a memory repair yield for the wafer based on the memory repair yields for each of the one or more dies.

In one embodiment, the MRI also indicates a probability that the memory repair bank will not be repairable. In one such embodiment, the method includes determining the MRI for each memory bank in one or more dies on the wafer and determining a MRI for the one or more dies based on the MRI for each of the memory banks in the one or more dies, and the MRIs for the one or more dies indicate a probability that the one or more dies will not be repairable. In one such embodiment, the method includes determining a wafer based yield prediction based on thresholding of the MRIs for the one or more dies on the wafer.

In one embodiment, the method includes determining a number of non-repairable defects in the memory bank based on a number of defects located in a decoder area of the memory bank, a number of defects located in a sense amp area of the memory bank, or some combination thereof.

In some embodiments, determining the number of the redundant rows and the number of the redundant columns includes determining a DCI for each of the defects located in the array block area of the memory bank, comparing the DCIs to a predetermined threshold, and determining the number of the redundant rows and the number of the redundant columns required to repair all of the defects having a DCI above the predetermined threshold.

In one embodiment, the method includes determining a MRI for failure of the memory bank due to the defects located in the array block area of the memory bank. In another embodiment, the method includes determining a MRI for failure of the memory bank due to defects located in the redundant rows and the redundant columns of the memory bank.

In some embodiments, the method includes generating a stacked map of like memory bank designs illustrating spatial correlations between defects detected in the memory banks. In another embodiment, the method includes determining the MRI on a die basis. In an additional embodiment, the method includes determining an index indicating if a die on the wafer will fail due to the defects located in the array block area.

In one embodiment, the method includes determining the MRI for memory banks in a die on the wafer and generating a stacked map of the die illustrating spatial correlations between two or more of the memory banks indicated by the MRIs to not be repairable. In another embodiment, the method includes determining the MRI for memory banks in a die on the wafer and generating a stacked map of a reticle used to form the memory banks on the wafer illustrating spatial correlations between two or more of the memory banks indicated by the MRIs to not be repairable.

In some embodiments, the method includes identifying memory banks of a die impacted by defects detected in the die and ranking the memory banks based on the impact of the defects on the memory banks. In another embodiment, the method includes determining a percentage of memory banks formed on the wafer impacted by defects in non-repairable areas of the memory banks. In an additional embodiment, the method includes generating a stacked wafer map of probable failures in memory banks formed on the wafer illustrating spatial correlations between the probable failures. In a further embodiment, the method includes determining the MRI for more than one die formed on the wafer and ranking the more than one die based on the MRIs.

Each of the embodiments of the method described above may include any other step(s) of any method(s) described herein. In addition, each of the embodiments of the method described above may be performed by any of the systems described herein.

Another embodiment relates to a different computer-implemented method for binning defects detected on a wafer. The method includes comparing positions of the defects in design data space with positions of hot spots in design data. Hot spots located proximate to design data that is at least similar are correlated with each other. The method also includes associating the defects and the hot spots having positions that are at least similar. In addition, the method includes binning the defects in groups such that the defects in each of the groups are associated with only hot spots that are correlated with each other. The method further includes storing results of the binning step in a storage medium.

In one embodiment, the method includes correlating the hot spots by identifying a location of a POI in the design data associated with a systematic defect, correlating the POI with similar patterns in the design data, and correlating the location of the POI and locations of the similar patterns in the design data as positions of correlated hot spots.

In some embodiments, the method includes assigning a DBC to one or more of the groups. In another embodiment, the computer-implemented method is performed by an inspection system used to detect the defects on the wafer. In a further embodiment, the method includes monitoring the hot spots using results of inspection of one or more wafers on which the design data is printed.

In one embodiment, the method includes inspecting the wafer based on correlations between the hot spots. In another embodiment, the method includes monitoring systematic defects, potential systematic defects, or some combination thereof over time using the results of the binning step. In an additional embodiment, the method includes performing review of the defects based on the results of the binning step. In a further embodiment, the method includes generating a process for selecting the defects for review based on the results of the binning step.

In one embodiment, the method includes identifying systematic defects and potential systematic defects in the design data based on the results of the binning step and monitoring occurrence of the systematic defects and the potential systematic defects over time. In another embodiment, the method includes generating a process for inspecting wafers on which the design data has been printed based on the results of the binning step. In an additional embodiment, the method includes altering a process for inspecting wafers on which the design data has been printed based on the results of the binning step.

In some embodiments, the method includes determining a percentage of a die formed on the wafer impacted by one or more of the groups of defects. In another embodiment, the method includes determining a DCI for one or more of the defects. In an additional embodiment, the method includes determining a percentage of a die formed on the wafer in which the defects binned in at least one of the groups are located and assigning a priority to the at least one of the groups based on the percentage.

In one embodiment, the method includes prioritizing one or more of the groups by number of total hot spots correlated with the hot spots associated with the defects in the one or more of the groups and number of the defects in the one or more of the groups. In another embodiment, the method includes prioritizing one or more of the groups by number of corresponding hot spot locations on a reticle used to print the design data on the wafer at which the defects in the one or more of the groups are detected at least once.

In some embodiments, the method includes determining reticle-based marginality for one or more of the groups based on number of locations on a reticle at which defects binned into the one or more of the groups were detected and total number of hot spot locations on the reticle that are correlated with the hot spots associated with the defects in the one or more of the groups.

Each of the embodiments of the method described above may include any other step(s) of any method(s) described herein. In addition, each of the embodiments of the method described above may be performed by any of the systems described herein.

Another embodiment relates to a different computer-implemented method for binning defects detected on a wafer. The method includes comparing one or more attributes of design data proximate positions of the defects in design data space. The method also includes determining if the one or more attributes of the design data proximate the positions of the defects are at least similar based on results of the comparing step. In addition, the method includes binning the defects in groups such that the one or more attributes of the design data proximate the positions of the defects in each of the groups are at least similar. The method further includes storing results of the binning step in a storage medium.

In one embodiment, the one or more attributes include pattern density. In another embodiment, the method includes determining if the defects are random or systematic defects using the one or more attributes. In an additional embodiment, the method includes ranking one or more of the groups using the one or more attributes. In a further embodiment, the method includes ranking the defects in at least one of the groups using the one or more attributes. In some embodiments, the one or more attributes include the one or more attributes in feature space.

In one embodiment, the method includes binning the defects within at least one of the groups into sub-groups using the one or more attributes. In another embodiment, the method includes analyzing the defects within at least one of the groups using the one or more attributes. In an additional embodiment, the method includes determining a yield relevancy of one or more of the defects using the one or more attributes. In a further embodiment, the method includes determining overall yield relevancy of one or more of the groups using the one or more attributes. In yet another embodiment, the method includes assigning a DCI to one or more of the defects using the one or more attributes.

In some embodiments, the method includes separating the design data proximate the positions of the defects into the design data in an area around the defects and the design data in an area on which the defects are located. In another embodiment, the method includes identifying structures in the design data for binning or filtering using rules and the one or more attributes.

In one embodiment, the method includes determining locations on the wafer at which review, measurement, test, or some combination thereof is to be performed based on inspection results generated during detection of the defects and based on the defects identified as systematic defects. In another embodiment, the method includes determining locations on the wafer at which review, measurement, test, or some combination thereof is to be performed based on inspection results generated during detection of the defects, the defects identified as systematic defects, and yield relevancy of the defects. In an additional embodiment, the method includes determining locations on the wafer at which review, measurement, test, or some combination thereof is to be performed based on inspection results generated during detection of the defects, the defects identified as systematic defects, and process window mapping.

In one embodiment, the method includes performing systematic discovery using the results of the binning step and user-assisted review. In another embodiment, the method includes prior to the comparing step, separating the defects based on functional blocks in which the defects are located to improve signal-to-noise in the results of the binning step.

In some embodiments, the design data is organized by design into hierarchical cells, and the method includes prior to the comparing step, separating the defects based on the hierarchical cells in which the defects are located to improve signal-to-noise in the results of the binning step. In another embodiment, the design data is organized by design into hierarchical cells, and if a defect could be located in more than one of the hierarchical cells, the method includes correlating the defect to each of the hierarchical cells based on a probability that the defect is located in each of the hierarchical cells based on area of the hierarchical cells, defect positional probability, or some combination thereof.

In one embodiment, the defects were detected by an inspection process, and the method includes reviewing locations on the wafer at which one or more POIs in the design data are printed, determining based on results of the reviewing step if defects should have been detected at the locations of the one or more POIs, and altering the inspection process to improve one or more defect capture rates.

Each of the embodiments of the method described above may include any other step(s) of any method(s) described herein. In addition, each of the embodiments of the method described above may be performed by any of the systems described herein.

Another embodiment relates to a computer-implemented method for assigning classifications to defects detected on a wafer. The method includes comparing portions of design data proximate positions of the defects in design data space with design data (e.g., POI design examples) corresponding to different DBCs (e.g., different DBC bin definitions). The design data corresponding to the different DBCs and the different DBCs are stored in a data structure. The method also includes determining if the design data in the portions is at least similar to the design data corresponding to the different DBCs based on results of the comparing step. In addition, the method includes assigning to the defects the DBCs corresponding to the design data that is at least similar to the design data in the portions. The method further includes storing results of the assigning step in a storage medium.

In one embodiment, the computer-implemented method is performed by an inspection system used to detect the defects. In another embodiment, the computer-implemented method is performed by a system other than an inspection system used to detect the defects.

In one embodiment, the method includes monitoring hot spots in the design data based on the results of the assigning step. In another embodiment, the design data corresponding to the different DBCs is identified by grouping defects detected on one or more other wafers based on portions of the design data proximate positions of the defects detected on the one or more other wafers in the design data space.

In some embodiments, the defects were detected in an inspection process, and the method includes reviewing locations on the wafer at which one or more POIs in the design data are printed, determining based on results of the reviewing step if defects should have been detected at the locations of the one or more POIs, and altering the inspection process to improve one or more defect capture rates.

In one embodiment, the method includes determining if the defects are nuisance defects based on the DBCs assigned to the defects and removing the nuisance defects from results of an inspection process in which the defects were detected to increase signal-to-noise ratio of the results of the inspection process.

In another embodiment, the method includes determining a KP value for one or more of the defects. In an additional embodiment, the method includes determining if the DBCs assigned to the defects correspond to systematic defects that are visible to a review system and sampling the defects for review by selecting only the defects that are visible to the review system for the review. In a further embodiment, the method includes determining one or more POIs in the design data by identifying one or more features in the design data indicative of a pattern dependent defect.

In one embodiment, the DBCs identify one or more polygons in the design data on which the defects are located or located near the defects. In another embodiment, the DBCs identify locations of the defects in one or more polygons in the design data. In an additional embodiment, the data structure includes a library containing examples of the design data (e.g. POI design examples for DBC bin definitions) organized by technology, process, or some combination thereof.

In some embodiments, the method includes separating the design data proximate the positions of the defects into the design data in areas around the defects and the design data in areas on which the defects are located. In another embodiment, the method includes monitoring systematic defects, potential systematic defects, or some combination thereof over time using the results of the assigning step. In an additional embodiment, the method includes determining a KP value for one or more of the DBCs based on one or more attributes of the design data corresponding to the DBCs. The KP value may also be determined based on the one or more attributes of the design data and electrical test data corresponding to the DBCs. In a further embodiment, the method includes determining a KP value for one or more of the defects based on one or more attributes of the design data corresponding to the DBCs assigned to the one or more of the defects. In yet another embodiment, the method includes monitoring KP values for one or more of the DBCs and assigning to the defects the KP values for the DBCs assigned to the defects.

In one embodiment, dimensions of at least some of the portions are different. In another embodiment, the design data in the portions includes design data for more than one design layer. In another embodiment, the method includes determining the positions of the defects in the design data space by comparing data acquired by an inspection system for alignment sites on the wafer with data for predetermined alignment sites. In an additional embodiment, the method includes determining the positions of the defects in the design data space by comparing data acquired by an inspection system during detection of the defects to locations in the design data determined by review.

In one embodiment, the assigning step includes assigning to the defects the DBCs corresponding to the design data that is at least similar to the design data in the portions and that has one or more attributes that are at least similar to one or more attributes of the design data in the portions. In one such embodiment, the one or more attributes include one or more attributes of an inspection in which the defects were detected, one or more parameters of the inspection, or some combination thereof.

In one embodiment, the design data proximate the positions of the defects include the design data on which the defects are located. In another embodiment, the design data proximate the positions of the defects includes the design data around the positions of the defects. In an additional embodiment, the method includes binning the defects assigned one or more of the DBCs in groups such that the positions of the defects in each of the groups with respect to polygons in the portions of the design data proximate the positions of the defects are at least similar.

In one embodiment, the method includes selecting at least some of the defects for review based on the results of the assigning step. In another embodiment, the method includes generating a process for sampling the defects for review based on the results of the assigning step. In an additional embodiment, the method includes altering a process for inspecting the wafer based on the results of the assigning step. In some embodiments, the method includes altering a process for inspection of the wafer during the inspection based on results of the inspection. In a further embodiment, the method includes altering a metrology process for the wafer based on the results of the assigning step. In yet another embodiment, the method includes altering a sampling plan for a metrology process for the wafer based on the results of the assigning step. In addition, the method may include determining locations on the wafer at which measurement, test, review, or some combination thereof is to be performed at run time based on results of the assigning step.

In another embodiment, the method includes prioritizing one or more of the DBCs and optimizing one or more processes to be performed on wafers on which the design data will be printed based on results of the prioritizing step.

In one embodiment, the method includes determining a root cause of the defects based on the DBCs assigned to the defects. In another embodiment, the method includes determining a root cause of at least some of the defects by mapping the at least some of the defects to experimental process window results. In an additional embodiment, the method includes determining a root cause of at least some of the defects by mapping the at least some of the defects to simulated process window results. In a further embodiment, the method includes determining a root cause corresponding to one or more of the DBCs and assigning a root cause to the defects based on the root cause corresponding to the DBCs assigned to the defects.

In one embodiment, the method includes determining a percentage of a die formed on the wafer impacted by the defects to which one or more of the DBCs are assigned. In another embodiment, the method includes determining a POI in the design data corresponding to at least one of the DBCs and determining a ratio of number of the defects to which the at least one of the DBCs have been assigned to number of locations of the POI on the wafer.

In some embodiments, the method includes determining one or more POIs in the design data corresponding to at least one of the DBCs and determining a ratio of number of the defects to which the at least one of the DBCs have been assigned to number of locations of the one or more POIs in the design data. In another embodiment, the method includes determining a POT in the design data corresponding to at least one of the DBCs, determining a percentage of a die formed on the wafer in which the defects to which the at least one of the DBCs have been assigned are located, and assigning a priority to the POT based on the percentage.

In one embodiment, the method includes prioritizing one or more of the DBCs by number of total design instances (e.g., of a POI design example from the DBC bin definitions) on the wafer (e.g., on the inspected region of the wafer) at which the defects to which the one or more of the DBCs have been assigned are detected. In another embodiment, the method includes prioritizing one or more of the DBCs by number of design instances on a reticle (e.g., on inspected regions of the reticle), used to print the design data on the wafer, at which the defects to which the one or more of the DBCs have been assigned are detected at least once.

In another embodiment, the method includes determining reticle-based marginality for one or more of the DBCs based on number of locations on a reticle (e.g., on inspection regions of the reticle) at which the defects to which the one or more of the DBCs have been assigned were detected and total number of portions of the design data (e.g. POI design examples from the DBC bin definitions) printed on the reticle that are similar to the portions of the design data proximate the positions of the defects to which the one or more of the DBCs have been assigned.

In some embodiments, the method includes converting the portions of the design data proximate the positions of the defects to first bitmaps prior to the comparing step and converting the design data corresponding to the DBCs to second bitmaps prior to the comparing step. In one such embodiment, the comparing step includes comparing the first bitmaps with the second bitmaps.

Each of the embodiments of the method described above may include any other step(s) of any method(s) described herein. In addition, each of the embodiments of the method described above may be performed by any of the systems described herein.

A further embodiment relates to a method for altering an inspection process for wafers. The method includes reviewing locations on the wafer at which one or more POIs in the design data are printed. The method also includes determining based on results of the reviewing step if defects should have been detected at the locations of the one or more POIs. In addition, the method includes altering the inspection process to improve one or more defect capture rates for defects located in at least some of the one or more POIs.

In one embodiment, the altering step includes altering an optics mode of an inspection system used to perform the inspection process. In another embodiment, the altering step includes determining an optics mode of an inspection system used to perform the inspection process based on results of the determining step. In an additional embodiment, the altering step includes altering the inspection process to suppress noise in results of the inspection process. In a further embodiment, the altering step includes altering the inspection process to reduce detection of defects not of interest. In yet another embodiment, the altering step includes altering an algorithm used in the inspection process. In still another embodiment, the altering step includes altering one or more parameters of an algorithm used in the inspection process.

Each of the embodiments of the method described above may include any other step(s) of any method(s) described herein. In addition, each of the embodiments of the method described above may be performed by any of the systems described herein.

An additional embodiment relates to a system configured to display and analyze design and defect data. The system includes a user interface configured for displaying a design layout for a semiconductor device, inline inspection data acquired for a wafer on which at least a portion of the semiconductor device is formed, and electrical test data acquired for the wafer. The user interface may also be configured for displaying modeled data for the semiconductor device and/or failure analysis data for the wafer. The system also includes a processor configured for analyzing one or more of the design layout, the inline inspection data, and the electrical test data upon receiving an instruction to perform the analyzing from a user via the user interface. The processor may also be configured for analyzing the modeled data and/or the failure analysis data as described above.

In one embodiment, the electrical test data includes logic bitmap data. In another embodiment, the user interface is configured for displaying overlay of at least two of the design layout, the inline inspection data, and the electrical test data, possibly in combination with any other data described herein. In one such embodiment, the electrical test data includes logic bitmap data. In some embodiments, the processor is configured for determining defect density in design data space upon receiving an instruction to perform determining the defect density from the user via the user interface. In an additional embodiment, the processor is configured to perform defect sampling for review upon receiving an instruction to perform the defect sampling from the user via the user interface. In a further embodiment, the processor is configured for grouping defects based on similarity of the design layout proximate to positions of the defects in design data space upon receiving an instruction to perform the grouping from the user via the user interface. Each of the embodiments of the system described above may be further configured as described herein.

A further embodiment relates to a computer-implemented method for determining a root cause of electrical defects detected on a wafer. The method includes determining positions of the electrical defects in design data space. The method also includes determining if the positions of a portion of the electrical defects define a spatial signature corresponding to one or more process conditions. In addition, if the positions of the portion of the electrical defects define a spatial signature that corresponds to the one or more process conditions, the method includes identifying the root cause of the portion of the electrical defects as the one or more process conditions. In this manner, the method may include performing spatial signature analysis on electrical test results. The method further includes storing results of the identifying step in a storage medium. The embodiment of the method described above may include any other step(s) described herein. The embodiment of the method described above may be performed by any of the system embodiments described herein.

Yet another embodiment relates to a computer-implemented method for selecting defects detected on a wafer for review. The method includes identifying one or more zones on the wafer. The one or more zones are associated with positions of one or more defect types (e.g., possible systematic defects) on the wafer. The method also includes selecting defects detected in only the one or more zones for review. In addition, the method includes storing results of the selecting step in a storage medium. This embodiment of the method may include any other step(s) described herein. This embodiment of the method may be performed by any of the system embodiments described herein.

There are multiple review use cases in which the method described above may be used. For example, the method described above may be used for systematic defect verification from a list of potentially systematic defects, which may be performed during the discovery phase or during maintenance in the monitoring phase. In addition, the method described above may be used for systematic defect capture by reviewing known hot spots or locations with local patterns (i.e., local design data) that are similar to known hot spots (which may be identified by arbitrary pattern searching, which may be performed during the discovery phase or during recipe setup). The method may also be used for verification or classification of defects detected on or near hot spots, which may be performed during the monitoring phase.

The zonal information described above may be used not only to sample defects from a particular zone, but also to sample defects in some intelligent manner from all zones of the wafer and/or to correlate critical areas extracted from the design to particular zones of the wafer in which there is a higher probability of finding or locating particular types of these design-determined critical areas. Critical areas extracted from the design data may be for a single device, but the probability of finding real inspection defects due to these critical areas may be more pronounced in certain wafer zones than other zones. In this manner, the method may include extrapolating defect information from the die to the wafer using the zonal analysis described above. This embodiment of the method may include any other step(s) described herein.

Still another embodiment relates to a computer-implemented method for evaluating one or more yield related processes for design data. The method includes identifying potential failures in the design data using rule checking, a model, or any other appropriate step or method described herein. The method also includes determining one or more attributes of the potential failures. In addition, the method includes determining if the potential failures are detectable based on the one or more attributes. The method further includes determining which of a plurality of different inspection systems is most suitable for detecting the potential failures based on the one or more attributes. Furthermore, the method includes storing results of determining which of the plurality of different inspection systems is most suitable for detecting the potential failures in a storage medium.

In one embodiment, the method includes selecting one or more parameters of the inspection system determined to be most suitable. The parameters are selected based on the one or more attributes. In this manner, the best inspection system type may be estimated or selected based on the attribute(s) of the defects of interest. In another embodiment, the method includes determining an impact of the potential failures on yield of devices fabricated with the design data. Each of the embodiments of the method described above may include any other step(s) described of any method(s) described herein. In addition, each of the embodiments of the method described above may be performed by any of the system embodiments described herein.

Further embodiments relate to a carrier medium that includes program instructions executable on a processor to perform any computer-implemented method(s) or method(s) described herein. Additional embodiments relate to a system configured to perform any computer-implemented method(s) or method(s) described herein. The system may include a processor configured to execute program instructions for performing one or more of the computer-implemented methods or methods described herein. In one embodiment, the system may be a stand-alone system. In another embodiment, the system may be part of or coupled to an inspection system such as a wafer inspection system. In a different embodiment, the system may be part of or coupled to a defect review system. In yet another embodiment, the system may be coupled to a fab database. The system may be coupled to an inspection system, a review system, and/or a fab database by a transmission medium such as a wire, a cable, a wireless transmission path, and/or a network. The transmission medium may include "wired" and "wireless" portions.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIG. 20 is a schematic diagram illustrating one embodiment of input to and output from a module configured to perform a computer-implemented method for binning defects detected on a wafer according to the embodiments described herein;

FIGS. 21-22 are schematic diagrams illustrating different embodiments of output of the module of FIG. 20;

Figure 1:
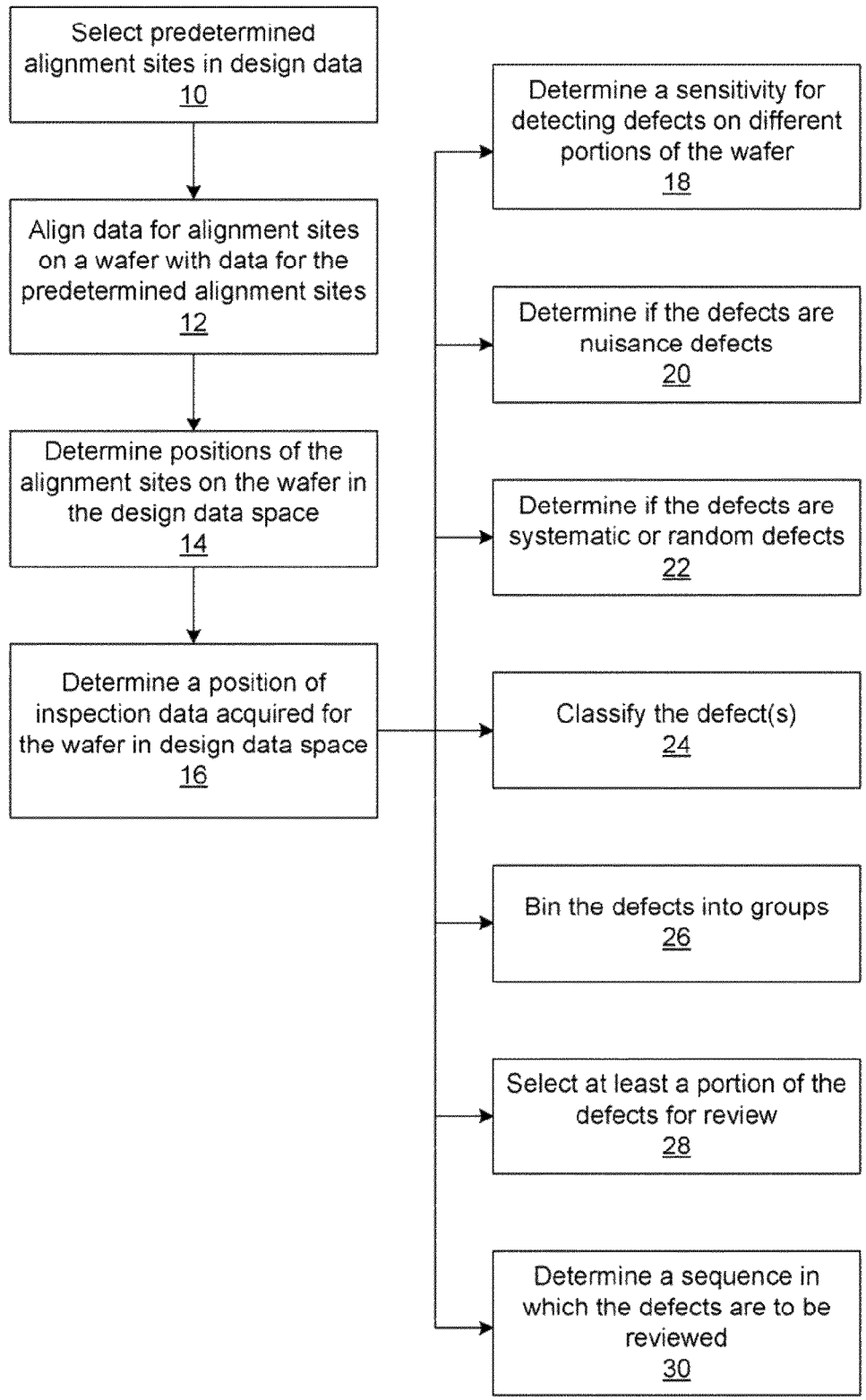
FIG. 1 is a flow chart illustrating one embodiment of a computer-implemented method for determining a position of inspection data in design data space.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as integrated circuits (ICs) may be formed on a wafer, and the term wafer as used herein is intended to encompass a wafer on which any type of device known in the art is being fabricated.

Although embodiments are described herein with respect to wafers, it is to be understood that the embodiments may be used for another specimen such as a reticle, which may also be commonly referred to as a mask or a photomask. Many different types of reticles are known in the art, and the terms "reticle," "mask," and "photomask" as used herein are intended to encompass all types of reticles known in the art.

The term "design data" as used herein generally refers to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design data. Such a reticle image or a derivative thereof can serve as a substitute for the design layout in any embodiments described herein that use design data.

For example, in one embodiment, an image of a reticle generated by a reticle inspection system is used as design data in the design data space. The reticle is used to print the design data on the wafer. In this manner, an image of a reticle generated by a reticle inspection system may be used as a substitute for design data. The image of the reticle used in this embodiment may include any suitable image of the reticle generated in any suitable manner by any reticle inspection system known in the art. For example, the image of the reticle may be a high magnification optical or electron beam image of the reticle acquired by a high magnification optical reticle inspection system or an electron beam based reticle inspection system, respectively. Alternatively, the image of the reticle may be an aerial image of the reticle acquired by an aerial imaging reticle inspection system. The image of the reticle may be used as a proxy for the design data in any of the embodiments described herein that use design data to perform one or more steps.

In an additional embodiment, the method includes generating a context map for design data in the design data space based on reticle inspection data acquired for a reticle used to print the design data on the wafer. In this manner, reticle inspection data may be included as input to the generation of a context map. The context map may be configured as described further herein (e.g., the context map may include values for one or more attributes of the design data across design data space). The reticle inspection data used to generate the context map may include any suitable reticle inspection data known in the art such as one or more of the reticle images described above. In this embodiment, therefore, the reticle inspection data may be used to determine values for one or more attributes of design data printed on the reticle across the reticle, and these values may be mapped to design data space to generate the context map. Determining the values for the one or more attributes of the design data printed on the reticle may be performed as described herein or in any other suitable manner. The one or more attributes of the design data may include any of the attribute(s) described herein. Mapping the values for the one or more attributes from reticle space to design data space may be performed as described further herein. Such a context map may be used in any of the embodiments described herein that include using a context map to perform one or more steps. In addition, such a context map may be further generated as described herein and/or based on any other information described herein.

Images derived from a reticle image can also serve as a "proxy" for the design data. For example, a reticle image generated by a reticle inspection system or any other suitable imaging system can be used to generate a simulated image illustrating how the reticle image would be printed on a wafer, which can be used as a "proxy" for the design data. In one embodiment, a simulated image illustrating how a reticle image would be printed on the wafer is used as design data in the design data space. In this manner, a simulation of how a reticle image would appear on the wafer surface can also serve as a substitute for the design data. The simulated image may be generated in any manner using any suitable method or system known in the art. The simulated image may be used as a proxy for the design data in any of the embodiments described herein that use design data to perform one or more steps.

In embodiments described herein in which design data is used, at least in part, to perform one or more steps, the design data may include any of the design data or design data proxies described above or any combination thereof.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

FIG. 1 illustrates one embodiment of a computer-implemented method for determining a position of inspection data in design data space. It is noted that all of the steps shown in FIG. 1 are not essential to practice of the method. One or more steps may be omitted from or added to the method illustrated in FIG. 1, and the method can still be practiced within the scope of this embodiment.

In general, the method may include a data preparation phase, a recipe setup phase (e.g., wafer inspection recipe setup), and the wafer inspection phase itself. The method may also include review and analysis phases. The data preparation phase may include creating or acquiring design data reflecting the physical design layout of a device being fabricated on a wafer or to be fabricated on the wafer (e.g., information obtained from a data structure such as a graphical data stream (GDS) file, GDSII file, or another standard file or database). The information from the GDS file, other file, or database may describe the physical design layout pre-decoration (i.e., without optical proximity correction (OPC) features and any other resolution enhancement technology (RET) features added to the design).

The method shown in FIG. 1 generally includes aligning an inspection data stream to the design data to within sub-pixel accuracy as described further herein. In this manner, the methods described herein may be generally referred to as "align to design" methods for inspection (e.g., wafer inspection). The method utilizes design data and optionally context data for wafer inspection. In this manner, the methods described herein may also be referred to as "context based inspection" (CBI) methods. The device design data and context data may be used to increase wafer inspection sensitivity, dramatically reduce nuisance event detection, increase the precision of classifying defects, and enhance applications for inspection systems such as process window qualification (PWQ). Context data can also be used to provide advantages for defect review processes and systems as described further herein. In addition, examples of methods that use design data and context data are illustrated in U.S. Pat. No. 6,886,153 to Bevis and U.S. patent application Ser. No. 10/883,372 filed Jul. 1, 2004 published on Jan. 6, 2005 as U.S. Patent Application Publication No. 2005/0004774 by Volk et al., which are incorporated by reference as if fully set forth herein. The methods described herein may include any step(s) of any of the method(s) described in this patent and patent application.

The methods described herein may include a hot spot discovery phase. Hot spot discovery may be performed during technology research and development, product design, RET design, reticle design and manufacturing, and product ramp. The hot spot discovery phase may include identifying hot spots for reticle design improvement and defect monitoring and classification. The hot spot discovery phase may also include generating a data structure containing information about the hot spots such as a hot spot database. In some embodiments, hot spot discovery may be performed using multiple sources. For instance, hot spot discovery may be performed using a correlation between any of design space hot spot discovery, wafer space hot spot discovery, reticle space hot spot discovery, test space hot spot discovery, and process space hot spot discovery. In one such example, discovery of hot spots may be performed by correlating multiple sources of input from design, modeling results, inspection results, metrology results, and test and failure analysis (FA) results. Any of the steps described herein may be used in any combination to discover hot spots.

In design space, the hot spots may be identified using results of design rule checking (DRC) to produce a list of critical points in the design data. DRC is commonly performed for quality control (QC) of reticle layout data prior to mask manufacturing (pre-mask). Thus, DRC may not produce hot spots. Instead, the results of DRC may be used to identify new marginal hot spots that were either in the design manual but not part of DRC rules or are newly discovered. In addition, the hot spots may be discovered using electronic design automation (EDA). In this manner, during the hot spot discovery phase, design rules (DRC used as a marginality checker) and/or EDA design tools may be used as sources of hot spots. Furthermore, the hot spots may be discovered using technology for computer-aided design (TCAD) tools and proxies. TCAD tools are commercially available from Synopsis, Inc., Mountain View, Calif. In addition, or alternatively, DesignScan analysis software that is commercially available from KLA-Tencor, San Jose, Calif., arbitrary pattern searching, and design context (e.g., functional block, design library element, cell, whether a pattern is redundant or not, pattern density, dummy/fill versus active, etc.) may be used as a source of hot spots. In another example, design data based grouping of defects (with or without pareto analysis) may be used to discover and group hot spots, which may be performed as described herein.

In an additional example, in design space, the hot spot discovery phase may include aligning or overlaying scanning electron microscope (SEM) images, of design data printed on a wafer, to design data (which may be performed as described herein) to identify an actual defect position in design data space, and arbitrary pattern searching based on the design data proximate to the position of the defect in design data space may be performed to identify similar possible hot spots in the design. Repeater analysis performed on original inspection results for the wafer may then be used to identify systematic defects and their design groups in the design data, which may be performed as described further herein. One advantage of this approach is that if a target defect is substantially accurately positioned in the design data space, the pattern search window used for arbitrary pattern searching and/or systematic defect identification may be adjusted defect by defect.

In wafer space, hot spots may be discovered using one or more of repeater analysis, zonal/spatial signature analysis of systematic (e.g., process marginal) defects, temporal signature analysis of systematic defects, stacked die (or reticle) results with design overlay to enhance the signal-to-noise ratio (S/N) for discovery in the reticle/die space, and yield (or kill probability (KP)) correlated to defect space as an attribute of defects for prioritizing systematic defects or groups of systematic defects, each of which may be performed as described further herein.

In reticle/die space, hot spots may be discovered using one or more of repeater analysis, defect density mapping, design pattern-based grouping analysis, filtering by design context (e.g., functional blocks) to improve S/N, identifying defects not of interest from reticle inspection to discover cold spots in the design, each of which may be performed as described further herein.

In test space, hot spots may be discovered using one or more of memory bit failure to design mapping and logic bitmap density to design mapping, both of which may be combined with repeater analysis (performed in wafer space) or design data based grouping (performed in reticle/die space) to identify defects not of interest (or cold spots in the design). Each of these steps may be performed as described further herein.

In process space, hot spots may be discovered using PWQ as a source of hot spots (using die-to-die, standard reference die, or die-to-database methods) and design of experiments (DOE) of processes to determine process window and critical design features as hot spots (using die-to-die, standard reference die, or die-to-database methods), each of which may be performed as described further herein.

In some embodiments, as shown in step 10 of FIG. 1, the method includes selecting predetermined alignment sites in design data. Selecting the predetermined alignment sites may be performed using an inspection system. The predetermined alignment sites may be selected during setup of an inspection process recipe. A "recipe" may be generally defined as a set of instructions for carrying out a process such as inspection. Setting up a recipe for wafer inspection as described herein may be performed automatically, semi-automatically (e.g., user-assisted), or manually.

In one example, during setup of an inspection process performed by an inspection system, information about parameters of the inspection system such as wafer swathing information, inspection system model number, optical mode(s) to be used for inspection, and pixel size, in addition to the design data may be used to select the predetermined alignment sites. The predetermined alignment sites may also be selected based on one or more attributes of the wafer to be inspected. Data for and/or images of the predetermined alignment sites (or indices that refer to this data) may be stored in the recipe for the inspection process. For example, information about the predetermined alignment sites for a layer on a wafer may be stored as alignment data in an inspection process recipe for the layer on the wafer, and the alignment data may be used each time the inspection system inspects a wafer of this particular device and layer.

Although some embodiments are described herein as including "wafer scanning" or "scanning a wafer" to acquire data and/or images for the wafer, it is to be understood that such data and/or images may be acquired using any appropriate technique and/or system known in the art. For instance, data and/or images for the wafer may be acquired by the inspection systems described herein or another inspection system configured to perform field-by-field image acquisition. In this manner, instead of scanning across the wafer, the inspection system may acquire data and/or images in a stepping manner. In another example, data and/or images for the wafer may be acquired by the inspection systems described herein or another inspection system configured to perform point-by-point inspection, which may be commonly referred to as automated process inspection (API).

Several methods may be used to select the predetermined alignment sites. In one embodiment, the method includes acquiring design data corresponding to the predetermined alignment sites. Data or images for the predetermined alignment sites that may be used in the methods described herein include rendered GDS clips (the term "clip" as used herein refers to a relatively small portion of the design layout) and images generated by an inspection system that have been aligned to a rendered GDS clip. Simulating (or "rendering") the design data corresponding to the predetermined alignment sites may be used to generate images that illustrate how the design data will be printed on the wafer. The method may also include performing a cross-correlation of the design data or a GDS clip with simulated ("rendered") images and recording the position of the simulated images in design data space (i.e., with coordinates in the design data space). Simulating images that illustrate how the design data corresponding to the predetermined alignment sites will be printed on the wafer as described above may be performed using any suitable method, algorithm, or software known in the art such as PROLITH, which is commercially available from KLA-Tencor.

In addition, simulated images may be generated as described above that illustrate how the predetermined alignment sites will be printed on the wafer after one or more processes have been performed on the wafer. The one or more processes may include, for example, lithography, a combination of lithography and etch, different lithography processes, etc. In this manner, the data for the predetermined alignment sites used in the methods described herein may include one or more simulated images selected or generated based on one or more processes performed on the wafer prior to inspection. Using different data for the predetermined alignment sites for alignment of inspection data acquired after different processes have been performed on the wafer may increase the accuracy of the methods described herein.

Selecting the predetermined alignment sites may include pre-processing design data (e.g., GDS data) to select predetermined alignment sites that are compatible with the inspection process and system. For example, in some instances, rendered GDS clips may be advantageous for use as the data for the predetermined alignment sites in the methods described herein since GDS clips are insensitive to variations caused by the wafer fabrication processes (e.g., color variation). However, images of the predetermined alignment sites acquired by the inspection system that have been aligned to rendered GDS clips "off-line" may be advantageous for use with inspection data generated at later stages of device fabrication because these images may be more similar to images of the alignment sites on the wafer generated by the inspection system than the rendered GDS clips thereby providing more accurate alignment. In some embodiments, therefore, the alignment data used in the methods described herein may include both GDS clips and images that have been aligned to the GDS clips to ensure that a suitable match to data for alignment sites on the wafer can be found at inspection run-time. Alternatively, one or more attributes of the predetermined alignment sites in the design data such as centroids of the predetermined alignment sites may be determined, and corresponding centroids of images of the alignment sites acquired by the inspection system may be determined and used to align the inspection pixel data to the design data.

The number of predetermined alignment sites selected per die may vary greatly. For example, a relatively sparse set of predetermined alignment sites may be selected. In addition, the predetermined alignment sites may be selected at a predetermined frequency across a die. Since the predetermined alignment sites are contained within the die itself, the predetermined alignment sites may be selected to include device features in the die and/or features located within a device area of the die. In this manner, the predetermined alignment sites may be selected to include pre-existing features of the design data. Such predetermined alignment sites are advantageous since the design data does not have to be modified to include alignment features and the alignment features do not increase the size of the die.

The method may also include selecting predetermined alignment sites within the design data that can be uniquely identified (within some misalignment tolerance window) in images or data acquired by the inspection system. For example, the predetermined alignment sites may be selected to include an alignment feature (i.e., a target) that is unique within a predetermined search range uncertainty. In this manner, given a certain positional uncertainty of the location of an alignment site on a wafer within an image or data, a correlation can be performed for the alignment data and the image or data to identify a relatively strong match of the two alignment sites without any ambiguity.

Figure 2:
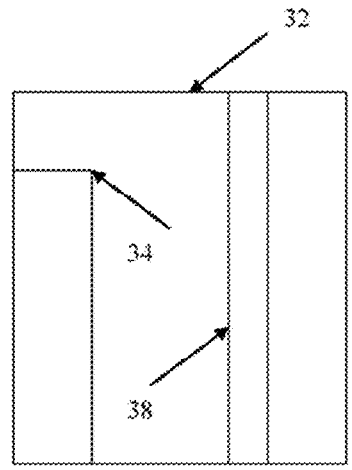
FIGS. 2-3 are schematic diagrams illustrating top views of different embodiments of a predetermined alignment site.
Figure 3:
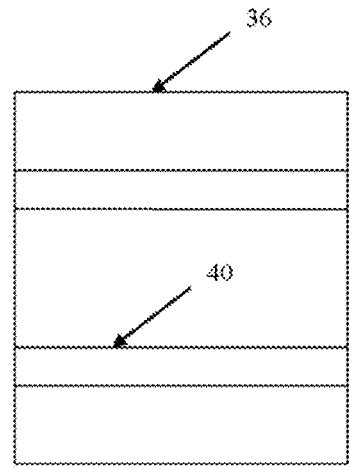

In one embodiment, the predetermined alignment sites include at least one alignment feature having one or more attributes that are unique in the x and y directions. An embodiment of one such predetermined alignment site is shown in FIG. 2. As shown in FIG. 2, predetermined alignment site 32 includes alignment feature 34. Alignment feature 34 has one or more attributes that are unique in the x and y directions. For example, the corner of the alignment feature may render the alignment feature unique in the x and y directions with respect to other features in the die and proximate the alignment feature. The predetermined alignment site may also include more than one such alignment feature that may be similarly or differently configured. In this manner, the alignment feature or features may be unique in both the x and y directions.

In an alternative embodiment, the predetermined alignment sites include at least two alignment features. A first of the two alignment features has one or more attributes that are unique in the x direction. A second of the two alignment features has one or more attributes that are unique in the y direction. An embodiment of one such predetermined alignment site is shown in FIG. 2. As shown in FIG. 2, predetermined alignment site 32 includes alignment feature 38. Alignment feature 38 has one or more attributes that are unique in the x direction but provides no information about alignment in the y direction. For example, the vertical edge of alignment feature 38 may render the alignment feature unique in the x direction with respect to other features in the die and proximate the alignment feature. The predetermined alignment site may include more than one such feature.

Predetermined alignment site 36 includes alignment feature 40. Alignment feature 40 has one or more attributes that are unique in the y direction but provides no alignment information in the x direction. For example, the horizontal edge of alignment feature 40 may render this alignment feature unique in the y direction with respect to other features in the die and proximate the alignment feature. The predetermined alignment site may also include more than one such feature. Furthermore, the predetermined alignment site may include more than two alignment features that are unique in the x and/or y directions. In this manner, a predetermined alignment site may be selected to include a set of alignment features such as features 38 and 40 that in combination provide sufficient x and y alignment information for determining the absolute (x, y) offsets between the "live" image or data (e.g., the image or data acquired by the inspection system during inspection) and data for the predetermined alignment sites.

Selection of the predetermined alignment sites may be performed manually, automatically, or some combination of the two (i.e., semi-automatically or user-assisted). Whether performed manually, automatically, or both, predetermined alignment site selection can be performed using the design data, an optical or electron beam image of a wafer, or both. In user-assisted selection of the predetermined alignment sites, the user may examine the computer-aided design (CAD) layout, a live or stored optical or electron beam image of the wafer, or both to determine one or more predetermined alignment sites that satisfy the uniqueness criteria described above.

In automatic or semi-automatic selection of the predetermined alignment sites, the method may include scanning a die row on a wafer using the inspection system and processing each frame of a die (e.g., by executing an algorithm) to identify unique alignment sites. The term "frame" is generally defined herein as data or an image for a portion of a die in a swath of inspection data or images acquired during scanning of the wafer. Processing the frames may include determining the x and y gradients of features in the frames and selecting one or more features that have a relatively strong gradient in the x and/or y directions for use in the predetermined alignment sites. The method may also include performing a cross-correlation of a frame and a patch image containing such a feature to determine if only one relatively strong peak of the gradient(s) is located within a predetermined search range. In this manner, alignment features that are unique within a pattern search window may be identified and selected for the predetermined alignment sites. The method may also include accessing the design data, rendering one or more relatively small regions of the design data as one or more images, and performing the above steps to identify suitable alignment sites. The method may also include displaying one or more potential alignment sites (e.g., optical or electron beam and CAD image pairs for the potential alignment sites) identified by the method and allowing a user to select one or more suitable alignment sites distributed over the die at a predetermined minimum interval distance.

In another embodiment, an imaging mode of the inspection system or another image acquisition system used to select the predetermined alignment sites is different than an imaging mode or imaging modes of the inspection system used to acquire the inspection data. In this manner, the method may include using different imaging modes for alignment site selection and wafer inspection. The alignment site selection step may also be performed based on the various imaging modes that may be used to inspect the wafer. For instance, the inspection system may be configured to use more than one optical imaging mode for inspection such as bright field (BF) mode, dark field (DF) mode, Edge Contrast (which is a trademark of KLA-Tencor) mode, various aperture modes, and/or an electron beam imaging mode. Edge Contrast (EC) inspection is generally performed using a circular symmetric illumination aperture with a complementary imaging aperture. The best imaging mode for inspection of a particular layer on a wafer is the imaging mode that maximizes the defect S/N, and the best imaging mode may vary with the layer type. In addition, the inspection system may be configured to inspect a wafer using more than one imaging mode simultaneously or sequentially. Since alignment site image or data acquisition performed during wafer inspection uses the best imaging mode for wafer inspection, the alignment site selection preferably uses that mode to select appropriate alignment sites and alignment features.

However, to precisely determine the positions of the selected predetermined alignment sites in the design data space, an optical patch image of the predetermined alignment site (on the wafer) may be aligned with a simulated image derived from the design data as described above or a GDSII clip. Obtaining a simulated image having suitable quality for alignment of the simulated image and the optical image may be difficult for all imaging modes. However, a best match of the simulated image and the optical image may be obtained for a particular imaging mode (e.g., BF mode). Therefore, the method may include scanning the wafer using the best imaging mode for inspection to select suitable predetermined alignment sites. The method may also include revisiting the selected predetermined alignment sites on the wafer using the inspection system to acquire optical patch images using the mode that provides an image that can best be matched to the simulated image or GDSII clip.

The images acquired using the best mode for matching with simulated images or GDSI clips may be aligned to simulated images or GDSI clips for the corresponding alignment sites in the design data. Using the (x, y) positions of the selected alignment sites in the design data space determined by aligning the images acquired using the best mode for matching to the simulated images or GDSII clips, these x and y positions can be associated with the patch images acquired using the best mode for inspection. If there is some fixed offset between the images gathered for the same site in the different modes (inspection mode and best mode for matching to simulated images or GDSI clips), this offset can be measured and/or corrected at the start of (or before) inspection using a suitable calibration target.

In one such embodiment, the method may include off-line alignment of a CAD simulated image or a GDSII clip to optical or electron beam images of the predetermined alignment sites to determine mapping (i.e., to determine the positions of individual pixels of the optical or electron beam image in design data space). For example, after selecting the predetermined alignment sites and acquiring images of those sites on the wafer using the imaging mode that can provide the best images for matching with simulated images, the design data corresponding to the predetermined alignment sites may be acquired (in any format such as a polygonal representation) and then rendered as a simulated image at the appropriate pixel size using an appropriate transform function. The optical (or electron beam) and simulated images may then be aligned to each other using any appropriate method and/or algorithm known in the art. Aligning the optical (or electron beam) and simulated images to each other may be performed using other information about the design data (e.g., in the design database) such as previous layer geometry that may be a source of noise in the optical images such that the previous layer geometry can be eliminated from the optical images or otherwise accounted for to achieve sufficiently accurate alignment.

Results of the process for setting up the recipe for inspection may include one or more optical or electron beam patch images representing the predetermined alignment sites, the position (e.g., x and y coordinates) of each of the predetermined alignment sites in the design data space, and any additional information that may be utilized by the inspection system to perform substantially accurate alignment during subsequent wafer inspections.

As shown in step 12 of FIG. 1, the method includes aligning data acquired by an inspection system for alignment sites on a wafer with data for the predetermined alignment sites. The data for the predetermined alignment sites may include any of the data described above. For example, the data for the predetermined alignment sites may include design data stored in a data structure such as a GDSII file or other standard machine-readable file formats. In another embodiment, the data for the predetermined alignment sites includes one or more simulated images illustrating how the predetermined alignment sites will be printed on the wafer. The one or more simulated images may be mapped to design data space as described further herein such that the positions of the alignment sites on the wafer in design data space can be determined as described further herein based on the positions of the predetermined alignment sites in design data space.

In an additional embodiment, the data for the predetermined alignment sites includes one or more attributes of the predetermined alignment sites, the data for the alignment sites on the wafer includes one or more attributes of the alignment sites, and the aligning step includes aligning the one or more attributes of the predetermined alignment sites to the one or more attributes of the alignment sites. The one or more attributes of the predetermined alignment sites and the alignment sites on the wafer used in this embodiment may include any of the attribute(s) described herein. For example, in one embodiment, the one or more attributes of the predetermined alignment sites include centroids of the predetermined alignment sites, and the one or more attributes of the alignment sites on the wafer include centroids of the alignment sites. The centroids of the predetermined alignment sites and the alignment sites on the wafer may be centroids for one or more alignment features in the sites. In this manner, the method may include matching centroids of the predetermined alignment sites and the alignment sites on the wafer to align the alignment sites on the wafer to the predetermined alignment sites. As such, the data for the predetermined alignment sites may include some property (or properties) of the predetermined alignment sites such as a centroid that can be aligned to the corresponding property (or properties) of the data for the alignment sites on the wafer. The one or more attribute(s) such as the centroids of the predetermined alignment sites and the alignment sites on the wafer may be determined as described herein or in any suitable manner known in the art.

In a further embodiment, the data for the predetermined alignment sites includes data acquired by the inspection system that has been aligned to design data stored in a data structure such as a GDSII file. The data acquired by the inspection system for the predetermined alignment sites may be aligned to the design data as described herein. In some embodiments, the data for the predetermined alignment sites includes at least a portion of a standard reference die image that has been aligned to design coordinates in the design data space. The standard reference die image may include any of the standard reference die images described herein, and the standard reference die image may be aligned to the design coordinates as described herein. For instance, the standard reference die image may be mapped to the design space and then used for alignment.

Aligning the data for the alignment sites to the data for the predetermined alignment sites may be performed using any suitable alignment method(s) and/or alignment algorithm(s) known in the art.

In one embodiment, step 12 may be performed during the wafer inspection. In addition, this step may be performed each time a wafer is inspected using the inspection process recipe. For instance, the inspection process may include an initialization phase that may be performed at the start of inspection of a lot of wafers and at the start of inspection of each wafer in the lot. During the initialization phase, the predetermined alignment sites and (x, y or two-dimensional) mapping of the predetermined alignment sites in the design data space may be accessed from the recipe setup results and downloaded into image computer processing nodes that may be used to perform alignment of the stored alignment patch images with the live patch images acquired by the inspection system for the wafer being inspected. The image computer and processing nodes may have any suitable configuration known in the art.

During the inspection process, the method may include scanning the wafer using the inspection system to acquire swaths of inspection data. Each swath may be acquired as a stream of pixels of some height H (in y) as the inspection system scans (in x) across the die in a row or column on the wafer. Each processing node in the image computer may process some part of the swath. For example, the swath may be separated into portions or "pages," and each of the portions of the swath may be directed to a different processing node. The processing nodes may be configured to perform defect detection using the pixels in the portions of the swath received by the processing nodes. The method and image computer may use information about the locations of the alignment sites on the wafer (e.g., locations within each die) and patch images of the predetermined alignment sites acquired from a storage medium of the image computer (e.g., downloaded during the initialization phase) to align the predetermined alignment sites with the live stream data for the alignment sites on the wafer.

In some embodiments, a context map (e.g., stored in a data structure such as a database) may be accessed and downloaded into the processing nodes. This context data may be stored in any suitable format known in the art. This context data may be stored and/or used in a compact polygonal representation rather than in image format. However, the context map may be rendered into an image such that the context map can be used for defect detection purposes. This rendering can be performed either once during initialization or each time the context map is used during inspection. An advantage of the former approach is that rendering the context map during initialization reduces the data processing cycles performed during the inspection process. However, a disadvantage of this approach is that storing a rendered image of the entire context map may require a relatively large amount of memory.

As shown in step 14 of FIG. 1, the method includes determining positions of the alignment sites on the wafer in design data space based on positions of the predetermined alignment sites in the design data space. For instance, since the (x, y) positions of the predetermined alignment sites with respect to the design data coordinates (i.e., in the design data space) have been determined and the data for the predetermined alignment sites has been aligned to the data for the alignment sites, the absolute locations of the live pixel coordinates of the alignment sites on the wafer can be determined in design data space. In another embodiment, determining the positions of the alignment sites on the wafer in design data space may include aligning the raw data stream (e.g., live images) to the data (e.g., reference images) for the predetermined alignment sites. Determining the positions of the alignment sites on the wafer in design data space may be performed before inspection of the wafer or subsequent to acquisition of the inspection data for the wafer.

As shown in step 16 of FIG. 1, the method includes determining a position of inspection data acquired for the wafer by the inspection system in design data space based on the positions of the alignment sites on the wafer in the design data space. The inspection data for which the position in design data space is determined may include any data (e.g., image data) acquired for the wafer by the inspection system during inspection. In addition, the position of the inspection data may be determined for some or all of the data acquired by the inspection system during inspection of the wafer. For example, the position of the inspection data may be determined only for inspection data acquired for care areas on the wafer.

In one embodiment, after aligning the portions of the raw data stream corresponding to the alignment sites on the wafer to the reference images of the predetermined alignment sites as described above, the method may include measuring the coordinate offset between the inspection data stream and the design data to within sub-pixel accuracy. In addition, the coordinate errors between the live inspection data and the design data may be corrected by shifting the raw inspection data image with respect to the reference images for the predetermined alignment sites so that the alignment sites on the wafer are substantially exactly aligned to the predetermined alignment sites for all points across the die. One significant advantage of the methods and systems described herein is that the position of the inspection data in the design data space can be determined with sub-pixel accuracy. In this manner, the care and do not care areas on the wafer may be determined as described further herein with relatively high precision at sub-100 nm accuracy.

In a different embodiment, the data for the predetermined alignment sites may be used to determine a two-dimensional mapping transform that can be used to map the live image pixel space to design data space. For instance, as described above, the method may include correlating downloaded predetermined alignment site patch images (acquired during setup of the inspection process) with the live image data over a predetermined search range and determining the offset between the downloaded and live images. The method may also include determining the correspondence between the live image pixel positions and the design data coordinates using this offset since the (x, y) positions of the predetermined alignment sites in design data space were determined during setup. The method may then include determining a two-dimensional function for mapping the live pixel coordinate space to the design data space using the correspondence between the live image pixel positions and the design data coordinates.

In one such example, using a suitable polynomial fit of a grid of alignment sites to the absolute coordinates in design data space, a mapping function may be determined that can be used to map any pixel in the inspection data (e.g., the live pixel stream) to its corresponding position in the design data space. In a similar manner, any pixel in the inspection data may be mapped to its corresponding position in the context space as described further below. Several other corrections may be used to provide substantially accurate mapping. For instance, corrections may be performed based on data provided by the inspection system such as pixel size in the x direction, which may be acquired by the run time alignment (RTA) subsystem of the inspection system, and stage calibration data. The mapping may be used for the die-to-die inspection mode. Mapping of the live pixel stream as described above may be performed in real-time during inspection of the wafer or subsequent to acquisition of the inspection data for the wafer. In this manner, determining the position of the inspection data in design data space may be performed during the inspection of the wafer. Alternatively, determining the position of the inspection data in the design data space may be performed subsequent to inspection of the wafer.

The position of the inspection data in design data space may be stored and used in any manner described herein.

In one embodiment, the method includes detecting defects on the wafer using the inspection data and a standard reference die for standard reference die based inspection. In this manner, the method embodiments described herein may include performing standard reference die based inspection. In some such embodiments, the method may include applying mapping of a standard reference die image in design data space to live images acquired by the inspection system for the wafer for standard reference die-to-die inspection mode. The term "standard reference die" generally refers to a reference die on the wafer that is being inspected but does not meet the normal adjacency constraints to the "test" die that are required for die-to-die inspection. Some commercially available inspection systems are configured to use some version of the standard reference die-to-die inspection mode. One implementation of the standard reference die-to-die inspection mode involves comparing a die to any die within a die row. In another implementation, the standard reference die image may be a stored image. Therefore, stored standard reference die-to-die inspection mode is much like standard reference die-to-die inspection mode, except that the constraint of using a reference die on the wafer is eliminated. One advantages of this inspection mode is that the stored standard reference die image can be modified to make the standard reference die image "substantially defect free." In addition, this inspection mode enables using standard reference die images from a different wafer thereby enabling the most simple implementation of the iPWQ application, which is described further herein.

In one embodiment, which may be used for standard reference die-to-die inspection mode, the live image acquired for a die being inspected is aligned to and compared with a stored die image obtained from a known good die (standard reference die) on another wafer. Such alignment and comparison may be performed as described herein. In this case, mapping of the standard reference die pixels to design data coordinate space may be performed completely offline. For instance, the alignment sites in the standard reference die may be mapped in the design data space as described above, and the mapped standard reference die pixels may be stored offline and fed into the inspection system during inspection. In this manner, for the standard reference die-to-die inspection mode, determining the position of the live inspection data in design data coordinate space may be performed by aligning the live data to the stored standard reference die image or data which itself has been mapped to design space.

In another embodiment, for standard reference die-to-die inspection, a known good die on a reference wafer is scanned at the selected pixel size and imaging mode, and the entire known good die image may be stored in an appropriate storage medium (e.g., a disk). During inspection of a wafer, a swath of the appropriate standard reference die image is downloaded into the inspection system image computer, and as each die is scanned, frames of the target die (i.e., the die being inspected) are aligned with the corresponding standard reference die frames. Misalignment between the frames may be corrected using sub-pixel interpolation. The standard reference die image may then be compared to an image of the wafer to detect defects on the wafer (e.g., to detect defective pixels). In this manner, the same image can be used for aligning inspection data to design data space coordinates and for defect detection.

In a different embodiment, the method includes aligning data for the alignment sites on the wafer in the inspection data stream to rendered GDS clips for the predetermined alignment sites to correct errors in real-time. For example, the method may include applying mapping of the rendered GDS II clips in design data space to the data for the alignment sites on the wafer for die-to-die inspection mode. The method may include correlating downloaded alignment site patch images (selected during setup of the inspection process) with the live image data over a predetermined search range and determining the offset between the two images. In another example, aligning data for the alignment sites on the wafer in the inspection data stream to data for the predetermined alignment sites may be performed by aligning a centroid or other attribute of one or more features in the alignment sites, which may be performed as described further herein.

In one embodiment, for defect detection in die-to-die inspection mode, data for each scanned die frame is aligned with data for the subsequent die frame in the swath. In this case, mapping of the predetermined alignment sites and the alignment sites on the wafer may not be performed offline since the position of the data for each die in the inspection data stream is subject to mechanical and other error sources of the inspection system. Therefore, in this case, the method may include identifying the alignment sites in each die (e.g., using the image computer) during the acquisition of the inspection data.

In another embodiment, defect detection may be performed in wafer-to-wafer inspection mode. In one such embodiment, data for alignment sites on one wafer may be aligned to data for the predetermined alignment sites, and the data for the alignment sites on this wafer may be aligned to data for the alignment sites on another wafer. Alternatively, data for alignment sites on both wafers may be aligned to data for the predetermined alignment sites including any of the data described herein. In this manner, after data for the alignment sites on the wafers have been aligned to the data for the predetermined alignment sites, the inspection data for the wafers will effectively be aligned to each other and can be overlaid or compared for defect detection. In some embodiments, the wafer-to-wafer inspection mode involves using a reference die that that exists outside of the wafer being inspected (i.e., an off-wafer reference). Implementation of this method is far from straightforward since it involves separating the runtime feedback concepts that are currently used to enable inspection systems to accomplish die-to-die level overlay tolerances (e.g., 0.1 pixel) to achieve adequate sensitivity results.

In one such embodiment, the method includes RTA of the wafer being inspected to an off-wafer reference image. RTA to an off-wafer image is an image alignment approach that can be used to enable the extension of scanning inspection technology from wafer "self-referencing" approaches such as die-to-die comparison and cell-to-cell comparison to wafer-to-wafer inspection for detecting defects on patterned wafers. For example, RTA may include electro-mechanically aligning a live acquired image with a previously acquired image to obtain sub-pixel accuracy positioning prior to digitizing the signals produced by one or more detectors of the inspection system. Examples of how RTA may be performed in the embodiments described herein are illustrated in U.S. Pat. No. 7,061,625 to Hwang et al., which is incorporated by reference as if fully set forth herein.

One currently available inspection approach that involves comparing an image of a wafer to an off-wafer image is the die-to-database inspection mode used by Nanogeometric Research, Japan (NGR). This die-to-database inspection approach entails "step and repeat" image acquisition and stitching followed by a complex series of edge based image processing, process simulation, and detection algorithm steps. However, this method cannot be used to directly compare images of different wafers. In particular, the die-to-database inspection mode compares a wafer image to a simulated reference derived from the design layout database. The simulation step of this approach must be carefully calibrated to the specific manufacturing process used to produce the wafer under test. The calibration is an expensive and time consuming process. The calibration is particularly complex for an integrated process flow with multiple steps. In addition, "step and repeat" image acquisition inspection processes are typically slow relative to scanning based inspection processes due to the practical limitations of stage inertia, stage vibration, static image acquisition, stitching the images, etc.

An alternative die-to-database inspection mode is a logical extension of the inspection mode that uses an "off-wafer" reference die described above. In this case, the "database" is a rendered image generated from design data and process simulation as described above. Therefore, database based inspection may be considered a logical extension of "off-wafer" reference inspection modes because wafer-to-wafer inspection can be performed using a "standard reference die" that was generated from an acquired image (possibly with statistical augmentation, which may be performed as described herein) and a "standard reference die" that was generated strictly from design data and process modeling. Using the standard reference die generated strictly from design data and process modeling is the most complex wafer inspection mode to implement. Many attempts have been made to implement this inspection mode, but the current performance of the attempted implementations is not adequate due to the computational intensity (modeling and detection), image acquisition rate, and image quality challenges of this application. However, the methods described herein are more practical to implement since a common absolute reference (e.g., the design data) can be used for alignment of the inspection data for the wafer under test and the off-wafer reference.

The methods described herein can, therefore, be used to enable comparison of wafers to one another, which is a potentially extremely useful application. One motivation for defect inspection using wafer-to-wafer comparison is to discover "systematic defect mechanisms" that may result from the interaction of a specific circuit layout and the stacked tolerances of the wafer manufacturing process. This discovery process may include comparing wafers on which the same device design was printed but which were processed differently. The most deterministic approach is to modulate process parameters in a single- or multi-variable experiment (e.g., using a methodical DOE approach). In one embodiment, the wafer and additional wafers (e.g., two or more wafers) are processed using wafer level process parameter modulation, which may be performed as described above or in any other suitable manner. The process parameters may be modulated to cause the measurable physical and/or electrical attributes of the resulting wafers to approach their allowable limits. In addition, the method may include detecting defects on the wafer and the additional wafers by comparing inspection data for die on the wafer and the additional wafers to a common standard reference die. Detecting the defects on the wafers in this manner may be performed as described further herein. In one such embodiment, the method may include determining if structural differences between wafers occur as measured by the detection of "defects." Such an approach may be referred to as integrated PWQ (iPWQ). In this manner, the methods described herein may be used to enable the implementation of iPWQ (e.g., using the standard reference die approach for iPWQ). As such, PWQ methodology may be extended to include wafer level process parameter modulation and comparison of die on different wafers to a common standard reference die for purposes of implementing the iPWQ methodology.

In contrast, discovery of lithography induced "systematic defect mechanisms" may be performed using methods described in U.S. Pat. No. 6,902,855 to Peterson et al., which is incorporated by reference as if fully set forth herein, and the PWQ product commercially available from KLA-Tencor. PWQ leverages the unique ability of lithography tools to modulate lithography exposure process parameters at the reticle shot level using focus and exposure as variables to determine design-lithography interactions. This application is often used for OPC verification. However, PWQ is limited to the direct comparison of dies on a wafer that are printed with modulated focus and/or exposure parameters. The impact of other process variables associated with process steps such as etch, deposition, thermal processing, chemical-mechanical polishing (CMP), etc. cannot be directly assessed by PWQ since these variables can only be modulated at the wafer level. However, systematic defect mechanisms associated with or caused by these process variables can be discovered using the methods described herein. In particular, the methods described herein can be used to examine non-lithography process modulation in a PWQ-type application by wafer-to-wafer comparison.

In scanning based defect detection systems, die-to-die image subtraction can be performed by "sub-pixel" image alignment to reduce difference image registration noise thus enabling better sensitivity to defects. Defects are identified by detecting pixels in the difference image that exceed one or more thresholds. The scanning based image acquisition process includes a feedback mechanism often referred to as RTA. This mechanism precisely aligns the image being acquired to image(s) acquired from the same wafer some time prior to the current image. Depending on the configuration of the inspection system, the feedback mechanism can include a combination of opto-mechanical, electro-mechanical, and electronic/algorithmic approaches.

In one embodiment, the methods described herein include RTA using a stored image as the reference rather than images acquired for the wafer under test. The stored image may be an image of a "standard reference wafer" or a reference wafer. Each die on the wafer under test may be compared to a corresponding die on the standard reference wafer. Although embodiments are described herein as including a comparison of two wafers or images of wafers, it is to be understood that the embodiments may include comparing any data acquired by inspection of two or more wafers.

Figure 4:
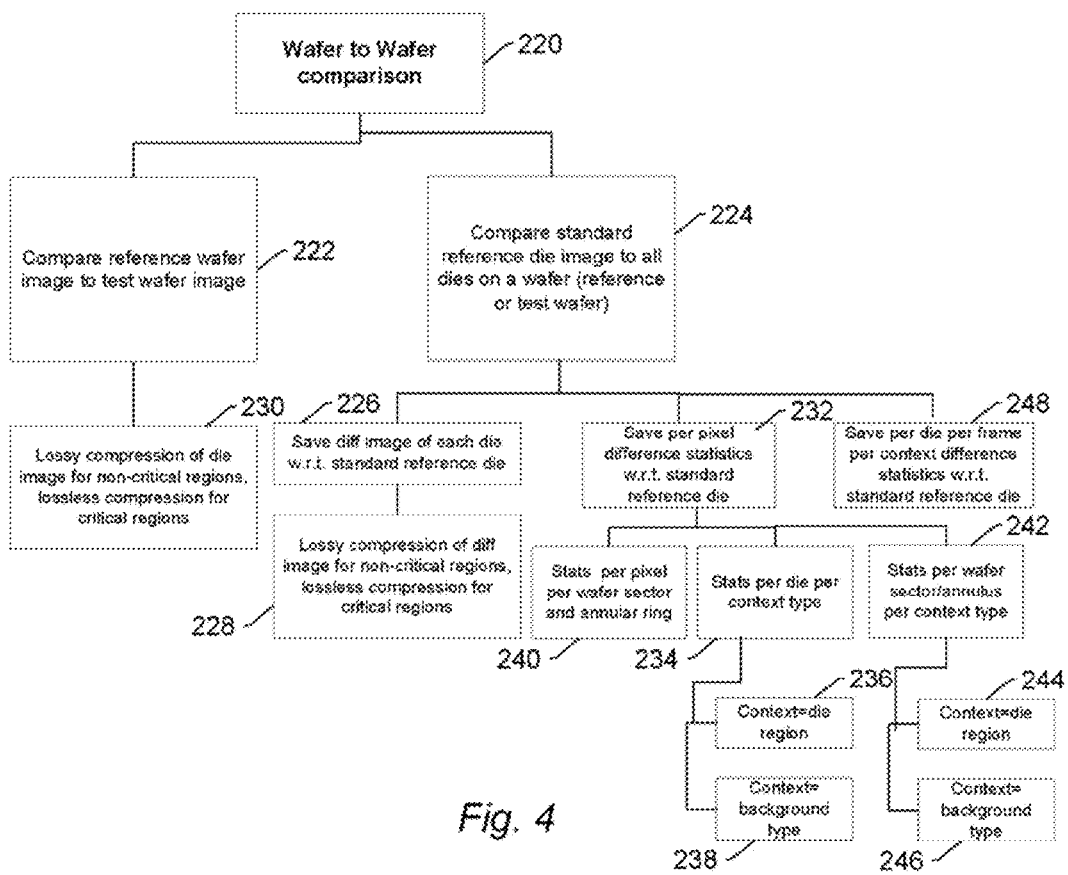
FIG. 4 is a hierarchical diagram illustrating various embodiments of a computer-implemented method for performing a wafer-to-wafer comparison.

FIG. 4 illustrates various embodiments of a computer-implemented method for performing a wafer-to-wafer comparison. It is noted that the steps shown in FIG. 4 are not essential to practice of the method. One or more steps may be omitted from or added to the method illustrated in FIG. 4, and the method can still be practiced within the scope of this embodiment.

As shown in step 220, the method includes a wafer-to-wafer comparison. In one embodiment, the wafer-to-wafer comparison includes comparing a reference wafer image to a test wafer image, as shown in step 222. For instance, the reference wafer image that is used in the methods described herein may be a stored image of the entire reference wafer. The comparison of the reference wafer image to the test wafer image may be performed as described herein. Alternatively, as shown in step 224, the wafer-to-wafer comparison may include comparing a standard reference die image to images of all dies on a wafer (e.g., a reference or test wafer).

In one embodiment, the method includes detecting defects on the wafer using the inspection data, a standard reference die, and a representation of wafer noise associated with the standard reference die in a perturbation matrix for standard reference die based inspection. In this manner, the method may include using a relatively compact representation of wafer noise associated with the standard reference die in the form of a perturbation matrix. For example, an image of a reference die on the reference wafer may be stored in addition to a perturbation matrix or other suitable data structure that shows how the die pixels vary from die to die on the reference wafer. Storing an image of a reference die in addition to the perturbation matrix instead of an entire reference wafer image allows a more compact representation of the reference wafer to be stored. In this manner, a perturbation matrix may be included in the representation of a reference wafer to reduce the reference wafer image size to a level that can be implemented in a practical and affordable manner. As such, the method may include standard reference die based inspection that includes using a perturbation matrix compression of noise signatures.

Generating a reference wafer image and corresponding perturbation matrix may involve standard reference die based inspection using a standard reference die acquired from the reference wafer (i.e., a sort of self-referencing). A single standard reference die image on the reference wafer may be used as an RTA reference at run time to reduce any impact that RTA performance may have on sensitivity as well as the baseline image that is perturbed with the compressed difference data stored for each die on the reference wafer. The size of the stored difference data may be reduced through compression algorithms as well as by imposing limitations on the total care area size per die swath. At run time, the perturbation matrix of difference image data may be loaded for the entire reference wafer by swath for each corresponding standard reference die swath that gets loaded. A perturbation matrix data volume for a whole wafer may be on the order of about 1 Gb to about 3 Gb, and a data volume for the standard reference die may be on the order of 1 Gb. All other methods described herein that include a standard reference die comparison may use a perturbation matrix as described above.

The perturbation matrix may be defined by $P_1(x, y)$, $D_x(1, 2)$, $D_y(1, 2)$ $\text{Diff}_{1,2}(x, y)$; $P_2(x, y)$, $D_x(2, 3)$, $D_y(2, 3)$, $\text{Diff}_{2,3}(x,y)$, ... $P_{m-1}(x, y)$, $D_x(m-1, m)$, $D_y(m-1, m)$, $\text{Diff}_{m-1,m}(x, y)$ if there are m die in a row, where $P_i(x, y)$ is a pixel value in the $i^{th}$ die at location $(x, y)$, $D_x(i, i+1)$ and $D_y(i, i+1)$ are offsets in x and y, respectively, of die(i) with respect to die(i+1), and $\text{Diff}_{i,i+1}(x, y)$ is the difference gray level of die (i+1) with respect to die(i) at location x, y after die(i+1) has been shifted by x and y offsets to align it with the frame of die(i). However, within interpolation error bounds, $P_2(x, y)$ can be reconstructed from $P_1(x, y)$, $D_x(1, 2)$, $D_y(1, 2)$, and $\text{Diff}_{1,2}(x, y)$. In addition, $P_1(x, y)$ can be reconstructed for any other die by applying these steps successively to each die. Of course, this may compound the interpolation error and progressively blur the image from die to die.

However, if a standard reference die is stored and all interpolations are performed with respect to this die, then the transitive error accumulation described above does not occur. Rather, the error is simply the interpolation error associated with reconstructing any die on the wafer from the standard reference die, given its offset and difference image. Therefore, as shown in step 226, the method may include saving a difference image of each die with respect to the standard reference die.

Figure 5:
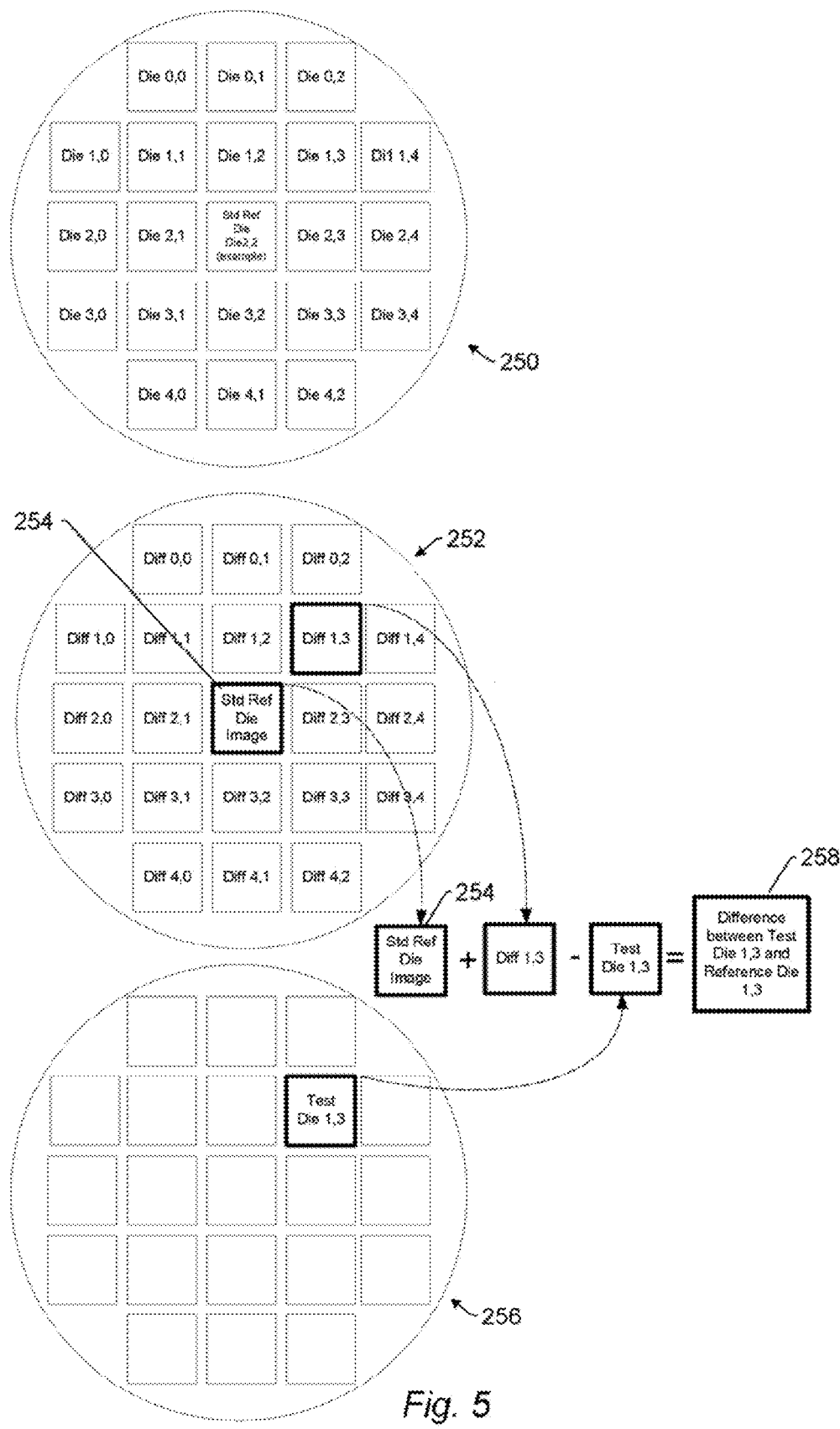
FIG. 5 is a schematic diagram illustrating one embodiment of a computer-implemented method for performing a wafer-to-wafer comparison.

FIG. 5 illustrates one embodiment of a method for performing a wafer-to-wafer comparison using such a difference image as the reference for comparison. For instance, reference wafer 250 includes a number of dies [(0,0), (0,1) ... (4,2)], one of which (e.g., die (2,2)) is designated as the standard reference die. Reference wafer 252 that is used for comparison to the test wafer is generated by storing a difference image [Diff(0,0), Diff(0,1) ... Diff(4,2)] for each of the dies with respect to standard reference die image 254. Test wafer 256 may then be compared with reference wafer 252. For instance, as shown in FIG. 5, defect detection may be performed for test die (1,3) by adding standard reference die image 254 and corresponding difference image (Diff(1,3)) and then subtracting test die (1,3) to generate difference 258 between test die (1,3) and reference die (1,3).

The difference image between any die (under test) and the standard reference die may, therefore, be represented in a compact manner. A lossy compression algorithm may be employed to achieve a higher degree of compaction. The information that may be lost by such a compression scheme depends on the scheme itself. For example, as shown in step 228 of FIG. 4, the method may include performing lossy compression for non-critical regions of the difference images and lossless compression for critical regions of the difference images. In this manner, an "intelligent" compression scheme may be used such that less critical device regions are allowed to suffer a higher loss than more critical regions. A similar compression scheme may be used for a reference wafer image. For example, as shown in step 230, the method may include performing lossy compression for non-critical regions of the wafer image and lossless compression for critical regions of the wafer image.

Alternatively, the method may include saving per pixel difference statistics with respect to the standard reference die, as shown in step 232. For instance, as shown in step 234, the method may include storing statistics per die per context type. Each die may be separated into one or more context types, which may be performed as described further herein. In one such example, the method may include recording statistics with respect to the difference at each (x, y) location in the standard reference die with respect to different groups of dies. As shown in step 236, the context may be the die region. Alternatively, as shown in step 238, the context may be the background type. The per pixel different statistics may be determined in any suitable manner.

Figure 6:
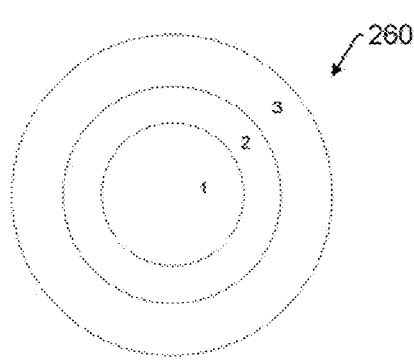
FIG. 6 is a schematic diagram illustrating a top view of one embodiment of inspection data acquired for an area of a surface of a wafer separated into annular rings.
Figure 7:
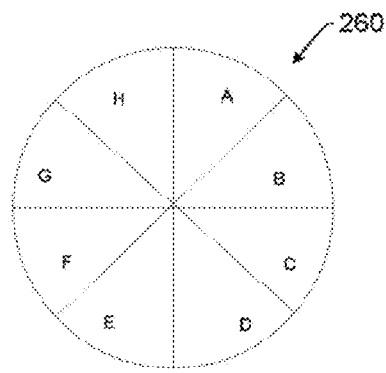
FIG. 7 is a schematic diagram illustrating a top view of one embodiment of inspection data acquired for an area of a surface of a wafer separated into radial sectors.

In another example, the wafer may be separated into N radial sectors and/or M annular rings. For example, as shown in FIG. 6, wafer 260 may be separated into annular rings 1, 2, and 3. Although wafer 260 is shown as being separated into three annular rings, it is to be understood that the wafer may be separated into any suitable number of annular rings. In addition, or alternatively, as shown in FIG. 7, wafer 260 may be separated into wafer sectors A, B, C, D, E, F, G, and H. Although wafer 260 is shown as being separated into eight sectors, it is to be understood that the wafer may be separated into any suitable number of sectors. The method may include saving statistics per pixel per wafer sector and/or annular ring, as shown in step 240 of FIG. 4. In one such example, for each of the (N+M) partitions, the average and standard deviation of the difference with respect to the standard reference die image at the (x, y) locations may be recorded. Using an 8-bit average and an 8 bit standard deviation involves storing 2*(N+M) bytes at each (x, y) location versus storing a byte of the difference per die on the wafer. In this manner, if there are 100 die on the wafer, using eight sectors and eight annular rings requires 32 bytes per (x, y) location versus 100 bytes per (x, y) location. In a further example, the method may include storing statistics per wafer sector and/or annulus as described above per context type, as shown in step 242. The context type may be based on die regions, as shown in step 244. Alternatively, the context type may be based on background type, as shown in step 246. The statistics per context type and the context types may be determined as described herein.

Figure 8:
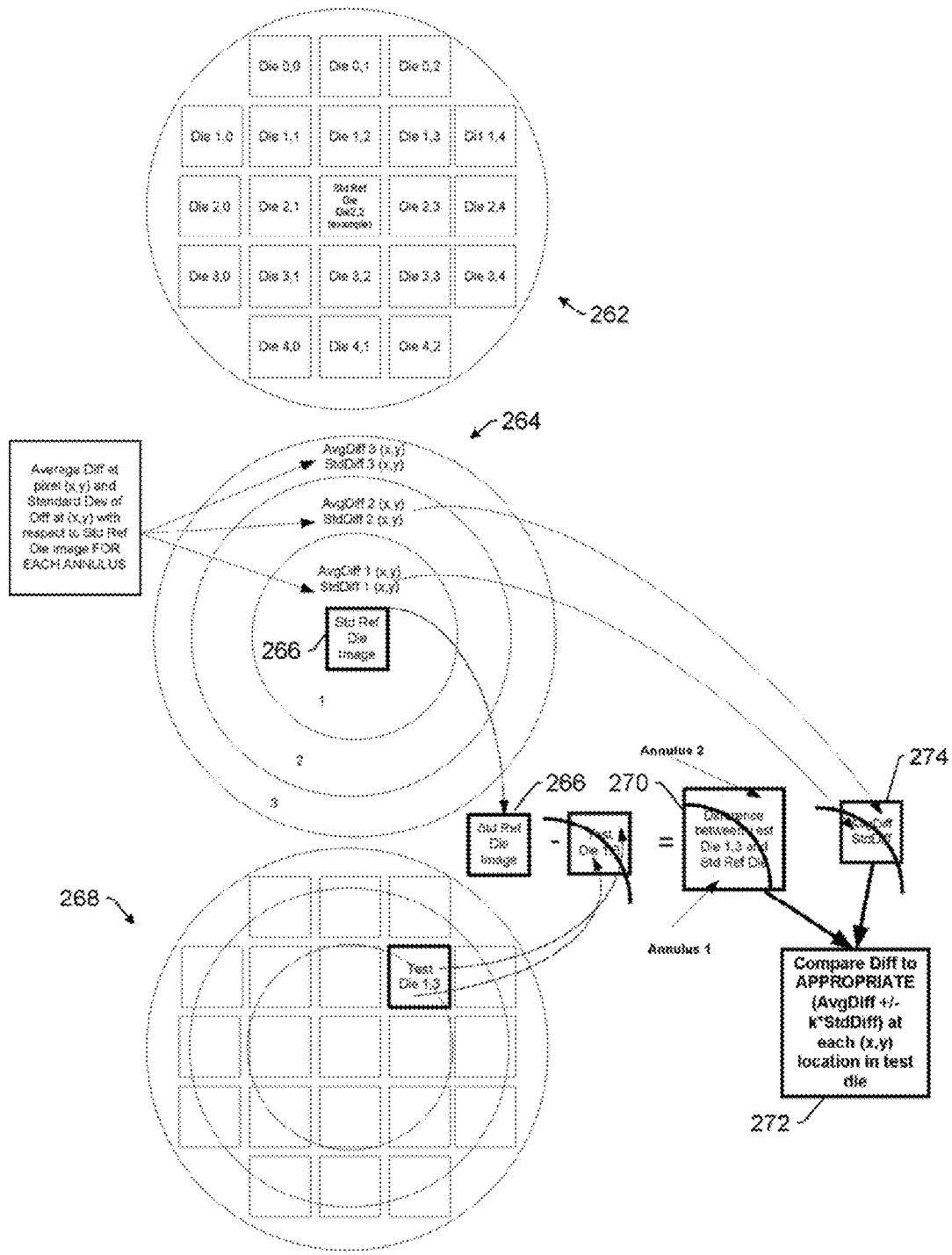
FIG. 8 is a schematic diagram illustrating another embodiment of a computer-implemented method for performing a wafer-to-wafer comparison.

FIG. 8 shows how such a scheme may be performed if statistics are stored for each (x, y) location on the standard reference die on a per annular ring basis. In particular, FIG. 8 illustrates an embodiment of a method for performing a wafer-to-wafer comparison using difference statistics by annulus as a reference. For example, as shown in FIG. 8, reference wafer 262 includes a number of dies [(0,0), (0,1) . . . (4,2)], one of which (e.g., die (2,2)) is designated as the standard reference die. Reference wafer 264 that is used for comparison to the test wafer is generated by determining an average difference at pixel (x, y) and a standard deviation of the difference at pixel (x, y) with respect to standard reference die image 266 for each annulus. Test wafer 268 (shown in FIG. 8 with the annuluses overlaid on the test wafer) may be compared with reference wafer 264. For instance, test die (1,3) is subtracted from standard reference die image 266 to generate difference 270 between test die (1,3) and standard reference die image 266. As further shown in FIG. 8, test die (1,3) is located within annulus 1 and annulus 2. Therefore, in step 272, difference image 270 is compared to statistics 274 (e.g., average difference+/-k*standard deviation of the difference) at each (x, y) location in the test die on a per annulus basis. In other words, difference 270 for portions of the test die that are located within annulus 1 are compared to the statistics for annulus 1, and difference 270 for portions of the test die that are located within annulus 2 are compared to the statistics for annulus 2.

Figure 9:
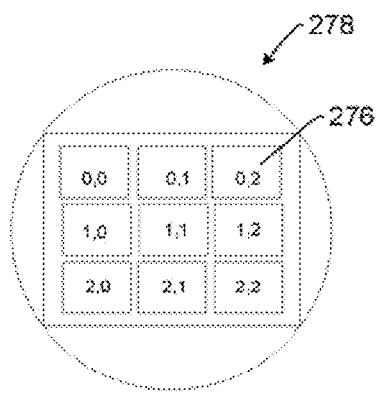
FIG. 9 is a schematic diagram illustrating a top view of one embodiment of an arrangement of dies printed on a wafer.
Figure 10:
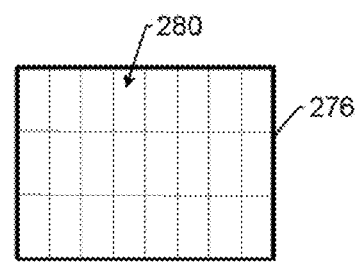
FIG. 10 is a schematic diagram illustrating a top view of an embodiment of inspection data acquired for a die printed on a wafer separated into frames.

More compact storage of the standard reference die may be enabled by storing the standard reference die data on a statistical basis (e.g., separate the die into frames, frames into different geometries (binned contexts) and for each frame/context, save the average/standard deviation of die-to-die differences). For example, as shown in step 248 of FIG. 4, the method may include saving per die per frame per context difference statistics with respect to the standard reference die. For example, as shown in FIG. 9, an arrangement of die [(0,0), (0,1), . . . (M,N)]276 may be formed on wafer 278. In addition, as shown in FIG. 10, die 276 may be separated into frames 280. The die may be separated into frames 280, and the pixels of each frame may be separated based on context (not shown in FIG. 10). Difference statistics for each different context of each frame in each die may be determined as described herein.

Figure 11:
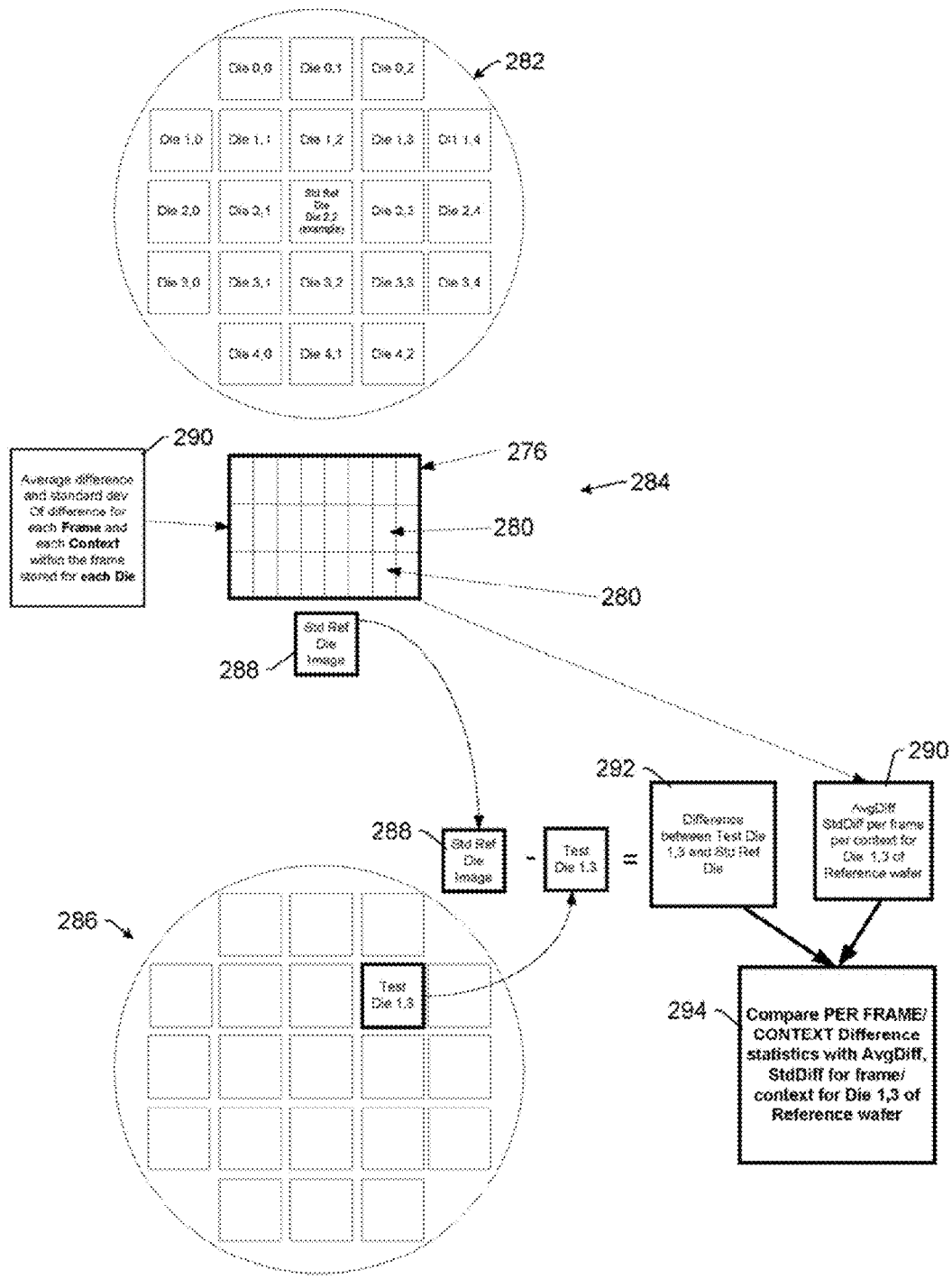
FIG. 11 is a schematic diagram illustrating an additional embodiment of a computer-implemented method for performing a wafer-to-wafer comparison.

FIG. 11 illustrates one embodiment of a method for performing a wafer-to-wafer comparison using difference frame statistics sorted by context. As shown in FIG. 11, reference wafer 282 includes a number of dies [(0,0), (0,1) . . . (4,2)], one of which (e.g., die (2,2)) is designated as the standard reference die. Reference 284 that is used for comparison to test wafer 286 includes die 276 separated into frames 280 and standard reference die image 288. Frames 280 may be configured as described above. Reference 284 may be generated by determining statistics 290 such as an average and standard deviation of the difference for each frame and each context within each frame for each die. To detect defects on test wafer 286, the test wafer is compared to reference 284. For instance, to detect defects in test die (1,3), test die (1,3) is subtracted from standard reference die image 288 to generate difference 292 between the test die and the standard reference die image. In step 294, difference 292 is compared with statistics 290 (e.g., average and standard deviation of the difference for each frame and context) for die (1,3) of reference wafer 282 on a per frame per context basis.

If the "standard reference die" is not known to be defect free, single arbitration (in which defect detection can be performed using one comparison with a reference die that is truly defect free) can be performed using a "polishing" scheme. In addition, "polishing" may be performed such that a standard reference wafer reflects image variations expected across the wafer due to "inherent" or expected process variations. Therefore, to generate a "defect free" reference wafer, standard reference die "polishing" may be performed for every die on the reference wafer.

Table 1 below shows the approximate size of the reference data for various wafer-to-wafer comparisons described above assuming a maximum die size of 40 mm by 40 mm, a smallest inspection pixel size of 90 nm, the number of maximum size die on the wafer of 44, the number of pixels in the maximum size die of 1.975E+11, a frame size of 512×512 pixels, a frames per maximum size die of 7.535E+05, the bytes to store average difference and standard deviation of difference of 2, the pixels per swath of maximum size die of 0.91 Gpixels, the swaths per maximum size die of 217, and a 2048 pixel high swath. The standard reference die includes 197 Gpixels or 0.91 Gpixels per swath assuming a 2K high sensor. In addition, the difference image for each die on the reference wafer or some compressed form thereof has to be stored.

TABLE 1

| Method | Data Size (Gbytes) |
| --- | --- |
| Difference image stored (no compression) | 8727.8 |
| Difference image at 0.1% of total pixels | 8.7 |
| Per pixel sector-based stats: 8 sectors | 3160.5 |
| Per pixel ring-based stats: 8 annular rings | 3160.5 |
| Per pixel sector + ring-based stats: 8 sectors, 8 rings | 6321.0 |
| Frame-based stats: 512 × 512 frames | 0.0666 |
| Frame + context-based stats: 8 contexts/frame | 0.5327 |

Table 1 clearly shows that data size for storing the difference image is much larger than the data size for storing frame and context-based statistics per die. However, saving a fraction of the difference pixels (e.g., 0.1%) having the largest difference and those in critical areas reduces the data size requirement from 8727.8 Gbytes for the difference image to 8.7 Gbytes.

Figure 12:
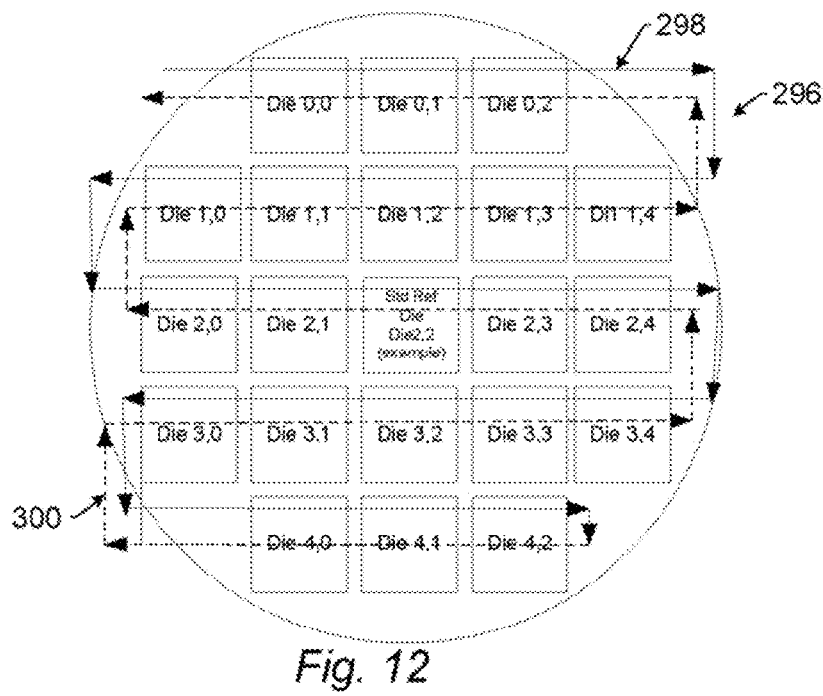
FIG. 12 is a schematic diagram illustrating a top view of one embodiment of an arrangement of dies printed on a wafer and a scan path on the wafer.

The dies on a test wafer may be scanned a number of times using a serpentine scan path to generate a number of swaths of inspection data. One embodiment of such a serpentine scan is shown in FIG. 12. As shown in FIG. 12, test wafer 296 includes an arrangement of dies [(0,0), (0,1) . . . (4,2)]. Test wafer 296 is scanned by serpentine scan 298 and serpentine scan 300. Although two serpentine scans are shown in FIG. 12, it is to be understood that the test wafer may be scanned using any suitable number of times. Assuming 217 swaths per die and performing the same serpentine scan in all die rows, one can load the standard reference die swath and the compressed difference for all dies for swath 1, then swath 2, etc. In this case, the memory requirements for storing reference data for a test wafer scan is (197+8.7)/217=0.95 Gpixels per swath.

One consideration in the implementation of standard reference die-to-die inspection is the disk input/output (I/O) speed and if the speed will impact throughput. Disk I/O traffic can be reduced by loading each swath of the "standard reference die" once. Such loading can be used with serpentine scanning across the whole wafer with die level stepping between wafer scans (vs. serpentine pattern of adjacent wafer scans).

Of course, for all of the inspection modes described herein, inspection may be performed using one image stored on a disk vs. another image stored on the disk or using images in memory that were just acquired from a wafer in real time. All of the data described above may be stored or saved as described further herein, and all of the storing or saving steps described herein may be performed in any manner described herein.

As described above, determining the position of the inspection data in design data space may be performed subsequent to inspection of the wafer. In one such embodiment, determining the position of the inspection data in design data space is performed for portions of the inspection data corresponding to defects detected on the wafer and not for portions of the inspection data that do not correspond to defects detected on the wafer. In this manner, the mapping transformation from pixel or wafer space to design data space may be applied only to the locations at which defects are found. In other words, the method may include post-process mapping of defects detected on a wafer to design data space. In addition, the alignment sites in each die may be identified during inspection although the alignment (e.g., alignment error measurements) may be performed after the defect detection is complete in a post-processing phase. The mapping is then applied to find the positions of the defects in the design data space.

Regardless of when or how the determining position of the inspection data in design data space is performed, if one or more defects are present on the wafer, the inspection data includes data for a defect or defects on the wafer. Therefore, the positions of one or more defects in design data space can be determined from the position of the inspection data in design data space. In addition, the positions of one or more defects in design data space can be advantageously determined with the same, substantially high (e.g., sub-pixel) accuracy as the position of the inspection data in design data space.

As described further herein, in some embodiments, the inspection data may be acquired in swaths by scanning the wafer. In one such embodiment, each swath of the inspection data may be individually aligned to the design data space by aligning data for alignment sites in each swath with data for predetermined alignment sites, which may be performed as described above.

In a different embodiment, determining the position of the inspection data includes determining the position of a swath of the inspection data in the design data space based on positions of the alignment sites in design data space and determining the position of an additional swath of the inspection data in design data space based on the position of the swath in the design data space. In this manner, one swath of inspection data may be aligned to the design data space as described above (e.g., by aligning data for the alignment sites on the wafer in a swath of the inspection data with the data for the predetermined alignment sites, and additional swaths of inspection data may be aligned to this swath of inspection data.

Figure 13:
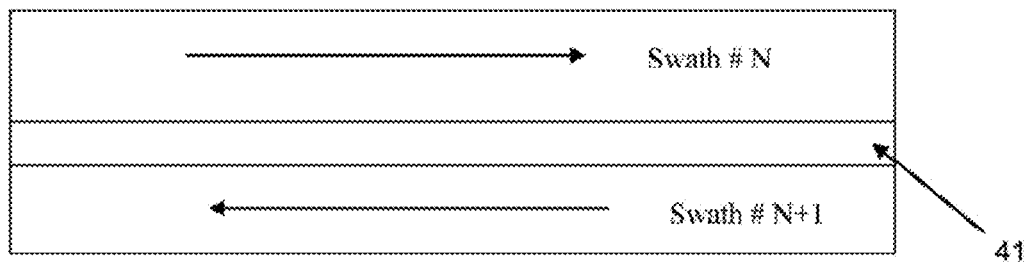
FIG. 13 is a schematic diagram illustrating a top view of consecutive swaths of inspection data acquired for a wafer.
Figure 14:
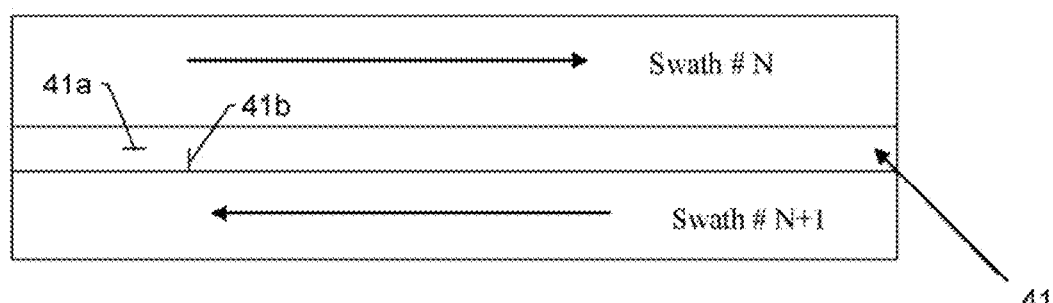
FIG. 14 is a schematic diagram illustrating a top view of consecutive swaths of inspection data acquired for a wafer and alignment sites selected by the computer-implemented method for determining the position of swath (N+1) with respect to swath N using data in a swath overlap region.

For example, as shown in FIG. 13, a swath (e.g., swath #N+1) may be aligned to the previous swath (e.g., swath #N) using inter-swath image alignment. In particular, as shown in FIG. 13, swaths #N+1 and #N partially overlap with each other in area 41 in wafer space. Therefore, both swaths will contain inspection data for the features formed within area 41. As such, the inspection data for these features may be used to align one swath to another. In one such example, FIG. 14 illustrates features 41a and 41b formed in inter-swath overlap area 41 in wafer space in which inspection data for two successive scans overlap. Features 41a and 41b can be used for performing swath-to-swath registration. Features 41a and 41b may be further configured as described herein with respect to other alignment features.

In this manner, if the first swath for a die row has been aligned to design data space by aligning data for an alignment site (or sites) in the die row to rendered images from the design database or other predetermined alignment site data described herein, subsequent swaths of the die row can be aligned using the technique described herein. In particular, using the position of swath #N with respect to design data space and the position of the alignment features within the swath, the position of swath #N+1 with respect to design data space may be determined. For example, determining the position of swath #N+1 may be performed by storing the alignment feature image acquired during the swath #N acquisition scan, and then aligning the alignment feature image to the image of the same feature acquired during the acquisition of swath #N+1. By determining the misalignment offset between the two alignment features images, the absolute position of swath #N+1 with respect to design data space may be determined.

During the setup of an inspection recipe, the wafer can be scanned with a relatively large overlap between consecutive swaths (e.g. 50% overlap) to determine suitable alignment sites in the inter-swath overlap regions. Using these site positions, the position of each swath with respect to the corresponding previous swath may be determined. Using the position of the first swath with respect to design data space using the above-described method for aligning a predetermined alignment site to an alignment site on the wafer and the shift of the second swath with respect to the first determined using an alignment site in the overlap area between the first and second swaths, the absolute position of the second swath with respect to the design data space may be determined. By repeating this procedure for each subsequent swath, the pixels for an entire die may be mapped to design data space.

Then, suitable alignment sites can be selected (using the above described methods) such that there is at least one such site in each inspection swath (i.e. the swath used during inspection in which the overlap between swaths is the minimum overlap to ensure that the die is fully scanned). The positions of these alignment sites in design data space are saved in the inspection recipe along with patch images of each alignment site. During inspection, for each swath, the corresponding alignment site is retrieved from the recipe and its position is determined in the pixel stream acquired by the inspection system. Once the alignment site has been located in the pixel stream, using cross-correlation or other image matching techniques, positions of pixels in the inspection swath can be determined in the design data coordinate space to sub-pixel accuracy. One advantage of this method is that the inspection swaths can be acquired with relatively small overlap (thus improving speed), while the setup swaths (which are used only for recipe setup) are acquired with relatively large overlap to perform the swath "stitching" used to map pixels for the entire die to the design data coordinate space and find suitable alignment sites in this space that occur in each inspection swath. It should be noted the technique of stitching swaths can be applied to a different scanning pattern, for example, a field by field acquisition using an area sensor. Fields may be stitched together in a manner similar to that described above.

Another advantage of the above-described embodiment over aligning each swath with respect to the design data space is that this scheme requires data for fewer alignment sites to be rendered from the design data. In addition, rendering data for alignment sites faithfully from design data may pose challenges due to the complexity of the models that can be used to predict how a given feature will be printed on a wafer, particularly when the wafer has multiple layers formed thereon. However, as noted above, the data for the predetermined alignment sites may be acquired in a number of different manners, which may be selected based on the layer being inspected thereby providing suitable data for the predetermined alignment sites regardless of the layer being inspected.

Figure 14A:
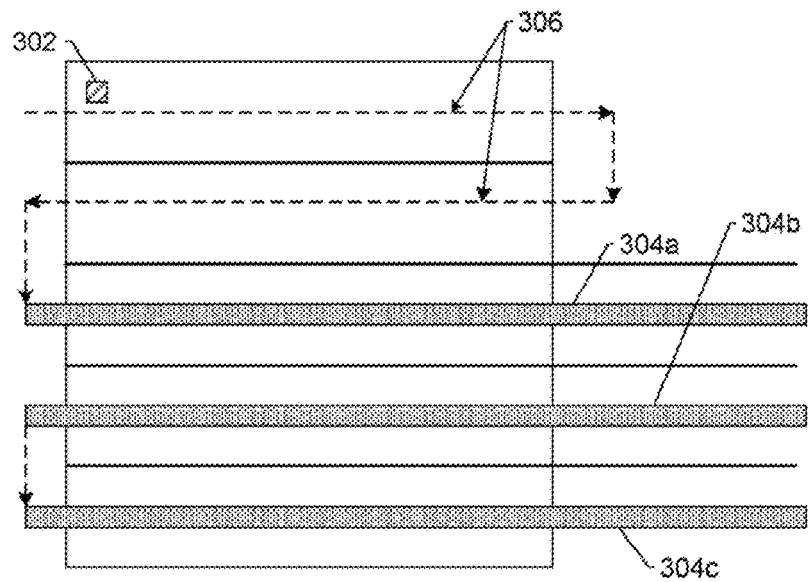
FIG. 14a is a schematic diagram illustrating a top view of one embodiment of different swaths of inspection data acquired for a wafer on which an alignment site is spaced relatively far away from the first inspection swath.

As described above, swath stitching using "short swaths" in coverage mode may be used to align inspection data to the design data. In some embodiments, however, as shown in FIG. 14a, alignment site 302 may be located on the wafer spaced from (e.g., far away from) the area on the wafer corresponding to first inspection swath 304a. This situation can occur when the only suitable alignment site is separated from the area of the wafer scanned for the first inspection swath. The location of the first inspection swath may be determined from the care area definition (e.g., care areas automatically defined or defined by a user). In such a situation, the methods or systems described herein can perform a series of "mini-scans" 306 on the wafer, each one die wide as shown in FIG. 14a. The swaths acquired by the mini-scans are used to "stitch" the swath containing the alignment site with the first inspection swath 304a using the inter-swath alignment methods described above. Subsequent inspection swaths 304b and 304c may then be aligned to first inspection swath 304a as described further above.

Figure 14B:
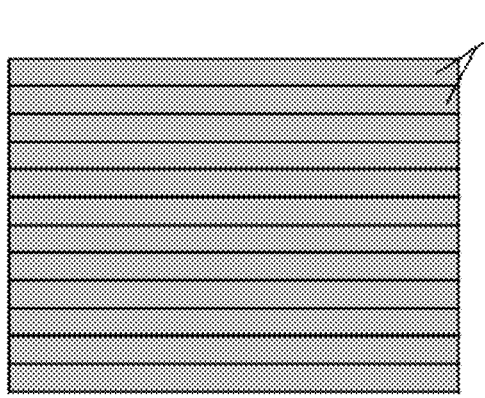
FIGS. 14b-14d are schematic diagrams illustrating top views of various embodiments of different swaths of inspection data acquired for a wafer.
Figure 14C:
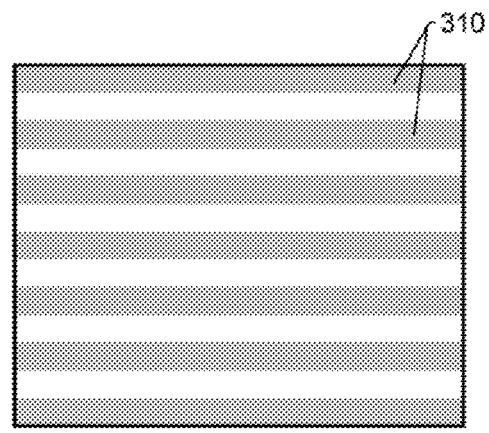
Figure 14D:
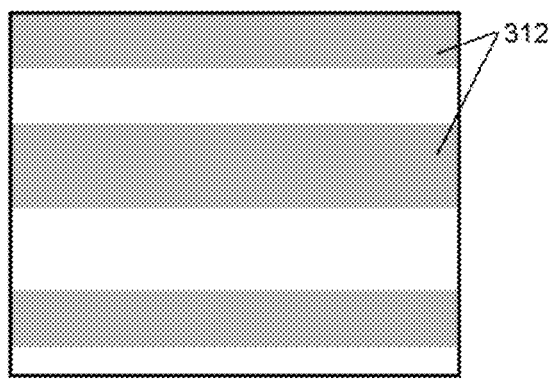

The methods and systems described herein may acquire inspection swaths for a wafer in a number of different manners. For example, as shown in FIG. 14b, the system may acquire inspection swaths 308 for the wafer in a 100% inspection mode. In particular, the system scans the wafer back and forth to acquire overlapping swaths that can be used to inspect 100% of the die area. In another example, as shown in FIG. 14c, the system may acquire inspection swaths 310 for the wafer in a standard coverage mode. In this coverage mode, the area on the wafer for which the swaths were acquired may be about 25% to about 50% of the die area. The swaths shown in FIG. 14c correspond to 50% coverage mode in which alternating swaths are used for inspection. In a different example, as shown in FIG. 14d, the system may acquire inspection swaths 312 for the wafer in a "smart scanning" mode. In this mode, about 50% of the die area may be scanned, and the areas that are scanned may be selected based on information about the design or an anticipated interaction between design and process. In addition, the systems described herein may be configured to perform any of the various scanning methods described above (e.g., different scanning methods for different wafers). Furthermore, the methods described herein (or a design analysis tool) may include using knowledge of the inspection system (e.g., scanning capability) to determine an optimum "coverage" scheme for a wafer.

In another embodiment, the method may include aligning inspection data to the design data and then using die relative design data space coordinates determined by this aligning step to transform coordinates of additional inspection data to design data space coordinates. The transformation may be performed based on user input or by extracting the relevant information from the appropriate design files and/or process recipes (stepper recipes). An alternative approach for determining the transformation without input from the user may include aligning (e.g., overlaying) the inspection data to the design data by manually selecting alignment sites or by using an algorithmic overlay optimization approach. It is noted that this is a die alignment technique. The wafer alignment technique may not be performed if die relative coordinates are used (i.e., if the inspection system already accurately knows where the alignment site is for each die).

The methods described herein may or may not include acquiring the inspection data by performing inspection of a wafer. In other words, the methods described herein may be performed by a system (such as a system described further herein) that does not include an optical or electron beam inspection subsystem. Instead, the system may be configured as a "stand-alone" system that is configured to receive the inspection data from the inspection system. In this manner, the stand-alone system may acquire the inspection data from the inspection system. The stand-alone system may acquire the inspection data in any manner known in the art (e.g., via a transmission medium that may include "wired" and/or "wireless" portions). Alternatively, the method may be performed by a system that includes an inspection system. In this manner, the inspection system may form part of the system, and the inspection data may be acquired by the system by performing inspection of the wafer. In addition, regardless of the manner in which the inspection data is acquired, the methods described herein may be performed using any type of inspection data known in the art in any format known in the art. The inspection data may include data for a defect or defects detected on the wafer. In another example, in one embodiment, the inspection data is acquired for PWQ, which is described further herein.

The methods described herein can be advantageously used to correlate inspection space to design data space coordinates with relatively high precision, and such a correlation may be used in a number of steps as described further herein. For example, the position of the inspection data in design data space may be advantageously used to determine if the inspection data corresponds to care areas or non-care areas on the wafer, and the inspection process may be performed based on the type of area corresponding to the inspection data or different portions of the inspection data. For example, by shifting the raw image data with respect to the inspection care areas so that the care areas are substantially exactly aligned to predetermined features in the design or CAD database for all points across the die, the methods and systems described herein may generate substantially precise care areas such that inspection may be performed only at critical locations on the die such as via locations while non-critical areas such as CMP pattern fill areas can be ignored. These critical locations, or "where to inspect" areas, may be input at recipe setup and may be determined by "hot spot" analysis performed using results of CAD DRC, DFM analysis such as Design Scan and/or PWQ analysis, electrical test, FA, or some combination thereof.

For example, in some embodiments, the methods described herein include translating design data and information about the design data such as care areas stored in standard EDA layout format (e.g., GDSII, OASIS, etc.) generated from layout analysis software tools into a format that can be used by an inspection system. In this manner, the method may include transferring care area information from design tools to an inspection system. For instance, a translator module (not shown) may be configured to generate inspection care areas from a standard design format such as GDS or OASIS. Therefore, files in such a design format include not the design but the resulting polygons from design analysis performed by EDA tools. The translator module, therefore, allows efficient translation between the two spaces (i.e., design and inspection).

In another embodiment, the method includes determining a position of a defect detected on the wafer in the design data space based on the position of the inspection data in the design data space, which may be performed as described herein, and determining values for one or more attributes of design data corresponding to the position of the defect using a data structure in which predetermined values for the one or more attributes of the design data are stored as a function of position in the design data space. In this manner, the values for the one or more attributes of the design data corresponding to the position of the defect may be determined from persistent previously extracted design layout attribute data. In other words, the values for the design data attribute(s) corresponding to the defect position may be determined from attributes that have been previously calculated based on the geometry of the design, for example, by determining values for the one or more attributes from polygons in the geometry (e.g., as a function of geometrical operations on the polygons). In this manner, the design can be processed at the polygon level, and values of any attributes at the polygon level that can be determined may be stored in the data structure. As such, the data structure may include "a superset" of data for the values of the one or more attributes of the design data stored in a data structure. The predetermined values for the one or more attributes of the design data as a function of position in the design data space may be generated using an EDA layout analysis tool or any other method or system known in the art. In this manner, the design may be pre-processed to determine values of the one or more attributes of the design data as a function of position across the design data space, and the values for the one or more attributes may be determined on a defect-by-defect basis by looking up values of the one or more attributes in the data structure "on the fly" using the defect positions in design data space. The data structure in which the predetermined values are stored as a function of design data space position may include any suitable data structure known in the art. In a similar manner, the data structure may include predetermined values for one or more attributes of a design layout for the design, one or more attributes of a floor plan of the design, one or more attributes of cells in the design, any other information about the design, or some combination thereof as a function of position in the design data space.

In one embodiment, the method includes determining a sensitivity for detecting defects on different portions of the wafer, as shown in step 18 of FIG. 1. In one such embodiment, the method includes determining a sensitivity for detecting defects on different portions of the wafer based on the position of the inspection data in the design data space and one or more attributes of design data in the design data space. In such an embodiment, the method may include performing design based inspection by transferring care area information from design tools to an inspection system. For example, the care area information may be used to identify the different portions on the wafer and the sensitivity to be used to detect defects in the different portions. As such, the one or more attributes of the design data may include the care area information. However, the one or more attributes of the design data may also or alternatively include any of the attribute(s) of the design data described herein.

The data preparation phase may include creating or acquiring data for one or more attributes of the design data. The one or more attributes of the design data used to determine the sensitivity for detecting defects on different portions of the wafer may include process or yield information associated with design data. For example, in one embodiment, the one or more attributes of the design data are selected based on one or more attributes of previously acquired inspection data for the wafer, other wafers, or some combination thereof for the design data, different design data, or some combination thereof for a process layer for which the inspection data for the wafer was acquired, for different process layers, or some combination thereof. In this manner, the one or more attributes of the design data in the design data space used to determine the sensitivity for detecting defects on different portions of the wafer may be selected based on a correlation to attributes of previously collected inspection data from the same wafer or different wafers on the same or different designs on the same or different process layers. The previously collected inspection data may be stored in a data structure such as a fab database or any other suitable database, file, etc. or may be included in a knowledge base, which may be configured as described herein. In this manner, the one or more attributes of the design data may be selected in this embodiment based on cumulative learning, historical data, or a training set of data.

In another embodiment, the one or more attributes of the design data are selected based on yield criticality of defects previously detected in the different portions, fault probability of the defects previously detected in the portions, or some combination thereof. In this manner, the sensitivity for detecting the defects may be based at least in part on one or more attributes of the design data that are selected based on the yield criticality and/or fault probability of defects detected in the different portions. The process or yield criticality information may include, for example, critical defects determined by PWQ, locations of defects of interest (DOI) based on hot spots (e.g., determined from inspection), hot spot information determined from logical bitmaps, a KP value determined from test results for a defect detected at a hot spot, any other process or yield information described herein, or some combination thereof. The KP value may be determined as described further herein. In addition, the fault probability may be determined in a manner similar to that described herein for determining the KP value for defects. The yield criticality value may be determined in a manner similar to that described further herein for determining the yield relevancy of defects.

Data for the one or more attributes of the design data may also be referred to as "context" data that defines geometrical areas in the device design that have different values of one or more attributes (e.g., type(s) of features within the areas such as contact areas or dummy fill areas, "where to inspect" information or "care areas," "critical" areas in which a process failure is possible, or some combination thereof). The term context data is used interchangeably herein with the terms "context information" and "context map." The context information may be acquired from a variety of sources including simulation, modeling, and/or analysis software products that are commercially available from KLA-Tencor, other software such as DRC software, or some combination thereof. Furthermore, additional context data may be determined and combined with data for the attribute(s) of the design data. A data structure such as a database or file including the design data and/or the context data may have any suitable format known in the art.

Determining the sensitivity as described above may be performed such that defects detected in different portions of the wafer corresponding to design data having different values of the one or more attributes of the design data are detected with different sensitivity. In this manner, the method may also include determining, identifying, and/or selecting the different portions based on the values of the one or more design data attributes as a function of design data space position. The dimensions of all, some, or none of the different portions may be different and may vary depending on the resolution at which the values of the attribute(s) of the design data are available or are acquired. For example, if a context map is used to determine the sensitivity for the different portions as described further herein, the dimensions of the different portions may vary depending on the resolution of the context map.

In one such embodiment, the sensitivity is determined based on the position of the inspection data in the design data space and a context map, which as described further herein may include values for one or more attributes of design data across the design data space. For example, the method may include using the context map to define relatively high sensitivity regions in a die on the wafer for critical regions and variable sensitivity regions based on criticality of context. In one example, segments of the design data may be defined to isolate dense arrays and logic, open areas, and grainy metal. A combination of image gray level and context may also be used to define one or more segments in the design data. For example, pixels having an intermediate gray level may be combined in one segment. The image gray levels may be determined using a simulated image or an image acquired by the inspection system or other image acquisition system.

In some embodiments, determining the sensitivity for detecting the defects on different portions of the wafer based on the position of the inspection data in the design data space and a context map is performed by the inspection system during inspection of the wafer. For example, the context map may be used by the inspection system as described herein when inspecting a wafer. In another embodiment, determining the sensitivity for detecting the defects on different portions of the wafer based on the position of the inspection data in the design data space and a context map is performed by the inspection system after acquisition of the inspection data for the wafer has been completed. For example, the context map may be used by the inspection system as described above after the inspection data is available offline. In both of these embodiments, the method may use the context map to automatically define dummy areas (do not inspect regions) of the die on the wafer and to define coarse regions of the die for which different sensitivity thresholds are to be used. For example, the context map (e.g., a context map that defines dummy fill areas) may be used to automatically define do not care regions which require no inspection and can therefore be excluded for purposes of defect detection. Such regions are typically less well controlled and therefore produce a relatively large amount of noise (when comparing die-to-die). Therefore, excluding such regions may increase the overall S/N of inspection.

In one embodiment, determining the sensitivity for detecting defects on different portions of the wafer based on the position of the inspection data in design data space and a context map includes determining sensitivity thresholds used with the inspection data to detect the defects on the different portions of the wafer. In this manner, the sensitivity may be altered from region-to-region by altering one or more thresholds used for defect detection, which is analogous to segmented automatic threshold (SAT) methods. For example, low threshold (high sensitivity) detection can be used for critical regions, and high threshold (low sensitivity) detection can be used for non-critical regions. By segmenting the design data and varying the threshold(s) used for defect detection based on one or more attributes of the design data, the overall sensitivity of the inspection process can be increased. Therefore, the methods and systems described herein provide improved defect detection.

The method may also include using the context map described above to perform a number of different steps. For example, the context map (regardless of whether die-to-die inspection mode, standard reference die-to-die inspection mode, etc. is used for defect detection) may be used to perform a variety of steps such as, but not limited to, determining sensitivity, filtering nuisance defects, classifying defects, and generating a review sample for either online or offline review. To use design or contextual information as described further herein, the absolute location of an image pixel or other inspection data acquired (e.g., by scanning a wafer) during an inspection process is determined in design data space (e.g., design database coordinates). Mapping of the inspection data to the design data space to within half of the inspection pixel size allows for substantially accurate setting of detection thresholds (by substantially accurately separating critical from non-critical areas), filtering of nuisance defects from actual defects, and any other steps, which may be performed as described further herein.

In addition, relatively high bandwidth, pixel-level context information may be used with the substantially highly precise mapping of inspection space to design space coordinates for a wide range of applications. For example, a relatively high resolution context map may be used to automatically define pixel-level regions that can be inspected with different sensitivities. Relatively high resolution context as described herein is generally more accurate than user-defined region based multi-thresholds (RBMT) which are relatively coarse (e.g., about 50 μm by about 50 μm) and inaccurate due to ambiguity in the care area border (e.g., a border uncertainty having a spread of about 5 μm or more).

In one embodiment, the context map can be used at the pixel level to control the detection sensitivity at each pixel. However, a simpler approach (from a system complexity point of view) is to use the context map only for post-processing of defects detected using a detection method that does not detect defects using context information. In this manner, the mapping of inspection or wafer space to the design data space may be applied only to inspection data corresponding to detected defects. As described above for die-to-die and standard reference die-to-die inspection, the position of a defect is determined in design data space. Subsequently, a patch image of the design data at the position of the defect in design data space can be acquired, and this patch image may be used to determine design context corresponding to the defect. Alternatively, a context map aligned to the design data may be used to determine the design data context corresponding to the defect based on the position of the defect in design data space.

For standard reference die-to-die inspection, determining the context of each pixel in the inspection data may include determining the context of each standard reference die pixel. Since the standard reference die image is acquired during the recipe setup phase, the method may include aligning data for alignment sites (selected as described above) in the standard reference die image with data for the predetermined alignment sites and performing a mapping transformation to determine the location of each standard reference die pixel in design data space. These steps may also be performed during the recipe setup phase. In addition, the standard reference die may be mapped to the context data based on mapping of the standard reference die to design data space, and the standard reference die pixels along with the context corresponding to each pixel may be stored offline and provided to or acquired by the inspection system during inspection. This processing can be performed offline and may be performed only once during the recipe setup phase.

In one such embodiment, each standard reference die pixel may be associated ("tagged") with context information. In this manner, the context information may be "attached" to the standard reference die pixels. In one example, if there are 16 different possible contexts, a 4 bit tag can be attached to each pixel. Alternatively, the context data may be compressed using a suitable compression algorithm or method, or the context data may be represented in polygonal form. In this manner, during inspection both the standard reference die pixel data and the mapped (transformed) context data associated with the standard reference die pixel data may be provided to or acquired by the image computer or other process of the inspection system. Therefore, the context corresponding to inspection data pixels may be determined based on the context information of the corresponding pixels in the standard reference die image. As such, the context information corresponding to the inspection data pixels will be available for defect detection and classification (and/or binning) applications, which may be performed as described further herein.

In another embodiment, the method may use the context map at any resolution to assist in wafer inspection. For instance, a variable resolution context map may be used to assist in wafer inspection and binning of defects. The resolution of the context map may vary depending on, for example, the accuracy with which the live pixel stream can be aligned to the design data and the accuracy requirements of the application. The context map at different resolutions may be represented in a number of different ways. For example, an absolute (i.e., to many decimal places in microns) representation of the context map in a polygonal format can be rendered internal to the inspection system at the appropriate pixel size to produce a pixel level context map. Additionally, or alternatively, a coarse context map may include context for relatively coarse regions having lateral dimensions of, for example, about 1 µm×about 1 µm. The coarse regions may form "tiles" that separate the design data. Context data such as feature type (e.g., dummy features, contacts, line ends), feature attributes (e.g., the minimum line widths/spaces between geometries, etc.), or some combination thereof may be associated with each tile.

In one embodiment, the method includes generating a relatively high resolution context map using the location and attribute information for a design that may be acquired from any software program that can be used to analyze the design for critical regions and possible design rule violations. Such a context map may be generated using analysis software that is commercially available from KLA-Tencor (such as Design Scan) or other software such as DRC software that generates a list of locations and some attributes (or labels) of each location that can be converted into a format for use by inspection, metrology, or review systems.

In another embodiment, the method includes generating a relatively low resolution, coarse context map by extracting feature vectors from a CAD layout and using unsupervised clustering to define equivalent context groups. For example, a method for generating a relatively coarse context map (e.g., a map including about 1 µm×about 1 µm regions or tiles) may include processing the CAD layout file, rendering or analyzing these tiles, and extracting certain attributes or feature vectors for each tile. For each region, multiple features may be extracted from a predefined feature set. The value of each feature is its feature vector. The feature vectors for each region can be combined into a series of feature vectors that can be used to determine the similarity of the regions by evaluating clustering in feature space. These feature vectors (one or more vectors per tile) can be clustered in feature space using any unsupervised clustering algorithm and/or method known in the art that can be used to find clusters of vectors (i.e., tiles that have similar attributes). Examples of such algorithms and methods that can be used in the methods described herein are illustrated in U.S. Pat. No. 6,104,835 to Han, which is incorporated by reference as if fully set forth herein. Each such cluster can then be assigned a unique context code or identity. A map of the die in which each tile is represented by this code or identity can then be used by the inspection system as described further herein.

In a different embodiment, the method may include generating a relatively low resolution, coarse context map by rendering CAD layout patch images and cross-correlating the CAD layout patch images to identify equivalent context groups (which may be used for binning as described further herein). Another method for generating a context map (e.g., relatively a coarse context map) includes rendering the CAD layout file into patch images, separating the design data into the patch images, and identifying image cross-correlations between patch images such that the patch images that have a relatively high cross-correlation may be binned into groups of patch images corresponding to the same context type.

In some embodiments, the context data used in the methods described herein may include context data for more than one layer that is or will be formed on the wafer. For example, some defects may not be located in critical areas in the layer on which the defects were detected. However, these non-critical defects may be rendered critical if the defects are located in an area on the wafer in which a critical area in an overlying layer will be formed on the wafer. The context map used in any of the steps described herein may be a context map for multiple layers on the wafer.

In another embodiment, the method includes determining a sensitivity for detecting defects on different portions of the wafer based on the position of the inspection data in the design data space, one or more attributes of design data in the design data space, and one or more attributes of the inspection data. The attribute(s) of the design data used in this step may include any of the attribute(s) described herein. In one such embodiment, the one or more attributes of the inspection data include one or more image noise attributes, if defects were detected in the different portions, or some combination thereof. In this manner, the one or more attributes of the inspection data used in this embodiment may include image noise attributes and/or the detection or non-detection of defects in different regions of the inspection data. The attribute(s) of the inspection data used in this step may include any other attributes of the inspection data described herein. Determining the sensitivity in this embodiment may be performed for RBMT setup for the inspection process based on image noise correlated to design attributes. Determining the sensitivity in this embodiment may be further performed as described herein.

In another embodiment, the method includes altering one or more parameters for detecting defects on the wafer based on one or more attributes of schematic data for a design of a device being fabricated on the wafer, one or more attributes of expected electrical behavior of a physical layout for the device, or some combination thereof. In this manner, design schematic data attribute(s) and other electrical descriptions of the behavior expected of the physical design (layout) may be used to alter one or more parameters for detecting defects or any other parameters of the inspection process. For example, information about the critical and non-critical paths, active and non-active geometries, and other such information about the schematic data or expected electrical behavior of the physical design (layout) may be used to alter the sensitivity for detecting the defects, to determine which portions of the wafer in which defects are to be detected (e.g., the care areas and non-care areas), determining which portions of the inspection data are to be used for detecting defects (e.g., based on the correlation from wafer space to design data space), and altering any other one or more parameters of the inspection process.

In another example, defect capture rate and electrical behavior monitoring may be performed based on design/image context. For example, the electrical behavior may be monitored by performing electrical testing, FA, or any other testing or analysis known in the art or using results of such testing or analysis. The results of the electrical testing, FA, or other testing or analysis may be correlated to context information about the schematic data and the physical layout for the device. The monitored defect capture rate and the electrical behavior may be correlated to the design/image context to determine information about the defects detected on the wafers, information about the inspection process used to detect the defects, and information about the design. For example, results of monitoring the defect capture rate and the electrical behavior may be used to determine what type of defects are being detected on the wafer, which defects should be detected (e.g., in an online inspection process) but are not being detected, and weak points in the design. Such information may be used to alter the inspection process as described further herein.

In an additional embodiment, the method includes altering one or more parameters for detecting defects on the wafer using the inspection data based on one or more parameters of an electrical test process to be performed on the wafer. For example, one or more parameters for detecting defects on the wafer or any other parameters of the inspection process may be altered based on an electrical test definition associated to the relevant (physical) design data space. In this manner, the inspection process may be altered based on how electrical testing is performed. In one such example, the areas on the wafer that will be analyzed by the electrical test process may be determined based on the one or more parameters of the electrical test process, and the one or more parameters for detecting the defects or any other parameters of the inspection process may be altered such that defects in the areas on the wafer that will not be analyzed in the electrical test process may be inspected with adequate sensitivity.

In addition, the one or more parameters of the electrical test process and the positions of the defects in the design data space or wafer space may be used to identify defects that will not be tested by the electrical test process (or "electrical test escapes"). In one such example, the areas on the wafer that will be tested in the electrical test process and the positions of the defects on the wafer may be used to determine which defects will not be tested by the electrical test process. In another example, the areas in the design that will be tested in the electrical test process and the positions of the defects in design data space may be used to determine which defects will not be tested by the electrical test process. In a similar manner, the one or more parameters of the electrical test process and the positions of the defects in the design data space or wafer space may be used to separate or bin defects into different groups depending on whether the defects will or will not be tested by the electrical test process.

In wafer space, attributes of the design data and information about hot spots (e.g., information from a hot spot database) may be used to setup an inspection recipe in the monitoring phase. For example, care areas may be automatically defined in the monitoring phase in wafer space. The automatically defined care areas may include macro and micro care areas. The automatically defined care areas may also include do not care areas. In addition, the inspection recipe may be setup for automatically altering the sensitivity, filtering nuisance defects, enhancing capture of known systematic defects (e.g., enhancing sensitivity for hot spots or hot spot regions), and suppressing defect signals or data corresponding to cold spot regions. Furthermore, attributes of the design data and information about the hot spots may be used to setup the inspection recipe to better group, classify or bin defects and sample defects, which may include design data based binning using GDS (i.e., GDS pattern grouping) and/or GDS pattern grouping pareto, each of which may be performed as described herein.

In a further embodiment, the method includes periodically altering one or more parameters of an inspection process performed by the inspection system based on results of one or more steps of the method using a feedback control technique. In another embodiment, the method includes automatically altering one or more parameters of an inspection process performed by the inspection system based on results of one or more steps of the method using a feedback control technique. For example, the monitoring phase may include automatic process control (APC) for inspection processes that involves changing the inspection recipe or parameters based on previous metrology results perhaps in combination with prior knowledge of process zone differences. APC for metrology processes may be performed based on systematic defects, which may be identified according to any of the embodiments described herein, to determine locations at which measurements are to be performed in addition to the measurements that are to be performed in subsequent metrology. APC for test processes may be performed based on systematic defects, which may be identified according to any of the embodiments described herein, to determine locations at which testing is to be performed and the electrical parameters that are to be tested in subsequent electrical testing.

In an additional embodiment, the method includes generating a knowledge base using results of one or more steps of the method and generating an inspection process performed by the inspection system using the knowledge base. The knowledge base may be generated by storing one or more image attributes and/or one or more attributes of the design data in a suitable data structure. In addition, the knowledge base may include cumulative learning acquired by the inspection system that can be used to generate the inspection process. For example, for an inspection process, the knowledge base may be used to determine cumulative results of the inspection such as frequency of defect detection and percentage of detected defects that are nuisance defects, and such cumulative results may be used to determine additional information such as the probability that a defect is a nuisance defect.

Such a knowledge base may be used to generate the inspection process as described further herein. In this manner, the knowledge base may be used to generate new inspection recipes. In addition, the knowledge base may be used to generate the inspection process for recipe setup and/or waferless recipe setup. Generating the inspection process may include selecting any one or more parameters of the inspection process. In addition, the knowledge base may be used to alter an inspection process by recipe optimization and automated recipe optimization. For example, the method may include using a feedback mechanism for training of the knowledge base for the periodic or automatic optimization of one or more parameters of an existing inspection process. Altering the inspection process may include altering any one or more parameters of the inspection process.

In another embodiment, the method includes optimizing a wafer inspection process for determining printability of a reticle defect on the wafer using the position of the inspection data in the design data space and a context map. In this manner, the method may include optimization of a wafer inspection process for purposes of determining the printability of defects detected on a reticle using CBI in combination with a context map. Optimizing the wafer inspection process may include altering any one or more parameters of the wafer inspection process, which may include any parameter(s) of any wafer inspection process(es) described herein. In general, determining the printability of a reticle defect on a wafer may include inspecting the wafer to detect defects on the wafer that may correspond to a defect on the reticle. In this manner, optimizing the wafer inspection process for determining printability of reticle defect(s) may include optimizing the wafer inspection process for detecting defects on the wafer that may correspond to a defect on the reticle.

In one example, the method may include using the position of the inspection data, acquired for the wafer, in design data space and the positions of one or more reticle defects in design data space, which may be determined as described herein, to identify portions of the inspection data that can be used to determine the printability of the reticle defect(s). In this manner, the design data space positions of the reticle defect(s) and the inspection data acquired for the wafer may be used to determine portions of the inspection data that can be used to detect defects on the wafer that may correspond to the reticle defect(s). Any of the attribute(s) of the design data included the context map may be used to select one or more parameters of the wafer inspection process for determining the printability of the reticle defects. For example, the context map may be used to determine one or more attributes of the design data corresponding to the portions of the inspection data identified as described above. In this manner, one or more parameters of the wafer inspection process used for different portions of the inspection data identified as described above may be selected based on the one or more attributes of the design data corresponding to the different portions. As such, different portions of the inspection data identified as described above, which correspond to design data having different values of the one or more attributes, may be processed with one or more different parameters to detect wafer defects that may correspond to the reticle defect(s). In one such example, the context map may be used to determine the criticality of the design data corresponding to different portions of the inspection data acquired for the wafer, which are identified as described above, and the criticality may be used to determine the sensitivity for detecting defects in the different portions of the inspection data. In one such particular example, different parameters of the wafer inspection process may be selected for different portions of the inspection data such that the printability of one or more reticle defects may be determined with higher accuracy in critical areas of the design data than in non-critical areas of the design data.

The one or more parameters of the wafer inspection process may also be altered and/or optimized based on the position of the inspection data in design data space, the context map, and any other information described herein. For example, one or more attributes of different portions of the design data in which one or more reticle defects were detected may be determined using a context map, and the one or more design data attributes of the different portions may be used in combination with one or more attributes of reticle inspection data (such as attributes of the one or more reticle defects) to select the wafer inspection process parameters for different portions of the inspection data corresponding to the different portions of the design data in which the reticle defect(s) were detected. In one such example, the one or more parameters of the wafer inspection process may be selected such that the printability of different types of reticle defects located in portions of the design data having substantially the same attribute(s) may be determined with one or more different parameters of the wafer inspection process. In another example, the one or more parameters of the wafer inspection process may be selected such that the printability of the same type of reticle defects located in portions of the design data having different values of the attribute(s) may be determined with one or more different parameters of the wafer inspection process.

The context map used in the embodiments described above for optimizing the wafer inspection process for determining printability of reticle defects may be configured as described herein and may include any of the context maps described herein. In addition, any of the information included in the context map may be used in the embodiments described above for altering one or more parameters of the wafer inspection process.

In some embodiments, the method includes altering one or more parameters of an electrical test process to be performed on the wafer based on defects detected on the wafer using the inspection data. For example, in test space, the monitoring phase may include using systematic defects identified according to any of the embodiments described herein to define or modify the test pattern and/or other test parameters. In addition, the defects detected on the wafer using the inspection data may be used to determine if one or more of the defects will not be tested by the electrical test process (or are "electrical test escapes") and to alter one or more parameters that define areas on the wafer at which the electrical test process is performed such that the one or more defects will be tested by the electrical test process. In this manner, the results of the inspection process may be fed forward to the electrical test process to reduce the number of defects that are not tested in the electrical test process. In addition, the one or more parameters of the electrical test process may be altered based on the defects detected on the wafer using the inspection data, positions of the defects in design data space, which may be determined as described herein, or wafer space, one or more attributes of the defects, which may include any attribute(s) of the defects described herein determined in any manner described herein, one or more attributes of the design data, which may include any attribute(s) of the design data described herein determined in any manner described herein, any other information described herein, or some combination thereof. For instance, the positions of the defects, the attribute(s) of the defects, and the attribute(s) of the design data may be used to determine a fault probability value for one or more of the defects as described herein. If the defects that will not be tested by the existing electrical test process have a relatively low fault probability value, then one or more parameters of the electrical test process may not be altered by the method. In contrast, if the defects that will not be tested by the existing electrical test process have a relatively high fault probability value, then one or more parameters of the electrical test process may be altered such that the defects having the relatively high fault probability value are tested by the electrical test process. In a similar manner, one or more parameters of a metrology process such as sampling of the metrology process may be selected, determined, or altered as described above.

Aligning the inspection data to the design data enables inspection of "hot spots" on the wafer. A "hot spot" may be generally defined as a location in the design data printed on the wafer at which a killer defect may be present. In contrast, a "cold spot" may be generally defined as a location in the design data printed on the wafer at which a nuisance defect may be present. One example of a nuisance defect is a variation in critical dimension (CD) of a feature that will not substantially affect the yield of the device formed on the wafer but causes the inspection system to indicate that there is a defect at that location. Some defects may be killer defects only under certain conditions such as if the defects are contacted by a device structure formed on another layer of the wafer. Therefore, the locations at which such defects may be present in the design data printed on the wafer may be generally referred to as "conditional hot spots."

In an additional embodiment, the method includes determining if defects detected on the wafer are nuisance defects, as shown in step 20 of FIG. 1. Whether or not a defect is a nuisance defect is determined based on the position of the inspection data in the design data space and one or more attributes of the design data. For example, in some embodiments, the method includes determining positions of the defects in the design data space based on the position of the inspection data in the design data space and determining if the defects are nuisance defects based on the positions of the defects in the design data space and one or more attributes of design data in the design data space. The one or more attributes of the design data used to identify nuisance defects in this step may include any of the attribute(s) described herein. For example, the one or more attributes of the design data may be defined in the context map. In this manner, the method may include applying the context map to defect data to filter (e.g., discard) defects considered not important (e.g., nuisance defects) in applications such as, but not limited to, PWQ. As such, portions of the design that are approaching the limits of the capabilities of the fabrication processes may be separated into portions that are critical and portions that are not critical based on the context. In another example, the attribute(s) of the design data used to identify nuisance defects in this step include hot spot information for the design data. In this manner, the positions of the defects in design data space and the hot spot information may be used to identify defects detected at cold spots in the design data as nuisance defects.

PWQ applications for lithography generally involve exposing dies on a wafer at different exposure dosages and focus offsets (i.e., at modulated dose and focus) and identifying systematic defects in the dies that can be used to determine areas of design weakness and to determine the process window. Examples of PWQ applications for lithography are illustrated in commonly assigned U.S. patent application Ser. No. 11/005,658 filed Dec. 7, 2004 by Wu et al., now U.S. Pat. No. 7,729,529 issued on Jun. 1, 2010, which is incorporated by reference as if fully set forth herein. Many artifacts of focus and exposure modulation can appear as defects (die-to-standard reference die differences), but are in fact nuisance defects. Examples of such artifacts may include CD variations and line-end pullbacks or shortening in regions in which these artifacts have no or little impact on yield or performance of the device. However, the position of a defect may be determined substantially accurately with respect to the design layout using the methods described herein. In addition, the methods described herein can be used to determine care areas with relatively high accuracy as described further above. These "micro" care areas can be centered on known hot spots and inspected with relatively high sensitivity or may be centered on known cold-spots (systematic nuisance) as don't care areas or areas inspected with relatively low sensitivity.

As described above, therefore, the method may include determining if a defect is a nuisance defect based on the position of the defect with respect to the design data space and whether or not that position is located in a care area. The defects may also be filtered depending on context, size, redundancy, PWQ "rules," or some combination thereof. For example, in process space, PWQ analysis and DOE analysis may be performed using hot spots in the monitoring phase. In addition, the methods described herein may be used to extend PWQ applications below 65 nm design rules at which currently used noise filters fail due to limited resolution. One advantage of the methods described herein is, therefore, that the methods can be used to extend BF inspection for detecting systematic and DFM defects. In particular, CBI as described herein may enable additional functionality for BF inspection systems such as systematic defect inspection and/or DFM applications at 65 nm design rules and below. The methods also provide or assist in making relatively quick determinations of the root cause of a DFM systematic defect. Determining the root cause may be performed as described further herein.

In another embodiment, the method includes determining if the defects not determined to be nuisance defects are systematic or random defects, as shown in step 22, based on one or more attributes of the design data in the design data space (which may be defined in the context map as described further above) or by comparing the positions of the defects to positions of hot spots, which may be stored in a data structure such as a list or database. In addition, all of the defects not of interest may not be nuisance defects. For instance, systematic defects that have relatively low or no yield impact may be defects not of interest and not nuisance defects. Such defects may appear on the active pattern or device area on the wafer. The methods described herein may include identifying such defects. Such defects, or defects located at cold spots, may be identified from the design context (e.g., redundant vias), modeling (e.g., DesignScan), PWQ, inspection and review, and defect correlation with test (e.g., relatively high stacked defect density at a location with relatively low stacked electrical fault locations, etc.). In addition, monitoring of these defects may be performed by comparing the positions of the defects with the positions of hot spots and cold spots. These defects may also be binned separately from other systematic defects using the design data based grouping methods described herein if the pattern in which these defects are located is common. Furthermore, discovery of the systematic defects may be performed by correlating multiple sources of input from design, modeled results, inspection results, metrology results, and test and FA results.

Systematic DOI may include all pattern dependent defect types. Identifying systematic defects is advantageous such that the impact that these defects will have on devices can be analyzed. Random DOI may include a statistical sample of critical types of random defects. Identifying random defects is advantageous since critical types of random defects can be analyzed to determine the impact that these defects will have on devices. In addition, by identifying the random defects, one or more inspection process parameters may be altered to suppress the detection of random defects that can be considered nuisance defects. Furthermore, the inspection process parameter(s) may be altered to distinguish nuisance defects from systematic causes (cold spots).

Determining if defects are nuisance, systematic, or random defects is also advantageous since yield can be predicted more accurately based on the types of defects that are detected on a wafer or wafers and the relevance to the yield that the different types of defects have. In addition, the results of the methods described herein, possibly in combination with the yield predictions, may be used to make one or more decisions regarding the design data and the manufacturing process. For example, the results of the methods described herein may be used to verify the IC design. In another example, the results of the methods described herein may be fed back to the IC design process such that the IC designs generated by the process may be susceptible to fewer systematic defects and/or fewer types of systematic defects. In one such example, the results of the methods described herein may be used to alter the design and/or optical rules used in the IC design process. In yet another example, the results of the methods described herein may be used to alter one or more parameters of a process or processes used to fabricate the wafer level being inspected. Preferably, the one or more parameters of the process(es) are altered such that fewer systematic defects and/or fewer types of systematic defects, and possibly fewer critical random defects and/or fewer types of critical random defects, are caused by the process(es).

In some embodiments, the method includes classifying one or more defects, as shown in step 24, based on the position of the inspection data in the design data space and one or more attributes of the design data in the design data space. For example, the position of the defect in design data space may be determined from the position of the inspection data in the design data space. In addition, one or more attributes of the design data associated with the position of the defect in the design data space may be determined from the context map or in any other manner described herein, and the one or more attributes associated with the position of the defect may be used to classify the defect. In another embodiment, the method includes classifying defects detected on different portions of the wafer based on the positions of portions of the inspection data corresponding to the defects in design data space and a context map, which as described further herein may include values for one or more attributes of design data across the design data space. In this manner, the method may use the context map to classify the defects by context. Classifying the defect(s) in this step may also be performed in any other manner described herein.

In one such embodiment, classifying the defects is performed by the inspection system during inspection of the wafer. For example, the context map may be used by the inspection system to classify defects as described herein when inspecting the wafer. In another such embodiment, classifying the defects is performed after acquisition of the inspection data for the wafer has been completed. For example, the context map may be used by the inspection system to classify defects as described herein subsequently after the inspection data is available offline. In this manner, the method may include using the context map to classify defects either online (e.g., using the inspection system) in a second pass high resolution defect classification (HRDC) or offline in HRDC (e.g., using a SEM review station). Typically, second pass defect classification, whether performed online by the inspection system or offline on a review system (optical or SEM), involves redetection of the defect and classification. Both redetection and classification may be performed manually by the user or automatically (i.e., automatic defect classification, ADC). As design rules shrink, the possibility of identifying the wrong object as the defect in the review process increases. The design data and context map can be useful for both redetection and classification.

For redetection, the context map provides local background information near the defect that allows a user or the system to position the correct defect in the field of view of the review system. For instance, a local image of a wafer generated by the review system may be aligned to the design data thereby allowing the position of the defect in design data space to be substantially accurately identified in the aligned local image. In addition, a simulated image of the design data (e.g., a gray scale image) may be used by the review system for alignment to the local image, and the position of the defect in the design data space may be used to determine the position of the defect in the local image. Such a simulated image may be used for redetection of the defect and fine alignment in the review process. Examples of such simulations are illustrated in U.S. Pat. No. 6,581,193 to McGhee et al., which is incorporated by reference as if fully set forth herein. The methods described herein may include any step(s) of the methods described in this patent. Therefore, the methods and systems described herein can be used to perform relatively highly accurate defect detection.

For classification, the context map may provide additional information that can be used (along with data acquired by review) to determine the class to which the defect belongs. Review may also be performed using the context map, the data acquired by review, and the inspection data. For example, patch images acquired by a time delay integration (TDI) camera of the inspection system and/or high resolution patch images acquired by the inspection system may be sent to review with the defect sample. The patch images may be used in combination with the context map for optical or SEM review and classification. In this manner, the coordinate accuracy with which defect positions can be determined as described further above enables the system to substantially accurately classify defects based on design context and/or DRC failure codes.

One or more of the steps described above may be performed in the monitoring phase in which systematic defects are identified and classified (or binned) using the inspection results and any other results described herein. The monitoring phase may include excursion monitoring and baseline improvement. The monitoring phase may be performed during product ramp and production. In multi-source space (which may involve a correlation between any of design, wafer, reticle, test, and process spaces), identifying and classifying systematic defects detected by inspection may use any combination of the steps described herein. In addition, one or more of the multi-source space steps may be used in any combination thereof to validate systematic defect identification.

In addition, the position of a defect in design data space may be combined with inspection data, design data, or classification data to identify systematic defects (e.g., defects located at hot spots or cold spots) in the monitoring phase. The identified hot spots may also be used to determine design context for inspection results where there is a "hit" at a hot spot location, which may be performed on-tool or off-tool in post-processing. The yield (or KP value) correlated to design data space may also be used as an attribute for monitoring systematic defects. In addition, one or more defect attributes may be used to infer association to a hot spot when there are multiple hot spot candidates.

In reticle space, the monitoring phase may include generating information about hot spots (e.g., creation of hot spot list(s)) that can be compared to inspection results to separate known systematic defects from random defects. In addition, one or more hot spot attributes such as context information for the hot spots may be used to determine if the hot spots can be shared across multiple technologies, layers, or devices, and if so, which technologies, layers, or devices. Furthermore, systematic defects identified by inspection may be used to define or modify one or more parameters of a metrology process such as the metrology site locations, measurements, or other parameters.

In some embodiments, the method includes determining a fault probability value for one or more defects detected on the wafer based on the position of the inspection data in the design data space and one or more attributes of design data in the design data space. In addition, the method may include determining a fault probability attribute value of detected defects on different portions of the wafer based on the position of the inspection data in design data space and one or more attributes of the design data in the design data space. The fault probability value for the defects may be determined based on the design data space position of the inspection data corresponding to the defects and one or more attributes of design data in the design data space as described further herein.

In another embodiment, the method includes determining coordinates of positions of defects detected on the wafer in the design data space based on the position of the inspection data in the design data space and translating the coordinates of the positions of the defects to design cell coordinates based on a floor plan for the design data. In this manner, the defect coordinates may be translated to design cell coordinates based on the floor plan of the chip design. In one such embodiment, the method includes determining different regions surrounding the defects using an overlay tolerance and performing defect repeater analysis using the regions for one or more cell types to determine if the one or more cell types are systematically defective cell types and to determine one or more locations of one or more systematically defective geometries within the systematically defective cell types. In this manner, the method may include using cell-based coordinates for repeater analysis. In particular, defect repeater analysis may be performed using an overlay tolerance (e.g., to define a two-dimensional region surrounding each defect) and for each cell type to determine the existence of systematically defective cell types and locations of systematically defective geometries within the cells. In addition, the method may include cell-based binning of the defects based on cell context. Such binning may be performed as described further herein. In one such embodiment, the method includes determining if spatially systematic defects occur in the systematically defective cell types based on one or more attributes of design data for cells, geometries, or some combination thereof located proximate to the systematically defective cell types. In this manner, the design contexts (surrounding cells or geometries) of the spatially systematically defective cells may be used as attributes to further characterize the occurrence of spatially systematic defects.

In another embodiment, the method includes binning the defects (e.g., all or some of the defects) into groups, as shown in step 26, based on the position of the inspection data in the design data space and one or more attributes of the design data in the design data space. For example, the positions of the defects in design data space may be determined from the position of the inspection data in the design data space as described herein. The one or more attributes of the design data used to bin the defects may then be determined based on the positions of the defects in design data space. The one or more attributes of the design data used in this embodiment may include any of the attribute(s) of the design data described herein such as values associated with the design data (e.g., yield impact) perhaps in combination with other inspection results (e.g., integrated defect organizer (iDO) results and integrated automatic defect classification (iADC) results). In addition, one or more attributes of the design data associated with the positions of the defects in the design data space may be determined from the context map. In this manner, the method may include applying the context map to defects detected during wafer inspection to sort defects into contexts.

The methods described herein may, therefore, include context-based background binning for wafer inspection. For instance, as described above, the method may use the context map to bin the defects by context. In one such example, the defects that remain after nuisance filtering may be sorted by context or any other information described above to identify defects that are systematic defects rather than random defects. Context may also be used in conjunction with other image-derived attributes associated with the defects to perform binning and sorting.

Furthermore, the defects may be binned based on the expected electrical parameters of the defects and/or the expected electrical parameters of the device features proximate the defect position in the design data space. The expected electrical parameters of the defects and the device features may be determined based on prior electrical testing, simulation of the electrical parameters of the defects, review of the defects, or some combination thereof. In addition, fault simulation for one or more defects may be based on the position of the defect(s) in the design data space and/or the group in which the defect(s) are binned.

In some embodiments, the method includes binning the defects into groups based on the position of the inspection data in the design data space, one or more attributes of design data in the design data space, and one or more attributes of reticle inspection data acquired for a reticle on which the design data is printed. In this manner, the reticle inspection data may be used as binning attributes. In particular, reticle inspection data attributes may be used in the binning of defects detected on a wafer. In this embodiment, the one or more attributes of the design data may include any of the attribute(s) of the design data described herein. The one or more attributes of the reticle inspection data may include any attributes of the reticle inspection data such as defects detected on the reticle, positions of defects detected on the reticle in reticle space, one or more attributes of the defects detected on the reticle, one or more attributes of the design data printed on the reticle, or some combination thereof. The one or more attributes of the defects detected on the reticle may include any of the defect attribute(s) described herein. In addition, the one or more attributes of the design data printed on the reticle may include any of the design data attribute(s) described herein.

The attribute(s) of the reticle inspection data may be determined in any suitable manner by the method and system embodiments described herein (e.g., by using output of a reticle inspection system). Alternatively, or in addition, the attribute(s) of the reticle inspection data may be acquired by the method and system embodiments described herein from a storage medium in which the attribute(s) are stored and/or from a reticle inspection system that determined the attribute(s).

Binning the defects based, at least in part, on the one or more attributes of the reticle inspection data may be used to separate defects based on whether the defects are caused by defects on the reticle, one or more attributes of the reticle defects that caused the defects on the wafer, and one or more attributes of the design data printed on the reticle, which may have caused defects on the wafer. As such, the binning results can provide additional information about the cause of the defects and/or how the reticle affects the defects and/or the design data printed on the wafer. Such binning results may be advantageously used to alter one or more parameters of a reticle manufacturing process, one or more parameters of a reticle inspection process, one or more parameters of a reticle defect review process, one or more parameters of a reticle repair process, one or more parameters of any other reticle- or design-related process, one or more parameters of any other process described herein, or some combination thereof. Binning the defects in this embodiment may also be performed based on the position of the inspection data in design data space, one or more attributes of the design data in design data space, one or more attributes of the reticle inspection data, and any other information described herein.

In another embodiment, the method includes binning the defects into groups based on the position of the inspection data in the design data space, one or more attributes of design data in the design data space, and one or more attributes of the inspection data. In this manner, one or more attributes derived from inspection data may be used in the binning calculations. In this embodiment, the one or more attributes of the design data may include any of the attribute(s) of the design data described herein. In addition, the one or more attributes of the inspection data used for binning may include any attribute(s) of the inspection data described herein. The defects may also be binned in this embodiment using any other information described herein. Binning in this embodiment may be performed as described further herein.

In an additional embodiment, the method includes binning the defects into groups based on the position of the inspection data in the design data space, one or more attributes of design data in the design data space, one or more attributes of the inspection data, and one or more attributes of reticle inspection data acquired for a reticle on which the design data is printed. In this manner, the reticle inspection data may be used as binning attributes. In particular, reticle inspection data attributes may be used in the binning of defects detected on a wafer. The one or more attributes of the design data in the design data space used for binning in this embodiment may include any of the attribute(s) of the design data described herein. The one or more attributes of the inspection data used for binning in this embodiment may include any of the attribute(s) of the inspection data described herein. The one or more attributes of the reticle inspection data used for binning in this embodiment may include any of the attribute(s) of the reticle inspection data described herein. Binning in this embodiment may be performed as described further herein. In addition, the binning results of this embodiment may be used to perform any step(s) of any method(s) described herein.

In some embodiments, the method includes binning the defects into groups based on the position of the inspection data in the design data space, one or more attributes of design data in the design data space, one or more attributes of the inspection data, and one or more attributes of previously acquired inspection data for the wafer, other wafers, or some combination thereof for the design data, different design data, or some combination thereof for a process layer for which the inspection data for the wafer was acquired, for different process layers, or some combination thereof. In this manner, attributes determined from previously collected inspection data for the same or different wafers, the same or different designs, and the same or different process layers may be included in the binning calculations. The previously collected inspection data may be stored in a data structure or may be included in a knowledge base, which may be configured as described herein. In this manner, the one or more attributes of the previously acquired inspection data may be determined from cumulative learning data, historical data, or a training set of data. In this embodiment, the one or more attributes of the design data may include any of the attribute(s) of the design data described herein. In addition, the one or more attributes of the inspection data used for binning may include any attribute(s) of the inspection data described herein. The defects may also be binned in this embodiment using any other information described herein. Binning in this embodiment may be performed as described further herein.

In any of the embodiments described above, binning may be performed on-tool, off-tool, or some combination thereof.

In an additional embodiment, the method includes selecting at least a portion of the defects for review, as shown in step 28, based on the position of the inspection data in the design data space and one or more attributes of the design data in the design data space such as yield impact associated with the design data perhaps in combination with other inspection results (e.g., iDO results and iADC results). The one or more attributes of the design data used to select defects for review may include any attribute(s) of the design data described herein. In addition, the position of the inspection data in design data space may be used to determine the positions of the defects in design data space as described herein, which can be used to determine the attribute(s) of the design data corresponding to the defects as described herein. In some such embodiments, nuisance defects can be filtered from other defects detected on the wafer as described herein, and only the DOI (or non-nuisance defects) can be retained for review or further analysis. In another embodiment, the defect list and the identified hot spots, classification of the defects and hot spots, and design context may be used to improve review sampling (which may include sub-sampling) in the monitoring phase, which may be performed on-tool or during post-processing off-tool.

In another embodiment, selecting defects for review is performed as a function of the binning results. For example, defects in some groups may be selected for review while defects in other groups may not be selected for review. In another example, some groups of defects may be more heavily sampled than other groups (i.e., more defects from some groups may be selected for review). The groups of defects that are sampled and the degree to which the groups are sampled may be determined based on, for example, one or more attributes of the design associated with each of the groups or any other information described herein that is associated with the groups of defects. Selecting the defects for review may also be performed as a function of the yield relevance associated with the defects or the defect bins. For example, the population of defects may be split into random defects and systematic defects, and a different sample plan may be used for each of the different defect types. In this manner, the sampling strategies for the different types of defects may be dramatically different.

In some embodiments, the method includes selecting at least a portion of the defects for review, which includes at least one defect located within each portion of the design data in the design data space having different values of one or more attributes of the design data. In this manner, defects in each different portion of the design data may be sampled for review. For instance, the context of each defect can be used to sort defects for review (e.g., by criticality of context) to generate a review sample that ensures that all contexts in which defects are detected are represented in the review sample.

In a further embodiment, the method includes determining a sequence in which the defects are to be reviewed, as shown in step 30, based on the position of the inspection data in the design data space and one or more attributes of the design data in the design data space. For example, the method may include using the context map to sort defects based on priority for offline review (e.g., optical or SEM review). The context of each defect can be used to sort defects for review (e.g., by criticality of context) such that systematic defects and potential systematic defects are given a higher priority than other defect types.

Aligning the inspection data stream to predetermined alignment sites (such as rendered images from the GDS database) at sample points across a die pm a wafer to provide sub-pixel alignment of inspection data at all points on the wafer provides a number of advantages. For instance, since the raw data stream is substantially precisely aligned to the design data, defect positions in design data space may be determined with sub-pixel accuracy (e.g., sub-100 nm accuracy vs. 1000 nm accuracy currently achievable). The substantially high accuracy defect positions may greatly improve the precision of any subsequent review process and the speed with which defects can be located, imaged, and analyzed on a defect review system such as a SEM or a FIB system. In addition, the context information associated with defects can be used in the HRDC phase, which may be performed on the inspection system in a second-pass review or offline on a SEM or optical review station. Such information may also be provided to or acquired by another system such as an automatic defect location (ADL) system in addition to any other local contextual information about a defect that may aid in locating the defect either automatically or manually. In addition, the review system may use this information to generate a logical to physical coordinate translation appropriate for that system and that wafer under the measurement parameters.

In some embodiments, the method includes extracting one or more predetermined attributes of output from one or more detectors of the inspection system acquired for different portions of the wafer based on the position of the inspection data in the design data space and one or more attributes of design data in the design data space. In this manner, the method may include extracting predetermined signal or image attributes for inspection data regions (e.g., specific subsets of the area inspected) based on the position of the inspection data in design data space and one or more attributes of the design data in deign data space. The extracted attribute(s) of the output from the one or more detectors may include, for example, brightness or standard deviation of the signal or image for pixels in the different portions. In addition, the wafer may be a patterned wafer, on which a pattern corresponding to the design data is printed. Therefore, the attribute(s) of the output may be extracted based on knowledge about the output corresponding to the pattern formed on the wafer. In addition, information about structures in the pattern formed on the wafer may be extracted from the output from the one or more detectors.

The extracted attribute(s) of the output from the detector(s) may be used to generate an image of the attribute(s) across the different portions of the wafer. In this manner, the method may include generating "design aware images" of the surface of the wafer. The images may be used to determine one or more attributes of the wafer such as attributes of the wafer that can be determined by metrology. In this manner, the inspection system may be used like a metrology tool by extracting attribute(s) of output (such as signals) from the one or more detectors in substantially precisely defined locations based on the design data or the layout for the design data. The different portions of the wafer may, therefore, be treated essentially as metrology sites in this embodiment. In addition, the one or more extracted predetermined attributes of the output from one or more detectors of the inspection system may be used to perform one or more steps such as the steps described in commonly owned U.S. patent application Ser. No. 60/772, 418 by Kirk et al. filed Feb. 9, 2006, which is incorporated by reference as if fully set forth herein.

The one or more attributes of the design data used in this embodiment may include any of the attribute(s) of the design data described herein. In one such embodiment, the one or more attributes of the design data are selected based on one or more attributes of previously acquired inspection data for the wafer, other wafers, or some combination thereof for the design data, different design data, or some combination thereof for a process layer for which the inspection data for the wafer was acquired, for different process layers, or some combination thereof. In this manner, the one or more attributes of the design data in the design data space used in this embodiment may be selected based on a correlation to attributes of previously collected inspection data from the same wafer or different wafers for the same or different designs on the same or different process layers. The previously collected inspection data may be stored in a data structure or may be included in a knowledge base, which may be configured as described herein. In this manner, the one or more attributes of the design data may be selected in this embodiment based on cumulative learning, historical data, or a training set of data.

In another embodiment, the method includes extracting one or more predetermined attributes of output from one or more detectors of the inspection system acquired for different portions of the wafer based on the position of the inspection data in the design data space, one or more attributes of design data in the design data space, and one or more attributes of the inspection data. The one or more attributes of the design data used in this embodiment may include any of the attribute(s) of the design data described herein. In addition, the one or more attributes of the inspection data may include any of the attribute(s) of the inspection data described herein. For example, in one embodiment, the one or more attributes of the inspection data include one or more image noise attributes, if one or more defects were detected in the different portions, or some combination thereof. In this manner, the one or more attributes of the inspection data may include, but are not limited to, image noise characteristics and/or the detection/non-detection of defects in the inspection data regions. Extracting the one or more predetermined attributes of the output may be further performed as described herein. In addition, the extracted attribute(s) of the output may be used as described further herein.

Each of the embodiments of the method described above may include any other step(s) of any method(s) described herein. In addition, each of the embodiments of the method described above may be performed by any of the systems described herein.

Figure 15:
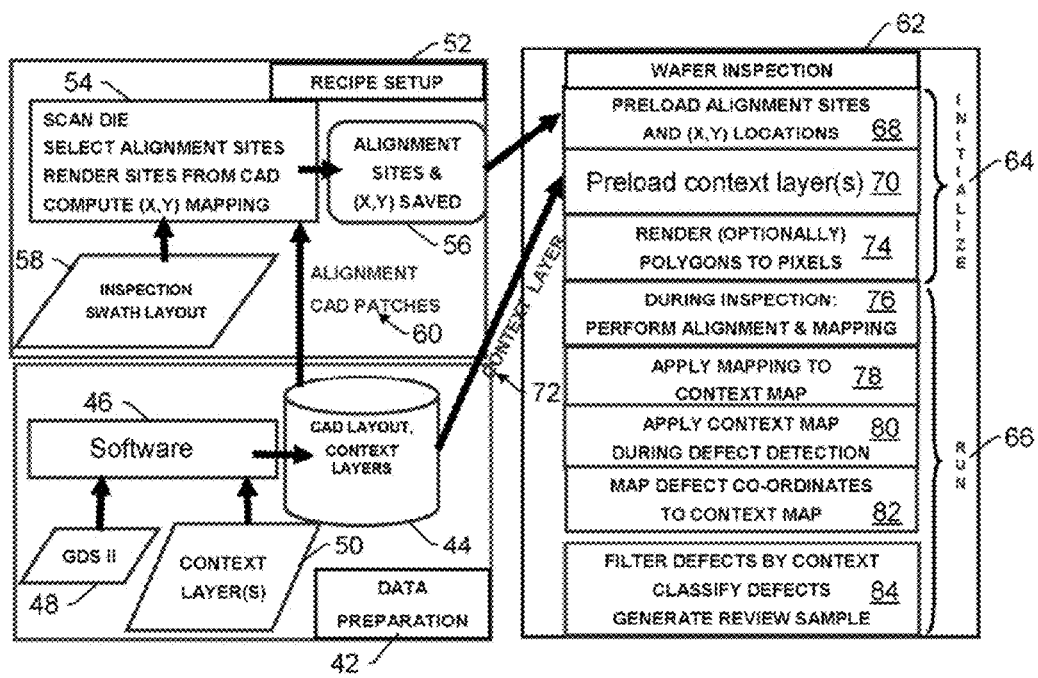
FIG. 15 is a flow chart illustrating another embodiment of a computer-implemented method for determining a position of inspection data in design data space.

FIG. 15 illustrates another embodiment of a computer-implemented method for determining a position of inspection data in design data space. It is noted that the steps shown in FIG. 15 are not essential to practice of the method. One or more steps may be omitted from or added to the method illustrated in FIG. 15, and the method can still be practiced within the scope of this embodiment.

The method shown in FIG. 15 can be generally used for CBI. In this embodiment, data preparation phase 42 includes generating database 44. Database 44 includes the CAD layout for design data and the context layer or layers for the design data. Database 44 may have any suitable configuration known in the art and may include any other data or information described herein. In addition, data in database 44 may be stored in any other suitable data structure. Database 44 may be generated by software 46 using GDSII file 48 and context layer(s) 50 as inputs. Software 46 may include any appropriate software known in the art. In general, the software may be configured as program instructions (not shown in FIG. 15) that are executable on a processor (not shown in FIG. 15, but which may be configured as described further herein) to generate the database using the GDSII file and the context layer(s). Context layer(s) 50 may be acquired or generated in any manner known in the art and may include any context information or data described herein. In addition, GDSII file 48 may be replaced with any other suitable data structure in which design data is stored.

The method shown in FIG. 15 also includes recipe setup phase 52. Recipe setup phase 52 includes steps 54 that may be performed to determine alignment information 56. Steps 54 may include scanning a die on a wafer, which may be performed by an inspection system configured as described further herein. Steps 54 may also include selecting alignment sites on the wafer using the data acquired by scanning the wafer. The alignment sites on the wafer may be selected as described herein. In addition, the alignment sites on the wafer may be selected based on inspection swath layout information 58 and any other suitable information as described further herein. The inspection swath layout information may include any of the swath information described herein and may be determined as described herein. Selection of the alignment sites on the wafer may be performed automatically, semi-automatically (or user-assisted), or manually as described further herein.

Steps 54 may also include rendering images or acquiring other suitable data corresponding to the alignment sites on the wafer from the CAD layout information in database 44. For example, steps 54 may include using CAD patches 60 corresponding to the selected alignment sites on the wafer to render suitable data or images, or compute values of geometric feature attributes, such as the centroids of certain features, that can be aligned to the alignment sites on the wafer. Steps 54 may also include computing the (x, y) mapping of the alignment sites on the wafer to the information obtained from the CAD layout information. Alignment information 56 includes data for the predetermined alignment sites and the (x, y) positions of the predetermined alignment sites in design data space.

The method shown in FIG. 15 also includes wafer inspection phase 62. Wafer inspection phase 62 may include initialization phase 64 and run phase 66. During initialization phase 64 as shown in step 68, the method may include preloading alignment information 56 including data for the predetermined alignment sites and the (x, y) locations of the predetermined alignment sites in design data space. As shown in step 70, the initialization phase may also include preloading context layer(s) 72 from database 44. The initialization phase may also optionally include rendering the data for the predetermined alignment sites from polygons to pixels, as shown in step 74, which may be performed as described herein. Context layer 72 may include any of the context information described herein.

During run phase 66, the method includes performing alignment and mapping, as shown in step 76, of the inspection data to the design data space. This step may be performed during inspection of the wafer. Alignment and mapping may be performed as described further herein. The run phase may also include applying mapping to the context map, as shown in step 78. The context data may be mapped as described further herein. The run phase may further include applying the context map to the inspection data during defect detection, as shown in step 80, which may be performed as described herein. In addition, the run phase may include mapping defect coordinates to the context map, as shown in step 82, which may be performed as described herein. The run phase may also include additional steps 84, which may include filtering the detected defects by context, classifying the defects, generating a review sample, any other steps described herein, or some combination thereof. Each of additional steps 84 may be performed as described further herein. Each of the embodiments of the method shown in FIG. 15 may include any other step(s) described herein. In addition, each of the embodiments of the method shown in FIG. 15 may be performed by any of the systems described herein.

Program instructions implementing methods such as those described herein may be transmitted over or stored on a carrier medium. The carrier medium may be a transmission medium such as a wire, cable, or wireless transmission link. The carrier medium may also be a storage medium such as a read-only memory, a random access memory, a magnetic or optical disk, or a magnetic tape.

Figure 16:
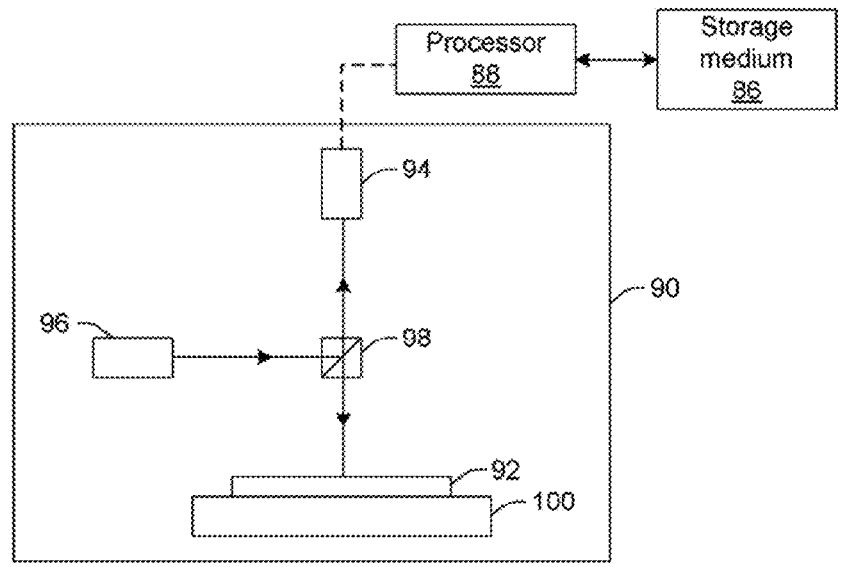
FIG. 16 is a schematic diagram illustrating a side view of various embodiments of a system configured to determine a position of inspection data in design data space.

FIG. 16 illustrates various embodiments of a system configured to determine a position of inspection data in design data space. In one embodiment, the system includes storage medium 86 that includes design data (not shown in FIG. 16). Storage medium 86 may also include any other data and information described herein. The storage medium may include any of the storage media described above or any other suitable storage medium known in the art. In this embodiment, the system also includes processor 88 coupled to storage medium 86. Processor 88 may be coupled to the storage medium in any manner known in the art. In this embodiment, the system may be configured as a stand-alone system that does not form part of a process, inspection, metrology, review, or other tool. In such an embodiment, processor 88 may be configured to receive and/or acquire data from other systems (e.g., inspection data from an inspection system) by a transmission medium that may include "wired" and/or "wireless" portions. In this manner, the transmission medium may serve as a data link between the processor and the other system. In addition, processor 88 may send data to the other system via the transmission medium. Such data may include, for example, design data, context data, results of the methods described herein, inspection recipes or other recipes, or some combination thereof.

Processor 88 may take various forms, including a personal computer system, mainframe computer system, workstation, image computer, parallel processor, or any other device known in the art. In general, the term "computer system" may be broadly defined to encompass any device having one or more processors, which executes instructions from a memory medium.

In other embodiments, however, the system includes inspection system 90. Inspection system 90 is configured to acquire data for alignment sites on wafer 92 and inspection data for the wafer. In embodiments of the system that include the inspection system, processor 88 may be coupled to the inspection system in any manner known in the art. For example, processor 88 may be coupled to detector 94 of inspection system 90 such that the processor can receive data for alignment sites on the wafer and inspection data generated by the detector. In addition, the processor may receive any other output of the detector such as image data and signals. Furthermore, if the inspection system includes more than one detector, the processor may be coupled to each detector as described above.

Processor 88 is configured to align data acquired by the inspection system for alignment sites on a wafer with data for predetermined alignment sites. The processor may be configured to align the data according to any of the embodiments described herein. Processor 88 is also configured to determine positions of the alignment sites on the wafer in design data space based on positions of the predetermined alignment sites in the design data space. The processor may be configured to determine the positions of the alignment sites on the wafer in design data space according to any embodiments described herein. In addition, processor 88 is configured to determine a position of inspection data acquired for the wafer by the inspection system in the design data space based on the positions of the alignment sites on the wafer in the design data space. The processor may be configured to determine the position of the inspection data in design data space according to any of the embodiments described herein. The processor may be configured to perform any other step(s) of any of the method embodiment(s) described herein.

In one embodiment, inspection system 90 includes light source 96. Light source 96 may include any appropriate light source known in the art. Light source 96 may be configured to direct light to beam splitter 98. Beam splitter 98 may be configured to direct light from light source 96 to wafer 92 at a substantially normal angle of incidence. Beamsplitter 98 may include any appropriate optical component known in the art. Light reflected from wafer 92 may pass through beam splitter 98 to detector 94. Detector 94 may include any appropriate detector known in the art. Output generated by detector 94 may be used to detect defects on wafer 92. For example, processor 88 may be configured to detect defects on wafer 92 using output generated by the detector. The processor may use any method and/or algorithm known in the art to detect defects on the wafer. During inspection, wafer 92 may be disposed on stage 100. Stage 100 may include any appropriate mechanical and/or robotic assembly known in the art. The inspection system shown in FIG. 16 may also include any other suitable components (not shown) known in the art.

As shown in FIG. 16, the inspection system is configured to detect light specularly reflected from the wafer. In this manner, the inspection system shown in FIG. 16 is configured as a BF inspection system. However, the inspection system may be replaced by an inspection system configured as a DF inspection system, an EC inspection system, an aperture mode inspection system, or any other optical inspection system known in the art. In addition, the inspection system may be configured to perform one or more inspection modes. For example, the inspection system shown in FIG. 16 may be configured to perform DF inspection by altering an angle of incidence at which the light is directed to the wafer and/or an angle at which light is collected from the wafer. In another example, the inspection system may be configured such that one or more optical components (not shown) such as apertures may be positioned in the illumination path and the collection path such that the inspection system can perform EC mode inspection and/or an aperture mode of inspection.

Furthermore, the optical inspection system shown in FIG. 16 may include a commercially available inspection system such as the 2360, 2365, 2371, and 23xx systems that are available from KLA-Tencor. In another embodiment, the optical inspection system shown in FIG. 16 may be replaced by an electron beam inspection system. Examples of commercially available electron beam inspection systems that may be included in the system of FIG. 16 include the eS25, eS30, and eS31 systems from KLA-Tencor. The embodiments of the system shown in FIG. 16 may be further configured as described herein. In addition, the system may be configured to perform any other step(s) of any of the method embodiment(s) described herein. The embodiments of the system shown in FIG. 16 have all of the advantages of the method embodiments described above.

The methods and systems described above generally perform alignment of inspection data with design data by aligning data acquired for alignment sites on a wafer (e.g., BF patch images) with data for predetermined alignment sites (e.g., images derived from GDS II files). Additional methods and systems described herein generally perform alignment between inspection data and design data and determine similarity between different defects using techniques such as statistical techniques (e.g., without using patch images or SEM images).

The embodiments described herein may be used for context-based setup, inspection, binning, review, measurement, test, analysis, or some combination thereof. The context that is used in the embodiments may include design data or information about the design stored in a data structure such as a design database or a file (e.g. GDS file, OASIS file, Open Access file, net-list, etc.); process simulation results; electrical simulation results; patterns of interest (POIs); hot spot information (e.g., OPC, electrical test results, inspection results): process tool data (work in progress); or some combination thereof. In addition, the embodiments may include predicting yield impact of one or more defects and/or one or more groups of defects based on results produced by the embodiments described herein. Predicting the yield impact may be performed as described further herein. Furthermore, the embodiments described herein can be advantageously used to provide actionable, yield relevant information relatively quickly.

The embodiments described herein may be used to group defects detected by an inspection system that inaccurately determines defect location coordinates (i.e., the real defect is likely to be located near the reported coordinates but not exactly at the reported coordinates). For instance, the methods and systems described herein can be used to search for patterns that are at least similar to those proximate to a reported defect position by attempting to align the patterns to one another thereby allowing improved grouping of defects even if the defect coordinates reported by the inspection system are not perfectly accurate. In another instance, an inspection image or a review image (e.g. a SEM image) acquired proximate a reported defect location may be compared to or overlaid with the design data to determine the actual location of the defect in the wafer space (as opposed to the location of the defect reported by inspection) and an exact representation of the design data proximate the defect position. All instances of at least similar patterns may be identified in the design data (including rotated, flipped, or otherwise skewed instances of the pattern) and binned into a pattern group. The actual defect positions in wafer space determined as described above may then be compared to the locations for a pattern group, and the defects which are located at the locations for the pattern group within a predetermined tolerance may be binned into a group. Such grouping of defects may be performed on-tool or off-tool and may improve the performance of the methods described herein (e.g., reducing the search range when there is coordinate inaccuracy in the defect location coordinates reported by inspection). In particular, with coordinate inaccuracy, the source pattern determined based on reported inspection coordinates is an approximate source pattern (unless the pattern is isolated or the coordinates of the defects happen to be substantially accurate). Of course, the embodiments described herein may be used with inspection results generated by a highly accurate inspection system.

One embodiment relates to a computer-implemented method for binning defects detected on a wafer. In general, in the methods described herein, a population of defects may be grouped based on design data (e.g., GDS design data) by selecting a source defect, comparing design data proximate the position of the source defect in design data space ("source design data") to the design data ("target design data") proximate positions in design data space of target defects (e.g., all or part of the defect population), and if there is a match or at least similarity between the compared design data, assigning the target defect to the source defect group. The comparison may be based on a direct comparison of the source and target design data. In addition, the comparison may be performed after minor coordinate inaccuracies between the positions in design data space of the source and target defects have been corrected. Furthermore, the comparison may include searching for the source design data within the target design data to account for coordinate inaccuracies in the source and target defect positions. Alignment and/or searching may be improved by using sub-pixel alignment techniques that may be performed as described herein. Moreover, comparing the source and target design data may be performed to determine if there is an exact match between the source and target design data or a similar but not exact match between the source and target design data. Each of the steps described above may be further performed as described herein.

After the target defect population is tested for the source defect, the next source defect may be selected. A defect that has yet to be grouped is selected as the next source defect. The above steps may be repeated until all defects are grouped (or at least tested). The defect population used in the methods described herein may include all defects detected on a wafer, all defects detected on multiple wafers, or a subset of defects detected on one or more wafers (e.g., defects detected on one or more wafers and identified to be near hot spots). In addition, the methods described herein may be performed for the entire defect population or a subset of the defects in the entire defect population (which may be selected based on design functional block such as logic, memory, etc.). Binning may be performed as automatic single-pass or multi-pass grouping.

Figure 17:
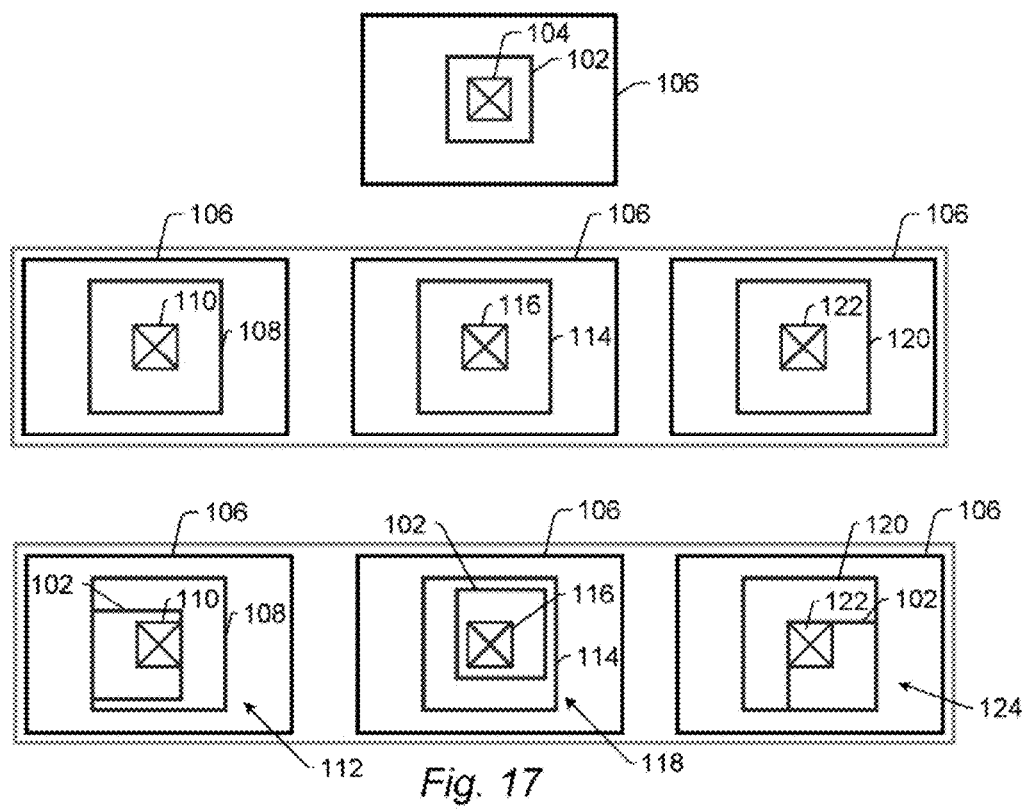
FIG. 17 is a schematic diagram illustrating one embodiment of a computer-implemented method for binning defects detected on a wafer.

The method includes comparing portions of design data proximate positions of the defects in design data space. For example, as shown in FIG. 17, the method may include comparing portion 102 of design data (not shown) proximate a position of defect 104 in design data space 106 with portion 108 of design data (not shown) proximate a position of defect 110 in design data space 106. Defect 104 is referred to herein as a "source defect," and defect 110 is referred to herein as a "target defect." The design data proximate the positions of the defects in design data space defines the background pattern data or background information for the defects.

As shown in FIG. 17, portion 102 is larger than defect 104. The dimensions (in the x and y directions) of portion 102 may be selected by a user. In addition, portion 108 is larger than defect 110. The dimensions of portion 108 may also be selected by a user. The dimensions of portion 108 are typically larger than the dimensions of portion 102 as described further herein. Alternatively, the dimensions of the portions may be selected by the computer-implemented methods described herein (e.g., automatically).

In one embodiment, the dimensions (in the x and y directions) of the portions are determined based, at least in part, on positions of the defects reported by an inspection system used to detect the defects, coordinate inaccuracy of the inspection system, one or more attributes of the design data, defect size, defect size error of the inspection system, or some combination thereof. For example, the method may include defining a portion (i.e., a "pattern window") of the design data centered on a reported defect location. The pattern window may have a width and height that are larger than the dimensions of the defect and are selected to account for error in the defect position due to coordinate uncertainty. For example, if the coordinates of a defect location reported by the inspection system are accurate to about +/−3 μm, the pattern window may be defined to include at least 3 μm in every direction from the x and y coordinates of the reported defect location for a total minimum size of about 6 μm by about 6 μm. In this manner, the better the coordinate accuracy of the inspection system, the smaller the pattern window may be, which may result in faster and more accurate grouping. The dimensions of the pattern window may also be selected such that the pattern window includes a "sufficient" amount of the background pattern data such as a sufficient number of features in the design data. In addition, if the design data in the pattern window will be compared to a clip, the pattern window dimensions may be selected such that the pattern window includes entire polygons that are only partially contained in the clip.

The portions of the design data used in the methods described herein may include a clip of the design taken around a position of a defect in design data space. The term "clip" is generally defined as the area in design data around a defect and can be thought of as the neighborhood of the defect. Polygons define the pattern within the clip, but the polygons can partially extend beyond the clip. The clips used in the methods described herein for some of the defects may have one or more different dimensions. However, the portions of the design data used in the methods described herein may include the design data within an extended bounding box (EBB) around a range of positions at which the defect may be located. The EBB may be selected based on the coordinate accuracy of the inspection system used to detect the defect and the defect size (and perhaps defect size error of the inspection system). For example, as the coordinate accuracy of the inspection increases, the dimensions of the EBB may be reduced. Smaller EBBs are preferable since the position of a defect within a smaller EBB can be more accurately determined than in a larger EBB, and a more accurate position of the defect within the EBB can be used to determine one or more attributes of the defect (e.g., the position of the defect with respect to polygons in the design, a classification for the defect, and a root cause of the defect) with higher accuracy. In addition, one or more dimensions of the EBBs used for at least some of the defects may be different. EBBs are generally smaller than clips and represent what the defect could be location on.

In another embodiment, the dimensions of at least some of the portions are different. For example, as shown in FIG. 17, the difference between the dimensions of portion 108 and defect 110 is larger than the difference between the dimensions of portion 102 and defect 104. In other words, the area of the target portion around the target defect is greater than the area of the source portion around the source defect. In this manner, the target portion may include more of the design data than the source portion.

The source portion of the design data may be compared with different areas of the target portion of the design data. In this manner, the method may include searching for the source portion of the design data within the target portion. For example, as shown in overlay 112 of the source and target portions, the source portion of the design data may be compared with one area of the target portion. After this comparison, the position of the source portion with respect to the target portion may be altered such that the design data in another area of the target portion may be compared to the source portion of the design data. In this manner, the method may include "sliding" the source portion of the design data around in the target portion until a match is identified or until all areas of the target portion have been compared to the source portion.

Comparing the portions of the design data may be performed with any information that is available for the comparing step. For instance, the portions of the design data that are compared may be portions of the design data contained in a data structure such as a GDS file. In addition, comparing the portions of the design data may include comparing polygons in the portions. In another embodiment, the method includes converting the portions of the design data proximate the positions of the defects in the design data space to bitmaps prior to the comparing step. For example, polygons in the portions of the design data may be converted to bitmaps for faster processing. The portions of the design data may be converted to bitmaps using any suitable method or system known in the art. For instance, the portions of the design data may be converted to bitmaps using a method or system described in U.S. Pat. No. 7,030,997 to Neureuther et al., which is incorporated by reference as if fully set forth herein. In one such embodiment, comparing the portions of the design data includes comparing the bitmaps to each other. Comparing the bitmaps to each other may be performed in any suitable manner. In addition, comparing the portions of the design data may include comparing one or more attributes of the design data in the portions. The one or more attributes that are compared may include any of the attribute(s) of the design data described herein.

The method also includes determining if the design data in the portions is at least similar (similar or exactly the same) based on results of the comparing step. If one or more attributes of the design data in the portions are determined, grouping can be based on common pattern similarity, common attribute(s) similarity, common attribute(s) similarity in feature space, or some combination thereof. For example, in one embodiment, determining if the design data in the portions is at least similar includes determining if common patterns in the design data in the portions are at least similar, which may be performed as described further herein. In another embodiment, determining if the design data in the portions is at least similar includes determining if common attributes of the design data in the portions are at least similar, which may be performed as described further herein. In an additional embodiment, determining if the design data in the portions is at least similar includes determining if common attributes in feature space of the design data in the portions are at least similar, which may be performed as described further herein. In addition, the method may include determining how similar different areas in the portions are. Furthermore, although the design data in the portions may be slightly offset from one another or contain slightly different design geometry, if the portions contain significant common geometry, the portions may be determined to be similar to each other. The method may include comparing the design data proximate the position of each defect in design data space with the design data proximate the position of every other defect in design data space to determine which defects are similar to each other based on their "background" patterns.

Determining if the design data in the portions is at least similar is preferably not performed based on whether or not the defects are located at the same position within the design data. In other words, defects that are binned in a group based on their "background" by the methods described herein may not necessarily be located at the same position with respect to patterns, features, polygons, or geometries in the design data. By not relying on matching of the positions of the defects with respect to the design data, the methods may provide more accurate defect binning. For instance, two defects may be located within the same type of pattern but at different locations within the pattern. In addition, a systematic defect within a POT may be localized, but also may not be localized. However, such defects may be caused by or related to the same pattern based issue. Therefore, binning defects without relying on similarity between actual defect positions within the design data may allow more accurate binning, which may be used for more accurate assessments of systematic issues and prediction and control of yield based on these systematic issues. Determining if the portions of the design data are at least similar may be performed using any appropriate algorithm. The method may, therefore, be used as a "similarity checker." A similarity checker may be advantageously used when there is coordinate inaccuracy in the actual defect positions within the design data since the target portion can be larger than the source portion being compared to the target portion.

In the embodiment shown in FIG. 17, the entire source portion is compared with different areas of the target portion. In some embodiments, the method includes comparing an entirety of the design data in at least some of the portions to the design data in other portions. In addition, the method may include comparing an entirety of the source portion of the design data to different areas of the target portion of the design data. As such, the method may include searching the target portion for design data that is at least similar to the entire source portion of the design data.

The method further includes binning the defects in groups such that the portions of the design data proximate the positions of the defects in each of the groups are at least similar. In this manner, the method includes binning the defects into groups based on the design data and/or the context of the design data proximate to the positions of the defects in design data space. For example, polygons in the portions of the design data that are at least similar or match may be used to bin defects into groups in an unsupervised manner. In addition, the binning step may include binning at least two defects in at least one group such that the design data proximate the positions of the at least two defects in the at least one group are at least similar. Furthermore, in the rare instance in which none of the portions of the design data proximate the positions of the defects in design data space are determined to be at least similar, the method will not bin any of the defects into groups.

The method also includes storing results of the binning step in a storage medium. The results of the binning step may include any of the results described herein. In addition, the storing step may include storing results of the binning step in addition to any other results of any steps of any method embodiments described herein. The results may be stored in any manner known in the art. In addition, the storage medium may include any storage medium described herein or any other suitable storage medium known in the art. After the results have been stored, the results can be accessed in the storage medium and used by any of the method or system embodiments as described herein. Furthermore, the results may be stored "permanently," "semi-permanently," temporarily, or for some period of time. For example, the storage medium may be random access memory (RAM), and the results of the binning step may not necessarily persist in the storage medium.

Determining if the portions of the design data are at least similar may include comparing results of the comparing step with predetermined criteria for similarity. For example, results of the comparing step may be compared to a threshold value. If the design data in the portions are at least similar by at least this threshold value, the method may bin the defects in a group. In another example, results of the comparing step may be compared to a "percent similar" value. If the design data in the portions are at least similar by at least this percent, then the method may bin the defects in a group.

In any case, when a similarity check is performed between two or more portions of design data (e.g., GDS pattern clips) and a common pattern in the two or more portions is identified, the method includes binning the defects in a group. The results produced by determining if the design data in the portions is at least similar may include an indication of whether or not the design data in the source portion was found in the target portion. In addition, the center point of the common geometry can be considered to be the approximate design data space position of a systematic defect. The (x, y) coordinates of the design data space positions of the defects in each group can, therefore, be adjusted (translated) to the center point of the geometry corresponding to each group. A coordinate correction vector (or error vector) may be determined for each binned defect based on the design data space coordinates of the defect and the center point of the common geometry corresponding to the group into which the defect was binned. To determine the overall systematic uncertainty in the design data space coordinates of the defect positions (wafer space to design data space translation errors plus errors in the reported coordinates), the method may include determining the average of these translation or error vectors over a statistically significant number of defects. The method may also include determining the standard deviation of all of the error vectors and determining an average of only those vectors that fall inside of the +/−1 standard deviation or +/−3 standard deviation. In this manner, outliers that may compromise the average value may be eliminated from the computations. The determined average value may also be used as a global correction value. For instance, this global correction value may be applied to additional design data space coordinates of defect positions determined by wafer space to design data translations such that more accurate overlay can be determined in subsequent data processing steps.

The results of the determining step may also include the x and y offsets between the target portion and the position of the source portion within the target portion at which the at least similar design data was found. These x and y offsets may be used to optimize the binning method. For instance, when initially comparing the portions, the source portion may be positioned in the target portion such that center points of the two portions are aligned. However, if there is determined to be some predictable or repeatable offset (in the x and/or y directions) between the initially used position of the source portion within the target portion and the position of the source portion within the target portion at which the at least similar design data is found, this offset may be used to tune the overlay used in the comparison step of the binning method.

In some embodiments, the design data in the portions includes design data for more than one design layer. In this manner, the method may include binning defects by checking one design layer for background similarity of the defects or binning defects by checking a set of design layers for background similarity (i.e., multi-layer background similarity) of the defects. For example, during inspection of a polysilicon layer (e.g., a gate electrode layer) on a wafer, an underlying diffusion layer may be visible to the inspection system and therefore affect the inspection results. As such, the design data that is included in the portions may include the design data for the polysilicon layer and the diffusion layer to increase the accuracy of the background based binning. In addition, an underlying design layer may not be visible to the inspection system. However, by using design data for more than one design layer, defects located proximate portions of the design data that are at least similar but are located above dissimilar design data on an underlying layer may be binned into different groups.

Regardless of whether or not the design data in the source portion was found in the target portion, the method may include comparing the source portion with other portions of the design data proximate positions of other defects in the design data space. Comparing the design data in the source portion to design data in multiple target portions may be performed since more than one target defect located proximate to design data that is at least similar to, or the same as, design data in the source portion may be detected on a wafer.

In one such example shown in FIG. 17, portion 102 may be compared with portion 114 of design data (not shown) proximate a position of defect 116 in design data space 106. The dimensions of portion 114 may be selected as described above. The source portion of the design data may be compared with the design data in different areas of the target portion as described further above. The method also includes determining if the design data in the source portion is at least similar to at least some of the design data in the target portion based on results of the comparison, which may be performed as described further above. Overlay 118 of the portions illustrates the position of the source portion within the target portion at which at least similar design data was found. Therefore, the method includes binning defects 104 and 116 in a group since the design data in portion 102 is determined to be at least similar to at least some of the design data in portion 114. In addition, defects 104, 110, and 116 are binned into a group since the design data in the source portion is determined to be at least similar to at least some of the design data in both of the target portions.

In another such example, portion 102 may be compared with portion 120 of design data (not shown) proximate a position of defect 122 in design data space 106. The dimensions of portion 120 may be selected as described above. The source portion of the design data may be compared with the design data in different areas of portion 120 as described further above. The method also includes determining if the design data in portion 102 is at least similar to at least some of the design data in portion 120 based on results of the comparison, which may be performed as described further above. Overlay 124 of portions 102 and 120 illustrates the position of portion 102 within portion 120 at which at least similar design data was found. Therefore, the method includes binning the source defect and target defect 112 in a group. In addition, the source defect and the three target defects are binned into a group since the design data in the source portion is determined to be at least similar to at least some of the design data in the three target portions. The steps described above may be performed until the background information for each defect detected on a wafer is compared with the background information for every other defect detected on the wafer.

As described above, the method includes binning the defects based on the design data and/or the context of the design data located proximate to the positions of the defects in design data space, possibly in combination with other information such as one or more attributes of the design data and/or the design layout. In contrast with other methods for binning defects based on context information, the methods described herein do not perform binning based on the background information as printed on the wafer. Instead, the methods described herein perform binning based on the background information as defined in the design data. In this manner, the methods described herein can perform background based binning regardless of whether or not or how the design data is printed on the wafer.

Such independence from the design data as printed on the wafer may be particularly advantageous for PWQ methods and focus exposure matrix (FEM) methods in which the design data as printed on the wafer may change (sometimes dramatically) across the process window parameters used for such methods thereby decreasing the accuracy of defect binning methods based on images of the design data printed on the wafer. In one such application for empirical techniques such as PWQ, the method may provide improved background based binning by using a GDS clip or excerpt of the design data at the position of the defect in the design data space. As such, binning may be performed by common pattern. The defects that are binned may be classified individually or collectively as a group of defects as described further herein. For example, the method may include classifying the defects based on one or more attributes of the design data (e.g., one or more attributes the design data located proximate the defect positions in design data space), which may be performed as described further herein.

Since the defects detected on the wafer are binned by design data proximate the design data space positions of the defects, the positions of the defects in the design data space may be determined before binning is performed. In one embodiment, the method includes acquiring data for x and y coordinates of positions of the detected defects in design data space (or to determine a translation function), which may be performed as described herein. In another embodiment, the method includes determining the positions of the defects in the design data space by comparing data acquired by an inspection system for alignment sites with data for predetermined alignment sites. Acquiring the data for the alignment sites on the wafer may include determining approximate wafer space positions of the alignment sites on the wafer using product layout data, optionally reticle frame data, and the stepper recipe (or input to the stepper) and acquiring the data at the approximate positions. Such comparing and determining may be performed as described further above. In addition, the method may include determining the positions of at least some of the defects in the design data space by comparing data acquired by an inspection system for alignment sites on the wafer with data for predetermined alignment sites. The positions determined for at least some of the defects may then be used to determine the positions of other defects in design data space (e.g., by generating and using a transformation for translating reported defect positions to defect positions in design data space). Determining the positions of the defects in the design data space may also be performed according to any of the embodiments described herein.

Sometimes all of the data described above is not available, or the wafer has not been properly aligned to the design data. In such instances, it may be useful to determine some of the transformation information empirically from the wafer during inspection or review. In one embodiment, the method includes determining the positions of the defects in design data space by comparing data acquired by an inspection system during detection of the defects to data acquired by a review system at locations in design data space determined by review. In this manner, the method may include aligning inspection results for one or more defects to review results acquired at design data space locations determined by review. In addition, the method may include determining the design data space positions of at least some of the defects by comparing data acquired by an inspection system during detection of the defects to data acquired by a review system at locations in the design data space determined by review. The positions determined for at least some of the defects may then be used to determine the positions of other defects in design data space (e.g., by generating and using a transformation for translating reported defect positions to defect positions in design data space). However, this approach provides a wafer scale offset that may be complicated by coordinate inaccuracy of the inspection system. Therefore, if there are coordinate inaccuracies in the reported locations of the defects, it may be beneficial to base the transformation function on a statistical sample of measurements.

After the positions of the defects in design data space are determined, portions of the design data around the determined positions may be extracted such that the extracted portions of the design data may be used for binning defects and performing other steps described herein. In addition, prior to using the extracted portions of the design data for binning, each of (or one or more of) the extracted portions may be mirrored, rotated, scaled, translated (shifted), or some combination thereof to generate a set of portions corresponding to and including each of the extracted portions. These sets of portions may be used for binning to increase the accuracy of the binning method.

The method may also include determining one or more attributes of the detected defects such as dimension in the x direction (e.g., width), dimension in the y direction (e.g., length), and dimension in the z direction (e.g., height), any other attribute(s) described herein, or some combination thereof. The one or more attributes may be organized and/or stored in any suitable data structure such as a table or list. In another embodiment, binning the defects includes binning the defects in the groups such that the portions of the design data proximate the design data space positions of the defects in each of the groups are at least similar and such that one or more attributes of the defects in each of the groups are at least similar. In one such embodiment, the one or more attributes of the defects include one or more attributes of the results of the inspection in which the defects were detected, one or more parameters of the inspection, or some combination thereof. The one or more attributes of the results of the inspection may include, for example, an optical mode and/or one or more other parameters of the inspection such as polarization, collection angle, incidence angle, etc., at which the defect was preferentially detected. In addition, or alternatively, the one or more attributes may include any other attribute(s) of the defects described herein. In this manner, binning may be performed such that the defects are separated into groups by design data and defect attribute(s). Such binning may be performed such that different defect types or defects having different attribute(s) located within at least similar portions of the design data may be separated into different groups.

In some embodiments, the defects that are binned as described herein are detected by optical or electron beam inspection. Optical and electron beam inspection may be performed by an inspection system described herein. In another embodiment, the defects that are binned as described herein are detected in a PWQ or FEM method, which may be performed as described herein. The embodiments described herein may be particularly useful for defects detected in a PWQ or FEM method. For example, the method embodiments described herein may be used to filter defects detected in PWQ and FEM methods such that potential systematic issues can be more easily and accurately identified, which may be performed as described further herein. In addition, the method embodiments described herein may be used to bin defects detected by PWQ or FEM into useful groups, which may be performed as described further herein. Furthermore, the method embodiments described herein may be used to prioritize the binned PWQ or FEM defects for review, measurement, or test, which may be performed as described further herein. In addition, the method may include binning inspection and/or electrical test defects into groups based on at least similar design/layout patterns.

In one embodiment, the inspection system used to detect the defects, which are binned in the embodiments described herein, may be aligned to three or four alignment sites on the wafer. The alignment sites may be selected as described further above. In addition, alignment sites that include one or more alignment features, patterns, and/or geometries visible on the physical wafer and in the design data or layout may be selected for use in the methods described herein. After the inspection system has been aligned to the alignment sites, stage positional accuracy, any rotational errors, x and y translational errors, magnification (scaling) errors, or some combination thereof may be corrected. This correction may take place during the inspection process or may be performed post-process (i.e., performed after inspection results have been produced). The correction may be based, at least in part, on a comparison of the coordinates for the alignment sites reported by the inspection system and reference coordinates for the same alignment sites.

Figure 18:
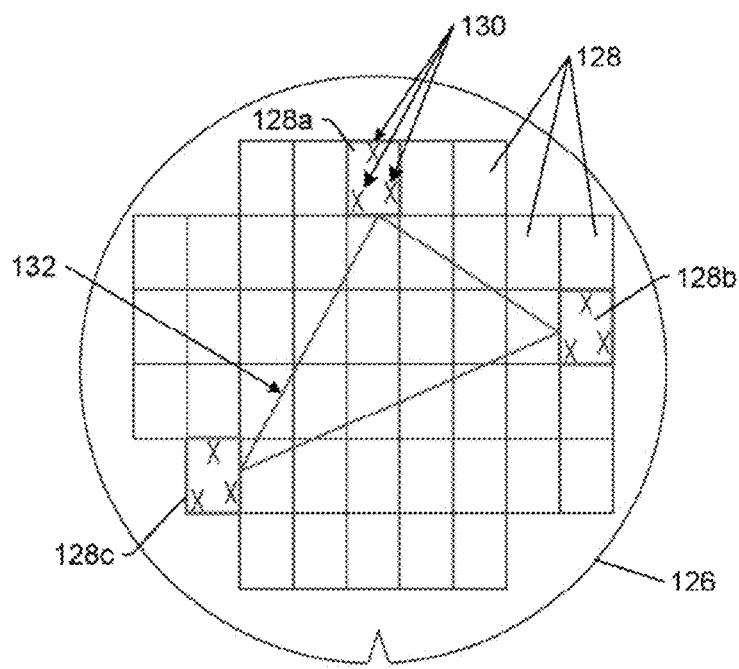
FIG. 18 is schematic diagram illustrating a top view of one embodiment of alignment sites on a wafer in three different die, which are located on the wafer in a triangular arrangement.

In some embodiments, the method may include obtaining coordinates for three or four alignment sites in multiple die on the wafer such as a die on the left side, right side, top, bottom, and center of the wafer. In another embodiment, the alignment sites on the wafer are located in three different die on the wafer. One such embodiment is illustrated in FIG. 18. As shown in FIG. 18, wafer 126 includes a plurality of die 128. Alignment sites 130 may be located in die 128a, 128b, and 128c. Although alignment sites are shown in only three die, it is to be understood that the alignment sites may be located in each die on the wafer. A subset of the alignment sites in each die or the alignment sites in a subset of the die may be used in the methods described herein.

The method may also include identifying three common alignment sites (i.e., alignment sites that are common to the die printed on the wafer and the design data (e.g., the GDS layout)) in a triangular distribution within the die. For instance, as shown in FIG. 18, alignment sites 130 are arranged in a triangular distribution within die 128a, 128b, and 128c. In one such embodiment, the three different die are also distributed across the wafer in a predetermined arrangement (e.g., a triangular or other arrangement). For instance, as shown in FIG. 18, die 128a, 128b, and 128c are located on wafer 126 in triangular arrangement 132. In this manner, the method may include aligning images (e.g., BF and/or DF images) acquired by the inspection system for the alignment sites on the wafer with data for the predetermined alignment sites. The method may include mapping the coordinates of the inspection data acquired by the inspection system with design data coordinates (e.g., GDS coordinates) and developing transformation matrices. The transformation matrices may be expressed in any suitable manner such as:

$$\text{Scale:} \begin{pmatrix} x' \\ y' \\ w' \end{pmatrix} = \begin{pmatrix} s_x & 0 & 0 \\ 0 & s_y & 0 \\ 0 & 0 & 1 \end{pmatrix} \begin{pmatrix} x \\ y \\ w \end{pmatrix}$$

$$\text{Rotate:} \begin{pmatrix} x' \\ y' \\ w' \end{pmatrix} = \begin{pmatrix} \cos\phi & -\sin\phi & 0 \\ \sin\phi & \cos\phi & 0 \\ 0 & 0 & 1 \end{pmatrix} \begin{pmatrix} x \\ y \\ w \end{pmatrix}$$

$$\text{Translate} \begin{pmatrix} x' \\ y' \\ w' \end{pmatrix} = \begin{pmatrix} 1 & 0 & t_x \\ 0 & 1 & t_y \\ 0 & 0 & 1 \end{pmatrix} \begin{pmatrix} x \\ y \\ w \end{pmatrix}$$

The coordinates of these alignment sites may also be used to perform (e.g., automatically perform) "tool matching" to eliminate coordinate differences between inspection systems. One advantage of such a method is that the coordinates may be determined individually and automatically for every inspected wafer thereby yielding a per-wafer set of correction factors. Another advantage of such a method is that the determined coordinates may be used to determine coordinate drifts in the inspection system or other systems across the wafers (e.g., coordinate drifts caused by accumulated error, stage movement errors, and errors caused by mechanical, electrical, and thermal noise) that may otherwise reduce the accuracy of alignment of the inspection data to the design data.

As described above, comparing the design data in the portions may include comparing an entirety of the design data in at least some of the portions to the design data in other portions. In this manner, the results of such comparing may be used to determine if all of the design data in the source portion is at least similar to at least some of the design data in the target portion. However, in an alternative embodiment, comparing the design data in the portions includes comparing different regions of the design data in at least some of the portions to the design data in other portions, which may be performed as described further herein. Further, while design data in multiple regions of the source portion may be at least similar or identical to design data in regions of the target portion, the results of such comparing may be used to identify the largest region of design data in the source portion that is at least similar or identical to a similarly-sized region of design data in the target portion. In this manner, the method may include determining if the design data proximate to the positions of the source defect and the target defect in design data space "look alike" or are at least similar. Therefore, this method can be much more effective at certain design layers for background based binning of defects as described herein.

Figure 19:
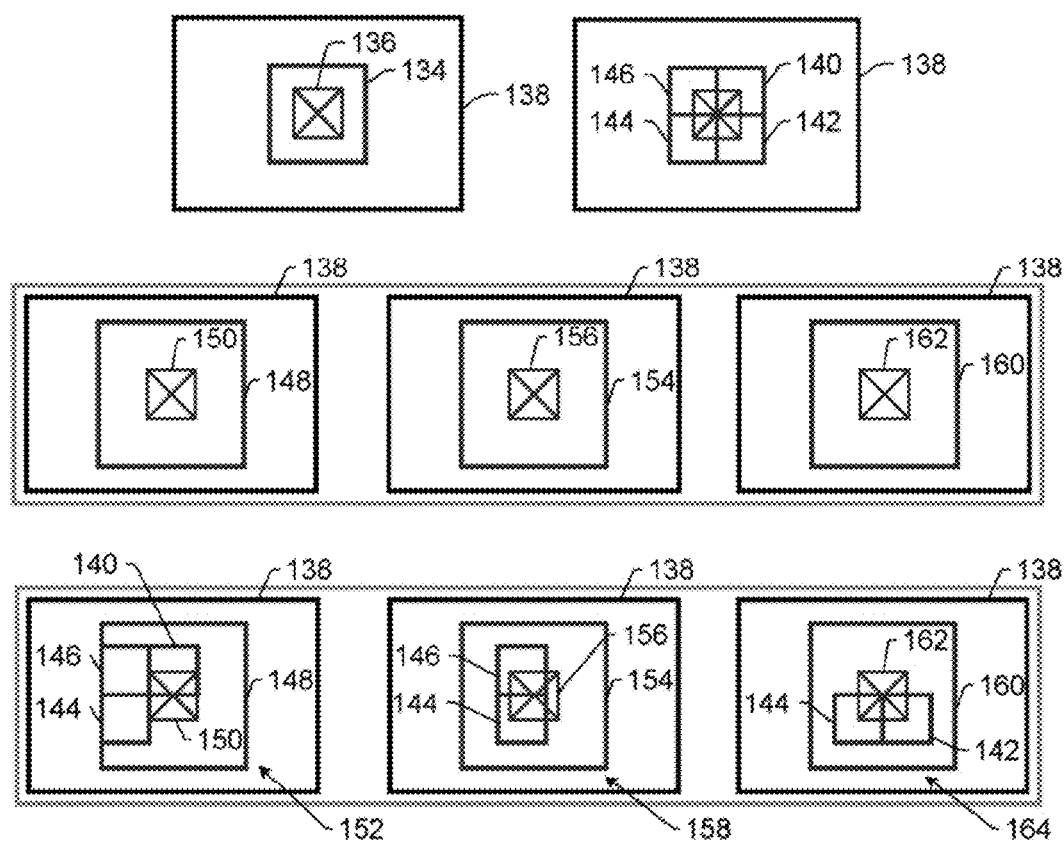
FIG. 19 is a schematic diagram illustrating another embodiment of a computer-implemented method for binning defects detected on a wafer.

One such embodiment of the method is illustrated in FIG. 19. For example, as shown in FIG. 19, the method may include defining portion 134 of design data (not shown) proximate a position of defect 136 in design data space 138.

Defect 136 is referred to herein as the "source defect." Defining portion 134 of the design data may include selecting the dimensions of the portion, which may be performed as described further above. The method may also include separating, segmenting, or partitioning the portion of the design data into one or more different regions. For example, as shown in FIG. 19, portion 134 may be divided into four different regions 140, 142, 144, and 146. The different regions into which portion 134 is separated may be referred to in this instance as "source quadrants." Although portion 134 is shown in FIG. 19 divided into four source quadrants, it is to be understood that the portion may be separated into any suitable number of regions. All of the regions may have the same size, or all or some of the regions may have different sizes.

In this example, the method includes comparing design data in source quadrants 140, 142, 144 and 146 with portion 148 of design data (not shown) proximate a position of defect 150 in design data space 138. Defect 150 is referred to herein as a "target defect." As shown in FIG. 19, portion 148 is larger than defect 150 and at least as large as portion 134. The dimensions of portion 148 may be selected as described further above.

The design data in each of the source quadrants may be compared with design data in different areas of the target portion. In this manner, the method may include searching for the design data in each of the source quadrants within the target portion. In this example, the method also includes determining if the design data in the source quadrants is at least similar to the design data in the target portion based on results of the comparing step. For example, the method may include determining how similar the design data in each of the source quadrants is to the design data in the target portion. As such, the design data in none, some, or all of the source quadrants may be determined to be at least similar to the design data in the target portion. As shown in overlay 152, the design data in three of the four source quadrants was determined to be at least similar to the design data in areas of portion 148 at the positions of source quadrants 140, 144, and 146 shown in overlay 152.

In this manner, the method may include comparing the design data in the source quadrants to the design data in the target portion to determine which defects are at least can be binned into groups based on their corresponding design data. The results of determining if the design data in each of the source quadrants and the target portion is at least similar may include an indication of how many and which of the source quadrants were determined to contain design data that is at least similar to the design data in the target portion. The results of the determining step may also include the x and y offsets between the target portion and each of the source quadrants within the target portion at which at least similar design data was found. Whether or not the source defect is binned in a group with the target defect may be determined based on how many and which of the source quadrants were determined to include design data that is at least similar to design data in the target portion and the offsets between the target portion and each of the source quadrants within the target portion at which at least similar design data was found.

In some embodiments, the design data in each of the source quadrants and the target portion includes design data for more than one design layer. In this manner, the method may include binning defects by checking one design layer for at least similar design data or binning defects by checking a set of design layers (e.g., multi-layer) for at least similar design data.

Regardless of whether or not the design data in the source quadrants was determined to be at least similar to the design data in the target portion, the method may include comparing each of the source quadrants with other portions of the design data proximate positions in the design data space of other defects.

In one such example, the design data in source quadrants 140, 142, 144 and 146 may be compared with portion 154 of design data (not shown) proximate a position of defect 156 in design data space 138. Portion 154 may be configured as described above. The design data in the source quadrants and portion 154 may be compared as described above. The method also includes determining if the design data in each of the source quadrants is at least similar to design data in portion 154, which may be performed as described further above. As shown in overlay 158, two of the four quadrants (e.g., quadrants 144 and 146) were determined to include design data that is at least similar to that in portion 154 at the positions of the quadrants shown in overlay 158. Therefore, the method may determine that the design data proximate the positions of defects 136 and 156 in design data space is less similar than defects 136 and 150. Whether or not the design data proximate the positions of defects 136 and 156 in design data space is similar enough to bin defects 136 and 156 in the same group may be determined as described further above.

In another such example, the design data in source quadrants 140, 142, 144 and 146 may be compared with portion 160 of design data (not shown) proximate a position of defect 162 in design data space 138. Portion 160 may be configured as described above. The design data in the source quadrants and portion 160 may be compared as described above. The method also includes determining if the design data in each of the source quadrants is at least similar to design data in portion 160, which may be performed as described further above. As shown in overlay 164, two of the four quadrants (e.g., quadrants 142 and 144) were determined to include design data that is at least similar to portion 160 of the design data at the positions of the source quadrants shown in overlay 164. Therefore, the method may determine that the design data proximate the positions of defects 136 and 162 in design data space is less similar than the design data proximate the positions of defects 136 and 150 in design data space. Whether or not the design data proximate the positions of defects 136 and 162 in design data space is similar enough to bin defects 136 and 162 in the same group may be determined as described further above.

The quadrant information determined as described above may be stored and/or displayed. This information may be used for setup, verification, and troubleshooting purposes.

The method may also include on-tool classification of systematic defects and nuisance defects (e.g., defects that are not real or are not of interest) by dynamically compiling a table, list, or other data structure of unique patterns in the design data and comparing the portions of design data proximate the positions of the defects in design data space with the patterns in the table, list, or other data structure. The dynamically created set of patterns (or a static set of patterns) may be stored in a data structure such as a library along with design based classifications (DBC) associated with each of the patterns. In this manner, the DBCs may define the groups into which the defects may be binned, and the unique patterns may include POI design examples. As such, design data proximate to design data space defect positions is not compared to design data proximate other design data space defect positions, but to unique patterns in a dynamically created set of patterns. Such comparing may be performed as described further herein. For example, one embodiment that may utilize such a data structure (which may or may not be dynamically created) is a computer-implemented method for assigning classifications to defects detected on a wafer, which is described in detail below.

In addition, in some embodiments, the computer-implemented method is performed by an inspection system used to detect the defects. In this manner, binning defects may be performed "on-tool." One advantage of performing the method on-tool is that the time to results may be quicker. The method may be performed on-tool at any time after the defects have been detected (e.g., during inspection either while or after other defects are being detected, during analysis of the inspection results, during review, etc.). In addition, locations of potential systematic defects or systematic defects (hot spots) and data used for binning may be stored in a data structure (e.g., a hot spot database) and used for inspection comparison (monitoring). Therefore, binning may be performed during inspection to provide better classification (binning for discovery, filtering, or monitoring).

In an alternative embodiment, the computer-implemented method is performed by a system other than an inspection system used to detect the defects. In this manner, the method embodiments described herein may be performed "off-tool." The system that performs the method off-tool may include, for example, a microscope (optical or electron beam), a review system, a system into which the wafer is not loaded (e.g., a stand-alone computer system), or any other appropriate system known in the art that can be configured to perform the method. For example, the method may be performed after defect detection during a second pass of the wafer in which a microscope is used to acquire images of at least some of the detected defects. Such image acquisition may be performed using an optical microscope since an electron beam microscope may not be able to image some of the defects (e.g., defects that are not visible to the electron beam microscope such as defects that are located below an upper surface of the wafer). The image acquisition may be performed off-line and used to provide better sampling of the defects for review. Binning of the defects may also be used for analysis and sampling of the defects as described further herein.

In some embodiments, the method includes identifying hot spots in the design data based on the results of the binning step. In this manner, design based binning can be used for discovery of hot spots. In addition, discovery of hot spots can be performed on-tool. The method may also include generating a data structure that includes the discovered hot spots and one or more attributes of the hot spots such as location, design data proximate the positions of the hot spots, etc. The data structure may include a list, a database, a file, etc. The hot spots may be used for hot spot management (possibly on-tool). Hot spot management may include discovering hot spots, using on-tool pattern grouping to generate a hot spot data structure, and hot spot monitoring, which may be performed as described further herein. In addition, the hot spots discovered by design based binning can be used as input for DesignScan, PWQ, DOE, and review. Alternatively, the hot spots used in the methods described herein may be discovered using any other method or system known in the art such as a reticle inspection system.

FIG. 20 illustrates one embodiment of input to and output from module 166 that is configured to perform a computer-implemented method for binning defects detected on a wafer according to the embodiments described herein. Module 166 may be configured to function as a GDS pattern checker (exactness checker of the design data or portion of the design data proximate design data space positions of any two defects) and/or a similarity checker (non-exactness checker). The module may be configured to perform one or more of the steps described herein on-tool or off-tool. For example, the module may be configured to perform one or more of the steps described herein on-tool post-process (e.g., on-tool, post-defect detection). In addition, the module may be configured to perform one or more of the steps described herein during defect detection. If the module is configured to perform one or more of the steps described herein on-tool, the module may be configured to perform other functions described herein such as defect organizing.

The input to module 166 may include defect list 168. In one embodiment, defect list 168 may include defect information such as information included in a KLARF file or another standard file that may be produced by an inspection system. The input to the module may also include coordinate transformation information, which may be determined as described above, and design data. In such an embodiment, module 166 may be configured to transform the positions of the defects in defect list 168 as reported by the inspection system to positions of the defects in the design data space.

Alternatively, module 166 may be configured to perform functions in wafer space with access to transformed design data space coordinates provided through another software module (a software module configured to perform transformation functions). In another alternative, defect list 168 may include positions of the defects in the design data space. In such embodiments, the defect positions reported by the inspection system may be transformed to defect positions in design data space by another software module. Such defect information may be input to module 166 in a suitable data file format or through programmatic means via intra- or inter-process communication either on the same computational hardware or between a set of networked computational hardware. In this manner, the defect information may be provided to module 166 by another system via a transmission medium that couples the module to the other system. The transmission medium may include any suitable transmission medium known in the art and may include "wired" and "wireless" transmission media or some combination thereof.

Additional input (not shown in FIG. 20) may also be provided to module 166 that may be used by the module to perform one or more steps of one or more embodiments described herein. The additional input may include any other defect and/or design data information that is available such as electrical inspection data, defect information for more than one wafer, hot spot or weak spot information ("weak spots" are generally defined as locations of potential weak points in the design identified by model-based simulation such as, but not limited to, post-OPC verification software, and empirical methods such as, but not limited to, PWQ), a search window size (e.g., the dimensions of the portions of the design data proximate the positions of the source and target defects in design data space as described above or the source defect enlargement and the target defect enlargement), some predetermined criteria for similarity (e.g., a similarity threshold), or some combination thereof.

In addition, the hot spots may be grouped based on design data in advance. For example, hot spots located proximate to design data that is at least similar may be correlated with each other, and the method and system embodiments described herein may perform such correlating of the hot spots. The correlated hot spots may be used for binning defects as described further herein. In one such embodiment, module 166 may be configured to bin defects into groups such that the defects in each group have positions in design data space that are at least similar to positions of only hot spots that are correlated with each other. In this manner, the module may be configured to bin defects without using the design data. Furthermore, one or more attributes of correlated hot spots can be determined for use in later analysis (e.g., yield information such as KP can be determined for correlated hot spots). In this manner, when defects are binned into a group corresponding to correlated hot spots, the module can report the expected yield impact determined for the correlated hot spots for the defect group.

Module 166 may be configured to function as a GDS pattern checker by binning defects in defect list 168 by "checking" if the design data proximate to positions of different defects in design data space matches. In this manner, module 166 may be configured to bin defects in groups such that the defects in each group are located in design data space proximate to matching design data. In addition, or alternatively, module 166 may be configured to function as a similarity checker by binning defects in defect list 168 by checking the similarity of the design data proximate to the positions of different defects in design data space.

Output of module 166 may include output 170. Output 170 may include a list of a variety of information including, but not limited to, the x and y coordinates of the defect positions as reported by the inspection system, the x and y coordinates of the defect positions in design data space, an identity (e.g., 1, 2, 3, a, b, c, etc.) of the group in which the defects were binned (e.g., if the defects are binned in the same group, their identity may be the same), and shift or offset in the x and/or y directions between the center of the target portion and the center of the area within the target portion in which design data matching or at least similar to the design data in the source portion is located. The output may include one or more data structures having any suitable format known in the art (e.g., a plain text file format). In addition, the output may be stored in any appropriate storage medium known in the art such that the output may be accessed and/or analyzed at a later time. The output may be stored and used as described further herein.

In addition, or alternatively, as shown in FIG. 21, the output of module 166 may include a table illustrating how similar (e.g., % similar) the design data proximate to the position of each defect in design data space is to the design data proximate to the position of each other defect in design data space. In the example shown in FIG. 21, the portions of the design data proximate to the positions of defects 1 and 2 in design data space are 40% similar while the portions of the design data proximate to the positions of defects 1 and 3 in design data space are 95% similar. In this manner, the method may use the output shown in FIG. 21 to determine which defects are to be binned in the same group. For instance, if the portions of the design data proximate the positions of the defects in design data space are more than 90% similar, the defects may be binned in the same group. In addition, as shown in FIG. 21, the portion of the design data proximate the position of defect 1 in design data space is more than 90% similar to the portions of the design data proximate to the positions of both defects 3 and 4 in design data space. In this manner, defects 1, 3, and 4 may be binned in the same group.

In another example, as shown in FIG. 22, the output of module 166 may include a graph (e.g., a bar graph) illustrating the number of defects (e.g., defect count or frequency) as a function of different groups. Each of the different groups includes defects located at design data space positions proximate to design data that is the same or at least similar as described further above. In this manner, the output shown in FIG. 22 provides information about which pattern types in the design are more defective. The chart may provide a breakdown of pattern types by various design contexts (e.g., background pattern context by functional block). The information in the chart can be further split by annular or angular zone on the wafer as described further herein to provide information about the spatial distribution of defects located in design data space proximate a common design pattern. This and similar or other information may be used to perform one or more step(s) of the methods described herein (e.g., defect sampling based on background pattern context). Additional information about the defects binned in each group may also be determined using any of the step(s) of any of the method(s) described herein.

Module 166 may provide output in only one of the formats shown in FIGS. 20-22. However, the module may provide output in more than one of the formats shown in FIGS. 20-22.

Figure 23:
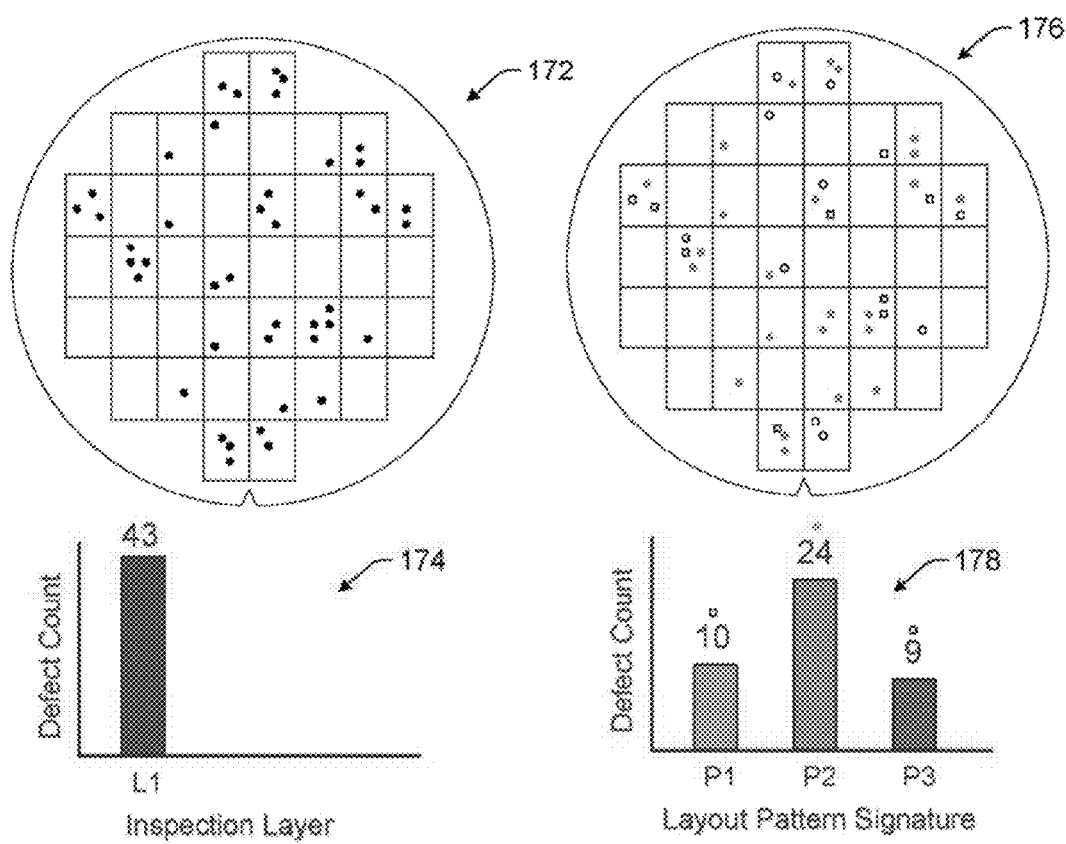
FIG. 23 is a schematic diagram illustrating one embodiment of input and output of the module of FIG. 20.

An additional example of different inputs and outputs of module 166 are illustrated in FIG. 23. As shown in FIG. 23, one input to module 166 may include wafer map 172 that illustrates the positions of the detected defects on the wafer. The wafer map may be generated by an inspection system. The wafer map may illustrate the positions of the defects on the wafer but not any other information about the defects. For instance, bar graph 174 corresponding to wafer map 172 illustrates all of the detected defects in a single group corresponding to the layer of the wafer that was inspected.

Output of module 166 may include wafer map 176 that illustrates the positions of the detected defects on the wafer, and defects that are binned into the same group are indicated in the wafer map with the same characteristics (e.g., different colors or symbols for different groups). The defects may be binned as described further herein (e.g., automatic grouping of defects by common GDS layout). In this manner, wafer map 176 indicates the positions of individual defects on the wafer and the group into which the individual defects were binned. The output may be sent to and used by a spatial signature analysis (SSA) tool such as KLARITY DEFECT SSA, which is commercially available from KLA-Tencor, to enhance monitoring and root cause determination.

The output of the module may also include a stacked die map, a stacked reticle map, or a stacked wafer map in which defects are displayed to represent the pattern groups. The stacked maps can be used to illustrate where systematic defects tend to occur statistically over many die, reticles, or wafers and may be useful for identifying spatial signatures. Furthermore, any of the output of the module described herein may also include one or more GDS clips, one or more SEM images, one or more optical images, or some combination thereof. The output of the module may be displayed by a user interface such as the user interface embodiments described further herein.

Bar graph 178 corresponding to wafer map 176 illustrates the number of defects that were binned into each group. In addition, the layout pattern signature that corresponds to each group of defects is indicated in the bar graph. In this manner, the bar graph illustrates the pattern in the design that exhibits (or causes) the most defectivity. For instance, the relatively high number of defects binned into the layout pattern signature 2 group indicates a potential pattern dependent failure mechanism corresponding to this layout pattern signature. This information may be used to perform one or more step(s) of the methods described herein (e.g., defect sampling based on design background context). Additional information about the defects binned in the groups may also be determined using any of the step(s) of any of the method(s) described herein. Module 166 may generate output including wafer map 176 and bar graph 178. The output of the module may be displayed by a user interface such as one of the user interface embodiments described further herein.

Figure 24:
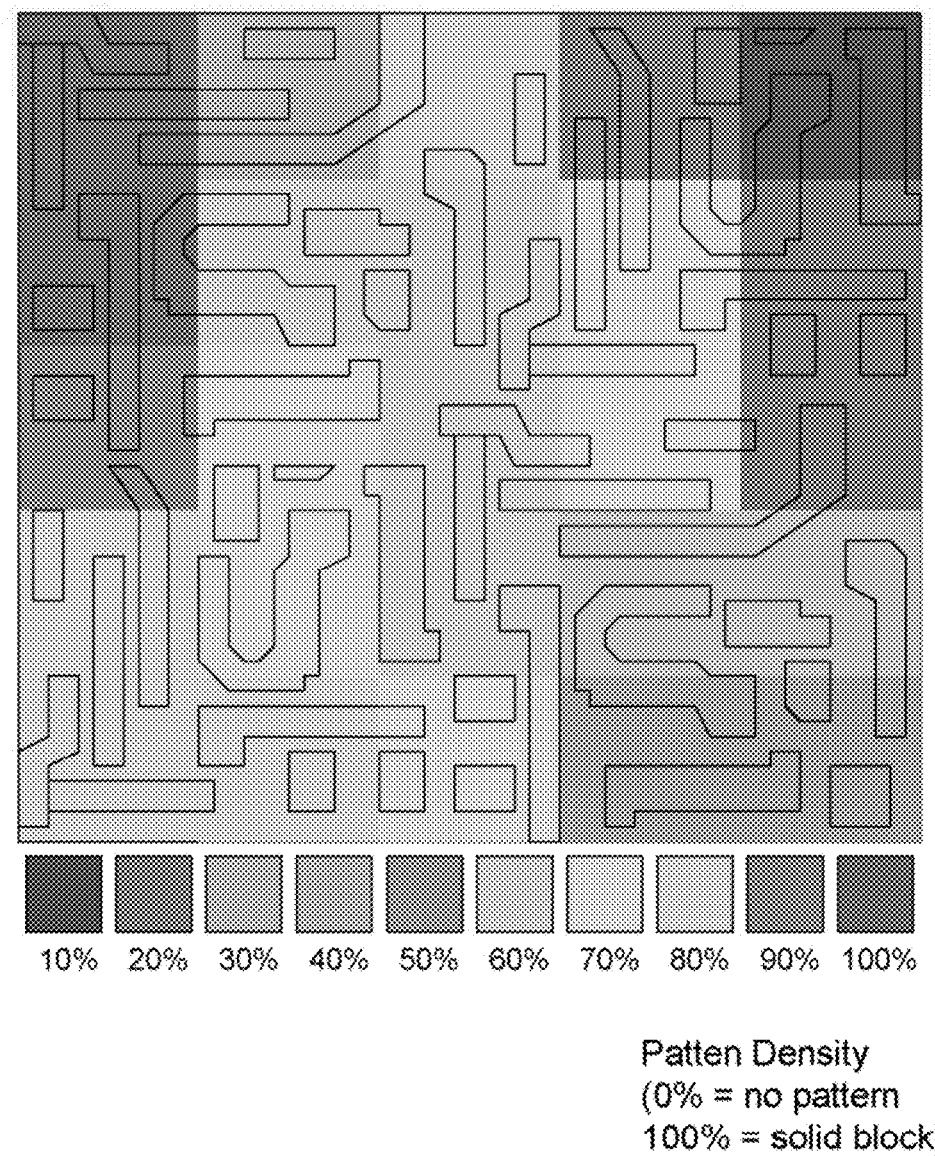
FIG. 24 is a schematic diagram illustrating a top view of one embodiment of output of the module of FIG. 20.

One example of how the output of module 166 may be used in the methods described herein is for correlation of different density zones in the device layout with different defectivities. For example, the device layout may be partitioned into different zones. The different zones may be determined based on the design pattern density of different areas of the device, as shown in FIG. 24. In one example, major cell blocks in the device may be partitioned into different zones. In another example, the device layout may be automatically partitioned based on the density of various device structures (e.g., contacts, vias, metal lines, etc.) across the device layout. In one embodiment, the method embodiments described herein include determining a defect density for different portions of the design data. For example, the methods described herein may use information about the partitioning of the device layout to determine a defect density of different portions of a cell in the design data. In one such instance, the number of defects detected in each zone in the design data may be determined. Such information may be plotted in a bar graph or any other suitable output format.

In another embodiment, module 166 splits the design data into "functional blocks" or "cell blocks." Cell blocks are defined in the design data and identify the boundaries of major and minor sub-cells of the design such as an input/output (I/O) block, a digital signal processor (DSP) block, etc. The module may determine the frequency of defects in each cell block. In this manner, it is possible to determine whether a major or minor cell in the design is more or less susceptible to yield issues.

The embodiments described herein may use statistical approaches to determine the design cells in which the defects are located. For example, in some embodiments, the method includes determining if the defects are systematic defects, determining a probability that two or more of the systematic defects are located in one or more different portions of the design data, and determining if a correlation exists between the systematic defects and the probability. In particular, as described further herein, region information in design data (i.e., the hierarchical design data) may be used in combination with the positions of the defects in the design data space to determine the hierarchy of the defects in the design data such as a cell in the design data. As described further herein, the hierarchy of the defects in the design data may be used to determine which portions of the design data can or should be altered to improve yield. One difficulty in determining the hierarchy of the defects is that as cells get smaller, the sizes of the cells approach and become smaller than the coordinate accuracy of inspection systems thereby decreasing the accuracy with which the cell in which the defects are located can be determined. To overcome this difficulty, statistics may be used to determine the probability that the defects are located in various portions of the design data (e.g., the probability that each defect is located in different cells). In this manner, for systematic defects, the statistics may be used to determine if a correlation exists between the systematic defects and the probability that the defects are located in various portions of the design data.

In another embodiment, the input provided to module 166 may include the design data (e.g., GDS layout), inspection data (e.g., physical defect data), and optionally a memory bitmap and/or a logic bitmap. The module may use some or all of the input to perform one or more additional steps such as, but not limited to, discovery, characterization, monitoring, and dispositioning (e.g., making one or more actionable decisions) of defects that will or may affect yield. The module may be configured to perform the steps described above in addition to one or more of the following steps: generating a hot spot/weak spot data structure, grouping of defects (e.g., defects detected by an optical or electron beam inspection system and/or defects detected by electrical inspection that are displayed in a bitmap) using the design data, generating a review sample plan, optimizing an inspection recipe, altering a review recipe (e.g., determining where to review), optimizing a review recipe, altering a defect analysis recipe (e.g., where to analyze during an in-line FIB process and/or a FA process may be determined based on design context possibly in combination with any other information described herein), optimizing a defect analysis recipe, generating a sampling recipe for a FIB process, an EDX process, or another defect analysis process, generating a sampling recipe for a metrology process, and predicting DOI and possibly one or more attributes of the DOI such as type and location. In addition, any of the sampling plans or sampling recipes described above may be determined dynamically based on results of the binning. In one such example, the module may be configured to analyze the design data or to acquire analysis of the design data such as results from DRC to predict potential DOI that may be detected in inline defect data and bitmap data.

As described above, module 166 may be configured to generate a data structure such as a database. For example, in some embodiments, the method includes generating a data structure that includes positions of systematic defects and potential systematic defects in the design data space and one or more attributes of the systematic defects and the potential systematic defects. Such a database may be generally referred to as a "hot spot" database. The database may also include information about weak spots, conditional hot spots, and cold spots (non-critical areas of the design that can result in systematic defects with little or no yield impact (e.g., dummy structures, dummy fill areas, etc.)). The database may also include locations and other attribute(s) of potential and real systematic defects (e.g., design context, KP, other yield property, etc.).

The data in the hot spot database may be acquired from a variety of sources. For example, the database may be configured as a flexible database that includes data about systematic issues from all (or at least some) possible sources. For example, some of the input to the module may be included in the database. In one such example, inspection results (e.g., PWQ results, defects detected by BF and/or DF inspection, a memory bitmap, a logic bitmap, etc.) may be included in the database. In some embodiments, the database may also include design rules for one or more semiconductor manufacturing processes such as lithography and CMP. In another embodiment, the database may include simulations performed for the design data such as results of OPC simulations. In this manner, a multi-source correlation may be used to identify hot spots and systematic defects.

As described above, the method includes binning defects based on the design data. In one such embodiment, the method described herein includes determining if the defects are nuisance defects based on one or more attributes of the design data. In this manner, nuisance defects may be identified based on context information. In some embodiments, the method includes removing a portion of the defects from results of an inspection process in which the defects were detected based on the design data proximate to the positions of the defects to increase the S/N of the results of the inspection process. In this manner, information about the design located proximate the positions of the defects in design data space can be used to reduce noise in the inspection results thereby increasing the S/N of the inspection results. For instance, defects in non-functional areas of the design can be binned in a group and filtered as nuisance from the inspection results before the inspection results are used for subsequent analysis. In another example, defects may be separated based on whether the defects are located in a care area or a non-care area of the wafer. In an additional example, defects that are systematic but are located in a portion of the design in which nuisance defects (e.g., non-DOI) are known to occur may be removed from the inspection results to increase the S/N of the results for DOI. One or more portions of the design in which nuisance defects are known to occur may be determined by a user and may be stored in a data structure such as a design library. For example, portions of the design in which nuisance defects are known to occur may include the polygons that the user has chosen specifically to use for supervised binning. In addition, if the POIs are defined prior to performing the binning method, then the binning method may perform supervised binning using the defined POIs. Alternatively, the POIs may be determined by a method as described further herein. The methods described herein may include performing supervised binning on the inspection system and excluding nuisance defects from the inspection results.

Removing a portion of the defects as described above thereby increasing the S/N of the inspection results may be advantageous for post-processing of the inspection results. For example, removing the portion of the defects (e.g., to remove non-yield impacting defects) may be performed prior to binning of the defects and may increase the S/N of the binning results for defect types of interest. In addition, analysis of the inspection results or results of the method embodiments described herein may be quicker and more accurate when the S/N of the results is higher and includes less noise. In one particularly advantageous example, in PWQ methods, a major source of noise is line end shortening (LES) that is detected as defects. However, LES generally does not significantly affect yield. Therefore, users generally do not care about LES, and because LES can appear in relatively large numbers, detected LES can overwhelm other defects that are more relevant to yield. As such, removing detected LES from results of inspection as described herein is particularly advantageous for further processing of the inspection results. The defects may include defects detected by an optical or electron beam inspection system. In addition, as described further herein, an inspection recipe can be created based on the design context to differentiate these defects during the inspection. In this manner, the methods and systems described herein can be used to create inspection recipes that can detect more DOI and suppress more nuisance defects and are capable of classifying systematic and random defects and pattern based binning of systematic defects.

In another embodiment, the method includes determining if one or more groups of defects correspond to nuisance defects by reviewing at least some of the defects in the one or more groups and removing the one or more groups corresponding to the nuisance defects from results of an inspection process in which the defects were detected to increase S/N of the results of the inspection process. Reviewing at least some of the defects may be performed as described herein or in any other suitable manner known in the art. Determining if one or more groups of defects correspond to nuisance defects may be performed using any results of review in any suitable manner. If one or more groups of defects correspond to nuisance defects, the one or more groups may also be removed from (filtered out of) the inspection results to increase S/N of DOIs within the inspection results.

As described above, the embodiments described herein advantageously use design data and defect positions in design data space to bin defects as opposed to defect information and/or background information as printed on the wafer. However, the design data in design data space may be used in combination with other information to bin the defects (e.g., to produce finer separation between the defects binned into different groups). For instance, in one embodiment, binning the defects includes binning the defects in the groups such that the portions of the design data proximate the positions of the defects in design data space in each of the groups are at least similar and such that one or more attributes of the defects in each of the groups are at least similar. The attribute(s) of the defects may include any of the defect attribute(s) described herein. In addition, the defect attribute(s) may include any defect attribute(s) that can be determined from results of the inspection. As such, binning may be performed using a combination of design and one or more attributes of the defects. In this manner, the method may separate defects into groups based on design data and defect attribute(s). Therefore, different types of defects that are located in design data space in portions of the design data that are at least similar may be separated. Such binning may be advantageously used to identify different defect mechanisms in a region of the design data and the rate at which the different defect mechanisms occur.

In another embodiment, the portions of the design data proximate the positions of the defects include the design data on which the defects are located. In other words, the portions of the design data that are compared for binning may include the design data "behind" the defects. In this manner, binning may include geometry binning by using the geometry in the design data on which the defect is located. Such binning may be performed for defects for which defect locations are reported with relatively high coordinate accuracy such that the probability that the correct geometry is used for binning is relatively high. Using the design data "behind" the defects is possible in embodiments described herein because the design data used in the embodiments is not the design data as printed on the wafer. In contrast, defects on a wafer may obscure the design data printed at the same location on the wafer or in an area surrounding the defect, which may further reduce the accuracy of methods for binning defects based on the design data as printed on the wafer. In another embodiment, the portions of the design data proximate the positions of the defects used in embodiments described herein include the design data around the positions of the defects. In addition, binning may be performed using the geometry on which the defects are located and the geometry surrounding or proximate to the positions of the defects in design data space.

As described above, binning may be performed without regard to the positions of the defects within the portions of the design data. Such binning may be particularly advantageous for defects that are detected by an inspection system that reports defect locations with relatively low accuracy. In addition, such binning may produce substantially highly accurate binning results while providing important information such as which portions of the design data exhibit particularly high defectivity and/or particularly high defectivity rates. However, in an additional embodiment, binning the defects includes binning the defects in the groups such that the portions of the design data proximate the positions of the defects in each of the groups are at least similar and such that positions of the defects in each of the groups with respect to polygons in the portions are at least similar. In this manner, binning may be performed using a combination of the portions of the design data proximate the positions of the defects in design data space and the positions of the defects with the portions of the design data. As such, binning may be performed based in part on where in the geometry the defects are located. In other words, binning may be performed based on the inter-portion positions of the defects in combination with the design data proximate the inter-portion positions. Such binning is preferably performed for defects for which locations are reported with relatively high coordinate accuracy such that substantially accurate inter-portion positions of the defects are used for binning. In this manner, defects that are located in the same portions of the design data but impact the device in different ways due to different inter-portion positions may be separated. For example, using such binning, defects that are located between two features in a portion of the design data and therefore have a relatively high probability of causing an open in the device may be separated from defects that are located entirely within one of the two features and therefore have a much lower probability of causing an open in the device. Therefore, such binning may be advantageously used to identify defects having different yield impacts on a region of the design data and the rate at which the different yield impacting defects occur.

In some embodiments, the binning step includes binning the defects in groups such that the portions of the design data proximate the positions of the defects in each of the groups is at least similar and such that hot spot information for the portions of the design data proximate the positions of the defects in each of the groups is at least similar. The hot spot information may include any of the hot spot information described herein or any other hot spot information known in the art. The hot spot information may be determined for the different portions of the design data as described further herein. In this manner, the method may perform binning using a combination of the design data and the hot spot information. In one such example, hot spots in the design data that have similar impacts on yield may be binned as described above before the method is performed. Therefore, defects can be binned based on design data similarities, and then the groups of defects resulting from this binning may be separated into sub-groups of defects having similar yield impact. In one such example, all portions of design data that are at least similar may not be associated with the same hot spot information if, for example, some of the positions are located above or below design data that is dissimilar. As such, defects located proximate at least similar portions of design data may be separated based on the hot spot information for each portion of the design data. In this manner, the overall yield of the process that was used to fabricate the wafer can be assessed quickly and accurately. In addition, the hot spot information may be used for binning to check or verify that the similarity of the portions of the design data has been determined correctly. For example, if portions of the design data that are determined to be at least similar are not associated with at least similar hot spot information, the defects corresponding to the portions of the design data may not be binned into the same group.

In another embodiment, the method includes determining if the defects in one or more of the groups are systematic defects or random defects based on one or more attributes of the design data proximate the positions of the defects in design data space, one or more attributes of the defects, or some combination thereof. In this manner, the method may include collectively classifying defects as a group. For instance, the systematic defects may be classified as nuisance defects or defects not of interest as a group. However, such classification may be performed for individual defects. The attribute(s) of the defects that may be used to determine if the defects are systematic or random defects may include, for example, if the defects are present at approximately the same location in more than one die, if the defects in more than one die have approximately the same attribute(s), and if the distribution of more than one defect in a die is orderly and/or clustered. In one example, defects that appear in only one die on a wafer may be classified as random defects, and defects that appear in a number of die at approximately the same location may be classified as systematic defects. The methods described herein may, therefore, be used to determine a cause of a defect detected on a wafer by an inspection process (an inline inspection process and/or an electrical inspection process) using information about the defects.

In some embodiments, the method includes classifying one or more groups of defects based on results of review of at least some of the defects in the one or more groups, one or more attributes of the design data, one or more attributes of the defects, or some combination thereof. Review of at least some of the defects in one or more groups may be performed as described herein or in any suitable manner known in the art. The one or more attributes of the design data and the one or more attributes of the defects may include any of the attribute(s) described herein. In this manner, defects may be classified collectively as a group based on a substantial amount of information thereby providing relatively quick and relatively accurate defect classification.

In another embodiment, the method includes determining if a group into which defects are binned as described herein contains systematic or potential systematic defects. In this manner, the defects may be classified as systematic or potential systematic defects collectively as a group. However, the defects may also be individually classified as systematic or potential systematic defects. For example, the defects may be classified in these embodiments based on the positions of the defects with respect to polygons in the design and whether hot spots, cold spots, etc. are located at approximately the same positions. The methods described herein may, therefore, be used to determine a cause of a defect detected on a wafer by an inspection process (an inline inspection process and/or an electrical inspection process) using information such as design data.

In some embodiments, the method includes monitoring systematic defects, potential systematic defects, or some combination thereof over time using the results of the binning step. For example, the results of the binning step may be used to identify systematic issues in the design data, and the identified systematic issues may be monitored for reoccurrence across wafers and/or across time. Monitoring the systematic and/or potential systematic defects may be performed using any of the results of any of the methods described herein.

In addition, monitoring the systematic and/or potential systematic defects may be performed in a manner similar to statistical process control (SPC) methods. For example, monitoring systematic defects, potential systematic defects, random defects, or some combination thereof can be used for yield-based SPC, in which different SPC methods and/or algorithms are used for different types of defects. In one such example, SPC parameters may be used for monitoring different types of defects, and the SPC parameters may be determined or selected based on potential yield impact of the different types of defects, which may be determined as described herein. In this manner, different types of defects may be monitored simultaneously for SPC, but with different SPC parameters. In another embodiment, only a subset of the defects detected by inspection may be used for SPC. For example, only non-nuisance systematic and/or potential systematic defects may be monitored for SPC purposes such that the process can be monitored for design based process marginalities. In an additional example, only systematic defects that are determined to have potentially large impacts on yield may be monitored for SPC such that changes in the yield of the fabrication process caused by changes in these defects may be detected relatively early and accurately. In addition, using different methods for estimating yield impact of systematic defect groups and random defects may advantageously provide more accurate prediction, monitor, and control of yield-related issues. In this manner, the method may provide information about fabrication of the device (e.g., increase in systematic defects over time, decrease in systematic defects over time, change in systematic defects over time, etc.) that can be used to monitor and improve yield of the fabrication.

In one embodiment, the method may include determining the cause of pattern based defects (e.g., systematic defects). For example, if one or more pattern based defect groups are dominant, the method may include acquiring inline inspection data and/or electrical inspection data for a number of other wafers for the same layer and the same device. For instance, inline inspection data and/or electrical inspection data may be acquired for about 100 to about 1000 other wafers. This data may be acquired from a storage medium such as a defect database or a fab database. If such data is not available, the method may include generating such information by inspecting wafers that have already been processed (or processing other wafers) in the processes which were performed on the wafer on which the systematic defects were detected and then inspecting the wafers.

The method may also include performing pattern-based binning of the defects detected on the additional wafers, which may be performed as described herein. The method may include determining if the one or more pattern based defect groups are dominant for the additional wafers. If the additional wafers exhibit commonality of dominant pattern based defects, the method may include determining if the wafers were processed through common equipment (or process tools). In this manner, the method may perform equipment commonality analysis. The method may include determining if the dominant pattern based defect groups are correlated to specific equipment, a specific chamber (e.g., equipment or a chamber whose parameters may have drifted for some reason), or a specific route-step (e.g., an integration issue between equipment and two or more steps). If the dominant pattern based defect groups are correlated to specific equipment or a specific chamber, then the cause of the pattern based defect groups has been isolated and possibly identified. The method may include stacking data to determine if there is a spatial signature for a group of interest. Spatial signatures can be useful for narrowing-down or determining the cause of process-, OPC- or design-related systematic issues, or combinations thereof.

If the dominant pattern based defect groups cannot be correlated to specific equipment or a specific chamber, then the method may include performing data mining to attempt to correlate the defects to other process factors. Data mining may be performed in any suitable manner known in the art based on any information about the defects and the design data and any information generated during device fabrication, which may be stored in one or more storage media such as a fab database. If a relatively strong correlation between one or more other process factors and the defects is identified, then the process factor(s) correlated to the defects may be identified as the cause of the defects. If a relatively strong correlation between one or more other process factors and the defects cannot be identified, then the method may include performing arbitrary pattern searching of the design for the potential POIs and setting up new inline hot spot monitors such that the cause of the pattern dependent defects may be determined. However, if process conditions are ruled out, it is then likely that the process itself or the design itself should be evaluated and, if necessary, adjusted to reduce or remove the problem. In addition, by comparing the attribute(s) of the systematic defects to results of process window mapping, inference may be made as to the probable sources and/or root cause.

The method may use information about the systematic and/or potential systematic defects to perform data reduction. For instance, there may be 50,000 to more than 200,000 hot spots generated by a full-die pattern-based search for a single POI or from empirical techniques such as electrical functional testing and lithography PWQ results. Therefore, to process and analyze this data in a meaningful and timely manner, data reduction techniques may be performed on the data. In one such example, for pattern based hot spots, the method may include binning the hot spots into "looks-like" groups. For example, each group may include hot spots located proximate to at least similar patterns in design data and/or located proximate to design data having one or more attribute(s) that are at least similar (e.g., hot spots located in relatively low pattern density areas of the design may be binned in a group). As such, the method may include binning hot spots based on design context and/or design attribute(s). In an additional example, for empirical techniques such as PWQ, the method may include removing from a defect population on which review sampling is performed defects that are proximate to locations of the design with little or no yield impact (cold spots). By performing data reduction as described above, a better (e.g., more yield relevant) review sample may be generated using the reduced data as described further herein.

The methods and systems described herein may include CBI in combination with design- and yield-based post processing (performed on-tool or off-tool) of inspection results. For example, after the nuisance, systematic, and random defects have been identified, the defects may be organized in some manner (e.g., using a defect organizer (DO) or an inline defect organizer (iDO)). In one example, the results are stored in a data structure such as a database. In another example, as described above, after the defects have been binned into groups based on portions of the design data proximate the positions of the defects in design data space, the defects in the groups may be further separated based on one or more attributes of the design data proximate to the positions of the defects in the design data space, one or more attributes of the defects, or some combination thereof. The defects may be separated based on one or more attributes of the design data and/or one or more attributes of the defects using iDO. In this manner, design based binning may be used in combination with iDO in the embodiments described herein. In particular, the output of design based binning may be input to iDO.

The one or more attributes of the design data, which are used to further separate the defects binned into groups based on design data, include, but are not limited to, one or more attributes of the patterns or structures in the design data proximate to the positions of the defects in the design data space, the pattern density proximate the positions of the defects in the design data space, the functional block in which the defect is located, and one or more attributes of the device (e.g., n-MOS or p-MOS). The one or more attributes of the defects, which are used to further separate the binned defects, include, but are not limited to, size, shape, brightness, contrast, polarity, and texture.

The results of design based binning and iDO may be illustrated in a bar graph. The bar graph may illustrate the total number of defects versus pattern in the design data in which the defects were detected and the number of defects within sub-groups as a function of pattern. Using design based binning in combination with iDO as described above may be used to separate random and systematic defects, to prioritize groups into which the defects were binned, and/or to identify and possibly prioritize changes that should be made to the design data (e.g., using potential yield impact of the defect groups, which may be determined as described further herein). In particular, the value that design based binning provides for separation of systematic and random defects may be increased by using iDO for further separation of the systematic (and possibly random) defects. In addition, the value that design based binning provides for separation of systematic and random defects may be increased by using yield relevancy possibly in combination with iDO for separation of the systematic (and possibly random) defects.

In this manner, the systematic defect population and the random defect population may be processed separately (e.g., the systematic defect population and the random defect population may be independently sampled). The different populations or different information for systematic and random defects may be used to generate separate results for the systematic defects and the random defects. For instance, the systematic and random defects may be illustrated in different bar graphs or other graphical or textual representations that may be processed automatically and/or used by a user. After sampling the defects for review, the systematic defects, and optionally some of the random defects, may be reviewed using a suitable review system (e.g., a relatively high magnification optical review system or a SEM). The results of defect review may be used to normalize the defect density of both the systematic and random defects.

The methods and systems described herein provide a number of advantages for the user. For instance, the methods and systems provide efficient baseline yield improvement, better excursion detection, improved review system efficiency, more efficient root cause detection, and improved knowledge retention. In addition, the results of the embodiments described herein may include various other types of information that are useful for consumers of the results (e.g., customers of the device manufacturers). Such other types of information may include information such as process tool owner, designer, integration engineer, etc.

Furthermore, it has been estimated that more than 50% of yield loss at 90 nm design rules and beyond will be caused by systematic issues. As such, systematic yield issues are significant at 90 nm design rules and are dominant at design rules smaller than 90 nm. Therefore, separating the systematic defects from nuisance defects and random defects as described above allows for better evaluation, analysis, and control of these systematic issues. Moreover, the locations of the systematic defects may be compared to the locations of functional blocks in the design data. In this manner, the systematic defects may be correlated to one or more functional blocks, and this information may be used to improve the S/N. In particular, the method may include separating the defects based on functional blocks in which the defects are located to improve S/N. In a similar manner, the method may include separating the defects based on hierarchical cells into which the design data is organized by design. Therefore, to improve S/N, the defects binned into groups and/or the defects to which a DBC has been assigned may be separated based on functional block (or any level of the hierarchy) in which the defect is located (e.g., memory or logic). The portions of the design data used in the embodiments described herein may correspond to any cell structure or hierarchy of cells.

The percentage of the defects per functional block may be determined in the methods described herein. In this manner, the functional blocks containing design issues may be identified based on the percentage of the defects detected in each functional block and/or binned into groups corresponding to the functional blocks. Additional information about the defects located in the functional blocks may be used to identify the design issues in each block. The above-described information may also be used to select and/or prioritize design issues for correction based on how many defects can be eliminated by the corrections. For instance, if it is determined that about 70% of the defects are caused by four design issues in four different functional blocks of the design, only these four design issues may be selected for correction, or these four design issues may be selected for correction before any others are corrected (e.g., by prioritizing the design issues based on the number or percentage of the defects caused by the design issues). A user (e.g., a chip designer) may have a choice of cell designs to use and may choose to use cell designs that historically exhibit fewer systematic defects, and such information about the cell designs may be generated using the embodiments described herein.

In another embodiment, the method includes prioritizing one or more POIs in the design data and optimizing at least one of the one or more POIs based on results of the prioritizing step. In one such embodiment, the POI(s) may be prioritized based on the number of defects detected in the POI(s). The number of defects detected in each POI can be determined from the results of the binning step, for example, by comparing the POI(s) or one or more attributes of the POI(s) to the portions of the design data corresponding to the groups and assigning to the POI the number of defects in the group corresponding to portions of the design data (and/or one or more attributes of the portions of the design data) that are at least similar to the POI(s) (or the attribute(s) of the POI(s)). In this manner, the POI in which the largest number of defects has been detected may be assigned the highest priority, the POT in which the next largest number of defects have been detected may be assigned the next highest priority, and so on.

In another embodiment, the method includes prioritizing one or more systematic defects types for yield optimization (e.g., by changing the process parameters, the design, OPC, etc., or some combination thereof). In one such embodiment, the systematic defect types may be classified as POI or groups of POI, and the POIs may be prioritized based on the number of defects detected on or near the POIs, which may be determined as described above. The priority may be further enhanced by using the criticality of the systematic defect(s) detected in the POI, the frequency of the POI in the design, and the sensitivity of the POI to process variation to prioritize the systematic defects.

In addition, or alternatively, the POI(s) may be prioritized based on any other results of any step(s) of any of the method(s) described herein or any combination thereof. For example, prioritizing the POI(s) may include determining a defect criticality index (DCI) for one or more defects detected in the POI(s) and prioritizing the POI(s) based on the DCI for the one or more defects. The DCI may be determined in this embodiment as described further herein. In another example, prioritizing the POI(s) may include determining a KP value for one or more defects detected in the POI(s) and prioritizing the POI(s) based on the KP values for the one or more defects. In yet another example, the POI(s) may be prioritized based on a combination of number of defects detected in or proximate the POT(s) and a DCI for one or more of the defects detected in or proximate the POI(s). In this manner, prioritizing the POT(s) may include prioritizing the POI(s) based on defectivity exhibited by the POI(s) such that the POI(s) having higher defectivity are assigned higher priorities.

Furthermore, the POI(s) may be identified and/or prioritized based on one or more attributes of the POT(s) possibly in combination with other results described herein. The one or more attributes of the POI(s) may include, for example, dimensions of features in the POI(s), density of features in the POI(s), the type(s) of features included in the POI(s), position of the POI(s) within the design, susceptibility of the yield impact of the POI(s) to defects, etc., or some combination thereof. In one such example, POI(s) that are more susceptible to yield impact by defects may be assigned a higher priority than POI(s) that are less susceptible to impact of defects on yield.

Moreover, the POI(s) may be prioritized based on one or more attributes of the design possibly in combination with one or more attributes of the POI(s) and/or other results described herein. The one or more attributes of the design may include, for example, redundancy, electrical connectivity, electrical attributes, etc., or some combination thereof. In particular, a cell in the design data may have context beyond the pattern contained within the cell. Such context may include, for example, hierarchy of cells, redundancy (or not), etc. Therefore, the one or more attributes that are used in the embodiments described herein may include context of the cells in which the POI(s) are located, which may be determined based on the positions of the POI(s) in design data space and/or the design data of POI(s) (if the design data is specific to a cell in the design data). In one such example, POI(s) that are not redundant in the design (e.g. non-array) may be assigned a higher priority than POT(s) that are redundant (e.g. array). The POIs may also be prioritized based on redundancy of connections between cells (e.g., routing or redundant vias). Such context of the design may be acquired and/or determined in any manner known in the art.

Optimizing at least one of the POIs based on results of the prioritizing step may include altering any one or more attributes of the POIs such as dimension(s) of feature(s) of the POI(s), density of feature(s) of the POI(s), etc., or any combination thereof. The one or more attributes of the POIs may be altered by altering the design data corresponding to the POIs. Preferably, the POI(s) are altered to decrease defectivity of the POI(s) (e.g., number of defects detected in the POI(s)), to alter one or more attributes (e.g., DCI, KP, etc.) of defects detected in the POI(s), and/or to increase yield of devices in which the POI(s) are included. In addition, POI(s) having a higher priority as determined by the prioritization step may be altered and optimized before POI(s) having a lower priority as determined by the prioritization step. In this manner, POI(s) exhibiting the largest defectivity and/or defectivity that has the largest impact on yield may be altered and/or optimized before POI(s) exhibiting lower defectivity and/or defectivity that has less of an impact on yield. As such, the results of the prioritization step indicate which POI(s) can be altered and/or optimized to produce the largest improvements in yield, and those POI(s) can be altered and/or optimized before other POI(s).

This embodiment is, therefore, advantageous over other previously used methods and systems for altering design data because without timely guidance as to which POI(s) have the largest impact on yield, alterations made to the design data and/or manufacturing processes are delayed resulting in slower improvements in yield and increased time to market. Furthermore, although the POI(s) that are altered in this step may include only the POI(s) that are included in the design printed on the wafer prior to detection of the defects binned in the embodiments described herein, the POI(s) that are altered to optimize the POI(s) may include POI(s) included in more than one design. For instance, if more than one design includes the POI(s), based on the prioritization and/or any other results of the methods described herein, the POI(s) in different designs may be altered and optimized to thereby increase the yield of devices fabricated with each of the different designs.

In an additional embodiment, the method includes prioritizing one or more POIs in the design data and optimizing one or more RET features of the one or more POIs based on results of the prioritizing step. Prioritizing the POI(s) in this embodiment may be performed as described above. The RET feature(s) that are optimized in this step may include any RET feature(s) (e.g., OPC features) that are included in the design. Optimizing the one or more RET features of the one or more POIs based on results of the prioritizing step may include altering one or more attributes of the RET feature(s) (e.g., dimensions of the RET feature(s), shape of the RET feature(s), position of the RET feature(s) with respect to features in the POI(s), etc.). The one or more attributes of the RET feature(s) that are altered in this step preferably include any attribute(s) of the RET feature(s) that will decrease the defectivity in the POI(s) and/or increase yield.

In addition, optimizing the one or more RET features based on the results of the prioritizing step in this embodiment may include optimizing the RET feature(s) for the POI that has been determined to have the highest priority before optimizing the RET feature(s) for other POIs. In this manner, RET feature(s) of POI(s) having higher priorities may be altered before RET feature(s) of POI(s) having lower priorities are altered. In this manner, RET feature(s) of POI(s) exhibiting the largest defectivity and/or defectivity that has the largest impact on yield may be altered and/or optimized before RET feature(s) of POI(s) exhibiting lower defectivity and/or defectivity that has less of an impact on yield. As such, the results of the prioritization step indicate which POI(s) can be altered and/or optimized to produce the largest improvements in yield and the RET feature(s) of those POI(s) can be altered and/or optimized before the RET feature(s) of other POI(s).

This embodiment is, therefore, advantageous over other previously used methods and systems for altering design data because without timely guidance as to which POI(s) have the largest impact on yield, alterations to the design are delayed, resulting in slower improvements in yield and increased time to market. Furthermore, although the RET feature(s) of the POI(s) that are altered in this step may include only the RET feature(s) of the POI(s) that are included in the design printed on the wafer prior to detection of the defects binned in the embodiments described herein, the RET feature(s) of the POI(s) that are altered and/or optimized may include RET feature(s) of POI(s) included in more than one design. For instance, if more than one design includes the POI(s) with the same RET feature(s), based on the prioritization and/or any other results of the methods described herein, the RET feature(s) of the POI(s) in different designs may be altered and optimized to thereby increase the yield of devices fabricated with each of the different designs.

In some embodiments, the method includes modeling electrical properties of a device being fabricated using the design data about a defect location and determining parametric relevancy of a defect at the defect location based on results of the modeling. In this manner, the results of the modeling step may be used to determine parametric relevancy of the defect. For example, the results of the modeling step may be used to determine how the defect alters one or more electrical parameters of the device being fabricated using the design. The defect for which the parametric relevancy is determined as described above may be a systematic defect. The parametric relevancy may be used in any step(s) of the method(s) described herein. For example, the parametric relevancy, possibly in combination with other information described herein (e.g., one or more defect attributes, one or more attributes of the design data, etc.) may be used to determine a DCI of the defect, to prioritize the POI(s) as described herein, etc.

Modeling the electrical properties of the device in this embodiment may be performed using any appropriate method or system known in the art. The electrical properties of the device that are modeled may include any one or more electrical properties of the device. The parametric relevancy of the defect may be determined using the modeled electrical properties and the as-designed electrical properties. For example, the modeled electrical properties may be compared to the as-designed electrical properties to determine the degree to which the defect alters the electrical properties. The parametric relevancy may then be determined based on the degree to which the defect alters the electrical properties (e.g., a defect that alters the electrical properties to a large degree is more parametrically relevant than a defect that alters the electrical properties to a lesser degree). The parametric relevancy may be determined in a similar manner using the modeled electrical properties and a range of suitable electrical properties of the device. For example, the modeled electrical properties may be compared to this range, and where the modeled electrical properties fall within or outside of this range may be used to determine parametric relevancy. In one such example, if the modeled electrical properties are near or outside of the acceptable range, the defect may be determined to be more parametrically relevant than if the modeled properties were inside of the acceptable range. The parametric relevancy may also be determined based, at least in part, on information from a number of different sources including, but not limited to, simulation, optical inspection results, defect review results, electrical testing results, or some combination thereof.

In one embodiment, the method includes assigning priorities to systematic defects and potential systematic defects based on the parametric relevancy determined for or associated with the systematic defects and the potential systematic defects. For example, the priority or severity of hot spots may be ranked based on the parametric relevancy. The parametric relevancy may define how and how much defects at the hot spots will affect the electrical parameters of the device.

The parametric relevancy may also be used to separate or prioritize defects which are more likely to cause parametric issues (e.g. yield loss) for the device. For example, electrical testing results or other information about the electrical properties of the device such as resistance, capacitance, timing, etc. can be used in combination with one or more attributes of the design data proximate to the positions of the defects in design data space and/or one or more attributes of the defects to determine which defects will affect the electrical properties of the device and which defects will not. The electrical testing results or other information about the electrical properties may be determined by the method (e.g., using simulation) or may be acquired from another source (e.g., netlist information). In this manner, defects that are more likely to cause parametric issues can be separated from defects that are less likely or unlikely to cause parametric issues. As such, defects that affect only the composition of the geometry or the material attributes of the device may be separated from defects that affect if the device can function according to its intended purpose. In addition, the electrical testing results or other information about the electrical properties of the device in combination with one or more attributes of the design data and/or one or more attributes of the defects may be used to separate electrical defects into critical parametric defects (e.g., electrical defects that may significantly affect the electrical properties of the device) and non-critical parametric defects (e.g., electrical defects that may not significantly affect the electrical properties of the device).

In some embodiments, the method includes determining a DCI for the defects (e.g., one or more of the defects). The DCI may be determined based on one or more attributes of the design data proximate the positions of the defects in design data space, one or more attributes of the defects, or some combination thereof. For example, one or more attributes of the design data proximate the positions of the defects in design data space, one or more attributes of the defects, or some combination thereof may be used to determine the design based potential yield impact of the defects thereby increasing the value of the defect data. In one particular example, DCI can be determined by using defect size and position of the defect in the design data to determine the likelihood that the defect will cause an electrical fault. The DCI can then be used to indicate yield relevance of the defect. In particular, defect size can be used to determine the likelihood that a defect will kill a die or otherwise alter one or more electrical attributes of a device being fabricated on the wafer. For instance, as the defect size increases and the pattern complexity increases, the likelihood that a defect will kill the die or change one or more electrical attributes of the device also increases. Therefore, a relationship describing the likelihood that a defect will kill a die or change one or more electrical attributes of the device as a function of defect size and pattern complexity may be used to determine the relative risk of each defect on each wafer. The relative risk of each defect may be determined right after inspection thereby allowing better decision making based on the relative risk.

Alternatively, the DCI may be determined using a statistical method that includes determining for different defect sizes and possibly different types of defects (possibly across an entire die) a probability that a defect will kill the die or change the one or more electrical attributes, which can then be used to determine the DCI for the defects. For example, in one embodiment, the method includes determining a probability that one or more of the defects will cause one or more electrical faults in a device (or alter one or more electrical attributes of the device thereby causing a parametric electrical issue) fabricated for the design data based on one or more attributes of the design data proximate the positions of the defects in design data space, one or more attributes of the defects (such as defect size), positions of the defects reported by an inspection system used to detect the defects, coordinate inaccuracy of the inspection system, or some combination thereof and determining a DCI for the one or more defects based on the probability. The probability may be determined in this manner using any appropriate statistical method known in the art.

The DCI for the defects may be used in a number of ways in the embodiments described herein such as for sampling in which defects are selected for review. In particular, for each defect classification or group of defects, DCI may be used for sampling the defects with the same classification or binned in the same group instead of performing random sampling of commonly classified defects or commonly binned defects. Using DCI for sampling, the distribution of the DCI may be used to determine which defects have a higher probability of killing a die or changing the one or more electrical attributes, and defects that have a higher probability of killing a die or changing the one or more electrical attributes may be more heavily sampled. As such, defects that are more likely to affect yield may be more heavily sampled for review, which may, therefore, generate defect review results that are particularly useful for identifying and classifying defects more likely to impact yield. The DCI may be used to sample not only potentially systematic and systematic defects but also random defects.

In some embodiments, the method includes determining high density zones on electrical failure density maps. Failure density maps may be produced by generating a "logic bitmap" or physical conversion of failing test chains or failing flip-flops (detected by structural testing, a type of which is scan-based testing). Every failing line or region that is found by scan-based testing may be shown as such on a graphical rendering of the die under test (DUT). The terms "logic bitmaps" and "bitmaps" are used interchangeably herein. Logic bitmaps for different die of the same layer(s) and design may be stacked (i.e., overlaid) to illustrate the number of failures at each point on the die thereby producing a failure density map. Defects that appear in the failure density map at a frequency that is greater than a predetermined value may be considered to be systematic defects. Defects found proximate to hot spots in the die coordinate space may be considered yield impacting systematic defects or systematic candidates.

In some embodiments, the results of an electrical inspection process (e.g., a bitmap) may be analyzed using information from inline inspection results to determine if the cause of an electrical defect can be determined from the inline inspection results. To correlate the inline inspection results and the electrical inspection results, the different inspection results may be aligned to each other as described herein. In addition, the different inspection results may first be aligned to the design data, and then the inspection results may be aligned to each other. In either case, the bitmap results may be overlaid with the inline inspection results.

The method may also include determining the cause of an electrical defect in a bitmap based on the inline inspection data and the design data. In addition, different fault types and their candidate locations or paths can be analyzed to determine how many of the electrical failures overlap with physical defects. These 'hits' provide evidence that the physical defect contributes to the cause of the electrical defect. In this manner, a hit ratio for a fault type may be determined as the number of faults of that type that correspond to a reported physical defect divided by the number of faults of that type. The hit ratio may be evaluated to determine if the fault type tends to be correlated with reported physical defects. In addition, the hit ratio and inline inspection results of the physical defects may be used to determine how many of the same type of physical defects caused an electrical failure. In this manner, the number of defects of the same type that caused an electrical failure may be used to determine a statistical prediction of the yield significance of the defects.

Additional information about the physical defects may also be used to determine the cause of the bit failures. Such information may include, but is not limited to, an image of a physical defect corresponding to the location of a bit failure, classification results for the physical defect, binning results for the physical defect, or some combination thereof, which may be used in combination with bitmap information such as a bitmap image of the entire die in which the bit failure is located, an image showing stacking (i.e., overlay) of the bitmap images of multiple die (e.g., to show repeatability of the electrical failures across die), a bitmap pareto diagram, and detailed information about the bitmap results (e.g., data in a table or list).

In some embodiments, the method may including using defect transition table (DTT) methodology to identify hot spots at which defects were not detected or at which non-killer or non-significant defects were detected. In general, rows of a DTT include inspection results for different defects, and different columns of the DTT include inspection results generated by inspections performed at different times. The inspection results may be arranged in chronological order across the columns. In this manner, the table illustrates which defects were re-detected at different layers during a semiconductor manufacturing process. The table may also include or provide access to (e.g., links to) additional information about the defects detected at different layers. In this manner, additional information such as images of the defects can be used to determine if and how the defect changed at different layers.

In an additional embodiment, the method includes determining a KP value for one or more of the defects based on one or more attributes of the design data, one or more attributes of the defects, or some combination thereof. In a similar manner, the method may include determining a KP value for one or more groups of defects based on one or more attributes of the design data corresponding to the one or more groups, one or more attributes of the defects in the one or more groups, or some combination thereof. The KP value for systematic defects may be used to determine additional attributes of the systematic defects such as yield ratio. In addition, the KP value may be used to perform additional steps described herein. For example, the KP values for the systematic defects may be used to determine which defects are selected for review. In particular, systematic defects having a relatively high KP value may be selected for review. In addition, the method may include monitoring the KP value for the systematic defects and generating an output signal if the KP value exceeds a predetermined KP value. The output signal may be an automated report, a visible output signal, an audible output signal, or some other output signal that can be used to alert a user to a potential problem with the process. In this manner, the output signal may be an alarm signal.

As described further herein, one advantage of the methods and systems described herein is that information from a number of different sources may be accessed, correlated, stored, displayed, and/or processed together. Such information may include, but is not limited to, information in GDS files, information about the processes performed on the wafer (which may be commonly referred to as WIP data and which may be acquired from a source such as a fab manufacturing execution system (MES) database), inline inspection results, inline metrology or measurement results, electrical testing results, and end-of-line yield information. Such information may be utilized to determine yield related information about the systematic defects. Furthermore, the yield ratio or other yield related information determined for the systematic defects may be used to assign yield related context to the systematic defects. Both the yield related context information and the design context may be assigned to the systematic defects. In one embodiment, instead of classifying defects based on design context, the systematic defects may be classified based on yield limiting context.

As described further herein, hot spot based inspection for systematic defects will produce inspection results that include the detected systematic defects and design context corresponding to the systematic defects. In this manner, marginal features in the design data can be identified and used for SPC applications. For instance, SPC can be performed by monitoring locations of the marginal features in the design data since these features will tend to fail first as the process drifts out of process limits. Therefore, SPC can be performed quicker by monitoring a subset of all features in the design including the most important features in the design instead of all features in the design and can more quickly detect drifts in processes since the features in the design that are most sensitive to changes in the process are monitored during SPC. In a similar manner, the marginal feature information can be used to generate a recipe for a metrology process such as a CD measurement process. The CD measurement process may include any suitable CD measurement process known in the art (e.g., CDSEM, scatterometry CD measurements, etc.). Generating the recipe for the CD measurement process may include determining locations on the wafer (e.g., locations at which the marginal features will be printed) at which the CD measurements are to be performed during the process. In addition, results of inspection of the wafer such as BF images acquired at the locations on the wafer at which the CD measurements are to be performed may be provided with the recipe or to the metrology system such that the results can be used by the metrology system to move to the locations on the wafer for the measurements.

However, with the addition of test data, the portions of the design corresponding to the systematic defects can be related to yield probability of the semiconductor manufacturing process and the KP of the systematic defects. In one such embodiment, an inspection system or any other system described herein may produce yield results for systematic defects such as the probability that each individual die yields and which defect or defects are most likely to have an impact on the yield. The KP of the systematic defects may also be used for SPC applications. For example, the probability that each die yields and which defect or defects are most likely to have an impact on the yield may be used to improve SPC monitoring applications and review sampling. In this manner, SPC may be performed based on context based yield. In addition, the improved SPC monitoring and review sampling may improve the root cause analysis and baseline reduction.

In a further embodiment, the method includes monitoring KP values for groups of defects over time and determining a significance of the groups of defects based on results of the monitoring. For instance, over time, as the KP value continues to be updated, hot spots with low KP values can be eliminated or downgraded to conditional hot spots, weak spots, or cold spots. In this manner, the identified potential hot spots can be assigned a low or zero KP value (i.e., cold spots). In another embodiment, the method includes determining a KP value for groups of defects based on an electrical failure density associated with the design data. In this manner, hot spots that are determined not to overlay with relatively high failure density zones on electrical failure density maps can be downgraded in KP and optionally removed from the hot spot database and/or their associated inspection recipe.

In one embodiment, the method includes monitoring a KP value for one or more POIs in the design data and assigning the KP value for the one or more POIs to one or more of the groups if the portions of the design data proximate the positions of the defects binned into the one or more groups correspond to the one or more POIs. For example, monitoring the KP value for one or more POIs in the design data may be performed based on electrical failures, an electrical failure density, any other attribute(s) of the electrical failures, or some combination thereof determined for the one or more POIs over time and inspection results acquired for the one or more POIs over time. The electrical failures, the electrical failure density, and any other attribute of the electrical failures may be determined using any suitable method or system known in the art. The inspection results may be acquired as described herein. Although monitoring the KP values is performed by the method in this embodiment, monitoring the KP values may be performed by a different method or system, and the assigning step described above may be performed by the method. In addition, monitoring the KP values may be performed during a setup phase prior to performing the binning method thereby decreasing the time between inspection and assigning a KP value to one or more groups of defects. Assigning the KP value for the one or more POIs to one or more of the groups may include comparing the portions of the design data proximate the positions of at least some of the defects binned into the one or more groups to portions of the design data corresponding to the one or more POIs. If the portions of the design data proximate the positions of at least some of the defects in a group are at least similar to the portions of the design data corresponding to a POI, which may be determined based on the results of the comparing step, the KP value corresponding to the POI may be assigned to the defects (e.g., all of the defects) in the group.

The methods described herein may include generating information for one or more diagnostic or repair processes that are sensitive to hot spots (e.g., have high signal and low noise for hot spots). The information may be used to automate or optimize one or more diagnostic or repair processes for hot spots. The one or more processes may be used for hot spot verification and analysis, capturing new learning, optimizing do not care areas and nuisance defect filtering, reporting, and differentiating between design and process marginalities. In this manner, the method may be used to generate recipes for diagnostic and repair processes such as wafer inspection, reticle inspection, optical inspection, macro-defect inspection, electron beam inspection, optical defect review, SEM defect review, metrology processes such as ellipsometry and CDSEM, defect analysis processes, FIB and other FA processes, and defect repair processes.

In some embodiments, the method includes prioritizing one or more POIs in the design data and optimizing one or more processes to be performed on wafers on which the design data will be printed based on results of the prioritizing step. Prioritizing the one or more POI(s) may be performed as described herein. Optimizing one or more processes in this embodiment may include altering any one or more parameters of the one or more processes such as focus, dose, exposure tool, resist, post expose bake (PEB) time, PEB temperature, etch time, etch gas composition, etch tool, deposition tool, deposition time, etc. Preferably, the parameter(s) of the process(es) are altered to decrease defectivity of the POI(s) (e.g., number of defects detected in the POI(s)), to alter one or more attributes (e.g., DCI, KP, etc.) of defects detected in the POI(s), and/or to increase yield of devices in which the POI(s) are included.

In addition, the one or more parameters of the one or more processes may be optimized for only the POI having the highest priority as determined by the prioritization step or the POI(s) having relatively high priorities as determined by the prioritization step. In this manner, the one or more parameters of the one or more processes may be altered and/or optimized based on the POT(s) exhibiting the largest defectivity and/or defectivity that has the largest yield impact. As such, the results of the prioritization step indicate which POI(s) should be used to alter and/or optimize the one or more parameters of the one or more processes to produce the largest improvements in yield.

This embodiment is, therefore, advantageous over other previously used methods and systems for altering and/or optimizing processes because without guidance as to which POI(s) have the largest impact on yield, advantageous opportunities to optimize the processes with respect to yield and stability may not be identified or made in a timely fashion thereby increasing time to market and reducing the efficiency of process optimization.

Furthermore, although the process(es) that are altered and/or optimized in this step may include only the processes that were used to print the POI(s) in the design data on the wafer prior to detection of the defects binned in the embodiments described herein, the one or more processes that are altered and/or optimized may include any process(es) that are used to print other design data that also includes the POI(s). For instance, if more than one design includes the POI(s), based on the prioritization and/or any other results of the methods described herein, one or more processes used to print the more than one design may be altered and optimized to thereby increase the yield of devices fabricated with each of the different designs.

In another embodiment, the method includes altering one or more parameters of a process performed on the wafer or to be performed on the wafer based on the results of the binning step and/or any other results of any other step(s) of any method(s) described herein. The process may include any process known in the art such as CMP, deposition (electro-chemical deposition, atomic layer deposition, chemical vapor deposition, physical vapor deposition), lithography, etch, ion implantation, and cleaning. The one or more parameters may be altered based on the results of the binning such that defects binned in one or more groups may be reduced on the wafer after subsequent processing of the wafer or may be reduced on other wafers after processing of the other wafers.

For example, if an etch process was performed on the wafer prior to inspection, one or more parameters of the etch process may be altered using a feedback control technique preferably such that other wafers processed in the etch process with the altered parameter(s) will exhibit fewer defects in one or more of the groups, fewer defects with relatively high DCIs, fewer defects with relatively high KP values, etc., or some combination thereof. Such altering of the parameter(s) may be performed based on prioritization of the groups of defects or other information described herein such as DCI and KP value. In this manner, the process may be altered based on the groups of defects that have the greatest impact on yield.

In another example, if an etch process was performed on the wafer prior to inspection, one or more parameters of a post-etch process to be performed on the wafer may be altered using a feed forward control technique preferably such that after the post-etch process is performed on the wafer with the altered parameter(s), the wafer will exhibit fewer defects in one or more of the groups, fewer defects with relatively high DCIs, fewer defects with relatively high KP values, etc., or some combination thereof. The parameter(s) of the post-etch process or other process(es) may also be altered as described further above.

Altering one or more parameter(s) of a process as described above may include determining how the one or more parameter(s) should be altered and changing the values of the one or more parameter(s) in a recipe that will be used to perform the process. Such altering may be performed by the methods and systems described herein, for example, by accessing the recipe in a fab database or in a storage medium coupled to a process tool that will perform the process and making the changes directly to the recipe.

Alternatively, altering one or more parameters of a process as described above may include determining how the one or more parameters should be altered and sending the values of the one or more parameters to another method or system (e.g., a fab database or a processor coupled to a process tool that will perform the process) that can be used to alter the values of the one or more parameters in a recipe that will be used to perform the process. The values of the one or more parameters that are to be altered may also be sent with other information such as the recipe identity, the process tool identity, an instruction to alter the one or more parameters, etc., such that the process can be altered by the other method or system.

In one embodiment, the method includes altering a process for inspecting the wafer based on the results of the binning step. The process for inspecting the wafer may be altered in this embodiment based on any of the binning results described herein. In addition, any parameter(s) of the process for inspecting the wafer may be altered in this embodiment. For example, the one or more parameters of the process for inspecting the wafer that may be altered based on the results of the binning step may include, but are not limited to, the care areas (or alternatively the do not care areas), the sensitivity, the in-line binning process, the inspection area, which wafers are inspected, or some combination thereof. In one particular example, the results of binning may indicate the number of defects included in one or more of the groups, and the care areas may be altered to include positions on the wafer corresponding to positions in design data space of the defects in group(s) including a relatively high number of defects. In another example, the process for inspecting the wafer may be altered to inspect more or differently based on the results of the binning step. The process for inspecting the wafer may also be altered based on any results of any of the step(s) of the method(s) described herein.

As described herein, the defects may be detected by an inspection process. In one embodiment, the method includes reviewing locations on the wafer at which one or more POIs in the design data are printed, determining based on results of the reviewing step if defects should have been detected at the locations of the one or more POIs, and altering the inspection process to improve one or more defect capture rates. Reviewing the locations in this embodiment may be performed using any method or system known in the art. In this manner, reviewing the locations on the wafer may be performed at the locations of the POIs to determine if defects were detected at the locations of the POIs. In one such embodiment, the method may include arbitrary pattern searching to identify locations of the one or more POIs in the design data and determining the locations of the one or more POI(s) on the wafer from the locations of the one or more POI(s) in the design data. Determining the locations of the POI(s) in this manner may be performed as described further herein.

In addition, in some such embodiments, the method may include displaying locations of the POIs with and without hits during the reviewing step to assist in review. As such, the results of the review may be used to determine where defects have occurred but have not been captured by the inspection system. Therefore, the POI(s) may be reviewed to find missed defects (or defects not captured) to know where to perform alteration or optimization of the inspection process.

Based on this information in addition to results of the review (e.g., one or more attributes of the defects, one or more attributes of the design data, etc.), one or more parameters of the inspection process such as optics mode, collection angle, incident angle, etc. may be altered, preferably such that the defects are captured at the locations of the POIs at a higher rate in subsequent inspections. In this manner, the method may include setup tuning based on analysis of the defect capture rates in POIs. The one or more parameters of the inspection process that are altered may be determined in any suitable manner such as using a rules database. The one or more defect capture rates that may be improved in this embodiment include defect capture rates for one or more defect types within one or more POIs. In a similar manner, the above-described embodiment for improving one or more defect capture rates may be performed by reviewing locations on the wafer corresponding to positions of one or more hot spots in the design instead of reviewing locations on the wafer at which the one or more POIs are printed.

Furthermore, if the above-described method is performed for more than one POT, the POIs may be prioritized as described further herein, and the inspection process may be altered to improve the defect capture rates for the POIs having the highest priority or higher priorities. In this manner, the inspection process may be optimized for the highest priority POI or the higher priority POIs (although such optimization may also result in optimization of the inspection process for lower priority POIs).

In another embodiment, the method includes altering a process for inspection of the wafer during the inspection based on results of the inspection. In this manner, the method may include altering the inspection process using an in-situ process control technique. The results of the inspection that are used to alter the inspection process may include any of the results described herein. In addition, altering the inspection process in this embodiment may include altering any one or more parameters of the inspection process.

As described further above, the method may include optimizing an inspection recipe. The inspection recipe that is optimized may include an inline inspection recipe and/or an electrical inspection recipe. In one embodiment, the method includes altering a process for inspecting the wafer based on hot spot information. In another embodiment, the method includes generating a process for inspecting the wafer based on the hot spot information and the design data. In addition, the method may include altering or generating a process for inspecting a wafer based on hot spot information and/or predicted POI. For example, the inspection recipe may be configured such that only locations of hot spots and POI are inspected and/or such that locations for systematic nuisance defects are not inspected or such that data acquired at such locations is otherwise suppressed. In another example, as described above, the method embodiments described herein may include identifying hot spots in a design (e.g., based on systematic defects). In this manner, the method embodiments may be a source of hot spots, and the locations of the hot spots in the design may be used to alter an inspection process using a feedforward control technique.

The method may also include altering the process for inspecting the wafer based on any other available information. In one such example, the method may include altering the inspection recipe based on hot spot information in addition to the design data, the inspection results, and one or more bitmaps. In this manner, any information available to the method may be used to optimize the sensitivity of the inspection recipe for detecting defects that will or may affect yield while reducing the sensitivity of the inspection recipe for detecting defects that will not affect yield. Generating and optimizing an inspection recipe may also be performed as described further herein (e.g., based on the detectability of the DOI).

In some embodiments, the method includes determining a sensitivity for detecting the defects on the wafer based on the design data. In some such embodiments, the sensitivity is different for at least two different portions of the wafer corresponding to at least two different portions of the design data. In addition, the method may include identifying "care areas" (or "where to inspect areas") on the wafer. Inspection results may not be acquired in do not care areas, or defect detection may not be performed on inspection results acquired in the do not care areas. However, if data acquisition and defect detection are performed in the do not care areas, before additional processing of the inspection results such as binning is performed, the method may include determining if the detected defects are located in care areas or do not care areas. If defects are located in do not care areas, then the additional processing may not be performed for these defects. In this manner, pattern based binning may be restricted to sensitive areas in the design data to optimize the throughput of the binning process. In another embodiment, after defects have been grouped by common design data (e.g., pattern grouping or other context data), the grouping information may be used for improved counting, binning, monitoring, analysis, sampling, review, test, etc. as described further herein.

This embodiment of the method may or may not utilize hot spot information. For instance, based on knowledge about the design data, the method may include identifying portions of the design data that are more critical to yield and/or are more susceptible to yield-reducing defects. In this manner, the sensitivity for detecting defects in these portions of the design data may be higher than the sensitivity for detecting defects in other portions of the design data. As such, during acquisition of the inspection data, the method may include aligning the inspection data to the design data, which may be performed as described further herein. The sensitivity of the inspection process may then be altered based on the position of the inspection data in design data space. In such embodiments, the sensitivity of the inspection process may be altered in real-time. Additional examples of design driven inspection or measurement recipes are illustrated in U.S. Pat. No. 6,886,153 to Bevis and U.S. patent application Ser. No. 10/082,593 filed Feb. 22, 2002 published as U.S. Patent Application Publication No. US 2003/0022401 by Hamamatsu et al., which are incorporated by reference as if fully set forth herein. The methods described herein may include any step(s) described in this patent and this patent application.

In one embodiment, the method includes selecting at least some of the defects for review based on the results of the binning step. For example, the results of the binning step may be used to determine which of the defects are most critical as described herein (e.g., by determining DCIs for the defects), and the most critical defects may be selected for review. In another example, the binning results may be used to determine which of the defects are systematic defects as described further herein. In this manner, the method may include review sampling from portions of the design data in which DOI tend to occur. In addition, information about which defects are systematic as well as information about whether or not the systematic defects are visible to a review system such as a SEM and/or whether the systematic defects are yield relevant may be used to select at least some of the defects for review (e.g., such that only defects that are visible to the SEM are selected for review). Selecting the defects in this manner is particularly advantageous since re-locating the defects during review can be difficult and relatively time consuming particularly if the review system spends a great deal of time looking for defects that are not actually visible to the review system. Results of selecting the defects for review may include locations of the selected defects on the wafer and any other results of any of the step(s) of the method(s) described herein.

In another embodiment, the method includes generating a process for sampling the defects for review based on the results of the binning step. Therefore, instead of or in addition to selecting the defects for review, the method may include generating a process that can be used (by the method, another method, a system configured to perform the method, or another system) for sampling the defects for review. Such a process may be used for sampling defects detected on multiple wafers for review and/or sampling defects for review performed by multiple review systems. The process for sampling may be generated based on the results of the binning step such that defects detected in a portion of the design data corresponding to a group of binned defects that includes a relatively large number of defects may be sampled more heavily than defects detected in portions of the design data corresponding to groups of binned defects that include a relatively small number of defects. The process for sampling the defects for review may be generated based on the results of the binning step in combination with any other results of any step(s) of any of the method(s) described herein such as DCIs for the defects, KP values for the defects, etc.

In another embodiment, the method includes generating a process for selecting defects for review based on hot spot information. The process for selecting defects for review may be generated based on hot spot information as well as any other information available to the method. For example, the process for selecting defects for review may be generated based on the design data, one or more attributes of the defects, one or more bitmaps, and hot spot information. Preferably, the process for selecting defects for review is generated such that certain types of defects such as defects detected at hot spots or systematic defects are selected for review while other types of defects such as defects detected at cold spots and nuisance defects are not selected for review. In this manner, the methods described herein may produce a defect sample that largely includes defects that will or may affect yield while increasing the throughput of the review process by largely excluding defects from the review sample that will not affect yield.

In another embodiment, after defects have been binned by at least similar design data as described above, the method may include using the results of binning for the purpose of creating a more "informed" review sample for CDSEM, optical, or other forms of physical defect review and classification or verification. In one such embodiment, the method includes generating a pattern group pareto chart such as that described above that illustrates pattern group identities on the x axis and the number of defects detected in each pattern group on the y axis. In this manner, the chart shows the number of defects detected in different patterns. However, any other data that indicates the number of defects detected in different patterns may be used in the method steps described herein. The embodiments described herein may also include generating electrical, systematic, and/or random pareto charts.

The method may include analyzing data for one or more of the different patterns illustrated in this chart to determine one or more physical defect types that were detected in each pattern type. More than one defect type may be detected in a pattern group. The method may also include analyzing data for one or more of the different spatial signatures illustrated in this chart to determine one or more attributes of the defects binned into one or more groups corresponding to the one or more different signatures. The defect attribute(s) may include, but are not limited to, size, die location (or die identity), and any other attributes known in the art. The die location indicates whether a pattern has a higher frequency of occurrence on a particular location, zone, or region of the wafer such as the edge, the center, the 3 o'clock position, etc.

A defect sampling plan may be determined from the results of the analyzing steps described above. For instance, the method may include determining if a strong signal emerges from the analyzing steps described above. This strong signal indicates which defects (e.g., from which pattern and which defect type and/or attributes determined by the analyzing steps) should be sampled in a higher proportion or a lower proportion. The sampling plans described above may be particularly useful for increasing the throughput of otherwise relatively slow review systems such as electron beam based review systems and atomic force microscope (AFM) or other scanning probe microscope based review systems.

The methods described herein may also be used to optimize a review recipe. For example, in one embodiment, the method includes altering a process for reviewing defects on the wafer based on hot spot information and optionally any other information available to the method. The parameters of the review recipe that are altered or selected based on this information may include any data acquisition parameters and any data processing parameters of the review process. The method may also include selecting additional parameters of the review process such as type of review system (e.g., optical or electron beam) to be used to review the defects and make and model of the review system to be used to review the defects.

The method may also include providing information to the review system that can be used to assist in determining the locations on the wafer at which review is to be performed. For instance, the positions of the defects to be reviewed may be reported to the review system in design data space, die space, and/or wafer space. In addition, other information about the defects and/or the defect positions may be provided to the review system. For instance, images or overlays of the defects generated by inline inspection in addition to portions of the design data corresponding to the defect positions may be provided to the review system. In this manner, the review system may use some or all of this information to find the locations of the selected defects on the wafer during review. In addition, the results of one or more steps of one or more methods described herein may be provided to the review system such that the review system can use the results to perform automatic defect locating (ADL) based on edge placement error. Furthermore, the method may include determining where to measure or test for review based on results of inspection and systematic identity (perhaps with yield relevancy and/or process window mapping). Review may also include user-assisted review, which may be performed using methods and systems such as those disclosed by Teh et al., in commonly assigned U.S. patent application Ser. No. 11/249,144 filed Oct. 12, 2005 published as U.S. Patent Application Publication No. 2006/0082763 on Apr. 20, 2006, which is incorporated by reference as if fully set forth herein. Therefore, a use case for the binning methods (and methods for assigning a classification to a defect described further herein) includes systematic discovery and user-assisted review.

In one embodiment, the method includes altering a metrology process for the wafer based on the results of the binning step. For example, the metrology process may be altered such that the most critical defects as determined from the results of the binning step are measured during the metrology process. Therefore, altering the metrology process may include altering the locations on the wafer at which the measurements are performed during the metrology process. In addition, results of inspection and/or review such as BF images and/or SEM images of the defects selected for measurement may be provided to the metrology system such that the results may be used to determine where the measurements are to be performed. For example, the metrology process may include generating an image of an approximate location of the defect on the wafer, and this image may be compared to the results of inspection and/or review for the defect such that the metrology system can correct the position on the wafer if necessary such that the measurements are performed at the correct wafer locations and therefore on the correct defects. In this manner, the measurements may be performed at substantially accurate locations on the wafer. Altering the metrology process may also include altering any other one or more parameters of the metrology process such as the type(s) of measurements performed, wavelength(s) at which the measurements are performed, angle(s) at which the measurements are performed, etc., or some combination thereof. The metrology process may include any suitable metrology process known in the art such as a CD measurement metrology process.

In another embodiment, the method includes altering a sampling plan for a metrology process for the wafer based on the results of the binning step. Therefore, the method may include adaptive sampling. For example, the sampling plan for the metrology process may be altered such that a greater number of the most critical defects as determined from the results of the binning step are measured during the metrology process. In this manner, the most critical defects may be sampled more heavily during the metrology process thereby advantageously producing larger amounts of information about the most critical defects. The metrology process may include any metrology process known in the art. In addition, the metrology process may be performed by any suitable metrology system known in the art such as a SEM. Furthermore, the metrology process may include performing any suitable measurements known in the art of any suitable attributes of defects or features formed on the wafer such as profile, thickness, CD, etc.

In a similar manner, the method may include altering a process for analyzing defects (e.g., metrology or composition analysis) or repairing defects on the wafer based on hot spot information and optionally any other information available to the method. For example, the method may include altering a process such as electron dispersive x-ray spectroscopy (EDS or EDX) for analyzing the composition of defects or a FIB process for repairing defects or for FA. The process for analyzing or repairing defects may be altered as described herein with respect to altering other processes. For example, the analysis or repair process may be altered such that the analysis and/or repair is performed only at the locations of selected defects, which may be selected as described herein. In addition, one or more parameters of the analysis or repair process may be selected and altered based on results of any of the step(s) of any of the method(s) described herein. Such results may include, for example, defect classification, defect root cause, defect size, defect criticality (which may indicate the accuracy with which analysis and/or repair should be performed), yield impact, one or more attributes of the design data proximate the defects (such as dimensions of features, density of features, hierarchy, redundancy, etc.), which may indicate if analysis and/or repair should be performed and the accuracy with which analysis and/or repair should be performed, etc. Additional examples of methods and systems for generating a recipe for a metrology tool are illustrated in U.S. Pat. No. 6,581,193 to McGhee et al., which is incorporated by reference as if fully set forth herein. The methods and systems described herein may be configured to perform any additional step(s) described in this patent.

In some embodiments, the method includes determining a root cause of the defects based on one or more attributes of the design data. In another embodiment, the method includes determining a root cause of one or more groups into which defects were binned. For example, in one embodiment, the method includes determining a root cause of one or more of the groups of defects based on results of review of at least some of the defects in the one or more groups, one or more attributes of the design data, one or more attributes of the defects, or some combination thereof. In this manner, the method may include determining a root cause of defects individually or collectively as a group. The root cause of a defect or a group of defects may also be determined based on analysis results from diagnostic systems such as an EDS system that can be used to analyze a defect, for example, by measuring a composition of the defect. One example of such an EDS system is illustrated in U.S. Pat. No. 6,777,676 to Wang et al., which is incorporated by reference as if fully set forth herein.

The root cause phase may include identifying the source, the cause, and/or the correction for systematic defects. The root cause phase may be performed in multi-source space using a correlation between any of the design, wafer, reticle, test, and process spaces. For example, in one embodiment, the method includes determining a root cause of one or more of the groups of defects by mapping at least some of the defects in the one or more groups to experimental process window results. The experimental process window results may be generated by the method, by another method, by a system configured to perform the method, or by a system other than a system configured to perform the method. In addition, the experimental process window results may be acquired using a PWQ method or any other suitable experiment (e.g., performing an etch process on different wafers with one or more different parameters) and detecting defects on the wafers after the PWQ method or other experiment. The experimental process window results may include any results acquired by inspection and/or by review of the defects detected on the wafers. For example, the experimental process window results may include images of the defects, portions of design data proximate the positions of the defects in design data space, positions of the defects in design data space, which may be determined as described herein, or any other inspection and/or defect review results described herein.

Mapping at least some of the defects to the experimental process window results may be performed using the results of the inspection process. For instance, if the experimental process window results include the portions of the design data proximate the positions of the defects in design data space and images of the defects on the wafer, mapping the defects to the experimental process window results may include comparing images of defects binned into one or more of the groups to the images in the experimental process window results for defects detected proximate design data that is at least similar to the design data proximate to positions of the binned defects in design data space. In another example, if the experimental process window results include positions of the defects in design data space, mapping the binned defects to the experimental process window results in this embodiment may include comparing the positions of the defects in design data space in the experimental process window results to the positions of the binned defects in design data space.

In this manner, the results of the mapping step may indicate where in process window space a process, which was performed on the wafer prior to detection of the defects, was performed. In particular, if results of the mapping indicate that a binned defect and a defect included the experimental process window results are at least similar and are located proximate to at least similar design data, the values of one or more parameters within the process window at which the defect included in the experimental process window results was detected may be correlated to the binned defect and may be determined as the root cause of the binned defect or may be used to determine the root cause of the binned defect.

In another embodiment, the method includes determining a root cause of one or more of the groups of defects by mapping at least some of the defects in the one or more groups to simulated process window results. The simulated process window results may include results similar to the experimental process window results described above. However, the simulated process window results are acquired by simulating images that illustrate how the design data would be printed on a wafer at various values of one or more parameters of the process, not by performing an experiment on a physical wafer. The process may include any process involved in fabrication of a device corresponding to the design data. For example, this embodiment may include modeling a patterning process (e.g., lithography or etch) about a systematic defect location, and results of such modeling may be used to determine a root cause of the systematic defect. The simulated process window results may be generated using any suitable method or system known in the art. For example, the simulated process window results may be generated by the PROLITH software that is commercially available from KLA-Tencor. In addition, the simulated process window results may be generated by the method, by another method, by a system configured to perform the method, or by a system other than a system configured to perform the method. Determining the root cause in this embodiment may be performed as described above with respect to the experimental process window results.

The root cause phase may include determining the source and/or correction for systematic defects. One possible source for systematic defects is a process window shift. In addition, knowledge of the hot spot signature may provide information about where the process is operating within the process window. The root cause phase may also include determining the most significant opportunities for improving the process to expand the process window. Furthermore, the root cause phase may include determining the most significant systematic issues for improving the reticle design. The root cause phase may further include determining the most significant systematic issues for improving and/or implementing next generation technology.

In some embodiments, the method includes determining a percentage of a die formed on the wafer impacted by one or more of the groups of defects. For instance, the percentage may be determined by determining the number of inspected die on the wafer in which the defects in a group were detected at least once and dividing the number of inspected die in which the defects in the group were detected at least once by the total number of inspected die. The number of inspected die on the wafer in which the defects in a group were detected at least once may be determined based on the design data space positions of the defects, the design data space positions of the dies printed on the wafer, and information about the inspection process used to detect the defects. The results of these steps may be multiplied by 100 to arrive at the percentage. In one particular example, if there are 300 defects binned into a group, the defects in this group are located in 5 die on the wafer, and there are 6000 die on the wafer, the percentage may be determined as [(5)(100)]/(6000) or 0.083%. The percentage, therefore, reflects the die impact marginality for the group of defects. Such a percentage may be determined for more than one group of defects, and each (or at least some) of the percentages may be displayed in a chart such as a bar chart that may be generated by the method. Therefore, the chart illustrates die impact marginality as a function of group into which defects were binned. Such a chart may be illustrated in a user interface, which may be configured as described further herein. The method may also include prioritizing one or more groups of the defects based on the percentage determined in this embodiment. Such prioritizing may be performed as described further herein, and the results of such prioritizing may be used as described further herein.

In another embodiment, the method includes determining one or more POIs in the design data corresponding to at least one of the groups and determining a ratio of number of the defects binned in the at least one of the groups corresponding to the one or more POIs to number of locations of the one or more POIs on the wafer. The one or more POIs in the design data corresponding to at least one of the groups may be determined as described further herein. If all instances of the one or more POIs on the wafer are not inspected during the inspection process used to detect the defects, the number of locations of the one or more POIs on the wafer used in this embodiment may be the number of inspected locations of the one or more POIs on the wafer. In this manner, the method may include performing marginality analysis by determining the ratio or percentage of the POI in which defects were detected on the wafer compared to the number of the locations of the POT printed on the wafer (or the number of the inspected locations of the POI on the wafer). In such embodiments, the number of the locations of the POI on the wafer may be identified by arbitrary pattern searching. In addition, the number of the inspected locations of the POI on the wafer may be identified by arbitrary pattern searching and using results of the arbitrary pattern searching and information about the inspection process to determine the number of inspected locations of the POI on the wafer. In addition, the methods described herein may include arbitrary pattern searching to identify locations of the POI on the wafer and to determine the area of the POI. The area of the POI and the number of locations of the POT on the wafer (or the number of inspected locations of the POI on the wafer) may then be used to determine a defect density by POI. The method may also include prioritizing the one or more POI(s) based on the ratios determined in this embodiment. Such prioritizing may be performed as described further herein, and the results of such prioritizing may be used as described herein.

In an additional embodiment, the method includes determining one or more POIs in the design data corresponding to at least one of the groups and determining a ratio of number of the defects binned in the at least one of the groups corresponding the one or more POIs to number of locations of the one or more POIs in the design data (or number of inspected locations of the one or more POIs in the design data if all locations of the one or more POIs in the design data are not inspected during the inspection process used to detect the defects). In this manner, the method may include performing marginality analysis by determining the ratio or percentage of the number of defects in a group corresponding to a POI compared to the number of locations of the POI in the design (or the number of inspected locations of the POT in the design). In such embodiments, the number of locations of the POI in the design data may be identified by arbitrary pattern searching. In addition, the number of inspected locations of the POT in the design data may be determined as described above. The one or more POIs corresponding to at least one of the groups may be determined as described further herein. This method may also include prioritizing one or more of the POI(s) based on the ratios determined in this embodiment. Such prioritizing may be performed as described further herein, and results of such prioritizing may be used as described herein.

In a further embodiment, the method includes determining a POI in the design data corresponding to at least one of the groups, determining a percentage of a die formed on the wafer in which the defects binned in the at least one of the groups are located, and assigning a priority to the POT based on the percentage. In this manner, the method may include performing marginality analysis based on a percentage of the die impacted by the defects. For example, the number of defects binned in a group may be divided by the number of design instances of the POI on a reticle used to print the design data on the wafer and the number of times the reticle is printed on the wafer. The result of this step may be multiplied by 100 to arrive at the percentage. In one particular example, if there are 300 defects binned in a group, 2000 design instances of the POI corresponding to the group on the reticle, and the reticle is printed on the wafer 1000 times, the percentage of the die formed on the wafer in which the defects binned in the group are located is equal to [(300)(100)]/[(2000)(1000)] or 0.015%, which is essentially the wafer-based marginality for this group of defects.

In this manner, the method may include prioritizing systematic defects by number of inspected die on the wafer in which the defects were detected at least once. For instance, a higher priority may be assigned to POIs if systematic defects appeared on 10% of the design instances of the POI in a die versus 1% of the design instances of the POT in the die. In another example, the groups of defects that are detected in a larger number of the die on the wafer may be assigned a higher priority than groups of defects that were detected in a lower number of die on the wafer. In addition, the method may include generating a chart such as a bar chart illustrating the percentage of a die formed on the wafer in which the defects binned in different groups are located. Therefore, such a chart graphically illustrates the die-based marginality for different groups of defects. Such a chart may be displayed in a user interface, which may be configured as described herein. The results of such prioritizing may be used as described herein.

In still another embodiment, the method includes prioritizing one or more of the groups by number of total design instances on the wafer at which the defects in the one or more of the groups are detected. The number of total design instances on the wafer used in this embodiment may be the number of total inspected design instances on the wafer if all of the design instances on the wafer are not inspected during the inspection process used to detect the defects. In this manner, the method may include prioritizing known systematic defects by number of total design instances (or number of total inspected design instances) on the wafer. As such, the method may include prioritizing known systematic defects based on wafer-based marginality. For instance, the groups of defects that are detected at a larger number of the design instances on the wafer may be assigned a higher priority than groups of defects that are detected at a lower number of the design instances on the wafer. Such prioritizing may also be performed based on the percentage of locations of design instances (or inspected design instances) on the wafer at which the defects were detected. For example, the number of defects detected and binned into a group may be divided by the total number of design instances (or total number of inspected design instances) on the wafer. The results of this step may be multiplied by 100 to produce the percentage described above. In addition, the method may include generating a chart such as a bar chart illustrating the number of design instances (or the number of inspected design instances) on the wafer at which different groups of defects were detected. Such a chart may be displayed in a user interface, which may be configured as described herein. Such prioritizing may be further performed as described herein, and results of such prioritizing may be used as described herein.

In some embodiments, the method includes prioritizing one or more of the groups by number of design instances on a reticle, used to print the design data on the wafer, at which the defects in the one or more of the groups are detected at least once. The number of design instances on the reticle used in this embodiment may be the number of inspected design instances. In this manner, the method may include prioritizing known systematic defects by number of design instances on the reticle at which the defects are found at least once. For instance, the groups of defects that are detected at a larger number of the design instances on the reticle may be assigned a higher priority than groups of defects that were detected at a lower number of design instances on the reticle. In addition, the method may include generating a chart such as a bar chart illustrating the number of design instances on the reticle at which different groups of defects were detected. Such a chart may be displayed in a user interface, which may be configured as described herein. Such prioritizing may be further performed as described herein. In addition, the results of such prioritizing may be used as described herein.

In another embodiment, the method includes determining reticle-based marginality for one or more of the groups based on number of locations on a reticle at which defects binned into the one or more of the groups were detected and total number of portions of the design data printed on the reticle that are at least similar to the portions of the design data proximate to the positions of the defects binned into the one or more of the groups. The number of locations on the reticle used in this embodiment may include the number of inspected locations. For example, the reticle-based marginality may be determined by dividing the number of locations in a stacked reticle map at which at least one defect in a group has been detected by the total design instances on the reticle. The result of this step may be multiplied by 100 to produce a percentage of the locations of the design instances, corresponding to the group, at which the defects were detected. In one particular example, if 300 defects are binned into a group, there are 2000 design instances for the POI corresponding to that group on the reticle, and the defects binned in the group are detected at 50 different locations in the reticle (which may be determined from a stacked reticle map), then the reticle based marginality for this group of defects would be equal to [(50)(100)]/(2000) or 2.5%. In addition, the method may include generating a chart such as a bar chart illustrating the reticle-based marginality or percentage of locations at which the defects in the different groups were detected. Such a chart may be displayed in a user interface, which may be configured as described further herein. The method may also include prioritizing one or more of the groups of defects based on the reticle-based marginality determined for one or more of the groups. For instance, groups that exhibit relatively high reticle-based marginality may be assigned higher priorities than groups of defects that exhibit lower reticle-based marginality. Such prioritizing may be further performed as described herein, and the results of such prioritizing may be used as described herein.

The steps of the embodiments described above may be performed for groups of defects as described above or for individual defects binned into the groups.

Each of the embodiments of the method described above may include any other step(s) of any method(s) described herein. In addition, each of the embodiments of method described above may be performed by any of the systems described herein.

As set forth in detail above, the method embodiments for binning defects may include determining a DCI. In addition, some methods may include determining a DCI for one or more defects detected on a wafer and may or may not include binning the defects detected on the wafer. For example, one embodiment of a computer-implemented method for determining a DCI for a defect detected on a wafer includes determining a probability that the defect will alter one or more electrical attributes of a device being fabricated on the wafer based on one or more attributes of design data, for the device, proximate the position of the defect in design data space. The probability that the defect will alter the one or more electrical attributes of the device may be a probability that the defect will alter one or more electrical parameters of the device and/or will kill a die for the device. The one or more attributes of the design data may include any design data attribute(s) described herein. The probability may also be determined based on the one or more attributes of the design data in combination with one or more attributes of the defect (e.g., defect size). In addition, the probability may be determined based on the attribute(s) of the design data in combination with one or more attributes of the defects, a location of the defect reported by an inspection system used to detect the defect, and coordinate inaccuracy of the inspection system.

In one particular example, determining the probability may include determining one or more attributes of the design data such as a critical area for defects in the design data. In this manner, the critical area, the reported defect size, and the reported defect location can be used to determine the probability that the defect will alter one or more electrical attributes of the device. For instance, as defect size increases and pattern complexity increases, the probability that a defect will alter the one or more electrical attributes of the device also increases. Therefore, a relationship describing likelihood of kill or change in the one or more electrical attributes of the device as a function of defect size and pattern complexity may be used to determine the relative risk of each defect on each wafer.

In another example, the probability may be determined by using the design data proximate to the position of the defect in design data space, a probability of the position of the defect in the design data, and the defect size as input to a model to determine if the defect will alter one or more electrical attributes of the device. In this manner, the probability is a probability that a defect will alter one or more electrical attributes of the device if the defect is located in a particular spot in the design layout.

The method also includes determining the DCI for the defect based on the probability that the defect will alter the one or more electrical attributes of the device. For instance, the DCI may be an index which correlates, at least roughly, to the probability. In one example, a higher DCI may be determined for defects for which a relatively high probability has been determined. In other words, the DCI may indicate that the criticality is higher for defects having a relatively high probability of altering one or more electrical attributes of the device. The DCI may be determined from the probability using any suitable method, algorithm, data structure, rules, etc., or some combination thereof that describes a relationship between the DCI and the probability. The method described herein may include generating such a method, algorithm, data structure, rules, etc. using experimental results (e.g., results of inspection, metrology, review, test, or some combination thereof), simulation results, empirical data, information about the design, historical data, or some combination thereof. In addition, the DCI may have any suitable format (numeric, alphanumeric, text string, etc.). The DCI may be expressed in a manner such that a user can easily understand the value of the DCI. For example, the DCI may be assigned a value between 1 and 10, with 10 being the highest DCI and 1 being the lowest DCI. The DCI may also or alternatively be expressed in a manner such that a method or system such as one or more of the embodiments described herein may utilize the DCI to perform one or more of the steps described herein.

The method further includes storing the DCI in a storage medium. In addition, the storing step may include storing the DCI in addition to any other results of any method embodiments described herein. The DCI may be stored in any manner known in the art. In addition, the storage medium may include any storage medium described herein or any other suitable storage medium known in the art. After the DCI has been stored, the DCI can be accessed in the storage medium and used by any of the method or system embodiments described herein. Furthermore, it is noted that the DCI may be stored "permanently," "semi-permanently," or temporarily for any period of time. In addition, storing the DCI may be performed in any other manner described herein.

In one embodiment, the defect for which the DCI is determined includes a random defect. In another embodiment, the defect for which the DCI is determined includes a systematic defect. In this manner, the DCI may be determined for both random and systematic defects. The defect may be determined as a random defect or a systematic defect as described further herein. In addition, although the embodiment of the method is described above as including determining a DCI for a defect, it is to be understood that the method may include determining a DCI for one defect, some defects, or all defects detected on a wafer. The defect(s) for which a DCI is determined in the method may be selected by a user. Alternatively, the defect(s) for which a DCI is determined in the method may be selected by the method (e.g., based on one or more attributes of the defect(s), one or more attributes of design data proximate to the position(s) of the defect(s) in design data space, any other information about the defect(s) and/or the design data described herein, or some combination thereof).

In some embodiments, the one or more electrical attributes include functionality of the device. In this manner, the DCI may be determined based on a probability that the defect will cause the device to fail or not function. In another embodiment, the one or more electrical attributes of the device include one or more electrical parametrics of the device. In this manner, the DCI may be determined based on a probability that the defect will alter one or more electrical parametrics of the device. As such, the probability may be a probability that the defect will cause an electrical parametric issue. The electrical parametric issue may not qualify as an electrical defect in electrical testing, but may be an indication that the defect alters the electrical performance of the device and may begin to cause electrical defects over time on other wafers if the defect persists. The electrical parametric(s) may include any electrical parametric(s) known in the art such as speed, drive current, signal integrity, and power distribution of the device.

In one embodiment, the one or more attributes of the design data include redundancy, net list, or some combination thereof. In another embodiment, the one or more attributes of the design data include dimensions of features in the design data, density of features in the design data, or some combination thereof. Such attributes may be used to determine the probability as described above. In an additional embodiment, the one or more attributes of the design data include one or more attributes of the design data for more than one design layer for the device. In this manner, the probability may be determined based on multi-layer context information for the defect, which may be advantageous if the defect affects one or more layers of the design by being propagated through the device and since devices formed on wafers typically are formed of many layers. Therefore, a defect may alter the design data printed on more than one layer of the device, and the alterations to any, some, or all of the layers may alter one or more electrical attributes of the device. As such, by using one or more attributes of the design data to determine the probability, the probability may be determined based on how the defect may affect one or more layers of the device thereby possibly making the probability and the DCI determined therefrom more indicative of potential parametric issues and more yield relevant.

In some embodiments, determining the probability includes determining the probability using a correlation between electrical test results for the design data and the one or more attributes of the design data. For example, the method may include performing data mining to determine if there is a correlation between one or more attributes of the design data and electrical test results. In particular, one or more attributes of the design data such as line width, spacing, etc. printed on a wafer may be measured and electrical test results for the wafer may be used to determine a correlation between the attribute(s) of the design data and the electrical test results. The electrical test results may include measurements of one or more electrical attributes of one or more devices formed on the wafer or may be used to determine one or more electrical attributes of the device(s). Therefore, the correlation may be determined as a correlation between one or more attributes of the design data and the one or more electrical attributes. The electrical test results may include any appropriate electrical test results produced using any method or system known in the art. The defect may be identified as a random defect according to any of the embodiments described herein. Such a correlation may be used to determine the probability for both systematic and random defects. Using such a correlation to determine the probability may be advantageous since the correlation and one or more attributes of the design data located proximate to the position of a defect in design data space may be used to determine the probability relatively quickly.

In another embodiment, determining the probability includes determining the probability based on the one or more attributes of the design data in combination with a probability of the position of the defect within the design data space, a position of the defect reported by an inspection system used to detect the defect, coordinate inaccuracy of the inspection system, a size of the defect, defect size error of the inspection system, or some combination thereof. In one such embodiment, the defect includes a random defect. In this manner, the defect size, the location of the defect reported by the inspection system, and coordinate inaccuracy of the inspection system may be used to determine the DCI for random defects. Using the defect size, defect size error, reported defect location, and coordinate inaccuracy to determine the DCI as described above may be advantageous since the size and location of random defects may be relatively unpredictable. Therefore, using such information for determining the DCI may increase the accuracy of the DCI.

In an additional embodiment, determining the probability includes determining the probability based on the one or more attributes of the design data in combination with one or more attributes of the defect. In one such embodiment, the defect includes a systematic defect. In this manner, the systematic defect attributes may be used to determine the DCI for systematic defects. The defect may be identified as a systematic defect according to any of the embodiments described herein. The one or more attributes of a systematic defect may be used to determine the DCI for the defect since the positions of systematic defects in design data space may be determined with relatively high accuracy in the embodiments described herein.

In one embodiment, determining the DCI includes determining the DCI for the defect based on the probability in combination with a classification assigned to the defect. For example, the DCI may be determined based on the probability and then the DCI may be modified based on a defect classification to improve the DCI. In one such example, if the defect classification indicates that a defect is a bridging defect, a DCI for the defect may be altered such that the altered DCI indicates a higher criticality for the defect than the originally determined DCI. In a different example, if the defect classification indicates that a defect is a partial bridging defect, then the DCI determined for the defect may be altered such that the altered DCI indicates a lower criticality for the defect than the originally determined DCI. The classification of the defect used in this embodiment may be determined or assigned to the defect according to any of the embodiments described herein or using any other method or system known in the art for classifying defects. In addition, the DCI may be modified using any other results of any step(s) of any method(s) described herein (e.g., a KP value for the defect) or any other available information (e.g., hot spot information).

In some embodiments, the method includes determining the design data proximate the position of the defect in design data space by determining a position of inspection data in design data space, which may be performed as described herein. In another embodiment, the method includes determining the design data proximate the position of the defect in design data space by defect alignment, which may be performed as described herein. In an additional embodiment, the method includes determining the design data proximate the position of the defect based, at least in part, on a position of the defect reported by an inspection system used to detect the defect, coordinate inaccuracy of the inspection system, one or more attributes of the design data, defect size, defect size error of the inspection system, or some combination thereof, which may be performed as described further herein. In this manner, the design data proximate the position of the defect in design data space may be determined based, at least in part, on the reported location of the defect and the location at which the defect could be located within coordinate accuracy of the inspection system. The design data beyond the location at which the defect could be located may be determined in a similar manner.

In one embodiment, the method includes modifying the DCI based on sensitivity of yield of the design data to defects. In this manner, the DCI may be modified based on sensitivity of yield impact within a region (e.g., cell or functional block) in the design. For example, the method may include determining the position of the defect in design data space, which may be performed as described herein, and the yield sensitivity due to defects located at this position and/or due to defects in the design data proximate to this position may be determined. Such yield sensitivity may be determined using any of the embodiments described herein. For example, the method may include modeling electrical properties of a device being fabricated using the design data about a position in design data space for different values of one or more attributes of the design data, which may be selected based on how the one or more attributes may be altered by defects. Such modeling may be performed as described herein, and the modeled electrical properties may be used to determine how yield changes as the values of the one or more attributes of the design data change, which may be used to determine the yield sensitivity of the design data to defects located at the position and/or defects in the design data proximate to this position. In this manner, the position of a defect in design data space may be used to determine the yield sensitivity of the design data to the defect. If the yield sensitivity of the design data to the defect is relatively high, then the DCI for the defect may be modified such that the modified DCI indicates a higher criticality than the originally determined DCI. Likewise, if the yield sensitivity of the design data to the defect is relatively low, then the DCI for the defect may be modified such that the modified DCI indicates a lower criticality than the originally determined DCI.

As described further above, the DCI may be used in a number of ways in the embodiments described herein. For example, in one embodiment, the method includes altering a process performed on the wafer based on the DCI determined for the defect. In one such embodiment, the process is a metrology process or involves one or more measurements on the wafer. In this manner, the method may include adapting a measurement process based, at least in part, on the DCI. In another example, the process is a defect review process. As such, the method may include adapting a defect review process based, at least in part, on the DCI. Altering the process as described above may include altering any one or more parameters of the process. In addition, such altering may be performed as described further herein.

In another embodiment, the method includes altering a process used to detect the defect based on the DCI determined for the defect. Altering the process used to detect the defect may include altering any one or more parameters of the process such as those described further herein. In addition, altering the process used to detect the defect based on the DCI may be performed using a feedback control technique. In one such example, if the DCI for the defect indicates that the defect is relatively critical, then the process used to detect the defect may be altered such that one or more locations on the wafer at which defects corresponding to the defect for which the DCI was determined may potentially be located may be inspected with a sensitivity that is higher than the sensitivity previously used to inspect these locations. Other parameter(s) of the process may be altered in a similar manner.

In some embodiments, the method includes generating a process for inspection of additional wafers on which the device will be fabricated based on the DCI determined for the defect. In this manner, instead of altering a previously used process in which the defect was detected, the method may include generating an entirely new inspection process. The new inspection process may be generated for any one or more layers of the additional wafers. For example, the process may be generated for the layer on which the defect for which a DCI was determined was detected. However, such an inspection process may also be generated for one or more other layers of the additional wafers. For example, if the DCI for the defect indicates that the defect is relatively critical, then a process for inspecting a subsequently formed layer on the wafer may be generated by selecting one or more parameters of the inspection process such that one or more locations on the subsequently formed layer at which defects, which may be caused by the defect for which the DCI was determined, may potentially be located may be inspected with relatively high sensitivity. Other parameter(s) of the process may be selected in a similar manner. Generating the process for inspecting the additional wafers may also be performed as described further herein.

In one embodiment, the computer-implemented method for determining the DCI is performed by an inspection system used to detect the defect. In this manner, the method may be performed on-tool. In another embodiment, the computer-implemented method for determining the DCI is performed by a system other than an inspection system used to detect the defect. As such, the method may be performed off-tool. The system used to perform the method off-tool may be configured as described further herein.

The DCI for the defects may be used in a number of ways in the embodiments described herein such as for sampling in which defects are selected for review. For example, for each group into which defects were binned, DCI may be used for sampling instead of performing random sampling of the grouped defects. In addition, the DCI determined for the defects may be used to determine which defects have a higher probability of altering the one or more electrical attributes of the device, and defects that have a higher probability of altering the one or more electrical attributes may be more heavily sampled. The DCI may be used to sample not only systematic defects but also random defects.

Each of the embodiments of the method for determining a DCI described above may include any other step(s) of any method(s) described herein. In addition, each of the embodiments of the method for determining a DCI described above may be performed by any system embodiments described herein.

Another embodiment relates to a computer-implemented method for determining a memory repair index (MRI) for a memory bank formed on a wafer. A memory die includes memory banks (often many memory banks). Each memory bank includes an array block area (or a raw area) and a redundancy area. The redundancy area includes a number of rows and a number of columns and is used to repair the memory bank. The numbers of rows and columns included in the memory bank may be user-defined. The array block area may be generally square or rectangular in shape. The redundant rows may be formed along one side of the array block area, and the redundant columns may be formed along another, adjacent side of the array block area. The memory bank may also include row decoders adjacent to the redundant rows, column decoders adjacent to the redundant columns, and sense amps adjacent to the column decoders. The method may also include determining the locations of redundant rows and columns, sense amps, and decoders for each array block area. Such locations may be determined using any method or system known in the art.

The method includes determining a number of redundant rows and a number of redundant columns required to repair the memory bank based on defects located in the array block area of the memory bank. For example, in some embodiments, the method includes determining which of the defects located in the array block area will cause bits in the memory bank to fail and determining positions of the bits that will fail based on locations of the defects that will cause the bits to fail. Alternatively, the method may include determining which defects in the array block area may cause bits in the memory bank to fail and determining the positions of the bits that may fail based on the locations of the defects that may cause the bits to fail. Determining which of the defects in the array block area will or may cause bits to fail may be performed using one or more attributes of the defects, which may include any of the defect attribute(s) described herein, and/or results of one or more other step(s) of any of the method(s) described herein. For example, a reported defect location, coordinate accuracy of an inspection system used to detect the defect, defect size, defect size inaccuracy of the inspection system, possibly in combination with a DCI for the defect, which can be determined as described herein, and possibly in further combination with correlated inspection and/or electrical test results for the memory bank may be used to determine if the defect will or may cause a bit failure.

In one such embodiment, determining the number of the redundant rows and the number of the redundant columns required to repair the memory bank is performed using the positions of the bits that will fail. This step may alternatively be performed using the positions of the bits that may fail. For example, individual failing bits are not necessarily replaced on a one-to-one basis with redundant rows and columns. Instead, if individual failing bits are "adjacent" to each other along the same logical row or column, then that entire row or column becomes a candidate for replacement by an available redundant row or column. Therefore, the positions of the bits that will or may fail may be used to determine which failing bits are "adjacent" to each other along the same logical row or column, which can be used to determine the number of redundant rows and columns needed to repair the memory bank. In this manner, the method may include predictive bit fail estimation, which can be used to determine and/or monitor the amount of redundancy that will be consumed by the failed bits.

In addition, although two memory bits may be physically adjacent to each other in the layout, they may belong to a different logical row or column. In other words, physical adjacency may not correlate with logical or electrical adjacency. For example, if logical Row 1 includes 256 bits, those 256 bits are not necessarily next to each other in the physical layout of the bank or segment. As such, physical (or topological) addresses may be converted to logical (or electrical) addresses through a mapping function that may be different for each device. Such mapping may be performed using any suitable method or system known in the art. For example, Klarity Bitmap, which is commercially available from KLA-Tencor, provides a graphical or otherwise easy way to create the topological-to-electrical mapping. Therefore, using such a mapping function in this method may allow determination of an MRI that accurately reflects the repairability of the memory bank.

The defects that are located in the array block area may be identified in or from results of inspection of the memory bank. For example, the inspection may detect defects in both the array block area and the redundancy areas (or across the entire memory bank), and the defects may be separated into defects in the array block area and defects in the redundancy areas based on locations of the defects, which may be determined according to any of the embodiments described herein. Separating the defects in the array block area, redundancy areas, decoder areas, and sense amp areas provides enhanced value for the inspection results since such separation can be used to separate the repairable defects from the non-repairable defects. In addition, separation of the defects into defects in the raw, redundancy, decoder, and sense amp areas can be rule-based or region-based.

The method also includes comparing the number of the redundant rows required to repair the memory bank to an amount of available redundant rows for the memory bank. In addition, the method includes comparing the number of the redundant columns required to repair the memory bank to an amount of available redundant columns for the memory bank. In some embodiments, comparing the number of the redundant rows is performed separately for each bank of a memory die, and comparing the number of the redundant columns is performed separately for each bank of the memory die. Comparing the number of the redundant rows and comparing the number of the redundant columns may be performed in any suitable manner.

In another embodiment, the method includes determining the amount of the available redundant rows and the amount of the available redundant columns based on defects located in the redundant rows and the redundant columns of the memory bank. Defects located in the redundant rows and columns may be identified as described above. Determining the amount of available redundancy as described above may be advantageous since if the redundancy is sufficiently defective, then a memory bank failure may occur. In addition, if the redundancy is partially defective, the amount of redundancy available for repair of the memory bank is reduced, and if the number of fails exceeds the amount of non-defective redundancy, then a memory bank may not be repairable. The amount of available redundancy may also be determined for individual memory banks within a die since as described further above, each bank has its own set of redundant rows and columns, and failing bits in each bank can only be replaced by available redundant rows or columns in the same bank.

The amount of available redundancy may also be determined based on the defects located in the redundancy area and one or more attributes of the defects located in the redundancy area. The one or more attribute(s) used in this step may include any of the defect attribute(s) described herein. Determining the available redundancy may also or alternatively be performed using any results of any step(s) of any method(s) described herein. For example, a reported defect size of a defect in the redundancy area, coordinate accuracy of an inspection system used to detect the defect, and a classification assigned to the defect may be used to determine if the defect will cause a failure in the redundancy area, which may be used to determine the amount of available redundancy.

The method further includes determining the MRI for the memory bank based on results of comparing the number of the redundant rows and comparing the number of the redundant columns. The MRI indicates if the memory bank is repairable. For example, if the number of the redundant rows and/or columns needed to repair the failed bits is larger than the number of available redundant rows and/or columns, then the memory bank is not repairable and the die is not repairable. The MRI may be determined based on such a comparison and assigned a value that indicates whether or not the memory bank is repairable. For example, the MRI may be assigned a first value if the memory bank is repairable, and the MRI may be assigned a second value if the memory bank is not repairable. The different values for the MRI may be expressed in any suitable format (e.g., such that the values are easily comprehended by a user and/or such that the values can be used by the method embodiments described herein). Suitable formats include, but are not limited to, numeric, alphanumeric, text string, etc.

The method also includes storing the MRI in a storage medium. The storing step may include storing the MRI in addition to any other results of any method embodiment(s) described herein. The MRI may be stored in any manner known in the art. In addition, the storage medium may include any storage medium described herein or any other suitable storage medium known in the art. After the MRI has been stored, the MRI can be accessed in the storage medium and used by any of the method or system embodiments as described herein. Furthermore, the MRI may be stored "permanently," "semi-permanently," or temporarily for any period of time. Storing the MRI may also or alternatively be performed as described herein.

The method embodiments described above, therefore, can be used for early detection of memory loss using the MRI, which is advantageous for a number of reasons and can be used in a number of manners. For example, in one embodiment, the method includes determining the MRI for more than one memory bank formed in a die and predicting a repair yield for the die based on the MRIs for the more than one memory bank. Predicting the repair yield for a die based on the MRIs determined for the memory banks in the die is advantageous since each bank or segment of the die has a corresponding set of redundant rows and columns available for repair. The bits that fail in a particular bank or segment can only be replaced by available corresponding redundant rows or columns. Therefore, it is possible for one bank to "run out" of redundancy while other banks in the die have available redundancy. In this case, the die is no longer fully repairable because at least one bank or segment is not repairable. As such, based on the MRIs for memory banks in the die, the method may determine yield of a repair process performed on the die. In addition, an MRI may be determined for the die, which indicates if the die is repairable, based on the MRIs determined for the memory banks in the die. For example, if the MRIs for the memory banks indicate that any of the memory banks are not repairable, then the MRI may be determined to be a value that indicates that the memory die is not repairable.

In another embodiment, the method includes determining the MRI for each memory bank in one or more dies on the wafer and determining a memory yield for the one or more dies based on the MRIs for each memory bank. These steps may be performed as described above. This embodiment of the method may be used to determine the die-to-die memory yield. In addition, the memory yield for the one or more dies may be used to determine a memory yield for the wafer.

In another embodiment, the method includes combining the memory yield prediction with a yield prediction outside the memory to determine a total yield prediction.

In an additional embodiment, the method includes performing wafer disposition based, at least in part, on the one or more memory yields for the one or more dies on the wafer. For example, the methods described herein can be used to perform in-line disposition of wafers thereby allowing better (e.g., more efficient) WIP planning and reduction of production costs. For example, the number of dies having a memory yield below some predetermined threshold may be determined and used to determine if repair should be performed on the wafer, if the wafer should be reworked, if the wafer should be scrapped, etc. In such an example, the number of dies having a memory yield below the predetermined threshold may be compared to another predetermined threshold, and both thresholds may be selected to represent the minimum wafer-based yield that is needed to determine if repair should be performed on the wafer. For example, the thresholds may be selected (e.g., by a user or by one or more embodiments described herein) to correspond to the minimum memory yield at which the estimated value of the wafer does not exceed the cost of completing the wafer. In another example, the method may include determining a memory yield for the wafer based on memory yields for one or more dies on the wafer. Therefore, the memory yield may be the yield after a memory repair process, if that process is performed on the one or more dies on the wafer. The memory yield for the wafer may be used to disposition the wafer as described above. For example, the value of the wafer after the memory repair process may be determined based at least in part on the memory yield, and this value may be compared to the cost of completing the wafer to determine if the wafer should be scrapped.

In one embodiment, comparing the number of the redundant rows includes determining a fraction of the redundant rows needed to repair the memory bank, comparing the number of the redundant columns includes determining a fraction of the redundant columns needed to repair the memory bank, and determining the MRI for the memory bank includes determining the MRI based on the fraction of the redundant rows and the fraction of the redundant columns.

Methods that include determining the MRI based on the fractions described above may include any other steps described herein. For example, in one such embodiment, the method includes determining the MRI for each memory bank in one or more dies on the wafer and determining a memory yield for the one or more dies based on the MRIs for each memory bank. The steps of this embodiment may be performed as described further herein. In another example, in another such embodiment, the method includes determining the MRI for each memory bank in one or more dies on the wafer, determining a memory yield for the one or more dies based on the MRIs for each memory bank, and determining a memory yield for the wafer based on the memory repair yields for each of the one or more dies. The steps of this embodiment may be performed as described further herein. In this manner, the method may include using the MRI to predict memory yield on a wafer to wafer basis. In a similar manner, the MRI may be determined for each die on a wafer, and the MRI for each die may be used to determine a wafer-based memory yield. For example, the wafer-based memory yield may be determined by dividing a sum of the MRIs for each die on the wafer by the number of die on the wafer to determine the fraction of dies on the wafer that are good or repairable with respect to its memory. The fraction of dies on the wafer that are good or can be repaired may be used possibly in combination with information about the repair process such as historical yield or success rate to better predict the memory yield for the repair process performed on the wafer.

In some embodiments, the MRI also indicates a probability that the memory bank will not be repairable. In this manner, the MRI may indicate whether or not the memory bank is repairable and how likely that the memory bank is not repairable. The probability that a memory bank is not repairable may be determined based on comparing the number of the available redundant rows to the number of redundant rows needed for repair and comparing the number of the available redundant columns to the number of redundant rows needed for repair, which may be performed as described above, possibly in combination with one or more attributes of the defects, one or more attributes of the memory design, and one or more attributes of the repair process. Such attributes may include, for example, historical success rates of the repair process performed in other memory banks that are at least similar by design to the memory bank for which the probability is being determined. Such an MRI may be expressed as two values, one indicating whether or not the memory bank is repairable and another indicating the probability that the memory bank is not repairable. Alternatively, the MRI may be expressed as a single value that indicates if the memory bank is repairable and the probability that the memory bank is not repairable. The two values and the single value may be expressed in any of the formats described herein. In one such embodiment, the method includes determining the MRI for each memory bank in one or more dies on the wafer and determining a MRI for the one or more dies based on the MRI for each of the memory banks in the one or more dies. These steps may be performed as described herein. In such an embodiment, the MRIs for the one or more dies indicate a probability that the one or more dies will not be repairable (since the MRI for each memory bank indicates the probability that the memory banks will not be repairable and since the repairability of the dies are related to the repairability of the memory banks as described further above). In one such embodiment, the method includes determining a wafer based memory yield prediction based on thresholding of the MRIs for the one or more dies on the wafer. Determining the wafer based memory yield predication may be performed as described above, but will be the yield of the wafer not the yield of the repair process as described above.

In some embodiments, the method includes identifying non-repairable defects in the memory bank (e.g., in the logic periphery of the memory bank) based on one or more defects located in a decoder area of the memory bank, one or more defects located in a sense amp area of the memory bank, or some combination thereof. For example, inspection of the memory bank may be performed to detect defects in all areas of the memory bank (e.g., including the logic periphery, the decoder area, and the sense amp area), and the location of the defects within the memory bank, which may be determined according to any embodiments described herein, may be used to determine which area of the memory bank each or one or more of the defects are located. The number of non-repairable defects in the memory bank may be determined based, at least in part, on the number of the defects detected and located in the decoder area and the sense amp area. The method may also include estimating the memory yield based at least in part on the non-repairable defects in the memory bank, which is advantageous since one non-repairable defect may kill the die.

In one embodiment, the method includes altering one or more parameters of an electrical test process based on the MRI using a feed forward control technique. In another embodiment, the method includes altering one or more parameters of an electrical test process based on the MRI using a feed forward control technique such that if the memory bank is not repairable, a die in which the memory bank is located is not tested during the electrical test process. For example, memory testing takes a relatively long time. Therefore, based on a prediction that a memory bank or a memory die is not repairable, which may be determined as described above, that information may be fed to the prober or other memory test system so that the affected, non-repairable die is skipped during the memory testing. In this manner, the amount of testing may be reduced thereby reducing the cost of memory testing. In addition, memory testing may include open/short testing, functional testing, and electrical parametric testing. If such testing can be eliminated by using the methods described herein to determine which dies can be repaired, then the memory testing process can be performed in a much shorter period of time. Alternatively, the electrical test process may be altered to collect more relevant test data for further FA on dies that cannot be repaired, and the testing may be focused at specific locations based on the predicted impact of various probable failure mechanisms. Furthermore, memory repair may include using a laser or electrical means to blow fuses thereby re-routing decoders to the redundant rows and/or columns. Memory testing may be performed after memory repair to verify the repair and to run further tests such as stress testing. Therefore, by determining which dies can be repaired as described herein, the memory repair and additional memory testing may be performed for only the repairable dies and therefore in a much shorter period of time.

In some embodiments, the method includes altering one or more parameters of a repair process based on one or more attributes of the defects located in the array block area of the memory bank, the MRI, or some combination thereof. For example, the memory repair process may be altered such that repair is not attempted on memory die that include memory banks determined to not be repairable. In addition, the memory repair process may be altered to increase the probability that repair will be successful. The one or more parameters of the repair process that are altered in this embodiment may include any parameter(s) of the repair process.

In some embodiments, the defects include defects detected at a gate layer of the memory bank. In other embodiments, the defects include defects detected at a metal layer of the memory bank. For example, in memory fabrication, inspection may be performed at the gate layer and the metal layers. The methods described herein may be performed for defects detected at one or more of these layers. In addition, although most memory fabrication involves inspection at the gate and metal layers and the inspection results generated at the gate and metal layers are sufficient to predict the yield, inspection may also be performed at the capacitor layer for bit repair. Therefore, inspection results generated at the gate, metal, and capacitor layers may be used to predict the yield as well. In addition, the embodiments described herein may be performed for defects detected at the capacitance layer.

In one embodiment, the method includes predicting bit failure modes of the defects based on locations of the defects in the memory bank. In this manner, the locations of the defects can be used to predict bit failure modes. Such information may be useful for determining the amount of redundancy needed to repair the memory bank. For example, defects in the p-MOS area of the memory bank will cause sense amp failure thereby consuming more redundancy than defects in the n-MOS area. One or more attributes of the design data proximate the defects and/or one or more defect attributes (e.g. size) of the defects may also be used to enhance the prediction of bit failure modes. In addition to assisting the prediction of redundancy needed for repair or if the memory in the die will yield, prediction of the mode of failure may result in faster or better identification of the defect(s) causing the bit failure(s). Early prediction may allow the DOI to be identified and reviewed, which is impossible without FA if the bit failures are discovered at test. It may also be possible to identify and review defects that may be responsible for latent failures of the device and to use available redundancy to reduce latent failure rates. In this manner, defects can be mapped to regions of the memory (e.g., sense amp), and defect and/or design attribute(s) can be used in combination with rules to predict bit failure modes inline.

In some embodiments, the method includes determining, based on the MRI, if the amount of the available redundant columns, the amount of the available redundant rows, or some combination thereof in the memory bank should be evaluated by a designer of the memory bank. In this manner, the method may include performing "redundancy analysis" to suggest to the designer if adding more rows or columns in the redundancy area should be performed at certain memory banks. The methods described herein are particularly advantageous for providing feedback about the design of the die because the methods described herein can be used for early detection of fatal wafers and allow faster yield learning.

In another embodiment, the method includes determining a DCI for one or more of the defects located in the array block area. The DCI for the one or more defects may be determined as described herein. In one such embodiment, determining the number of the redundant rows and the number of the redundant columns required to repair the memory bank is performed using the DCI for the one or more defects. In another embodiment, determining the number of the redundant rows and the number of the redundant columns required to repair the memory bank includes determining a DCI for each of the defects located in the array block area of the memory bank, comparing the DCIs to a predetermined threshold, and determining the number of the redundant rows and the number of the redundant columns required to repair all of the defects having a DCI above the predetermined threshold. For example, a DCI may be determined for every defect located in the array block area. The DCI may be determined for the defects located in the array block area as described further herein. In addition, the method may include using the DCI to predict the number of row or column failures caused by the defects. For example, if the number of defects having a DCI larger than a predetermined value, which may be user defined, is larger than the number of rows or columns in the redundancy area, then the MRI (in this example defined to be the ratio of the redundant rows or columns needed for repair to the available redundant rows or columns) may be determined to be greater than 1 (fail). In contrast, if the number of defects having a DCI smaller than a second predetermined value, which may be user defined and may be different than the first predetermined value, is smaller than the number of rows or columns in the redundancy area, then the MRI may be determined to be less than 1 (pass, perhaps with some repair). In addition, the method may include determining a max count or percent of available redundant rows and/or columns that might be needed to repair the memory bank if every defect having a DCI above a threshold requires repair.

Using the DCI to determine if the memory in a die is repairable may be advantageous since the actual yield impact of individual defects may vary depending to upon the pattern failure caused by the defects, the location of the defects (e.g., on top of a layer, embedded in a layer, etc.), one or more attributes of the defects such as defect size, etc. The DCI may be determined based on such variations in the defects as described herein thereby reflecting how different defects will actually impact yield. In addition, since systematic defects may have more of an actual yield impact, the methods described herein may include determining which defects detected in the memory bank are systematic defects and then determining the MRI as described herein based on the criticality of the systematic defects. The systematic defects may be identified according to any embodiment(s) described herein.

In some embodiments, the method includes determining a MRI for failure of the memory bank due to the defects located in the array block area of the memory bank. In this manner, the method may include determining an index for segment failure due to defects detected in non-redundant areas of the memory bank. In a similar manner, the method may include determining an index for segment failure due to defects detected in redundant areas of the memory bank.

In another embodiment, the method includes determining a MRI for failure of the memory bank due to defects located in the redundant rows and the redundant columns of the memory bank. In this manner, the method may include determining an index for logical row and/or column failure. Such an index may be used to alter one or more parameters of a test process as described above.

In some embodiments, the method includes generating a stacked map of like memory bank designs illustrating spatial correlations between defects detected in the memory banks. In this manner, the method may include generating a stacked map illustrating spatial correlations. Such a stacked map may be generated in any suitable manner known in the art.

In one embodiment, the method includes determining the MRI on a die basis. In a similar manner, the method may include determining the MRI on a wafer basis and/or a lot basis. Determining the MRI on a die basis, a wafer basis, and/or a lot basis may be performed as described herein.

In another embodiment, the method includes determining an index or memory yield prediction indicating if a die on the wafer will fail due to the defects located in the array block area. In this manner, the method may include determining an index or to a probability that a die will fail due to a bad memory bank. This index may be determined as described further herein.

In an additional embodiment, the method includes determining the MRI for memory banks in a die on the wafer and generating a stacked map of the die illustrating spatial correlations between two or more of the memory banks indicated by the MRIs to not be repairable. Determining the MRI for the memory banks in the die may be performed as described herein. In addition, the stacked map may be generated in any suitable manner known in the art.

In a further embodiment, the method includes determining the MRI for memory banks in a die on the wafer and generating a stacked map of a reticle used to form the memory banks on the wafer illustrating spatial correlations between two or more of the memory banks indicated by the MRIs to not be repairable. Determining the memory banks in the die may be performed as described herein. In addition, the stacked map may be generated in any suitable manner known in the art.

In some embodiments, the method includes identifying memory banks of a die impacted by defects detected in the die and ranking the memory banks based on the impact of the defects on the memory banks. In this manner, the method may include ranking a list of impacted memory banks. The impact of the defects on the memory banks may be determined based on any of the information described herein (e.g., one or more attributes of the defects, one or more attributes of the design data for the memory banks, etc.) The impact of the defects on the memory banks that is used to rank the memory banks may include any impact (e.g., any adverse effect) that the defects have on the memory banks. The memory banks may be ranked such that memory banks that are most impacted by the defects are assigned the highest rank and the memory banks that are least impacted by the defects are assigned the lowest rank. Such ranking of the memory banks may be used, for example, to determine a relationship between the location of the memory banks in the die and the degree to which the defects impact the memory banks. In addition, such a relationship may be used to predict the cause of at least some of the defects, which may be used to reduce these defects on additional wafers and/or to reduce the number of defects that have the largest impact on the memory banks first (e.g., using one or more of the altering steps described herein such as altering the process performed on the memory banks prior to detection of the defects and/or altering the design of the memory banks) before defects having smaller impacts on the memory banks are reduced (e.g., using one or more of the altering steps described above).

In another embodiment, the method includes determining a percentage of memory banks formed on the wafer impacted by defects in non-repairable areas of the memory banks. The memory banks impacted by defects in non-repairable areas of the memory banks may be determined as described herein. The percentage may be determined based on the number of such memory banks and the total number of memory banks formed on the wafer. In addition, the method may include determining a percent of die impacted by probable redundancy failures and/or impacted by non-repairable failures. The probable redundancy failures and the non-repairable failures may be identified as described herein. In addition, the die impacted by the probable redundancy failures and/or the non-repairable failures may be identified as described herein. The number of impacted die and the total number of die formed on the wafer may be used to determine the percent of the die impacted by the probable redundancy failures and/or the non-repairable failures.

In some embodiments, the method includes generating a stacked wafer map of probable failures in memory banks formed on the wafer illustrating spatial correlations between the probable failures. In this manner, the method may include generating a stacked wafer map of probable failures or binned indexes (for spatial correlations). The probable failures may be identified as described herein, and the stacked wafer map may be generated in any suitable manner. The stacked map may alternatively display or overlay the probability that a die will have memory failures by a method such as color coding probability bins.

In another embodiment, the method includes determining the MRI for more than one die formed on the wafer and ranking the more than one die based on the MRIs. In this manner, the method may include generating a ranked list of impacted die on the wafer. The MRI for the more than one die may be determined as described herein. In addition, ranking the more than one die based on the MRIs may be performed as described herein, and results of such ranking may be used as described herein.

Each of the embodiments of the method for determining the MRI described above may include any other step(s) of any method(s) described herein. In addition, to each of the embodiments of the method for determining the MRI described above may be performed by any of the system embodiments described herein.

Another embodiment relates to a different method for binning defects detected on a wafer. This method includes comparing positions of the defects in design data space with positions of hot spots in design data. Comparing the positions of the defects and the hot spots may be performed in any suitable manner. Hot spots located proximate to design data that is at least similar are correlated with each other. The hot spots may be correlated with each other by another method or system. Alternatively, the hot spots may be correlated with each other by an embodiment of the method. For example, in one embodiment, the method includes correlating the hot spots by identifying a location of a POI in the design data associated with a systematic defect, correlating the POI with similar patterns in the design data, and correlating the location of the POI and locations of the similar patterns in the design data as positions of the correlated hot spots. In one such embodiment, the systematic defects may be included in a data structure such as a list, database, or file of systematic defects for the design data, which may be generated by another method or system. In another such embodiment, the method includes identifying the systematic defects and/or determining the POI in the design data for a systematic defect. For example, a systematic defect may be identified by binning defects detected on a wafer based on portions of design data proximate to the positions of the defects in design data space, which may be performed as described above. The POI may be determined by extracting the pattern in the portion of the design data corresponding to a group into which the defects were binned. In this manner, the hot spots may be correlated to each other using design background based grouping, which may be performed as described further herein. Furthermore, the hot spots may be correlated to each other by binning the hot spots, which may be performed as described further herein. Correlating the hot spots with each other may be performed on-tool. The positions of the correlated hot spots may be stored in a "hot spot list" or other suitable data structure that includes some indication of which hot spots are correlated with each other, an identity for the hot spots in the list, and locations of the hot spots in the list. This list may then be used essentially as reference data in the binning method.

The method also includes associating the defects and the hot spots having positions that are at least similar. In particular, defects and hot spots that have at least similar positions in design data space may be determined based on results of the comparing step described above. The defects and the hot spots having positions in design data space may be associated with each other in any suitable manner. In addition, the method includes binning the defects in groups such that the defects in each of the groups are associated with only hot spots that are correlated with each other. In this manner, each group of defects may correspond to a group of correlated hot spots.

The method further includes storing results of the binning step in a storage medium. The storing step may include storing the results of the binning step in addition to any other results of any method embodiments described herein. The results of the binning step may be stored in any manner known in the art. In addition, the storage medium may include any storage media described herein or any other suitable storage media known in the art. After the results of the binning step have been stored, the results of the binning step can be accessed in the storage medium and used by any of the method or system embodiments as described herein. Furthermore, it is noted that the results of the binning step may be stored "permanently," semi-permanently, temporarily, or momentarily for any period of time. Storing the results of the binning step may be further performed according to any other embodiments described herein.

In one embodiment, the method includes assigning a DBC to one or more of the groups. Assigning the DBC to one or more of the groups may be performed according to any of the embodiments described herein. In another embodiment, the method includes determining a DCI for one or more of the defects. Determining a DCI for one or more of the defects in this embodiment may be performed according to any of the embodiments described herein.

In another embodiment, the computer-implemented method is performed by an inspection system used to detect the defects on the wafer. In this manner, the computer-implemented method may be performed on-tool. In addition, the method may include performing hot spot management on-tool. Hot spot management may include, for example, hot spot discovery, hot spot monitoring, hot spot revision, or some combination thereof, each of which may be performed as described further herein. For example, in some embodiments, the hot spots are identified by an inspection system used to detect the defects on the wafer. In this manner, the hot spots may be identified or discovered on-tool. Such identification or discovery of the hot spots may be performed as described herein (e.g., by performing design background based grouping of defects detected on a wafer).

In another embodiment, the method includes monitoring the hot spots using results of inspection of one or more wafers on which the design data is printed. Monitoring the hot spots based on the results of the inspection may be performed as described herein. Such monitoring of the hot spots may be performed on-tool. Monitoring the hot spots may also or alternatively be performed using the results of the inspection described above, results of one of the binning methods described herein, results of assigning one or more DBCs to one or more defects, which may be performed as described herein, any other results of any of the methods described herein, or some combination thereof.

In another embodiment, the method includes inspecting the wafer based on correlations between the hot spots. For example, positions on the wafer corresponding to different groups of correlated hot spots may be inspected differently. Inspecting the wafer based on the correlations between the hot spots may also be performed based on the correlations and one or more attributes of the design data corresponding to groups of correlated hot spots. For example, positions of a group of correlated hot spots that correspond to design data that has a particularly high yield sensitivity to defects may be used to determine positions on the wafer that are to be inspected with higher than normal sensitivity. The one or more attributes of the design data used in this embodiment may include any of the design data attribute(s) described herein. In addition, any one or more parameters of the inspection process may be altered such that positions on the wafer corresponding to different groups of correlated hot spots may be inspected differently. The one or more parameters of the inspection may include any of the parameter(s) described herein.

In some embodiments, the method includes monitoring systematic defects, potential systematic defects, or some combination thereof over time using the results of the binning step, which may be performed according to any of the embodiments described herein. In another embodiment, the method includes identifying systematic defects and potential systematic defects in the design data based on the results of the binning step and monitoring occurrence of the systematic defects and the potential systematic defects over time. The steps of this method embodiment may be performed as described herein.

In an additional embodiment, the method includes performing review of the defects based on the results of the binning step. For example, review of the defects may be performed such that groups of defects that correspond to different groups of correlated hot spots are reviewed different (e.g., using at least one different value of one or more parameters of the review process). Reviewing the wafer based on results of the binning step may also be performed based on the binning results and one or more attributes of the design data corresponding to the groups of correlated hot spots. In this manner, reviewing the defects based on results of the binning step may be performed as described above with respect to inspecting the wafer based on correlations between the hot spots.

In a further embodiment, the method includes generating a process for selecting the defects for review based on the results of the binning step. Generating the process for selecting the defects for review in this embodiment may be performed according to any of the embodiments described herein. In addition, the process for selecting the defects for review may be generated based on the results of the binning step in combination with information about the correlated hot spots associated with the groups of defects, and possibly in combination with the results of any other step(s) of any method(s) described herein and any other information described herein (e.g., one or more attributes of the design data, one or more attributes of the defects, etc.). Furthermore, generating the process for selecting the defects may include selecting values for any one or more parameters of the process to be used for selecting the defects.

In another embodiment, the method includes generating a process for inspecting wafers on which the design data has been printed based on the results of the binning step. Generating the process for inspecting wafers in this embodiment may be performed according to any of the embodiments described herein. In addition, the process for inspecting the wafers may be generated based on the results of the binning step in combination with information about the correlated hot spots associated with the groups of defects, and possibly in combination with the results of any other step(s) of any method(s) described herein and any other information described herein (e.g., one or more attributes of the design data, one or more attributes of the defects, etc.). Furthermore, generating the process for inspecting the wafers may include selecting values for any one or more parameters of the process to be used for inspecting the wafers.

In a further embodiment, the method includes altering a process for inspecting wafers on which the design data has been printed based on the results of the binning step. Altering the process for inspecting the wafers in this embodiment may be performed according to any of the embodiments described herein. In addition, the process for inspecting the wafers may be altered based on the results of the binning step in combination with information about the correlated hot spots associated with the groups of defects, and possibly in combination with the results of any other step(s) of any method(s) described herein and any other information described herein (e.g., one or more attributes of the design data, one or more attributes of the defects, etc.). Furthermore, altering the process for inspecting the wafers may include selecting values for any one or more parameters of the altered process to be used for inspecting the wafers.

In some embodiments, the method includes determining a percentage of a die formed on the wafer impacted by one or more of the groups of defects. In this embodiment, the percentage of the die may be determined according to any of the embodiments described herein.

In another embodiment, the method includes determining a percentage of a die formed on the wafer in which the defects binned in at least one of the groups are located and assigning a priority to the at least one group based on the percentage. Determining the percentage and assigning the priority may be performed according to any of the embodiments described herein.

In an additional embodiment, the method includes prioritizing one or more of the groups by number of total hot spots correlated with the hot spots associated with the defects in the one or more of the groups and number of the defects in the one or more of the groups. For example, the number of hot spots in a group of correlated hot spots may be compared to the number of defects in the group corresponding to the hot spot group. As such, the defectivity of a group of correlated hot spots may be determined (e.g., by determining the fraction of correlated hot spots at which a defect has been detected and/or by determining the percentage of correlated hot spots at which a defect has been detected). Therefore, the groups of defects may be prioritized by the defectivity of the correlated hot spots. For example, defects in a group that are detected at a larger number, a larger fraction, or a larger percentage of the corresponding hot spots may be assigned a higher priority than a group of defects that are detected at a smaller number, a smaller fraction, or a smaller percentage of the corresponding hot spots. The groups of defects may be prioritized, therefore, based on across wafer hot spot defectivity.

In a further embodiment, the method includes prioritizing one or more of the groups by number of corresponding hot spot locations on a reticle used to print the design data on the wafer at which the defects in the one or more of the groups are detected at least once. For example, a group of defects corresponding to a larger number of hot spot locations on the reticle may be assigned a higher priority than a group of defects corresponding to a smaller number of hot spot locations on the reticle. Therefore, the groups of defects may be prioritized based on the across wafer potential defectivity. In addition, if the number of times the reticle will be printed on a wafer is known or determined, the across-reticle potential defectivity of the groups may be used to determine or extrapolate the across wafer potential for defectivity of one or more of the groups. Results of this prioritizing step may be used to perform one or more other steps as described herein.

In some embodiments, the method includes determining reticle-based marginality for one or more of the groups based on number of locations on a reticle at which defects binned into the one or more of the groups were detected and total number of hot spot locations on the reticle that are correlated with the hot spots associated with the defects in the one or more of the groups. For example, the number of locations of hot spots in a group of correlated hot spots on a reticle may be compared to the number of these locations at which defects in a group corresponding to the group of correlated hot spots were detected. Therefore, the reticle-based marginality may be based on such a comparison and as such may be a measure of the defectivity across locations of correlated hot spots across a reticle. Such reticle-based marginality may be used in one or more steps as described herein.

Each of the embodiments of the method for binning defects described above may include any other step(s) of any method(s) described herein. In addition, each of the embodiments of the method for binning defects described above may be performed by any of the system embodiments described herein.

Another embodiment relates to a different method for binning defects detected on a wafer. In this embodiment, the method includes comparing one or more attributes of design data proximate positions of the defects in design data space. In one embodiment, the one or more attributes include pattern density. In another embodiment, the one or more attributes include the one or more attributes in feature space. Feature space may contain one or many feature vectors derived from design data. Unlike design space, feature space has the capability of efficiently considering many attributes which may be useful to determine groups of defects in a supervised manner (e.g. nearest neighbor binning techniques) or an unsupervised manner (e.g. natural grouping techniques). The one or more attributes of the design data used in this step may also or alternatively include any other attribute(s) of design data, defect data, hot spots or POI described herein.

The method also includes determining if the one or more attributes of the design data proximate the positions of the defects are at least similar based on results of the comparing step. Determining if the one or more attributes are at least similar may be performed in a manner similar to other steps for determining similarity described herein. In addition, the method includes binning the defects in groups such that the one or more attributes of the design data proximate the positions of the defects in each of the groups are at least similar. This binning step may be performed in a manner similar to other binning steps described herein. The method further includes storing results of the binning step in a storage medium, which may be performed as described herein.

In some embodiments, the method includes determining if the defects are random or systematic defects using the attribute(s). In addition, the attribute(s) can be used directly for random or systematic defects. The one or more attributes can be used to determine if defects that are binned and/or defects that are not binned are random or systematic defects. The one or more attributes of the design data may also be used in combination with any other results described herein and/or any other information described herein (e.g., one or more attributes of the defects and hot spot information) to determine if the defects are random or systematic defects. In one example of the embodiment described above, the one or more attributes of the design data that are used to determine if defects are systematic or random may include one or more attributes of features in the design data at the position of the defects with respect to the features. For example, if the one or more attributes of the design data proximate to a position of a defect in design data space include relatively high pattern density and relatively small feature dimensions and design data having such attributes is known to be prone to systematic defects (which may be determined experimentally, by simulation, or any other suitable method or system), the defects may be determined to be a systematic defect.

In another embodiment, the method includes ranking one or more of the groups using the attribute(s). The one or more attributes that are used for ranking one or more groups of binned defects may include any of the attribute(s) described herein. In one example, the groups of binned defects may be ranked based on pattern density such that groups of defects associated with higher pattern density are ranked higher than groups of defects associated with lower pattern density because defects located in high pattern density areas of the design may have a larger detrimental impact on yield. Results of such ranking may be used as described herein (e.g., the results may be used in steps involving prioritization results in place of the prioritization results).

The attribute(s) can also be used to rank defects within a group. For example, in an additional embodiment, the method includes ranking the defects in at least one of the groups using the one or more attributes. The attribute(s) of the design data used to rank the defects in a group may include any of the attribute(s) described herein. In addition, the attribute(s) used to bin the defects may or may not be the same attributes used to rank the defects in the group. Binning and ranking the defects in this embodiment may advantageously provide finer separation of the defects by group and rank, which may provide more information about the impact of the defects on yield. Ranking the defects within a group may be performed as described herein. In addition, the defects in more than one group may be ranked separately within their groups. Results of ranking the defects in a group described above may be used in one or more steps described herein.

The attribute(s) can also be used to bin defects within a group. For example, in a further embodiment, the method includes binning the defects within at least one of the groups into sub-groups using the one or more attributes. The attribute(s) of the design data used to bin defects in a group into sub-groups may include any of the attribute(s) described herein. In addition, the attribute(s) used to bin the defects in the group may or may not be the same attributes used to bin the defects into sub-groups. Binning the defects into groups and sub-groups in this embodiment may advantageously provide finer separation of the defects by group and sub-group, which may provide more information about the impact of the defects on yield. Binning the defects within a group into sub-groups may be performed as described herein. In addition, the defects in more than one group may be binned separately within one or more sub-groups. Results of binning the defects into groups and sub-groups described above may be used in one or more steps described herein.

In some embodiments, the method includes analyzing the defects within at least one of the groups using the one or more attributes. In this manner, the attribute(s) can be used to analyze defects within a group. DCI determination is one example of this type of analysis. For example, in a further embodiment, the method includes assigning a DCI to one or more of the defects using the attribute(s). The attribute(s) of the design data used to analyze the defects may include any of the attributes described herein. The analysis may also or alternatively include any other analysis described herein.

In another embodiment, the method includes determining a yield relevancy of one or more of the defects using the one or more attributes. In this manner, the attribute(s) can be used to estimate yield relevancy of an individual defect. The one or more attributes used to determine the yield relevancy may include any of the attribute(s) described herein. In one such example, defects that are located proximate to design data that has a relatively high pattern density may be determined to be more yield relevant than defects located proximate to design data that has a relatively low pattern density. In addition, the yield relevancy may be determined based on the one or more attributes of the design data and how likely the defect will affect yield based on those one or more attributes. The defects for which the yield relevancy is determined may or may not include binned defects.

In an additional embodiment, the method includes determining overall yield relevancy of one or more of the groups using the attribute(s). Therefore, the attribute(s) can be used to estimate overall yield relevancy. The overall yield relevancy may be determined as described above.

In some embodiments, the method includes separating the design data proximate the positions of the defects into the design data in an area around the defects and the design data in an area on which the defects are located, which may be performed as described herein. In addition, the attribute(s) can be used to differentiate the neighborhood around a defect from the area the defect may have landed on.

In another embodiment, the method includes identifying structures in the design data for binning or filtering using rules and the attribute(s). For example, the method may include using rules and one or more attributes of the design data to identify structures such as structures susceptible to LES, large poly block, etc., and defects located proximate to such structures may be binned in a group and/or filtered from the results. The rules may be generated by the method described herein using experimental and/or simulation results or using any suitable method.

In another embodiment, the method includes determining locations on the wafer at which review, measurement, test, or some combination thereof is to be performed based on inspection results generated during detection of the defects and based on the defects identified as systematic defects, which may be performed according to any of the embodiments described herein. In some embodiments, the method includes determining locations on the wafer at which review, measurement, test, or some combination thereof is to be performed based on inspection results generated during detection of the defects, the defects identified as systematic defects, and yield relevancy of the defects, which may be performed as described herein. In an additional embodiment, the method includes determining locations on the wafer at which review, measurement, test, or some combination thereof is to be performed based on inspection results generated during detection of the defects, the defects identified as systematic defects, and process window mapping, which may be performed as described herein.

In some embodiments, the method includes performing systematic discovery using the results of the binning step and user-assisted review. For example, the results of the binning step may be used to assist a user in review (e.g., to determine where to review, how to review, etc.). Review may include generating review results (e.g., high magnification images) for at least one defects in one or more of the groups and displaying the results to the user such that the user can identify one or more defects or one or more groups of defects as systematic defects.

In another embodiment, the method includes prior to the comparing step, separating the defects based on functional blocks in which the defects are located to improve S/N in the results of the binning step. The functional blocks in which the defects are located may be determined as described herein. By separating the defects by functional block prior to the comparing step, defects in some (e.g., non-yield relevant) functional blocks may be eliminated from use in other steps of the method, which will increase S/N in the binning results. In addition, the binning may be performed based on the one or more attributes of the design data in combination with the functional blocks in which the defects are located thereby providing better separation in the binning results and higher S/N. Furthermore, binning may be performed separately for each functional block or for one or more different functional blocks thereby increasing the S/N for the binning results.

In another embodiment, the design data is organized into hierarchical cells, and the method includes prior to the comparing step, separating the defects based on the hierarchical cells in which the defects are located to improve S/N in the results of the binning step. The design data may be organized into hierarchical cells as described further herein. Separating the defects based on the hierarchical cells may be performed as described above with respect to functional block based separation. Separating the defects based on hierarchical cells may be used to improve S/N of results of the binning step as described above.

In an additional embodiment, the design data is organized by design into hierarchical cells, and if a defect could be located in more than one of the hierarchical cells, the method includes correlating the defect to each of the hierarchical cells based on a probability that the defect is located in each of the hierarchical cells based on area of the hierarchical cells, defect positional probability, or some combination thereof. In this manner, if a defect could be located in multiple cells, the defect can be correlated to the cells based on a probability that the defect is located in different cells, which may be determined based on area of defect positional probability. The probabilities may be determined in any manner known in the art.

In some embodiments, the defects were detected by an inspection process, and the method includes reviewing locations on the wafer at which one or more POIs in the design data are printed, determining based on results of the reviewing step if defects should have been detected at the locations of the one or more POIs, and altering the inspection process to improve one or more defect capture rates, which may be performed as described further herein.

Each of the embodiments of the method for binning defects described above may include any other step(s) of any method(s) described herein. In addition, each of the embodiments of the method for binning defects described above may be performed by any of the system embodiments described herein.

As described above, the portions of the design data proximate the positions of the defects may be compared to design data (e.g., POI design examples) corresponding to different DBCs (e.g., DBC bin definitions) stored in a library or other data structure. One embodiment that may utilize such a library or data structure is a computer-implemented method for assigning classifications to defects detected on a wafer. This method includes comparing portions of design data proximate positions of the defects in design data space with design data corresponding to different DBCs. Comparing the portions of the design data (or the "source portions" of the design data) with the design data corresponding to the different DBCs (or the "target portions" or "reference patterns" of the design data) may be performed as described herein. In some embodiments, the method includes comparing one or more attributes of the portions of the design data with one or more attributes of the design data corresponding to the different DBCs. The one or more attributes of the design data in the portions and the one or more attributes of the design data corresponding to the different DBCs that are compared in this step may include any of the attribute(s) described herein. In addition, the one or more attributes that are used for the comparing step may include one or more attributes in feature space. Furthermore, the comparing step may include comparing the portions of the design data to the reference patterns to determine if there is an exact match or similarity between the source and reference patterns. Moreover, the comparing step may be performed using rules, which may include any of the rules described herein or rules based on any methods for performing the comparing step described herein. Furthermore, the comparing step may include comparing positions of the defects in design data space to positions of hot spots in design data space, which may be performed as described herein.

Dimensions of at least some of the portions are different in some embodiments, and the dimensions may be selected and/or determined as described further herein. In another embodiment, the design data in the portions includes design data for more than one design layer. Such portions of the design data may be configured and used in the method as described further herein. The design data in the portions may include any other design data described herein. For example, the design data proximate the positions of the defects includes the design data on which the defects are located in one embodiment. In this manner, the design data used in this method may include the design data under or behind the defect or the design data on which the defect may have landed. In another embodiment, the design data proximate the positions of the defects includes the design data around the positions of the defects.

In an additional embodiment, the method includes converting the portions of the design data proximate the positions of the defects to first bitmaps prior to the comparing step, which may be performed as described herein, and converting the design data corresponding to the DBCs to second bitmaps prior to the comparing step, which may be performed as described herein. In one such embodiment, the comparing step includes comparing the first bitmaps with the second bitmaps. Such comparing may be performed as described further herein. The embodiment of the method for assigning classifications to the defects may include determining the positions of the defects in the design data space according to any of the embodiments described herein.

In one embodiment, the DBCs identify one or more polygons in the design data on which the defects are located or located near the defects. In this manner, the one or more polygons on which the defects are located or the one or more polygons located near the defects may be identified by the DBCs assigned to the defects. As such, the one or more polygons that are or may be affected by the defects may be determined. In addition, the one or more polygons on which the defects are located or the one or more polygons located near the defects may be identified, and information about these polygon(s) may be used to determine a position of the defects with respect to the polygon(s) in the design data. In some embodiments, the DBCs identify locations of the defects in one or more polygons in the design data. Therefore, the method may include determining where in the polygons the defect is located or near based on the DBCs assigned to the defects.

In another embodiment, the method includes separating the design data proximate the positions of the defects into the design data in areas around the defects and the design data in areas on which the defects are located. In this manner, the method may include differentiating the neighborhood around a defect from an area on which the defect may have landed. Such separating may be performed as described further herein. In addition, results of such separating may be used in the computer-implemented method for assigning classifications to defects as described further herein.

The design data corresponding to the different DBCs and the different DBCs are stored in a data structure. In addition, the design data corresponding to the different DBCs and the different DBCs may be stored in a data structure as described above. In particular, the design data corresponding to the different DBCs and the different DBCs may be stored as a DBC library file in the data structure. In addition, in one embodiment, the data structure includes a library containing examples of the design data organized by technology, process, or some combination thereof. In this manner, the data structure may be configured as a design library that includes a set of POI design examples that may be used for classifying defects on-tool, and the POI design examples may be organized by technology, process step, or any other suitable information. The data structure may include any suitable data structure known in the art and may be stored on a storage medium such as one of the storage media described herein or any other suitable storage medium known in the art.

The method also includes determining if the design data in the portions is at least similar to the design data corresponding to the different DBCs based on results of the comparing step. This determining step may be performed according to any of the embodiments described herein. In some embodiments, this determining step includes determining if the design data in the portions is at least similar to the design data corresponding to the different DBCs and determining if the design data in the portions has one or more attributes that are at least similar to one or more attributes of the design data corresponding to the different DBCs based on results of the comparing step. The one or more attributes may include any of the attribute(s) described herein. For example, the one or more attributes may include information about the inspection system used to detect the defects (e.g., inspection system type, one or more parameters of the inspection system at which the inspection system was operating at the time the defects were detected, etc.) and/or attributes about the defects (e.g. size, rough bin, polarity, etc.).

In addition, the method includes assigning to the defects the DBCs corresponding to the design data that is at least similar to the design data in the portions. The assigning step may be performed in any suitable manner. In some embodiments, the assigning step includes assigning to the defects the DBCs corresponding to the design data that is at least similar to the design data in the portions and that has one or more attributes that are at least similar to one or more attributes of the design data in the portions. In one embodiment, the one or more attributes may include one or more attributes of results of an inspection in which the defects were detected, one or more parameters of the inspection, or some combination thereof. The one or more attributes may also or alternatively include any other attribute(s) described herein.

The method further includes storing results of the assigning step in a storage medium. The results may be stored in the storage medium in any suitable manner or as described herein. The storage medium may include any of the storage media described herein or any other suitable storage medium known in the art.

The computer-implemented method described above is performed by an inspection system used to detect the defects in one embodiment. In this manner, assigning classifications to the defects as described herein may be performed on-tool. In another embodiment, the computer-implemented method is performed by a system other than an inspection system used to detect the defects. In this manner, assigning classifications to the defects as described herein may be performed off-tool.

In one embodiment, the method includes binning the defects assigned one or more of the DBCs in groups such that positions of the defects in each of the groups with respect to polygons in the portions of the design data proximate the positions of the defects are at least similar. In this manner, the method may include separating the defects into groups based on the DBCs and the positions of the defects within the portions. The positions of the defects with respect to the polygons may be determined as described herein. In addition, such binning may be further performed as described herein.

In some embodiments, the method includes monitoring hot spots in the design data based on results of the assigning step. For example, the DBCs or the design data corresponding to the different DBCs may be associated with hot spots in the design data. The hot spots may be identified in the design data as described herein. Monitoring hot spots in the design data as described above may include determining if the number of defects assigned to the DBCs associated with the hot spots or the design data corresponding to the different DBCs and associated with the hot spots changes over time. In addition, monitoring the hot spots in the design data based on results of the assigning step may be performed based on the results of the assigning step in combination with any other data described herein such as one or more attributes of the defects to which the different DBCs have been assigned. In addition, the method may include monitoring hot spots based on location (e.g., approximate location). In another embodiment, the method includes binning hot spots based on the design data corresponding to the DBCs. Such binning of the hot spots may be performed as described further herein. Binning the hot spots may include generating one or more data structures (e.g., lists, databases, files, etc.) of hot spots that includes locations of hot spots and indicates which hot spots are at least similar. Such binning of the hot spots may be performed on-tool.

In another embodiment, the method includes monitoring systematic defects, potential systematic defects, or some combination thereof over time using the results of the assigning step. For example, the results of the assigning step may be used to identify systematic issues in the design data, and the identified systematic issues may be monitored across wafers and/or across time. The systematic issues may be determined based on the results of the assigning step as described further herein. In addition, monitoring the systematic defects, the potential systematic defects, or some combination thereof may be further performed as described herein.

In one embodiment, the design data corresponding to the different DBCs is identified by grouping defects detected on one or more other wafers based on portions of the design data proximate positions of the defects detected on the one or more other wafers in the design data space. Such grouping of the defects may be performed as described herein. The results of grouping may be used to identify design data that corresponds to different DBCs. For example, the design data corresponding to each group of defects may be identified as design data corresponding to different DBCs. In addition, the different DBCs corresponding to the design data may be determined by classifying the defects in the groups, which may be performed as described herein, one or more attributes of the design data, one or more attributes of the defects, any other information described herein, or some combination thereof.

In another embodiment, the method includes determining if the defects are nuisance defects based on the DBCs assigned to the defects and removing the nuisance defects from results of an inspection process in which the defects were detected to increase S/N of the results of the inspection process. In this manner, the method may include nuisance filtering. The defects determined as nuisance defects may be defects assigned a nuisance DBC (e.g., a DBC of LES), defects not assigned a DBC, or defects assigned a DBC that indicates that the defects are not yield relevant defects or that the defects are defects not of interest. Increasing the S/N of the inspection results may be advantageous particularly if the inspection results are used to perform one or more other steps thereby increasing the S/N of the results of the other steps.

In some embodiments, the method includes determining one or more POIs in the design data by identifying one or more features in the design data indicative of a pattern dependent defect. In this manner, the method may include identifying POI(s) in the design data. The one or more features in the design data indicative of a pattern dependent defect may be determined based on experimental results, simulation results, binning results, other results described herein, or some combination thereof. Such results may be generated as described herein. The one or more POIs may be determined using the identified features to perform arbitrary pattern searching of the design data. Patterns in the design data determined by arbitrary pattern searching to be at least similar to the identified features may be identified as POIs. One or more POIs may be determined in this manner for more than one pattern dependent defect.

The defects to which DBCs are assigned in the methods described herein were detected in an inspection process. In one embodiment, the method includes reviewing locations on the wafer at which one or more POIs in the design data are printed, determining based on results of the reviewing step if the defects should have been detected at the locations of the one or more POIs, and altering the inspection process to improve one or more defect capture rates. Each step of this embodiment may be performed as described herein.

In another embodiment, the method includes determining a KP value for one or more of the defects. In an additional embodiment, the method includes determining a KP value for one or more of the DBCs based on one or more attributes of the design data corresponding to the DBCs. In a further embodiment, the method includes determining a KP value for one or more of the defects based on one or more attributes of the design data corresponding to the DBCs assigned to the one or more defects. Each of these steps may be performed as described herein. In some embodiments, the method includes monitoring KP values for one or more of the DBCs and assigning to the defects the KP values for the DBCs assigned to the defects. The KP values for the one or more DBCs may be monitored as described herein. In this manner, KP values of one or more DBCs may be revised over time and/or wafer such that at the time the defects were detected, a KP value for the DBC assigned to the defect may also be assigned to the defect with relatively high accuracy. Assigning the KP value to a defect based on the DBC assigned to the defect may be further performed as described herein.

In some embodiments, the method includes selecting at least some of the defects for review based on results of the assigning step. For example, the results of the assigning step may be used to determine which of the defects are most critical as described herein (e.g., based on one or more attributes of the DBCs assigned to the defects), and the most critical defects may be selected for review. In another example, the assigning results may be used to determine which of the defects are systematic defects as described further herein. In this manner, the method may include review sampling from regions in the design data at which DOI tend to occur.

In one embodiment, the method includes determining if the DBCs assigned to the defects correspond to systematic defects that are visible to a review system and sampling the defects for review by selecting only the defects that are visible to the review system for the review. The DBCs corresponding to systematic defects that are or are not visible to a review system may be determined in any manner known in the art. The DBCs corresponding to systematic defects that are visible to a review system may be determined prior to the method, and the DBCs may be assigned some identity that indicates if the DBCs correspond to visible or not visible defects. In this manner, the defects may be selected for review based on this identity. Selecting only the defects that are visible to the review system may be performed such that defects that are not visible to a review system such as a SEM are not selected for review. Selecting the defects in this manner is particularly advantageous since re-locating the defects during review can be difficult and relatively time consuming particularly if the review system spends a great deal of time looking for defects that are not actually visible to the review system. Results of selecting the defects for review may include locations of the defects selected for review on the wafer and any other results of any of the step(s) of the method(s) described herein.

The method may include adapting a process, measurement, or test based on the results of the assigning step. For example, in another embodiment, the method includes generating a process for sampling the defects for review based on the results of the assigning step. Therefore, instead of or in addition to selecting the defects for review, the method may include generating a process that can be used, by the method, another method, a system configured to perform the method, or another system, for sampling the defects for review. Such a process may be used for sampling defects for review of defects detected on multiple wafers and/or sampling defects for review performed by multiple review systems. The process for sampling may be generated based on the results of the assigning step such that a relatively large number of defects assigned the same DBC may be sampled more heavily than a relatively small number of defects assigned the same DBC. The process for sampling the defects for review may be generated based on the results of the assigning step in combination with any other results of any step(s) of any of the method(s) described herein such as DCIs for the defects, KP values for the defects, etc.

In an additional embodiment, the method includes altering a process for inspecting the wafer based on the results of the assigning step. Any parameter(s) of the process for inspecting the wafer may be altered in this embodiment. For example, the one or more parameters of the process for inspecting the wafer that may be altered based on the results of the assigning step may include, but are not limited to, the care areas (or alternatively the do not care areas), the sensitivity, the in-line binning process, the inspection area, which wafers are inspected, or some combination thereof. In one particular example, the results of the assigning step may indicate the number of defects assigned the different DBCs, and the care areas may be altered to include positions on the wafer corresponding to additional positions in design data space which also contain the design data corresponding to DBCs to which a relatively high number of defects have been assigned. In another example, the process for inspecting the wafer may be altered to inspect more or differently based on the results of the assigning step. The process for inspecting the wafer may also be altered based on any results of any of the step(s) of the method(s) described herein.

In some embodiments, the method includes altering a process for inspection of the wafer during the inspection based on results of the inspection. Altering the process for inspection in this embodiment may be performed as described further herein.

In a further embodiment, the method includes altering a metrology process for the wafer based on the results of the assigning step. For example, the metrology process may be altered such that the most critical defects as determined from the results of the assigning step are measured during the metrology process. Therefore, altering the metrology process may include altering the locations on the wafer at which the measurements are performed during the metrology process. In addition, results of inspection and/or review such as BF images and/or SEM images of the defects selected for measurement may be provided to the metrology process such that the results may be used to determine where the measurements are to be performed. For example, the metrology process may include generating an image of an approximate location of the defect on the wafer, and this image may be compared to the results of inspection and/or review for the defect such that the metrology system can correct the position on the wafer if necessary such that the measurements are performed at the correct wafer locations and therefore on the correct defects. In this manner, the measurements may be performed at substantially accurate locations on the wafer. Altering the metrology process may also include altering any other one or more parameters of the metrology process such as the type of measurements performed, wavelength at which the measurements are performed, angles at which the measurements are performed, etc., or some combination thereof. The metrology process may include any suitable metrology process known in the art such as a CD measurement metrology process.

In some embodiments, the method includes altering a sampling plan for a metrology process for the wafer based on the results of the assigning step. Therefore, the method may include adaptive sampling. For example, the sampling plan for the metrology process may be altered such that a greater number of the most critical defects as determined from the results of the assigning step are measured during the metrology process. In this manner, the most critical defects may be sampled more heavily during the metrology process thereby advantageously producing larger amounts of information about the most critical defects. The metrology process may include any metrology process known in the art. In addition, the metrology process may be performed by any suitable metrology system known in the art such as a SEM. Furthermore, the metrology process may include performing any suitable measurements known in the art of any suitable attributes of defects or features formed on the wafer known in the art such as profile, thickness, CD, etc.

In another embodiment, the method includes prioritizing one or more of the DBCs (e.g., DBCs assigned to defects) and optimizing one or more processes to be performed on wafers on which the design data will be printed based on results of the prioritizing step. In one such embodiment, the DBC(s) may be prioritized based on the number of defects to which the DBCs have been assigned. The number of defects to which each DBC has been assigned can be determined from the results of the assigning step. In one such example, the DBC assigned to the largest number of defects may be assigned the highest priority, the DBC assigned to the next largest number of defects may be assigned the next highest priority, and so on.

In addition, or alternatively, the DBC(s) may be prioritized based on any other results of any step(s) of any method(s) described herein or any combination of results of any step(s) of any method(s) described herein. For example, prioritizing the DBC(s) may include determining a DCI for one or more defects to which the DBC(s) have been assigned and prioritizing the DBC(s) based on the DCI for the one or more defects. The DCI may be determined in this embodiment as described further herein. In another example, prioritizing the DBC(s) may include determining a KP value for one or more defects to which the DBC(s) have been assigned and prioritizing the DBC(s) based on the KP values for the one or more defects. In yet another example, the DBC(s) may be prioritized based on a combination of number of defects to which the DBC(s) have been assigned and a DCI for one or more of the defects to which the DBC(s) have been assigned. In this manner, prioritizing the DBC(s) may include prioritizing the DBC(s) based on defectivity detected in design data corresponding to the DBC(s) such that the DBC(s) corresponding to higher defectivity are assigned higher priorities.

Furthermore, the DBC(s) may be prioritized based on one or more attributes of the design data corresponding to the DBC(s) possibly in combination with other results described herein. The one or more attributes of the design data may include, for example, dimensions of features in the design data, density of features in the design data, the type of features included in the design data, positions of the design data corresponding to the DBC(s) within the design, susceptibility of the yield impact of the design data to defects, etc., or some combination thereof. In one such example, DBC(s) corresponding to design data that is more susceptible to yield impact by defects may be assigned a higher priority than DBC(s) corresponding to design data that is less susceptible to impact of defects on yield.

Moreover, the DBC(s) may be prioritized based on one or more attributes of the design possibly in combination with one or more attributes of the design data corresponding to the DBC(s) and/or other results described herein. The one or more attributes of the design may include, for example, redundancy, net list, etc., or some combination thereof. In particular, a POI in the design data may have context beyond the pattern contained within the POI. Such context may include, for example, the label of the cell containing the POT, the hierarchy of cells above the cell containing the POI, the impact of redundancy (or not) of a systematic defect on the POI, etc. Therefore, the one or more attributes that are used in the embodiments described herein may include context of the POI in which the design data corresponding to the DBC(s) is located, which may be determined based on the positions of the design data corresponding to the DBC(s) in design data space and/or based on the design data corresponding to the DBC(s) (if the design data corresponding to the DBC(s) is specific to a cell in the design data). In one such example, DBC(s) corresponding to design data that has redundancy such that a systematic defect may not have a yield impact in the design may be assigned a lower priority than DBC(s) corresponding to design data that does not have redundancy such that a systematic defect may have a significant yield impact. Such context of the cells may be acquired and/or determined in any manner known in the art.

Optimizing one or more processes in this embodiment may include altering any one or more parameters of the one or more processes such as focus, dose, exposure tool, resist, PEB time, PEB temperature, etch time, etch gas composition, etch tool, deposition tool, deposition time, CMP tool, one or more parameters of a CMP process, etc. Preferably, the parameter(s) of the process(es) are altered to decrease defectivity of the design data corresponding to the DBC(s) (e.g., number of defects detected in the design data corresponding to the DBC(s)), to alter one or more attributes (e.g., DCI, KP, etc.) of defects detected in the design data corresponding to the DBC(s), and/or to increase yield of devices in which the design data corresponding to the DBC(s) are included.

In addition, the one or more parameters of the one or more processes may be optimized for only the DBC having the highest priority as determined by the prioritization step or the DBC(s) having relatively high priorities as determined by the prioritization step. In this manner, the one or more parameters of the one or more processes may be altered and/or optimized based on the design data corresponding to the DBC(s) exhibiting the largest defectivity and/or defectivity that has the largest yield impact. As such, the results of the prioritization step indicate which DBC(s) should be used to alter and/or optimize the one or more parameters of the one or more processes to produce the largest improvements in yield.

This embodiment is, therefore, advantageous over other previously used methods and systems for altering and/or optimizing processes because without guidance as to which DBC(s) have the largest impact on yield, many alterations may be made to the processes without producing large or any improvements in yield thereby increasing the turn around time for and cost of process optimization.

Furthermore, although the process(es) that are altered and/or optimized in this step may include only the processes that were used to print the design data corresponding to the DBC(s) on the wafer prior to detection of the defects assigned DBCs in the embodiments described herein, the one or more processes that are altered and/or optimized may include any process(es) that are used to print other designs that also include the design data corresponding to the DBC(s). For instance, if more than one design includes the design data corresponding to the DBC(s), based on the prioritization and/or any other results of the methods described herein, one or more processes used to print the more than one design may be altered and optimized to thereby increase the yield of devices fabricated with each of the different designs.

In an additional embodiment, the method includes determining a root cause of the defects based on the DBCs assigned to the defects. For example, the root cause may be determined based on one or more attributes of the design data corresponding to the DBCs assigned to the defects. The one or more attributes may be used to determine the root cause as described further herein. The attribute(s) of the design data used to determine the root cause may include any of the design data attribute(s) described herein. In addition, any other information and/or results of any step(s) of any method(s) described herein may be used in combination with the attribute(s) of the design data to determine the root cause of the defects.

In a further embodiment, the method includes determining a root cause of at least some of the defects by mapping the at least some of the defects to experimental process window results, which may be performed as described herein. In another embodiment, the method includes determining a root cause of at least some of the defects by mapping the at least some of the defects to simulated process window results, which may be performed as described herein.

In another embodiments, the method includes determining a root cause corresponding to one or more of the DBCs and assigning a root cause to the defects based on the root cause corresponding to the DBCs assigned to the defects. For example, a root cause of defects previously detected in design data corresponding to the DBCs may be associated with the DBCs. The root cause of the previously detected defects may be determined in any manner described herein or in any other suitable manner known in the art. In this manner, the root cause of the defects may be determined as the root cause associated with the DBCs assigned to the defects.

In a further embodiment, the method includes determining a percentage of a die formed on the wafer impacted by the defects to which one or more of the DBCs are assigned. For instance, the percentage may be determined by the number of die across the wafer in which the defects assigned the same DBC were detected at least once. Such a percentage may be determined by dividing the number of die in which at least one defect assigned the same DBC is detected by the total number of inspected die. The results of this step may be multiplied by 100 to arrive at the percentage. The percentage, therefore, reflects the die impact marginality for defects assigned the same DBC. Such a percentage may be determined for more than one DBC assigned to the defects, and each or at least some of the percentages may be displayed in a chart such as a bar chart that may be generated by the method. Therefore, the chart illustrates die impact marginality as a function of DBCs assigned to the defects. Such a chart may be illustrated in a user interface, which may be configured as described further herein. The method may also include prioritizing defects assigned one or more of the DBCs based on the percentage determined in this embodiment.

In some embodiments, the method includes determining a POI in the design data corresponding to at least one of the DBCs and determining a ratio of number of the defects to which the at least one of the DBCs have been assigned to number of locations of the POI on the wafer. In this manner, the method may include performing marginality analysis by determining the ratio or percentage of number of defects assigned a DBC compared to the number of locations of the POI corresponding to the DBC printed on the wafer. In such embodiments, the locations of the POI on the wafer may be identified by arbitrary pattern searching. In addition, the methods described herein may include arbitrary pattern searching to identify locations of the POI in the inspected region of the design and determining the cumulative area of the POI in the inspected regions of the design. The ratio of the number of defects to which the DBC has been assigned to the cumulative area of the POT in the inspected regions of the design may then be used to determine a defect density of the DBC corresponding to the POI. The method may also include prioritizing the one or more DBC(s) based on the ratios determined in this embodiment.

In another embodiment, the method includes determining one or more POIs in the design data corresponding to at least one of the DBCs and determining a ratio of number of the defects to which at least one of the DBCs have been assigned to number of locations of the one or more POIs in the design data (e.g., with respect to the inspected region of the wafer). In this manner, the method may include performing marginality analysis by determining the ratio or percentage of the number of defects assigned a DBC corresponding to a POT found on the wafer compared to number of locations of the POI in the design across the inspected area of the wafer. In such embodiments, the locations of the POT on the wafer may be identified by arbitrary pattern searching. This method may also include prioritizing one or more of the DBC(s) based on the ratios determined in this embodiment.

In an additional embodiment, the method includes determining a POI in the design data corresponding to at least one of the DBCs, determining a percentage of a die formed on the wafer in which the defects to which the at least one of the DBCs have been assigned are located, and assigning a priority to the POI based on the percentage. In this manner, the method may include performing marginality analysis based on a percentage of the die impacted by the defects. For example, the number of defects assigned the same DBC may be divided by the number of design instances of the POI in a reticle used to print the design data on the inspected region of the wafer and the number of times the reticle is printed and inspected on the wafer. The result of this step may be multiplied by 100 to arrive at the percentage. In this manner, the method may include prioritizing known systematic defects by number of die across the wafer in which the defects were detected at least once. For instance, a higher priority may be assigned to POIs in which systematic defects were detected if the POIs appeared on 10% of the die versus 1% of the die. In another example, defects assigned the same DBC that are detected in a larger number of the die on the wafer may be assigned a higher priority than defects assigned a different DBC that were detected in a lower number of die on the wafer. In addition, the method may include generating a chart such as a bar chart illustrating the percentage of a die formed on the wafer in which the defects assigned different DBCs are located. Therefore, such a chart graphically illustrates the die-based marginality for different DBCs. Such a chart may be displayed in a user interface, which may be configured as described herein.

In a further embodiment, the method includes prioritizing one or more of the DBCs by number of defects to which the one or more of the DBCs have been assigned are detected. In this manner, the method may include prioritizing known systematic defects by number of total number of defects to which the DBCs were assigned. As such, the method may include prioritizing known systematic defects based on wafer-based marginality. For instance, a DBC assigned to defects detected at a larger number of the design instances on the wafer may be assigned a higher priority than a DBC assigned to defects detected at a lower number of design instances on the wafer. Such prioritizing may also be performed based on the percentage of locations of design instances across the wafer at which the defects were detected. For example, the number of defects detected and assigned a DBC may be divided by the total inspected design instances corresponding to the DBC across the wafer. The results of this step may be multiplied by 100 to produce the percentage described above. In addition, the method may include generating a chart such as a bar chart illustrating the number of design instances across the reticle at which defects assigned different DBCs were detected. Such a chart may be displayed in a user interface, which may be configured as described herein.

In some embodiments, the method includes prioritizing one or more of the DBCs by number of design instances on a reticle, used to print the design data on the wafer, at which the defects to which the one or more of the DBCs have been assigned are detected at least once. In this manner, the method may include prioritizing known systematic defects by number of design instances across the reticle at which the defects are found at least once. For instance, DBCs assigned to defects detected at a larger number of the design instances on the reticle may be assigned a higher priority than DBCs assigned to defects detected at a lower number of design instances on the reticle. In addition, the method may include generating a chart such as a bar chart illustrating the number of design instances across the reticle at which defects assigned different DBCs were detected. Such a chart may be displayed in a user interface, which may be configured as described herein.

In another embodiment, the method includes determining reticle-based marginality for one or more of the DBCs based on number of locations on a reticle at which the defects to which the one or more of the DBCs have been assigned were detected and total number of portions of the design data printed on the reticle that are at least similar to the portions of the design data proximate the positions of the defects to which the one or more of the DBCs have been assigned. For example, the reticle-based marginality may be determined by dividing the number of locations in a stacked reticle map at which at least one defect assigned a DBC has been detected by the total inspected design instances across the reticle. The result of this step may be multiplied by 100 to produce a percentage of the locations of the design instances, corresponding to the DBC, at which the defects to which the DBC was assigned were detected. In addition, the method may include generating a chart such as a bar chart illustrating the reticle-based marginality or percentage of locations at which defects assigned different DBCs were detected. Such a chart may be displayed in a user interface, which may be configured as described further herein. The method may also include prioritizing one or more of the DBCs based on the reticle-based marginality determined for one or more of the DBCs. For instance, DBCs that exhibit relatively high reticle-based marginality may be assigned higher priorities than DBCs that exhibit lower reticle-based marginality. The steps of the embodiments described above may be performed for groups of defects to which the same DBC have been assigned or for individual defects to which a DBC has been assigned.

Each of the embodiments of the method for assigning a classification to a defect described above may include any other step(s) of any method embodiment(s) described herein. In addition, each of the embodiments of the method for assigning a classification to a defect described above may be performed by any of the system embodiments described herein.

Another embodiment relates to a method for altering an inspection process for wafers. This method includes reviewing locations on the wafer at which one or more POIs in the design data are printed. The method also includes determining based on results of the reviewing step if defects should have been detected at the locations of the one or more POIs. In addition, the method includes altering the inspection process to improve one or more defect capture rates and/or improving the S/N for defects located in at least some of the one or more POIs. Each of these steps may be performed as described further herein. For example, one or more parameters of the inspection process may be altered based on prioritization of the POIs, which may be determined as described herein.

One use case for the above-described method is optics sensitivity applications. For example, in one embodiment, altering the inspection process includes altering an optics mode of an inspection system used to perform the inspection process. In this manner, the optics mode used for inspection may be altered to improve the S/N of detecting one or more defects corresponding to at least some of the one or more POIs. The optics mode may include any optics mode known in the art.

In another embodiment, the method includes determining an optics mode of an inspection system used to perform the inspection process based on results of determining if the defects should have been detected at the locations of the one or more POIs. In this manner, the optics mode with the highest S/N for the defects that should have been detected may be determined. The optics mode may include any optics mode known in the art. In addition, the determined optics mode and/or the defects that should have been detected may be used to select other parameters of the altered inspection process such as type of inspection system used to perform the inspection process.

In some embodiments, altering the inspection process includes altering the inspection process to increase capture of DOI associated with one or more POI. Altering the inspection process to increase capture may include altering any one or more parameters of the inspection process. The detection enhanced by altering the parameters of the inspection process may include detection of DOI associated with POI in inspection results (e.g., increasing the defect count for a yield critical systematic DOI, etc.). The one or more parameters altered to increase the capture may be selected based on any results of the inspection process and/or any results of the reviewing step (e.g., not just results of reviewing the locations on the wafers at which the one or more POIs are printed).

In some embodiments, altering the inspection process includes altering the inspection process to suppress noise in results of the inspection process. Altering the inspection process to suppress the noise may include altering any one or more parameters of the inspection process. The noise that is suppressed by altering the parameters of the inspection process may include any noise in inspection results (e.g., background noise, nuisance defects, etc.). The one or more parameters altered to suppress the noise may be selected based on any results of the inspection process and/or any results of the reviewing step (e.g., not just results of reviewing the locations on the wafers at which the one or more POIs are printed).

In a further embodiment, altering the inspection process includes altering the inspection process to reduce detection of defects not of interest or to improve binning of defects not of interest. Altering the inspection process to reduce detection of defects not of interest may include altering any one or more parameters of the inspection process. The defects not of interest that are detected less by altering the parameters of the inspection process may include any defects not of interest (e.g., non-yield relevant systematic defects, defects at cold spots, etc.). The one or more parameters altered to reduce detection of the defects not of interest may be selected based on any results of the inspection process and/or any results of the reviewing step (e.g., not just results of reviewing the locations on the wafers at which the one or more POIs are printed).

Altering the inspection process to improve one or more defect capture rates may include altering any one or more parameters of the inspection process. For example, in one embodiment, altering the inspection process includes altering an algorithm used in the inspection process. The algorithm that is altered may be a defect detection algorithm or any other algorithm used in the inspection process. The altered algorithm may include any suitable algorithm known in the art. In addition, altering the inspection process may include altering more than one algorithm used in the inspection process.

In an additional embodiment, altering the inspection process includes altering one or more parameters of an algorithm used in the inspection process. The algorithm for which one or more parameters are altered may include a defect detection algorithm or any other algorithm used in the inspection process. In addition, altering the inspection process may include altering one or more parameters of more than one algorithm used in the inspection process. The one or more parameters in the algorithm(s) may include any parameters of the algorithms, preferably parameter(s) that affect the defect capture rates.

Each of the embodiments of the method for altering an inspection process for wafers described above may include any other step(s) of any method embodiment(s) described herein. In addition, each of the embodiments of the method for altering an inspection process for wafers described above may be performed by any of the system embodiments described herein.

Figure 25:
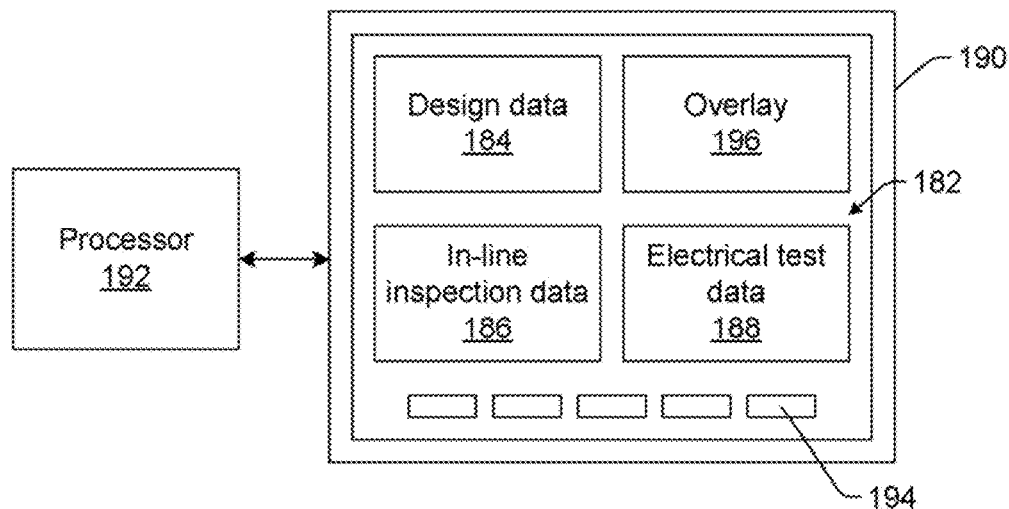
FIG. 25 is a schematic diagram illustrating a side view of one embodiment of a system configured to display and analyze design and defect data.

An additional embodiment relates to a system configured to display and analyze design and defect data. One embodiment of such a system is shown in FIG. 25. As shown in FIG. 25, the system includes user interface 182. User interface 182 is configured for displaying one or more of design layout 184 for a semiconductor device, inline inspection data 186 acquired for a wafer on which at least a portion of the semiconductor device is formed, and electrical test data 188 acquired for the wafer. In one embodiment, the electrical test data includes logic bitmap data. Design, inspection (or metrology), test, and overlay data may be represented in design, device, reticle, or wafer space. The user interface may also be configured for displaying modeled data for the semiconductor device and/or FA data for the wafer. In addition, the user interface may be configured to display information for specific hot spots or DOI based on input from the user (e.g., a selection of a hot spot or DOI by the user). In this manner, the user interface may be configured for displaying information about different hot spots or DOI at different times. However, the user interface may be configured for displaying information about different hot spots or DOI simultaneously (e.g., in a wafer map or a bar graph) using one or more different indicia (e.g., color, symbol, etc.) to indicate the different hot spots or DOI. The user interface may also be configured to display information in the hot spot database. Using the display of the information in the hot spot database, a user may create one or more hot spot lists by selecting subset(s) of hot spots of interest with a given analysis or inspection recipe. The user interface may be displayed on display device 190. Display device 190 may include any suitable display device known in the art.

The system also includes processor 192. Processor 192 is configured for analyzing one or more of the design layout, the inline inspection data, and the electrical test data upon receiving an instruction to perform the analysis from a user via the user interface. The processor may also be configured for analyzing the modeled data and/or the FA data as described above. For instance, user interface 182 may be configured for displaying one or more icons 194. Each of the icons may correspond to a different function that may be performed by the processor. In this manner, although five icons are shown in FIG. 25, the user interface may be configured for displaying any number of icons corresponding to the number of possible functions. The user may then instruct the processor to perform one or more functions by selecting (e.g., clicking on) one or more of the icons. In addition, the user interface may display the various functions that are available to the user in any other manner known in the art (e.g., a drop down menu). In this manner, the user interface may be configured as a single integrated user interface that combines design/layout visualization and analysis operations with inline process data visualization and analysis operations and functional/structural electrical test data visualization and analysis operations.

The system may be configured to process the data at increased resolution, which may be commonly referred to as "drill down capabilities." For instance, the system may be configured to use input such as a wafer map illustrating defects detected on the wafer to select two or more dies for stacking, to select defects illustrated in the die stacking results, and to perform some function on the defects. The system may also be configured to use the data from more than one of the domains together, which may be commonly referred to as "drill across capabilities."

In one embodiment, the user interface is also configured for displaying overlay 196 of at least two of the design layout, the inline inspection data, the electrical test data, and any other information described herein. In one such embodiment, the electrical test data includes logic bitmap data. In such embodiments, the processor may be configured for overlaying the different data according to any of the embodiments described herein. In this manner, the system may be configured to generate and display overlay of data from two or more of the three domains (e.g., design, inspection, and electrical test). Such overlay of the data may be used to map physical to logical positions of defects and using electrical test results (e.g., electrical failures) and the mapping to identify defects that impact the electrical test results (e.g., causing the electrical failures).

In one embodiment, the processor is also configured for determining a defect density in design data space upon receiving an instruction to perform this determination from the user via the user interface. In this manner, the system may be configured to perform fault density calculations as described further herein. The user interface may also be configured for displaying results of the fault density calculations.

In an additional embodiment, the processor is configured to perform defect sampling for review upon receiving an instruction to perform the defect sampling from the user via the user interface. In a further embodiment, the processor is configured for grouping defects based on similarity of the design layout proximate to positions of the defects in design data space upon receiving an instruction to perform the grouping from the user via the user interface. In this manner, the system may be configured to perform sampling and data reduction (e.g., data reduction by pattern dependent binning) techniques. These techniques may be performed as described further herein.

In some embodiments, the processor is configured for monitoring KP values for groups of defects over time and determining a significance of the groups of defects based on the KP values over time. In this manner, the system may be configured for defect tracking (e.g., using DTT methodology and/or using images). The user interface may also be configured for displaying results of monitoring the KP values and the significance of the groups of defects over time. The processor and the system shown in FIG. 25 may be further configured as described herein. For example, the processor and the system may be configured to perform any other ste¹p(s) of any other methods described herein. In addition, the system shown in FIG. 25 may include other components described herein such as an inspection system, which may be configured as described further above. The system shown in FIG. 25 has all of the advantages of the methods described herein.

A further embodiment relates to a computer-implemented method for determining a root cause of electrical defects detected on a wafer. In one such embodiment, the results of the inspection of the wafer for the electrical defects may include a bitmap for a logic device. The method includes determining positions of the electrical defects in design data space. The positions of the electrical defects in design data space may be determined as described herein.

In some embodiments, the method includes correlating spatial signatures of defects such as systematic defects to process conditions. For example, after converting scan-based and structural test results to wafer space coordinates, particular spatial signatures may be correlated to one or more process conditions. Methods and systems for performing spatial signature analysis of defect data are illustrated in U.S. Pat. No. 5,991,699 to Kulkarni et al., U.S. Pat. No. 6,445,199 to Satya et al., and 6,718,526 to Eldredge et al., which are incorporated by reference as if fully set forth herein. The methods and systems described herein may be configured to perform any step(s) of any of the methods described in these patents.

The method also includes determining if the positions of a portion of the electrical defects define a spatial signature corresponding to one or more process conditions. This step may be performed by comparing a spatial signature for the portion of the electrical defects to a set of spatial signatures corresponding to the process conditions, by applying rules to the positions of the portion of the electrical defects, or in any other suitable manner. In addition, if the positions of the portion of the electrical defects define a spatial signature that corresponds to the one or more process conditions, the method includes identifying the root cause of the portion of the electrical defects as the one or more process conditions. In this manner, the method described above may include performing spatial signature analysis on logic bitmap data. The method further includes storing results of the identifying step in a storage medium. The results of the identifying step may include any results described herein. In addition, this method may perform the storing step as described further herein. The storage medium may include any of the storage media described herein.

Each of the embodiments of the method for determining a root cause of electrical defects described above may include any other step(s) of any method embodiment(s) described herein. In addition, each of the embodiments of the method for determining a root cause of electrical defects described above may be performed by any of the system embodiments described herein.

The root cause of other defects may also be determined in the methods described herein. For example, wafer based or reticle based spatial signature by pattern group (and combination of such) mapped across a process window may be particularly useful in determining correlations to aid in root cause determination. In one example, at one edge of a process window, defect x and y are marginal and tend to fail first from the outside of the wafer. At the other edge of the process window, defect z tends to fail in the edge of the wafer first. Thus, a possible root cause could be determined by observing which systematic defects fail most often (and perhaps with respect to the outer annular ring) on the wafer.

Figure 26:
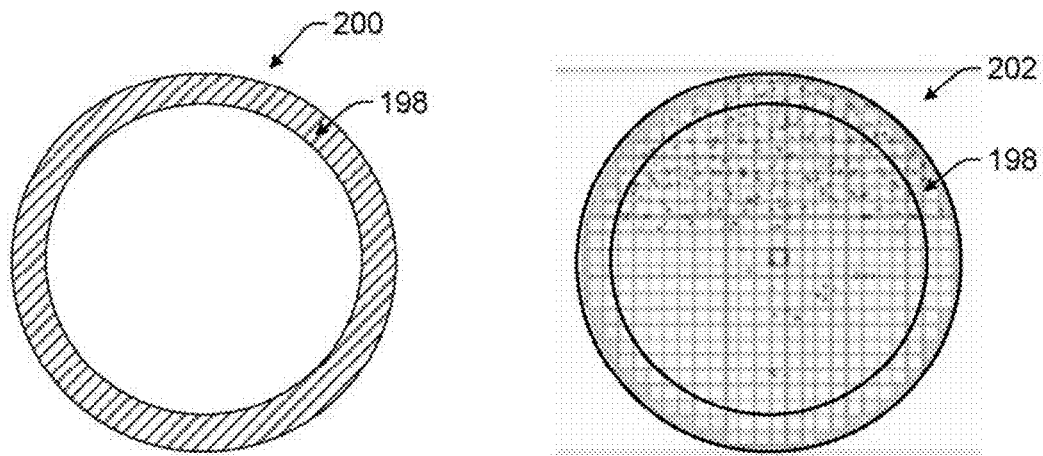
FIG. 26 is a schematic diagram illustrating a top view of one embodiment of one or more zones on a wafer associated with positions of one or more defect types on the wafer.

Another embodiment relates to a computer-implemented method for selecting defects detected on a wafer for review, discovery for classification/investigation, and monitoring for verification/root cause analysis including on-tool, off-tool, and on-SEM. The method includes identifying one or more zones of the wafer. The one or more zones are associated with positions of one or more defect types on the wafer. One embodiment of one or more such zones is illustrated in FIG. 26. As shown in FIG. 26, zone 198 on wafer 200 may be identified as being associated with positions of one or more defect types on the wafer. For instance, this zone may be associated with defect types that are caused by focus errors proximate the outer edge of the wafer during a lithography process or etch variation from the wafer center to the wafer edge.

The method also includes selecting defects detected in only the one or more zones for review. For instance, as shown in FIG. 26, wafer map 202 may be overlaid with the layout of zone 198. In this manner, defects illustrated in wafer map 202 may be selected for review based on the zone in which they are located and the one or more defect types associated with the zone. In one such example, if the zone shown in FIG. 26 is associated with de-focus errors proximate the outer edge of the wafer, the method may select defects (only, primarily, or heavily) in zone 198. Alternatively, the defects may be selected from zones on the wafer other than zone 198.

Although only one zone is shown in FIG. 26, it is to be understood that the wafer may be separated into any number of suitable zones. In addition, the zones may be defined on the wafer as annular zones as shown in FIG. 26, angular zones, angular and radial zones, or rectangular zones. However, the zones may have irregular (e.g., polygonal) shapes. In addition, all, some, or none of the zones may have the same characteristics such as shape and/or size.

The method described above may be used to provide a defect sample such that results of review of the defect sample can be interpolated from the die to the wafer. In contrast, a typical review sample plan includes 100 to 200 defects for recipe optimization and 25 to 100 defects for monitoring spread over the entire wafer. However, there may be tens of thousands of hot spots on one die alone. Hot spots may be reviewed for discovery. Systematic defects may be reviewed for monitoring and verification. Therefore, even after selecting 100 or 200 defects from this population, one preferably does not review them all on the same die. Instead, the selected defects are preferably spread out across multiple die. The method described above uses zonal analysis results to identify a correlation between certain defect types and certain zones on the wafer. As such, the methods described herein may be used to identify wafer position specific defects. In this manner, the method may include biasing the sampling plan toward these zones to provide results suitable for use in die-to-wafer interpolation. The method further includes storing results of the selecting step in a storage medium. The results of the selecting step may include any results described herein. In addition, this method may perform the storing step as described further herein. The storage medium may include any of the storage media described herein.

Each of the embodiments of the method for selecting defects for review described above may include any other step(s) of any method embodiment(s) described herein. In addition, each of the embodiments of the method for selecting defects for review described above may be performed by any of the system embodiments described herein.

Figure 27:
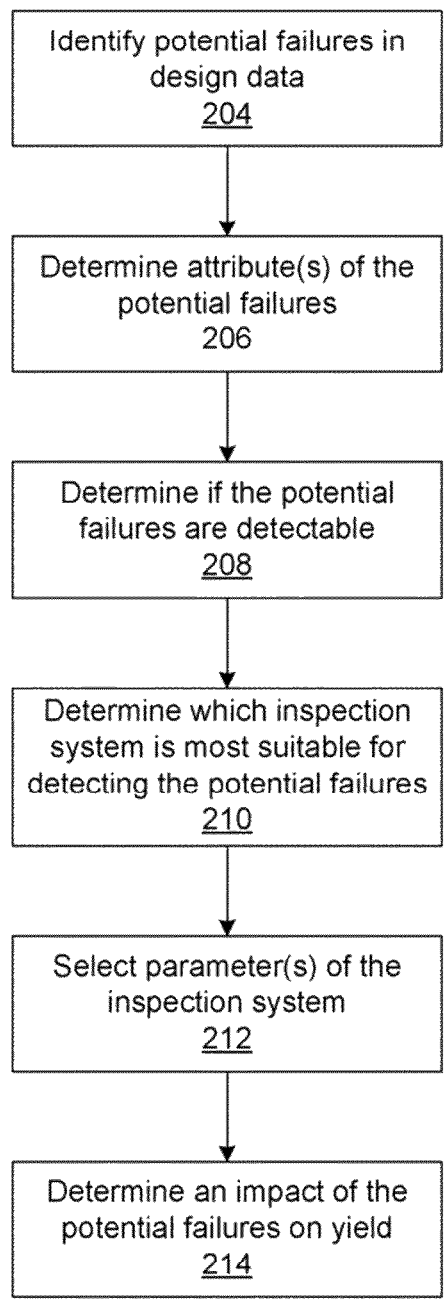
FIG. 27 is a flow chart illustrating one embodiment of a computer-implemented method for evaluating one or more yield related processes for design data.

Another embodiment relates to a computer-implemented method for evaluating one or more yield related processes for design data. One such embodiment is shown in FIG. 27. It is noted that the steps shown in FIG. 27 are not essential to practice of the method. One or more steps may be omitted from or added to the method illustrated in FIG. 27, and the method can still be practiced within the scope of this embodiment.

As shown in FIG. 27, the method includes identifying potential failures in the design data using rule checking, as shown in step 204. Alternatively, the potential failures in the design data may be identified using observed potential hot spots from repeater analysis or a defect density map. The potential failures that are identified in this step may include one or more different types of DOI. In some embodiments, the potential failures that are identified in this step may include post-pattern potential failures (e.g., post-etch potential failures). In addition, once a potential failure has been identified, it may be propagated throughout the design, which may be detected by searching for common patterns in the design (e.g., via arbitrary pattern searching). In some embodiments, the method includes arbitrary pattern searching to identify the locations of all similar POI. The common patterns may be identified by searching for the pattern rotated or flipped to find all of the potential failures. Furthermore, the potential failures in the design data may be identified in step 204 using any other suitable method (e.g., modeling), software, and/or algorithm known in the art. In addition, the potential failures may include areas or patterns in the design data that may cause failure of a device fabricated for the design data or that may alter one or more electrical parameters of the device in an undesirable manner without actually causing failure of the device.

As shown in step 206, the method also includes determining one or more attributes of the potential failures. The attribute(s) of the potential failures that are determined may include, for example, type. The attribute(s) of the potential failures may be acquired by experimental testing, simulation results, design data, or any other method. Since the method includes identifying potential failures as described above, the method may include altering the design data prior to fabrication to eliminate as many of the potential failures as possible. Such altering of the design data may be performed as described herein. However, it is conceivable that not all potential failures can be eliminated prior to fabrication. In addition, the potential failures identified in the method described herein may or may not actually produce failures or impact yield during fabrication. Therefore, while some of the potential failures may be eliminated prior to fabrication (and therefore inspection), the method described herein can provide important information about where in the design inspection should be performed such that if potential failures actually fail they can be detected as soon as possible. In addition, the method described herein can provide important information about how different areas of the design should be inspected such that inspection of areas on wafers at which portions of the design data containing the potential failures in the design can be performed with the most suitable inspection parameters thereby increasing the probability that if a potential failure should actually cause a failure, it will be detected by inspection.

As shown in step 208, the method includes determining if the potential failures are detectable based on the one or more attributes of the potential failures. Whether or not the potential failures are detectable may be determined based on the attribute(s) of the potential failures in combination with the known capabilities of various inspection systems. As shown in step 210, the method includes determining which of a plurality of different inspection systems (e.g., BF, DF, voltage contrast, EC, electron beam, etc.) is most suitable for detecting the potential failures based on the one or more attributes.

In some embodiments, the method includes selecting one or more parameters of the inspection system determined to be most suitable, as shown in step 212. In one such embodiment, the parameter(s) are selected based on the one or more attributes of the potential defects. The parameter(s) may be selected as described further herein. In addition, the parameter(s) that are selected in this step may include any parameter(s) of the inspection system that can be varied and/or are controllable. One example of such a parameter is optical mode or inspection mode. Preferably, the parameter(s) are selected to optimize inspection of wafers for the potential failures (e.g., to increase defect capture rates of defects at the locations of the potential failures, to increase sensitivity to defects at the locations of the potential failures, etc.).

In some embodiments, the method includes prioritizing one or more of the potential failures based on one or more attributes of the design data proximate the positions of the potential failures possibly in combination with any other information described herein (e.g., susceptibility of the design data to defects, susceptibility of the electrical parameters of the device corresponding to the design data to defects, etc.). Such prioritizing may be performed as described further herein. In addition, the most suitable inspection system and the parameters of the inspection system may be selected based on results of such prioritizing as described further herein. For example, in such embodiments, the most suitable inspection system and the parameters of the inspection system may be selected to optimize the inspection for potential failures that have the highest priority or priorities such that the most important defects are detected in the inspection process. Such determination of the most suitable inspection system and selection of the parameters may or may not result in optimization of the inspection for potential failures that have the lowest priority or priorities.

In another embodiment, the method includes determining an impact of the potential failures on yield of devices fabricated with the design data, as shown in step 214. In this manner, the method may be used for recipe optimization and monitoring. In a further embodiment, the method may include determining the impact of potential failures that were determined to be undetectable but impact yield. In this manner, the method may include determining a percentage of yield loss that is undetectable by inspection. One example of a method for predicting yield that may be used in the methods described herein is illustrated in U.S. Pat. No. 6,813,572 to Satya et al., which is incorporated by reference as if fully set forth herein.

The methods described above may, therefore, be used for completely automated prediction, tracking, and validation of hot spots (after some initial manual setup is performed). The method described above further includes storing results of determining which of the plurality of different inspection systems is most suitable for detecting the potential failures in a storage medium. The results of this step may include any results described herein. In addition, this method may perform the storing step as described further herein. The storage medium may include any of the storage media described herein.

Each of the embodiments of the method for evaluating one or more yield related processes described above may include any other step(s) of any method(s) described herein. In addition, each of the embodiments of the method for evaluating one or more yield related processes described above may be performed by any of the systems described herein.

The method and system embodiments described herein can be used to provide a total design, defect, and yield solution. For instance, as described above, the method may include separating defects (detected by inline inspection and/or electrical inspection) into systematic defects and random defects. The method and system embodiments described herein can also be used to manage hot spots.

Defects related to parametric yield losses may be used as input for a simulation such as a simulation that determines electrical parameters of devices based on parameters of semiconductor manufacturing processes. In this manner, the defects related to parametric yield losses may be used in combination with information about the processes performed on the wafer to tune or optimize the simulation. In addition, the simulation results may be used to identify parameters of the process performed on the wafer that can be altered to reduce the defects related to parametric yield losses. Furthermore, the simulation and the results of the methods described herein may be used to identify which parameters of the process or processes are critical to reducing parametric yield losses.

The defects related to systematic patterning losses may be used to identify pattern defects that are related to the interaction between the design of the device and the process. In this manner, the information about these defects can be used to alter the process, alter the design, or alter the process and the design to reduce these defects.

The steps described above may be performed during the design feedback phase that is performed to improve future designs by considering the lessons learned. In other words, knowledge transfer from the hot spot database and monitoring phase may be provided to the design phase (e.g., technology research and development, product design, RET design, etc.). This phase may be performed in multi-source space (e.g., using a correlation between any of design, wafer, test, and process spaces). This phase may also include improving the design based on hot spots that have a strong correlation to a particular cell design. In addition, this phase may include improving the design using hot spots that have a strong correlation to proposed design rules.

Information about the random defects may be used to determine the defect limited yield (i.e., the maximum possible yield attainable if all systematic and repeater defects were eliminated). Such information may also be used for online and offline monitoring in combination with simulations that determine the effect of the random defects on the device to identify the random defects that are top yield killers.

The methods described herein may include monitoring semiconductor fabrication processes using the results of the methods. The results that are used to monitor the semiconductor fabrication processes may include any of the results described herein (e.g., inline inspection data, systematic defect information, random defect information, failure density maps, binning results, etc.) or any combination of the results described herein. The methods described herein may also include altering one or more parameters of one or more semiconductor fabrication processes based on the results of any of the methods described herein. The parameter(s) of the semiconductor fabrication process(es) may be controlled using a feedback technique, a feedforward technique, an in situ technique, or some combination thereof. In this manner, the methods described herein and the results generated by the methods may be used for SPC applications.

As described further herein, the methods and systems described herein can be used for on-tool yield prediction based on design data for improved binning, review sampling, inspection setup, and any other analysis described herein. The methods and systems described herein have a number of advantages over other currently used methods and systems. For example, currently used methods and systems for KP analysis use historical yield data for total random yield loss predictions by considering the defect density by size distribution and/or classification One disadvantage of such methods and systems is that other defect groupings (e.g., size bins, class bins, layers) are not considered when calculating the probability that one or more defects will kill a die. In addition, these methods and systems require statistically significant historical data for setup. In another example, currently used methods and systems for KP analysis use historical yield data and yield loss prediction per defect by considering size and/or classification within a region (e.g., similar pattern density) to better predict the KP of detected defects. One disadvantage of such methods and systems is that statistically significant historical data is required for setup. In a further example, currently used methods and systems for critical area analysis (CAA) determines a yield loss prediction by defect and relies on pre-calculation of critical areas across the full die by geometry (line width, spacing) for various defect sizes. The approach is relatively computationally intensive, but once calculated, defects with an area greater than the critical area based on location are predicted to be killer. One disadvantage of such methods and systems is that statistically significant historical data is required for setup. In addition, such methods and systems involve computationally intensive pre-processing, and the accuracy of the methods and systems is limited by defect coordinate accuracy.

In contrast, the methods and systems described herein utilize highly accurate coordinates, which results in improved yield prediction accuracy for CAA and methods described herein. The methods and systems described herein may also be used for active CAA. For instance, rather than pre-processing data to generate a look up table across many sizes and locations, this approach calculates the yield based on the improved location and size. This requires design data to be available to the inspection system and has the potential to be more computationally efficient. In addition, the methods and systems described herein involve saving the analysis for systematic defects or by pattern grouping, which may result in further improved computational efficiency. Furthermore, the methods and systems described herein can be used to predict yield of on-tool results, which allows the results to be used for prioritizing defects for review (e.g., manual review for recipe optimization, high resolution image grab, etc.) while the wafer is on the chuck.

Further modifications and alternative embodiments of various aspects of the invention may be apparent to those skilled in the art in view of this description. For example, methods and systems for utilizing design data in combination with inspection data are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for assigning classifications to defects detected on a wafer, comprising:

comparing portions of design data proximate positions of the defects in design data space with design data corresponding to different design based classifications, wherein the design data corresponding to the different design based classifications and the different design based classifications are stored in a data structure;

determining if the design data in the portions is at least similar to the design data corresponding to the different design based classifications based on results of said comparing;

assigning to the defects the design based classifications corresponding to the design data that is at least similar to the design data in the portions; and storing results of said assigning in a storage medium, wherein said comparing, said determining, said assigning, and said storing are performed using a computer system.

2. The method of claim 1, wherein the computer-implemented method is performed by an inspection system used to detect the defects.

3. The method of claim 1, wherein the computer-implemented method is performed by a system other than an inspection system used to detect the defects.

4. The method of claim 1, further comprising monitoring hot spots in the design data based on the results of said assigning.

5. The method of claim 1, wherein the design data corresponding to the different design based classifications is identified by grouping defects detected on one or more other wafers based on portions of the design data proximate positions of the defects detected on the one or more other wafers in the design data space.

6. The method of claim 1, wherein the defects were detected in an inspection process, the method further comprising reviewing locations on the wafer at which one or more patterns of interest in the design data are printed, determining based on results of said reviewing if defects should have been detected at the locations of the one or more patterns of interest, and altering the inspection process to improve one or more defect capture rates.

7. The method of claim 1, further comprising determining if the defects are nuisance defects based on the design based classifications assigned to the defects and removing the nuisance defects from results of an inspection process in which the defects were detected to increase signal-to-noise ratio of the results of the inspection process.

8. The method of claim 1, further comprising determining a kill probability value for one or more of the defects.

9. The method of claim 1, further comprising determining if the design based classifications assigned to the defects correspond to systematic defects that are visible to a review system and sampling the defects for review by selecting only the defects that are visible to the review system for the review.

10. The method of claim 1, further comprising determining one or more patterns of interest in the design data by identifying one or more features in the design data indicative of a pattern dependent defect.

11. The method of claim 1, wherein the design based classifications identify one or more polygons in the design data on which the defects are located or located near the defects.

12. The method of claim 1, wherein the design based classifications identify locations of the defects in one or more polygons in the design data.

13. The method of claim 1, wherein the data structure comprises a library containing examples of the design data organized by technology, process, or some combination thereof.

14. The method of claim 1, further comprising separating the design data proximate the positions of the defects into the design data in areas around the defects and the design data in areas on which the defects are located.

15. The method of claim 1, further comprising monitoring systematic defects, potential systematic defects, or some combination thereof over time using the results of said assigning.

16. The method of claim 1, further comprising determining a kill probability value for one or more of the design based classifications based on one or more attributes of the design data corresponding to the design based classifications.

17. The method of claim 1, further comprising determining a kill probability value for one or more of the detects based on one or more attributes of the design data corresponding to the design based classifications assigned to the one or more of the defects.

18. The method of claim 1, further comprising monitoring kill probability values for one or more of the design based classifications and assigning to the defects the kill probability values for the design based classifications assigned to the defects.

19. The method of claim 1, wherein dimensions of at least some of the portions are different.

20. The method of claim 1, wherein the design data in the portions comprises design data for more than one design layer.

21. The method of claim 1, further comprising determining the positions of the defects in the design data space by comparing data acquired by an inspection system for alignment sites on the wafer with data for predetermined alignment sites.

22. The method of claim 1, further comprising determining the positions of the defects in the design data space by comparing data acquired by an inspection system during detection of the defects to locations in the design data determined by review.

23. The method of claim 1, wherein said assigning comprises assigning to the defects the design based classifications corresponding to the design data that is at least similar to the design data in the portions and that has one or more attributes that are at least similar to one or more attributes of the design data in the portions.

24. The method of claim 23, wherein the one or more attributes comprise one or more attributes of results of an inspection in which the defects were detected, one or more parameters of the inspection, or some combination thereof.

25. The method of claim 1, wherein the design data proximate the positions of the defects comprises the design data on which the defects are located.

26. The method of claim 1, wherein the design data proximate the positions of the defects comprises the design data around the positions of the defects.

27. The method of claim 1, further comprising binning the defects assigned one or more of the design based classifications in groups such that the positions of the defects in each of the groups with respect to polygons in the portions of the design data proximate the positions of the defects are at least similar.

28. The method of claim 1, further comprising selecting at least some of the defects for review based on the results of said assigning.

29. The method of claim 1, further comprising generating a process for sampling the defects for review based on the results of said assigning.

30. The method of claim 1, further comprising altering a process for inspecting the wafer based on the results of said assigning.

31. The method of claim 1, further comprising altering a process for inspection of the wafer during the inspection based on results of the inspection.

32. The method of claim 1, further comprising altering a metrology process for the wafer based on the results of said assigning.

33. The method of claim 1, further comprising altering a sampling plan for a metrology process for the wafer based on the results of said assigning.

34. The method of claim 1, further comprising prioritizing one or more of the design based classifications and optimizing one or more processes to be performed on wafers on which the design data will be printed based on results of said prioritizing.

35. The method of claim 1, further comprising determining a root cause of the defects based on the design based classifications assigned to the defects.

36. The method of claim 1, further comprising determining a root cause of at least some of the defects by mapping the at least some of the defects to experimental process window results.

37. The method of claim 1, further comprising determining a root cause of at least some of the defects by mapping the at least some of the defects to simulated process window results.

38. The method of claim 1, further comprising determining a root cause corresponding to one or more of the defect based classifications and assigning a root cause to the defects based on the root cause corresponding to the defect based classifications assigned to the defects.

39. The method of claim 1, further comprising determining a percentage of a die formed on the wafer impacted by the defects to which one or more of the design based classifications are assigned.

40. The method of claim 1, further comprising determining a pattern of interest in the design data corresponding to at least one of the design based classifications and determining a ratio of number of the defects to which the at least one of the design based classifications have been assigned to number of locations of the pattern of interest on the wafer.

41. The method of claim 1, further comprising determining one or more patterns of interest in the design data corresponding to at least one of the design based classifications and determining a ratio of number of the defects to which the at least one of the design based classifications have been assigned to number of locations of the one or more patterns of interest in the design data.

42. The method of claim 1, further comprising determining a pattern of interest in the design data corresponding to at least one of the design based classifications, determining a percentage of a die formed on the wafer in which the defects to which the at least one of the design based classifications have been assigned are located, and assigning a priority to the pattern of interest based on the percentage.

43. The method of claim 1, further comprising prioritizing one or more of the design based classifications by number of total design instances on the wafer at which the defects to which the one or more of the design based classifications have been assigned are detected.

44. The method of claim 1, further comprising prioritizing one or more of the design based classifications by number of design instances on a reticle, used to print the design data on the wafer, at which the defects to which the one or more of the design based classifications have been assigned are detected at least once.

45. The method of claim 1, further comprising determining reticle-based marginality for one or more of the design based classifications based on number of locations on a reticle at which the defects to which the one or more of the design based classifications have been assigned were detected and total number of portions of the design data printed on the reticle that are similar to the portions of the design data proximate the positions of the defects to which the one or more of the design based classifications have been assigned.

46. The method of claim 1, further comprising converting the portions of the design data proximate the positions of the defects to first bitmaps prior to said comparing and converting the design data corresponding to the design based classifications to second bitmaps prior to said comparing, wherein said comparing comprises comparing the first bitmaps with the second bitmaps.

47. A non-transitory computer-readable medium storing program instructions executable on a computer system for performing a computer-implemented method for assigning classifications to defects detected on a wafer, wherein the computer-implemented method comprises:
    comparing portions of design data proximate positions of the defects in design data space with design data corresponding to different design based classifications, wherein the design data corresponding to the different design based classifications and the different design based classifications are stored in a data structure;
    determining if the design data in the portions is at least similar to the design data corresponding to the different design based classifications based on results of said comparing;
    assigning to the defects the design based classifications corresponding to the design data that is at least similar to the design data in the portions; and
    storing results of said assigning in a storage medium.

48. A system configured to assign classifications to defects detected on a wafer, comprising:
    an inspection subsystem configured to detect defects on a wafer, wherein the inspection subsystem is an optical inspection subsystem or an electron beam inspection subsystem; and
    a computer subsystem configured for:
        comparing portions of design data proximate positions of the defects in design data space with design data corresponding to different design based classifications, wherein the design data corresponding to the different design based classifications and the different design based classifications are stored in a data structure;
        determining if the design data in the portions is at least similar to the design data corresponding to the different design based classifications based on results of said comparing;
        assigning to the defects the design based classifications corresponding to the design data that is at least similar to the design data in the portions; and
        storing results of said assigning in a storage medium.

49. The system of claim 48, wherein the computer subsystem is further configured for monitoring hot spots in the design data based on the results of said assigning.

50. The system of claim 48, wherein the design data corresponding to the different design based classifications is identified by grouping defects detected on one or more other wafers based on portions of the design data proximate positions of the defects detected on the one or more other wafers in the design data space.

51. The system of claim 48, wherein the defects were detected in an inspection process, and wherein the computer subsystem is further configured for reviewing locations on the wafer at which one or more patterns of interest in the design data are printed, determining based on results of said reviewing if defects should have been detected at the locations of the one or more patterns of interest, and altering the inspection process to improve one or more defect capture rates.

52. The system of claim 48, wherein the computer subsystem is further configured for determining if the defects are nuisance defects based on the design based classifications assigned to the defects and removing the nuisance defects from results of an inspection process in which the defects were detected to increase signal-to-noise ratio of the results of the inspection process.

53. The system of claim 48, wherein the computer subsystem is further configured for determining a kill probability value for one or more of the defects.

54. The system of claim 48, wherein the computer subsystem is further configured for determining if the design based classifications assigned to the defects correspond to systematic defects that are visible to a review system and sampling the defects for review by selecting only the defects that are visible to the review system for the review.

55. The system of claim 48, wherein the computer subsystem is further configured for determining one or more patterns of interest in the design data by identifying one or more features in the design data indicative of a pattern dependent defect.

56. The system of claim 48, wherein the design based classifications identify one or more polygons in the design data on which the defects are located or located near the defects.

57. The system of claim 48, wherein the design based classifications identify locations of the defects in one or more polygons in the design data.

58. The system of claim 48, wherein the data structure comprises a library containing examples of the design data organized by technology, process, or some combination thereof.

59. The system of claim 48, wherein the computer subsystem is further configured for separating the design data proximate the positions of the defects into the design data in areas around the defects and the design data in areas on which the defects are located.

60. The system of claim 48, wherein the computer subsystem is further configured for monitoring systematic defects, potential systematic defects, or sonic combination thereof over time using the results of said assigning.

61. The system of claim 48, wherein the computer subsystem is further configured for determining a kill probability value for one or more of the design based classifications based on one or more attributes of the design data corresponding to the design based classifications.

62. The system of claim 48, wherein the computer subsystem is further configured for determining a kill probability value for one or more of the defects based on one or more attributes of the design data corresponding to the design based classifications assigned to the one or more of the defects.

63. The system of claim 48, wherein the computer subsystem is further configured for monitoring kill probability values for one or more of the design based classifications and assigning to the defects the kill probability values for the design based classifications assigned to the defects.

64. The system of claim 48, wherein dimensions of at least some of the portions are different.

65. The system of claim 48, wherein the design data in the portions comprises design data for more than one design layer.

66. The system of claim 48, wherein the computer subsystem is further configured for determining the positions of the defects in the design data space by comparing data acquired by an inspection system for alignment sites on the wafer with data for predetermined alignment sites.

67. The system of claim 48, wherein the computer subsystem is further configured for determining the positions of the defects in the design data space by comparing data acquired by the inspection subsystem during detection of the defects to locations in the design data determined by review.

68. The system of claim 48, wherein said assigning comprises assigning to the defects the design based classifications corresponding to the design data that is at least similar to the design data in the portions and that has one or more attributes that are at least similar to one or more attributes of the design data in the portions.

69. The system of claim 68, wherein the one or more attributes comprise one or more attributes of results of an inspection in which the defects were detected, one or more parameters of the inspection, or some combination thereof.

70. The system of claim 48, wherein the design data proximate the positions of the defects comprises the design data on which the defects are located.

71. The system of claim 48, wherein the design data proximate the positions of the defects comprises the design data around the positions of the defects.

72. The system of claim 48, wherein the computer subsystem is further configured for binning the defects assigned one or more of the design based classifications in groups such that the positions of the defects in each of the groups with respect to polygons in the portions of the design data proximate the positions of the defects are at least similar.

73. The system of claim 48, wherein the computer subsystem is further configured for selecting at least some of the defects for review based on the results of said assigning.

74. The system of claim 48, wherein the computer subsystem is further configured for generating a process for sampling the defects for review based on the results of said assigning.

75. The system of claim 48, wherein the computer subsystem is further configured for altering a process for inspecting the wafer based on the results of said assigning.

76. The system of claim 48, wherein the computer subsystem is further configured for altering a process for inspection of the wafer performed by the inspection subsystem during the inspection based on results of the inspection.

77. The system of claim 48, wherein the computer subsystem is further configured for altering a metrology process for the wafer based on the results of said assigning.

78. The system of claim 48, wherein the computer subsystem is further configured for altering a sampling plan for a metrology process for the wafer based on the results of said assigning.

79. The system of claim 48, wherein the computer subsystem is further configured for prioritizing one or more of the design based classifications and optimizing one or more processes to be performed on wafers on which the design data will he printed based on results of said prioritizing.

80. The system of claim 48, wherein the computer subsystem is further configured for determining a root cause of the defects based on the design based classifications assigned to the defects.

81. The system of claim 48, wherein the computer subsystem is further configured for determining a root cause of at least some of the defects by mapping the at least some of the defects to experimental process window results.

82. The system of claim 48, wherein the computer subsystem is further configured for determining a root cause of at least some of the defects by mapping the at least some of the defects to simulated process window results.

83. The system of claim 48, wherein the computer subsystem is further configured for determining a root cause corresponding to one or more of the defect based classifications and assigning a root cause to the defects based on the root cause corresponding to the defect based classifications assigned to the defects.

84. The system of claim 48, wherein the computer subsystem is further configured for determining a percentage of a die formed on the wafer impacted by the defects to which one or more of the design based classifications are assigned.

85. The system of claim 48, wherein the computer subsystem is further configured for determining a pattern of interest in the design data corresponding to at least one of the design based classifications and determining a ratio of number of the defects to which the at least one of the design based classifications have been assigned to number of locations of the pattern of interest on the wafer.

86. The system of claim 48, wherein the computer subsystem is further configured for determining one or more patterns of interest in the design data corresponding to at least one of the design based classifications and determining a ratio of number of the defects to which the at least one of the design based classifications have been assigned to number of locations of the one or more patterns of interest in the design data.

87. The system of claim 48, wherein the computer subsystem is further configured for determining a pattern of interest in the design data corresponding to at least one of the design based classifications, determining a percentage of a die formed on the wafer in which the defects to which the at least one of the design based classifications have been assigned are located, and assigning a priority to the pattern of interest based on the percentage.

88. The system of claim 48, wherein the computer subsystem is further configured for prioritizing one or more of the design based classifications by number of total design instances on the wafer at which the defects to which the one or more of the design based classifications have been assigned are detected.

89. The system of claim 48, wherein the computer subsystem is further configured for prioritizing one or more of the design based classifications by number of design instances on a reticle, used to print the design data on the wafer, at which the defects to which the one or more of the design based classifications have been assigned are detected at least once.

90. The system of claim 48, wherein the computer subsystem is further configured for determining reticle-based marginality for one or more of the design based classifications based on number of locations on a reticle at which the defects to which the one or more of the design based classifications have been assigned were detected and total number of portions of the design data printed on the reticle that are similar to the portions of the design data proximate the positions of the defects to which the one or more of the design based classifications have been assigned.

91. The system of claim 48, wherein the computer subsystem is further configured for converting the portions of the design data proximate the positions of the defects to first bitmaps prior to said comparing and converting the design data corresponding to the design based classifications to second bitmaps prior to said comparing, and wherein said comparing comprises comparing the first bitmaps with the second bitmaps.

92. The system of claim 48 wherein the computer subsystem is further configured for determining a sensitivity for detecting the defects on different portions of the wafer based on a position of inspection data generated for the wafer by the inspection subsystem in the design data space and one or more attributes of the design data in the design data space, and wherein the design data used to determine the sensitivity comprises design data for more than one design layer on the wafer.

93. The system of claim 48, wherein the computer subsystem is further configured for determining a sensitivity for detecting the defects on different portions of the wafer based on a position of Inspection data generated for the wafer by the inspection subsystem in the design data space and one or more attributes of the design data in the design data space, and wherein the one or more attributes of the design data comprise one or more attributes of design data for different process layers on the wafer.

94. The system of claim 48, wherein the computer subsystem is further configured for determining one or more attributes of the design data corresponding to portions of inspection data generated for the wafer by the inspection subsystem based on a context map for multiple layers on the wafer.

95. The system of claim 48, wherein the computer subsystem is further configured for determining a criticality of the design data corresponding to different portions of inspection data acquired for the wafer by the inspection subsystem based on a context map for multiple layers on the wafer.

96. The system of claim 48, wherein the computer subsystem is further configured for determining if the defects are nuisance defects based on a position of inspection data generated for the wafer by the inspection subsystem in the design data space and one or more attributes of the design data in the design data space, and wherein the one or more attributes of the design data comprise one or more attributes of design data for different process layers on the wafer.

97. The system of claim 48, wherein the computer subsystem is further configured for applying a context map to the defects to sort the defects into contexts, and wherein the context map is for multiple layers on the wafer.

98. The system of claim 48, wherein the computer subsystem is further configured for binning the defects into groups based on a position of inspection data generated for the wafer by the inspection subsystem in the design data space and one or more attributes of the design data in the design data space, and wherein the one or more attributes of the design data comprise one or more attributes of design data for different process layers on the wafer.

99. The system of claim 48, wherein the computer subsystem is further configured for binning defects by checking a set of design layers for background similarity of the defects.

100. The system of claim 48, wherein the computer subsystem is further configured for performing arbitrary pattern searching of the design data for potential patterns of interest and setting up new inline hot spot monitors for the potential patterns of interest, and wherein the design data comprises design data for more than one design layer on the wafer.

101. The system of claim 48, wherein the computer subsystem is further configured for generating a process for inspecting the wafer based on the design data, wherein generating the process comprises configuring an inspection recipe such that only locations of patterns of interest in the design data are inspected, and wherein the design data comprises design data for more than one design layer on the wafer.

102. The system of claim 48, wherein the computer subsystem is further configured for determining a sensitivity for detecting the defects on the wafer based on the design data for more than one design layer on the wafer.

103. The system of claim 48, wherein the computer subsystem is further configured for identifying care areas on the wafer based on the design data for more than one design layer on the wafer.

* * * * *